US012598915B2

(12) United States Patent
Oh et al.

(10) Patent No.: US 12,598,915 B2
(45) Date of Patent: Apr. 7, 2026

(54) CONDENSED CYCLIC COMPOUND, LIGHT-EMITTING DEVICE INCLUDING THE CONDENSED CYCLIC COMPOUND, AND ELECTRONIC APPARATUS INCLUDING THE LIGHT-EMITTING DEVICE

(71) Applicant: Samsung Display Co., Ltd., Yongin-si (KR)

(72) Inventors: Chanseok Oh, Yongin-si (KR); Seran Kim, Yongin-si (KR); Sunyoung Pak, Yongin-si (KR); Kyoung Sunwoo, Yongin-si (KR); Munki Sim, Yongin-si (KR); Moran Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 840 days.

(21) Appl. No.: 17/969,989

(22) Filed: Oct. 20, 2022

(65) Prior Publication Data

US 2023/0255100 A1 Aug. 10, 2023

(30) Foreign Application Priority Data

Feb. 10, 2022 (KR) ........................ 10-2022-0017773

(51) Int. Cl.
*H10K 85/60* (2023.01)
*C07F 5/02* (2006.01)
(Continued)

(52) U.S. Cl.
CPC ........... *H10K 85/658* (2023.02); *C07F 5/027* (2013.01); *H10K 50/11* (2023.02); *H10K 50/121* (2023.02);
(Continued)

(58) Field of Classification Search
CPC .. H10K 85/322; H10K 85/658; H10K 85/633; H10K 2101/90; H10K 50/12;
(Continued)

(56) References Cited

U.S. PATENT DOCUMENTS

| | | | | |
|---|---|---|---|---|
| 10,374,166 | B2 | 8/2019 | Hatakeyama et al. | |
| 2021/0066616 | A1 | 3/2021 | Fleetham et al. | |
| 2024/0268224 | A1 * | 8/2024 | Ju .......................... | H10K 85/30 |

FOREIGN PATENT DOCUMENTS

| | | | |
|---|---|---|---|
| CN | 111647009 | A | 9/2020 |
| CN | 112028912 | | 12/2020 |

(Continued)

OTHER PUBLICATIONS

Anton Pershin et al., "Highly emissive excitons with reduced exchange energy in thermally activated delayed fluorescent molecules", Nature Communications, Feb. 5, 2019, pp. 1-5.

(Continued)

*Primary Examiner* — James D Sells
(74) *Attorney, Agent, or Firm* — Womble Bond Dickinson (US) LLP

(57) ABSTRACT

Embodiments provide a condensed cyclic compound, a light-emitting device that includes the condensed cyclic compound, and an electronic apparatus that includes the light-emitting device. The light-emitting device includes a first electrode, a second electrode facing the first electrode, and an interlayer between the first electrode and the second electrode, wherein the interlayer includes an emission layer, and at least one of the condensed cyclic compound. The condensed cyclic compound is represented by Formula 1, which is explained in the specification:
(Continued)

[Formula 1]

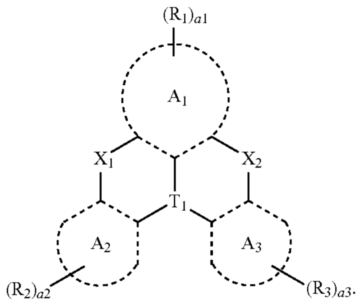

20 Claims, 3 Drawing Sheets

(51) Int. Cl.

| | |
|---|---|
| ***H10K 50/11*** | (2023.01) |
| ***H10K 50/12*** | (2023.01) |
| ***H10K 50/15*** | (2023.01) |
| ***H10K 50/16*** | (2023.01) |
| *H10K 101/40* | (2023.01) |

(52) U.S. Cl.
CPC ............ *H10K 50/15* (2023.02); *H10K 50/16* (2023.02); *H10K 2101/40* (2023.02)

(58) Field of Classification Search
CPC ............ H10K 50/121; H10K 2101/40; H10K 85/657; H10K 50/11; H10K 85/40; H01K 50/16
USPC ........................................................ 428/690
See application file for complete search history.

(56) References Cited

FOREIGN PATENT DOCUMENTS

| | | |
|---|---|---|
| KR | 10-2016-0119683 | 10/2016 |
| KR | 10-2017-0121345 | 11/2017 |

OTHER PUBLICATIONS

Chan Seok Oh et al., "Dihedral Angle Control of Blue Thermally-Activated Delayed Fluorescent Emitters through Donor Substitution Position for Efficient Reverse Intersystem Crossing", ACS Applied Materials & Interfaces, Sep. 22, 2018, 33 total pages.

Kleitos Stavrou et al, "Hot Vibrational States in a High-Performance Multiple Resonance Emitter and the Effect of Excimer Quenching on Organic Light-Emitting Diodes", ACS Applied Materials & Interfaces, Feb. 8, 2021, pp. 8643-8655.

* cited by examiner

CONDENSED CYCLIC COMPOUND, LIGHT-EMITTING DEVICE INCLUDING THE CONDENSED CYCLIC COMPOUND, AND ELECTRONIC APPARATUS INCLUDING THE LIGHT-EMITTING DEVICE

CROSS-REFERENCE TO RELATED APPLICATION(S)

This application claims priority to and benefits of Korean Patent Application No. 10-2022-0017773 under 35 U.S.C. § 119, filed on Feb. 10, 2022, in the Korean Intellectual Property Office, the entire contents of which are incorporated herein by reference.

BACKGROUND

1. Technical Field

Embodiments relate to a condensed cyclic compound, a light-emitting device including the condensed cyclic compound, and an electronic apparatus including the light-emitting device.

2. Description of the Related Art

In comparison to devices in the art, light-emitting devices are self-emissive devices which have wide viewing angles, high contrast ratios, short response times, and excellent characteristics in terms of luminance, driving voltage, and response speed, and produce multi-color images.

In a light-emitting device, a first electrode is arranged on a substrate, and a hole transport region, an emission layer, an electron transport region, and a second electrode are sequentially formed on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. The excitons may transition from an excited state to a ground state, thus generating light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments include a condensed cyclic compound, a light-emitting device including the condensed cyclic compound, and an electronic apparatus including the light-emitting device.

Additional aspects will be set forth in part in the description which follows and, in part, will be apparent from the description, or may be learned by practice of the embodiments of the disclosure.

According to embodiments, a condensed cyclic compound may be represented by Formula 1:

[Formula 1]

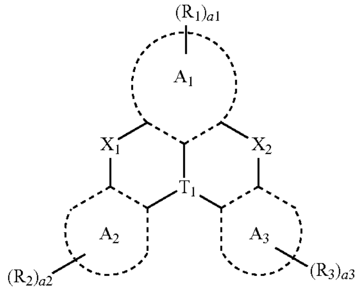

[Formula 2]

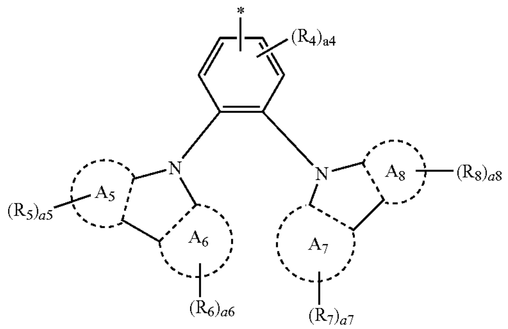

In Formula 1 and Formula 2, $T_1$ may be B, P(=O), or P(=S), $X_1$ may be O, S, or $N(R_{1a})$, $X_2$ may be O, S, or $N(R_{2a})$, ring $A_1$ to ring $A_3$ and ring $A_5$ to ring $A_8$ may each independently be a $C_5$-$C_{30}$ carbocyclic group or a $C_2$-$C_{30}$ heterocyclic group, $R_1$ to $R_3$ may each independently be:

hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_2$-$C_{60}$ heteroarylalkyl group unsubstituted or substituted with at least one $R_{10a}$, $-C(Q_1)(Q_2)(Q_3)$, $-Si(Q_1)(Q_2)(Q_3)$, $-N(Q_1)(Q_2)$, $-B(Q_1)(Q_2)$, $-C(=O)(Q_1)$, $-S(=O)_2(Q_1)$, or $-P(=O)(Q_1)(Q_2)$; or a group represented by Formula 2, a1 to a3 may each independently be an integer from 1 to 10, at least one of $R_1$(s) in the number of a1, $R_2$(s) in the number of a2, and $R_3$(s) in the number of a3 may each independently be a group represented by Formula 2, $R_{1a}$, $R_{2a}$, and $R_4$ to $R_8$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_2$-$C_{60}$ heteroarylalkyl group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), a4 may be 0, 1, 2, or 3, a5 to a8 may each independently be an integer from 1 to 10,

* indicates a binding site to a neighboring atom, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, $T_1$ may be B.

In an embodiment, ring $A_1$ to ring $A_3$ and ring $A_5$ to ring $A_8$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In an embodiment, ring $A_5$ to ring $A_8$ may each independently be a benzene group, a pyridine group, or a pyrimidine group.

In an embodiment, $R_1$ to $R_3$ may each independently be: hydrogen, deuterium, —F, or a cyano group; a $C_1$-$C_{20}$ alkyl group or a $C_3$-$C_{20}$ cycloalkyl group, each unsubstituted or substituted with deuterium, —F, a cyano group, or any combination thereof; a phenyl group, a naphthyl group, a dibenzofuranyl group, a dibenzothiophenyl group, or a carbazolyl group, each unsubstituted or substituted with deuterium, —F, —Cl, —Br, —I, a hydroxyl group, a cyano group, a nitro group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, or any combination thereof; —N($Q_1$)($Q_2$); or a group represented by Formula 2, and $Q_1$ and $Q_2$ may each independently be: an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

In an embodiment, one of Conditions i to iv may be satisfied, wherein Conditions i to iv are explained below.

In an embodiment, $R_{1a}$ and $R_{2a}$ may each independently be a phenyl group unsubstituted or substituted with deuterium, —F, —$CD_3$, —$CD_2H$, —$CDH_2$, —$CF_3$, —$CF_2H$, —$CFH_2$, a cyano group, a $C_1$-$C_{20}$ alkyl group, a phenyl group, or any combination thereof.

In an embodiment, $R_4$ to $R_8$ may each independently be: hydrogen, deuterium, —F, or a cyano group; a $C_1$-$C_{20}$ alkyl group or a $C_3$-$C_{10}$ cycloalkyl group, each unsubstituted or substituted with deuterium, —F, a cyano group, or any combination thereof; or a phenyl group, a naphthyl group, a dibenzofuranyl group, a dibenzothiophenyl group, or a carbazolyl group, each unsubstituted or substituted with deuterium, —F, $—CD_3$, $—CD_2H$, $—CDH_2$, $—CF_3$, $—CF_2H$, $—CFH_2$, a cyano group, a $C_1$-$C_{20}$ alkyl group, a phenyl group, or any combination thereof.

In an embodiment, Formula 2 may be represented by one of Formulae 2-1 to 2-8, which are explained below.

In an embodiment, at least one of Condition a to Condition c may be satisfied, wherein Condition a to Condition c are explained below.

In an embodiment, the condensed cyclic compound may be represented by one of Formulae 1(1) to 1(13), which are explained below.

In an embodiment, Equation 1 may be satisfied, wherein Equation 1 is explained below.

According to embodiments, a light-emitting device may include a first electrode, a second electrode facing the first electrode, and an interlayer between the first electrode and the second electrode, wherein the interlayer may include an emission layer, and at least one condensed cyclic compound represented by Formula 1.

In an embodiment, the first electrode may be an anode; the second electrode may be a cathode; the interlayer may further include a hole transport region between the emission layer and the first electrode, and an electron transport region between the emission layer and the second electrode; the hole transport region may include a hole injection layer, a hole transport layer, an emission auxiliary layer, an electron blocking layer, or any combination thereof; and the electron transport region may include a buffer layer, a hole blocking layer, an electron control layer, an electron transport layer, an electron injection layer, or any combination thereof.

In an embodiment, the emission layer may include the at least one condensed cyclic compound.

In an embodiment, the emission layer may further include a first compound that is a hole-transporting compound, and a second compound that is an electron-transporting compound.

In an embodiment, the emission layer may further include a third compound, and the third compound may be a phosphorescent sensitizer.

In an embodiment, the emission layer may emit light having a maximum emission wavelength in a range of about 400 nm to about 500 nm.

According to embodiments, an electronic apparatus may include the light-emitting device, and a thin-film transistor, wherein the thin-film transistor may include a source electrode and a drain electrode, and the first electrode of the light-emitting device may be electrically connected to the source electrode or the drain electrode.

In an embodiment, the electronic apparatus may further include a color filter, a quantum dot color conversion layer, a touch screen layer, a polarizing layer, or any combination thereof.

It is to be understood that the embodiments above are described in a generic and explanatory sense only and not for the purpose of limitation, and the disclosure is not limited to the embodiments described above.

BRIEF DESCRIPTION OF THE DRAWINGS

The above and other aspects and features of the disclosure will be more apparent by describing in detail embodiments thereof with reference to the accompanying drawings, in which.

DETAILED DESCRIPTION OF THE EMBODIMENTS

Figure 1:
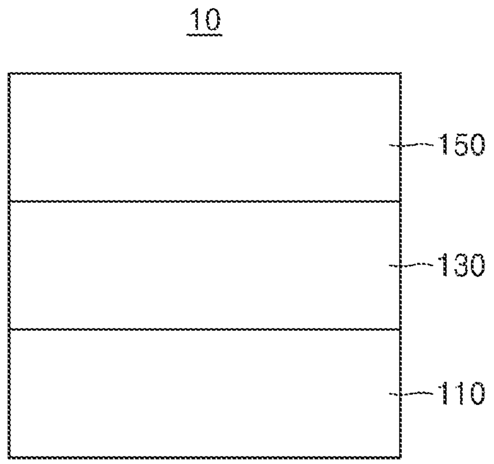
FIG. 1 is a schematic cross-sectional view of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element.

Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within +20%, 10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

An aspect provides a condensed cyclic compound which may be represented by Formula 1:

[Formula 1]

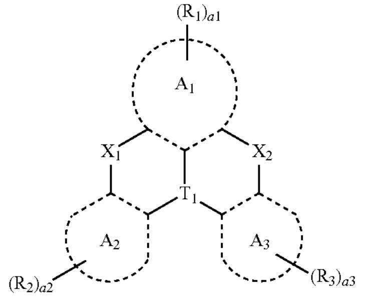

[Formula 2]

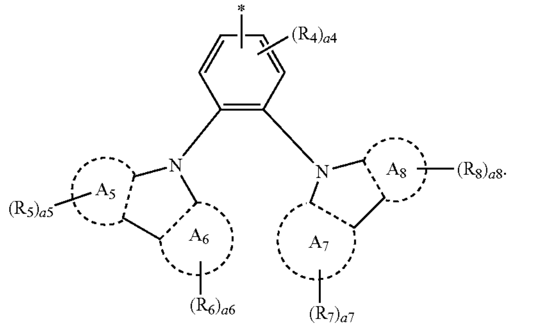

In Formula 1, $T_1$ may be B, P(=O), or P(=S).

In an embodiment, $T_1$ may be B.

In Formula 1, $X_1$ may be O, S, or $N(R_{1a})$, and $X_2$ may be O, S, or $N(R_{2a})$. $X_1$ and $X_2$ may be identical to or different from each other.

In Formulae 1 and 2, ring $A_1$ to ring $A_3$ and ring $A_5$ to ring $A_8$ may each independently be a $C_5$-$C_{30}$ carbocyclic group or a $C_2$-$C_{30}$ heterocyclic group.

In an embodiment, ring $A_1$ to ring $A_3$ and ring $A_5$ to ring $A_8$ may each independently be a benzene group, a naphthalene group, an anthracene group, a phenanthrene group, a triphenylene group, a pyrene group, a chrysene group, cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In embodiments, ring $A_1$ to ring $A_3$ may each independently be a benzene group, a pyridine group, or a pyrimidine group.

For example, ring $A_1$ to ring $A_3$ may each be a benzene group.

In embodiments, ring $A_5$ to $A_8$ may each independently be a benzene group, a pyridine group, or a pyrimidine group.

For example, ring $A_5$ to ring $A_8$ may each be a benzene group.

In Formula 1, $R_1$ to $R_3$ may each independently be:

hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_6$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_2$-$C_{60}$ heteroarylalkyl group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), or a group represented by Formula 2.

In Formula 1, a1 to a3 indicates the number of $R_1$(s) to the number of $R_3$(s), respectively, and may each independently be an integer from 1 to 10. When a1 is 2 or greater, two or more of $R_1$(s) may be identical to or different from each other, when a2 is 2 or greater, two or more of $R_2$(s) may be identical to or different from each other, and when a3 is 2 or greater, two or more of $R_3$(s) may be identical to or different from each other.

In Formula 1, at least one of $R_1$(s) in the number of a1, $R_2$(s) in the number of a2, and $R_3$(s) in the number of a3 may each independently be a group represented by Formula 2. In case that two or more of $R_1$(s) in the number of a1, $R_2$(s) in the number of a2, and $R_3$(s) in the number of a3 are each independently a group represented by Formula 2, the two or more groups represented by Formula 2 may be identical to or different from each other.

In Formulae 1 and 2, $R_{1a}$, $R_{2a}$, and $R_4$ to $R_8$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_2$-$C_{60}$ heteroarylalkyl group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$).

In Formula 2, a4 may be 0, 1, 2, or 3.

In Formula 2, a5 to a8 may each independently be an integer from 1 to 10.

In Formula 2, * indicates a binding site to a neighboring atom.

In the specification, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_6$ alkoxy group, a $C_3$-$C_{60}$ carbocyclic group, or a $C_1$-$C_{60}$ heterocyclic group, each unsubstituted or substituted with deuterium, —F, a cyano group, a $C_1$-$C_{60}$ alkyl group, a $C_1$-$C_6$ alkoxy group, a phenyl group, a biphenyl group, or any combination thereof.

In an embodiment, in Formula 1, $R_1$ to $R_3$ may each independently be:

hydrogen, deuterium, —F, —Cl, —Br, —I, a hydroxyl group, a cyano group, or a nitro group;

a $C_1$-$C_{60}$ alkyl group or a $C_3$-$C_{60}$ cycloalkyl group, each unsubstituted or substituted with deuterium, —F, —Cl, —Br, —I, a hydroxyl group, a cyano group, a nitro group, or any combination thereof;

a $C_3$-$C_{60}$ carbocyclic group or a $C_1$-$C_{60}$ heterocyclic group, each unsubstituted or substituted with deuterium, —F, —Cl, —Br, —I, a hydroxyl group, a cyano group, a nitro group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$alkyl)phenyl group, or any combination thereof;

—C($Q_1$)($Q_2$)($Q_3$), —Si($Q_1$)($Q_2$)($Q_3$), —N($Q_1$)($Q_2$), or —B($Q_1$)($Q_2$); or a group represented by Formula 2.

In an embodiment, in Formula 1, $R_1$ to $R_3$ may be identical to or different from each other.

In an embodiment, in Formula 1, $R_1$ to $R_3$ may each independently be:

hydrogen, deuterium, —F, —Cl, —Br, —I, a hydroxyl group, a cyano group, or a nitro group;

a $C_1$-$C_{20}$ alkyl group or a $C_3$-$C_{20}$ cycloalkyl group, each unsubstituted or substituted with deuterium, —F, —Cl, —Br, —I, a hydroxyl group, a cyano group, a nitro group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluorantenyl group, a triphenylenyl group, a pyrenyl group, a chrysenyl group, a pyrrolyl group, a thiophenyl group, a furanyl group, an isoindolyl group, an indolyl group, an indazolyl group, a purinyl group, a cinnolinyl group, a carbazolyl group, a benzofuranyl group, a dibenzofuranyl group, a benzothiophenyl group, a dibenzothiophenyl group, a benzocarbazolyl group, or a dibenzocarbazolyl group, unsubstituted or substituted with deuterium, —F, —Cl, —Br, —I, a hydroxyl group, a cyano group, a nitro group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, or any combination thereof;

—N($Q_1$)($Q_2$); or a group represented by Formula 2, and $Q_1$ and $Q_2$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

In embodiments, in Formula 1, $R_1$ to $R_3$ may each independently be:

hydrogen, deuterium, —F, or cyano group;

a $C_1$-$C_{20}$ alkyl group or a $C_3$-$C_{20}$ cycloalkyl group, each unsubstituted or substituted with deuterium, —F, a cyano group, or any combination thereof;

a phenyl group, a naphthyl group, a dibenzofuranyl group, a dibenzothiophenyl group, or a carbazolyl group, each unsubstituted or substituted with deuterium, —F, —Cl, —Br, —I, a hydroxyl group, a cyano group, a nitro group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, or any combination thereof;

—N($Q_1$)($Q_2$); or a group represented by Formula 2, and $Q_1$ and $Q_2$ may each independently be:

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

In an embodiment, one of $R_1$(s) in the number of a1, $R_2$(s) in the number of a2, and $R_3$(s) in the number of a3 may be a group represented by Formula 2, and the remaining groups may not be represented by Formula 2; or two of $R_1$(s) in the number of a1, $R_2$(s) in the number of a2, and $R_3$(s) in the number of a3 may each independently be a group represented by Formula 2, and the remaining groups may not be represented by Formula 2.

In case that two of $R_1$(s) in the number of a1, $R_2$(s) in the number of a2, and $R_3$(s) in the number of a3 are each independently a group represented by Formula 2, the groups represented by Formula 2 may be identical to or different from each other.

In embodiments, the condensed cyclic compound represented by Formula 1 may satisfy one of Conditions i to iv:

[Condition i]

one of $R_1$(s) in the number of a1, $R_2$(s) in the number of a2, and $R_3$(s) in the number of a3 is a group represented by Formula 2, and the remaining groups are not represented by Formula 2;

[Condition ii]

one of $R_1$(s) in the number of a1 and one of $R_2$(s) in the number of a2 are each independently a group represented by Formula 2, and the remaining groups are not represented by Formula 2;

[Condition iii]

one of $R_1$(s) in the number of a1 and one of $R_3$(s) in the number of a3 are each independently a group represented by Formula 2, and the remaining groups are not represented by Formula 2; and

[Condition iv]

one of $R_2$(s) in the number of a2 and one of $R_3$(s) in the number of a3 are each independently a group represented by Formula 2, and the remaining groups are not represented by Formula 2.

Condition i may include, regarding $R_1$(s) in the number of a1, $R_2$(s) in the number of a2, and $R_3$(s) in the number of a3:

[Condition i-1]

one of $R_1$(s) in the number of a1 may be a group represented by Formula 2, and the remaining groups may not be represented by Formula 2;

[Condition i-2]

one of $R_2$(s) in the number of a2 may be a group represented by Formula 2, and the remaining groups may not be represented by Formula 2; or

[Condition i-3]

one of $R_3$(s) in the number of a3 may be a group represented by Formula 2, and the remaining groups may not be represented by Formula 2.

In Conditions ii to iv, the two groups represented by Formula 2 may be identical to or different from each other.

In embodiments, a1 to a3 may each independently be an integer from 1 to 5.

In an embodiment, $R_{1a}$, $R_{2a}$, and $R_4$ to $R_8$ may each independently be:

hydrogen, deuterium, —F, —Cl, —Br, —I, hydroxyl group, cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, an azafluorenyl group, an azacarbazolyl group, an azadibenzofuranyl group, an azadibenzothiophenyl group, or an azadibenzosilolyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof; or $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, and $Q_1$ to $Q_3$ and $Q_{31}$ to $Q_{33}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

In embodiments, in Formula 1, $R_{1a}$ and $R_{2a}$ may each independently be a phenyl group unsubstituted or substituted with deuterium, —F, $—CD_3$, $—CD_2H$, $—CDH_2$, $—CF_3$, $—CF_2H$, $—CFH_2$, a cyano group, a $C_1$-$C_{20}$ alkyl group, a phenyl group, or any combination thereof.

In embodiments, in Formula 2, $R_4$ to $R_8$ may each independently be:

hydrogen, deuterium, —F, or a cyano group;

a $C_1$-$C_{20}$ alkyl group or a $C_3$-$C_{10}$ cycloalkyl group, each unsubstituted or substituted with deuterium, —F, a cyano group, or any combination thereof; or a phenyl group, a naphthyl group, a dibenzofuranyl group, a dibenzothiophenyl group, or a carbazolyl group, each unsubstituted or substituted with deuterium, —F, $—CD_3$, $—CD_2H$, $—CDH_2$, $—CF_3$, $—CF_2H$, $—CFH_2$, a cyano group, a $C_1$-$C_{20}$ alkyl group, a phenyl group, or any combination thereof.

For example, in Formula 2, $R_4$ may be:

hydrogen, deuterium, —F, or a cyano group;

a $C_1$-$C_{20}$ alkyl group unsubstituted or substituted with deuterium, —F, a cyano group, or any combination thereof; or a phenyl group unsubstituted or substituted with deuterium, —F, $—CD_3$, $—CD_2H$, $—CDH_2$, $—CF_3$, $—CF_2H$, $—CFH_2$, a cyano group, a $C_1$-$C_{20}$ alkyl group, a phenyl group, or any combination thereof.

For example, in Formula 2, each of $R_5$ to $R_8$ may be hydrogen.

In an embodiment, a5 to a8 may each independently be an integer from 1 to 5.

In an embodiment, any group represented by Formula 2 may be a group represented by one of Formulae 2-1 to 2-8:

2-1

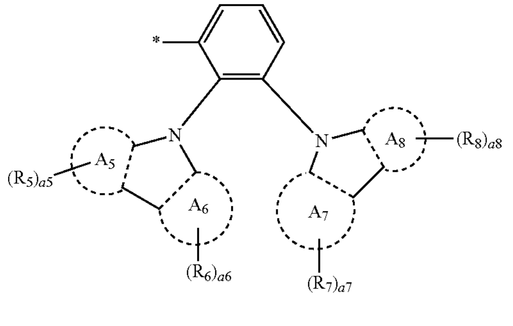

-continued 2-2

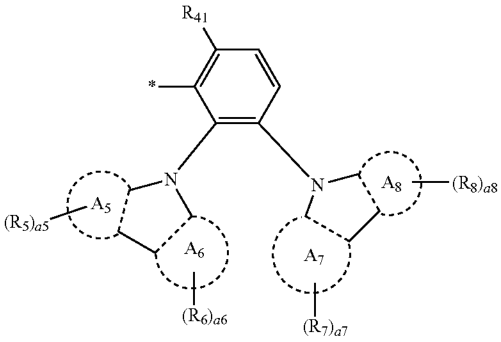

2-3

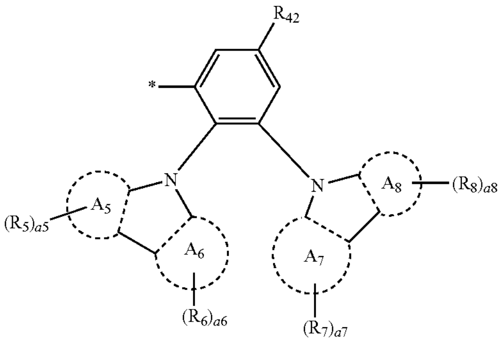

2-4

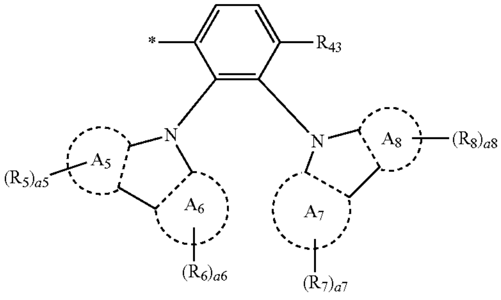

2-5

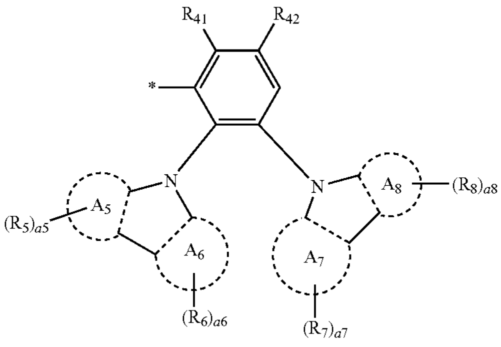

-continued 2-6

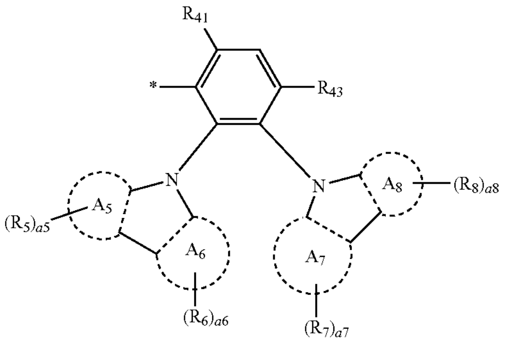

2-7

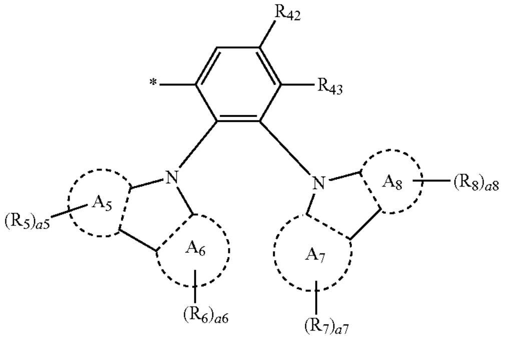

2-8

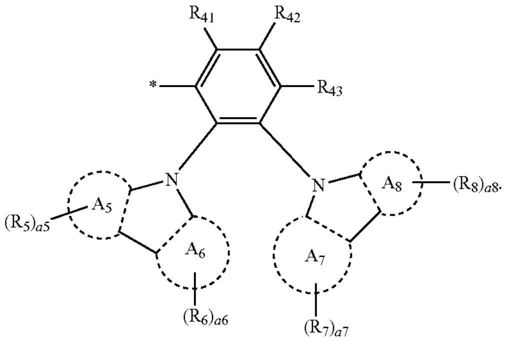

In Formulae 2-1 to 2-8, ring $A_5$ to $A_8$, $R_5$ to $R_8$, and a5 to a8 may each be the same as defined herein, $R_{41}$ to $R_{43}$ may each independently be the same as defined in connection with $R_4$ in Formula 2, except that each of $R_{41}$ to $R_{43}$ may not be hydrogen, and

* indicates a binding site to a neighboring atom.

In embodiments, any group represented by Formula 2 may be a group represented by Formula 2(1):

2(1)

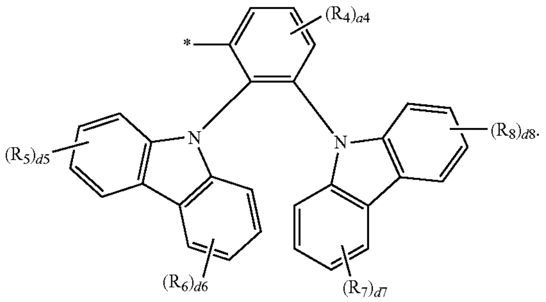

In Formula 2(1), $R_4$ to $R_8$ and a4 may each be the same as defined herein, and d5 to d8 may each independently be an integer from 0 to 4.

In an embodiment, the condensed cyclic compound may satisfy at least one of Condition a to Condition c:

[Condition a]

a group represented by

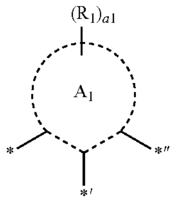

in Formula 1 is a group represented by Formula A1:

A1

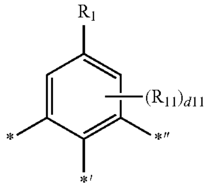

wherein in Formula A1, $R_1$ is the same as defined herein, $R_{11}$ is the same as defined in connection with $R_1$ in Formula 1, except that $R_{11}$ is not a group represented by Formula 2, d11 is 0, 1, or 2,

* indicates a binding site to $X_1$ in Formula 1,

*' indicates a binding site to $T_1$ in Formula 1, and

*" indicates a binding site to $X_2$ in Formula 1;

[Condition b]

a group represented by

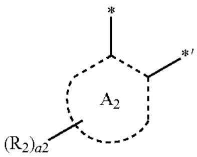

in Formula 1 is a group represented by Formula A2-1 or Formula A2-2:

A2-1

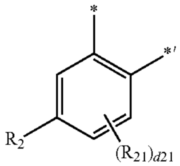

A2-2

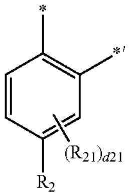

wherein in Formulae A2-1 and A2-2, $R_2$ is the same as defined herein, $R_{21}$ is the same as defined in connection with $R_2$ in Formula 1, except that $R_{21}$ is not a group represented by Formula 2, d21 is 0, 1, 2, or 3,

* indicates a binding site to $X_1$ in Formula 1, and

*' indicates a binding site to $T_1$ in Formula 1; and

[Condition c]

a group represented by

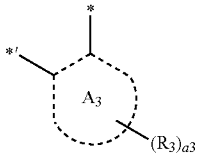

in Formula 1 is a group represented by Formula A3-1 or Formula A3-2:

A3-1

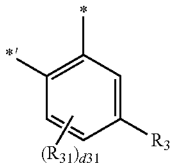

A3-2

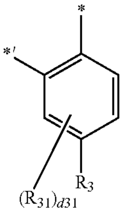

wherein in Formulae A3-1 and A3-2, $R_3$ is the same as defined herein, $R_{31}$ is the same as defined in connection with $R_3$ in Formula 1, except that $R_{31}$ is not a group represented by Formula 2, d31 is 0, 1, 2, or 3,

* indicates a binding site to $X_2$ in Formula 1, and

*' indicates a binding site to $T_1$ in Formula 1.

For example, the condensed cyclic compound represented by Formula 1 may satisfy all of Conditions a to c.

In an embodiment, the condensed cyclic compound may be represented by Formula 1-1:

1-1

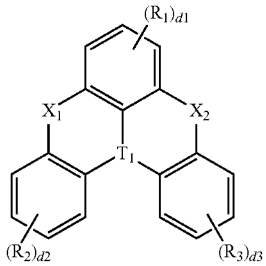

In Formula 1-1, $T_1$, $X_1$, $X_2$, $R_1$, $R_2$, and $R_3$ may each be the same as defined herein, d1 may be an integer from 0 to 3, and d2 and d3 may each independently be an integer from 0 to 4.

In embodiments, the condensed cyclic compound may be represented by one of Formulae 1(1) to 1(13):

1(1)

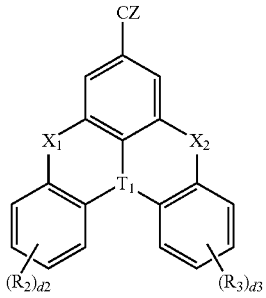

1(2)

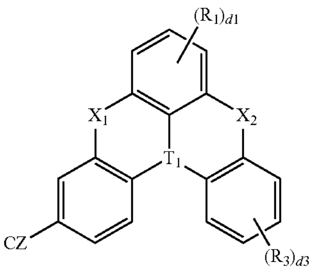

1(3)

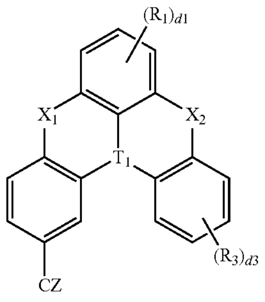

-continued

1(4)

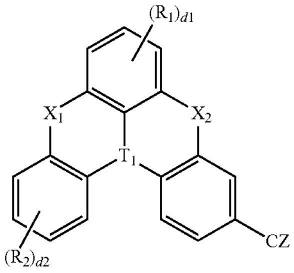

1(5)

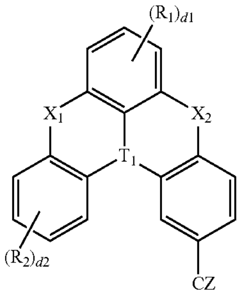

1(6)

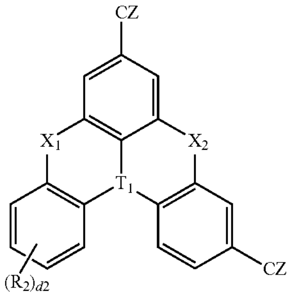

1(7)

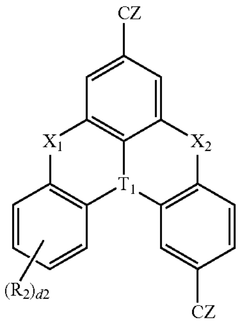

1(8)

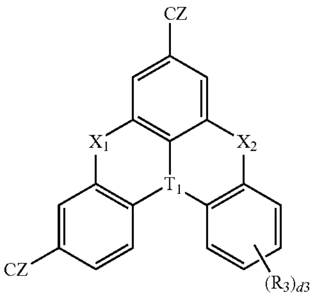

-continued

1(9)

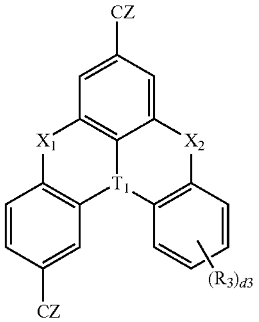

1(10)

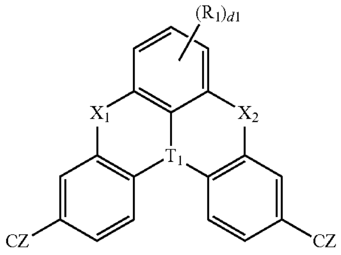

1(11)

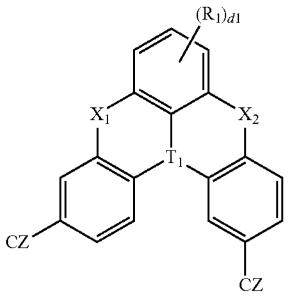

1(12)

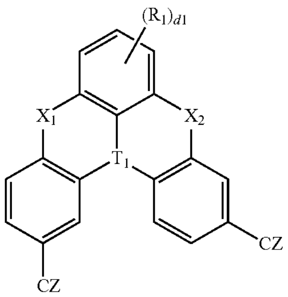

-continued

1(13)

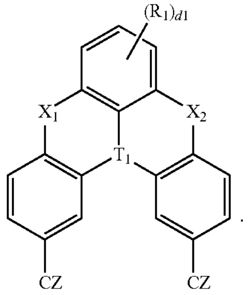

In Formulae 1(1) to 1(13), $T_1$, $X_1$, $X_2$, $R_1$, $R_2$, and $R_3$ may each be the same as defined herein, CZ may be a group represented by Formula 2, d1 may be an integer from 0 to 3, and d2 and d3 may each independently be an integer from 0 to 4.

For example, in Formulae 1(1) to 1(13), $R_1$ to $R_3$ may not be a group represented by Formula 2.

For example, CZ in Formulae 1(1) to 1(13) may each independently be a group represented by one of Formulae 2-1 to 2-8.

For example, in Formulae 1(1) to 1(13), CZ may each be a group represented by Formulae 2(1).

For example, the condensed cyclic compound may be represented by one of Formulae 1(1), 1(2), 1(4), 1(6), 1(8), and 1(10).

In an embodiment, the condensed cyclic compound may have a $\Delta E_{ST}$ equal to or less than about 0.44 eV. The condensed cyclic compound may satisfy Equation 1:

$$\Delta E_{ST} = S1 - T1 \leq 0.44 \text{ eV} \quad \text{[Equation 1]}$$

In Equation 1, S1 is a lowest excitation singlet energy level (eV) of the condensed cyclic compound, and T1 is a lowest excitation triplet energy level (eV) of the condensed cyclic compound.

In an embodiment, the condensed cyclic compound may have a $\Delta E_{ST}$ equal to or less than 0.437 eV. For example, the condensed cyclic compound may have a $\Delta E_{ST}$ equal to or less than 0.435 eV.

In an embodiment, the condensed cyclic compound may have an f value (representing oscillator strength) equal to or greater than about 0.20.

In an embodiment, the condensed cyclic compound represented by Formula 1 may be one of Compounds 1 to 80, but embodiments are not limited thereto:

1
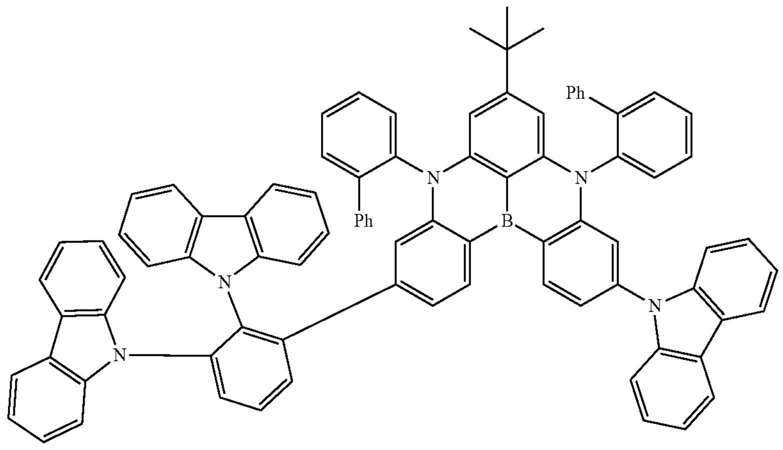
2
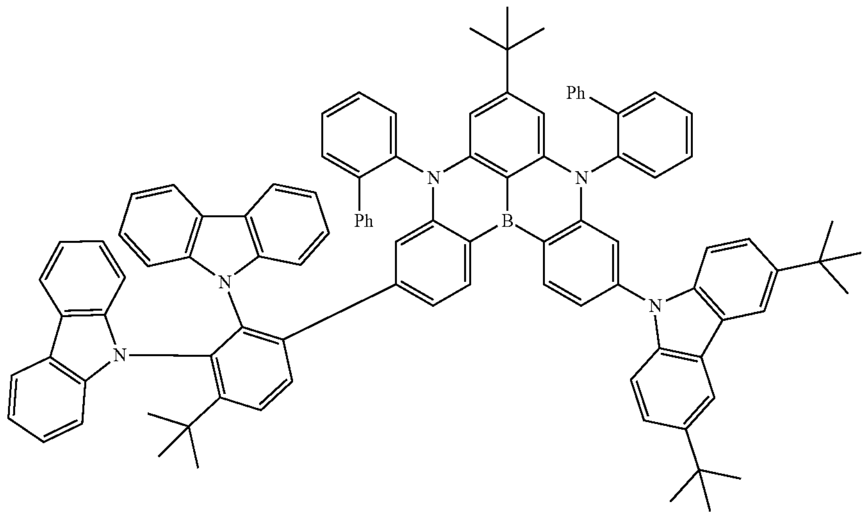
3
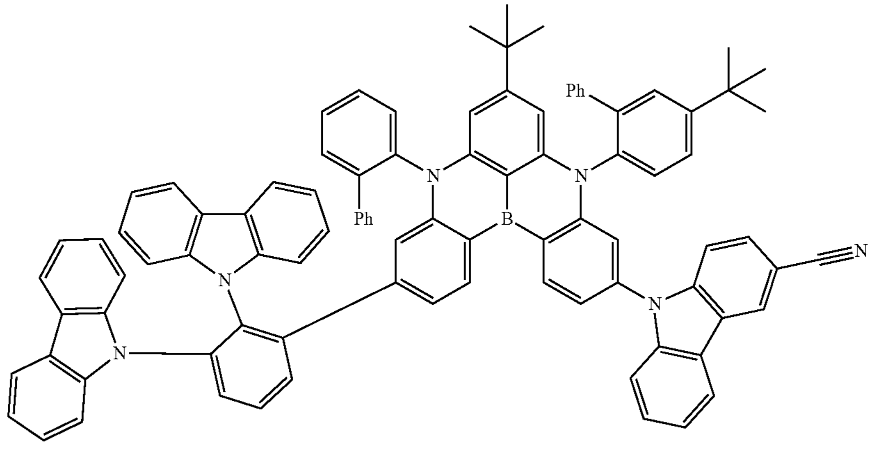

-continued
4
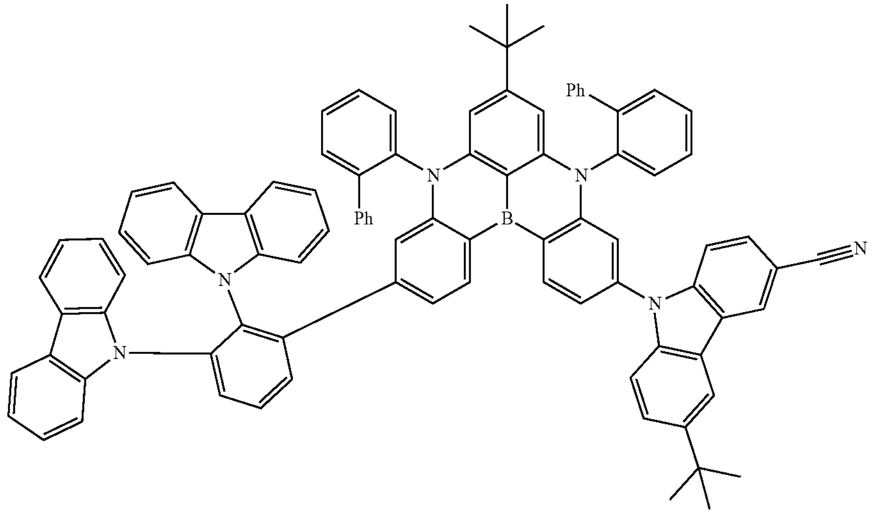
5
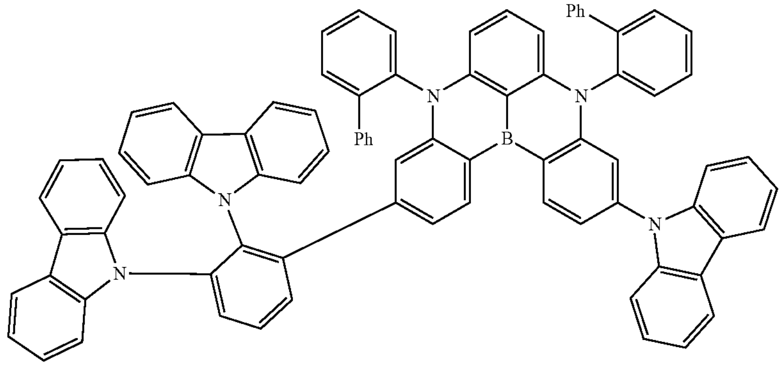
6
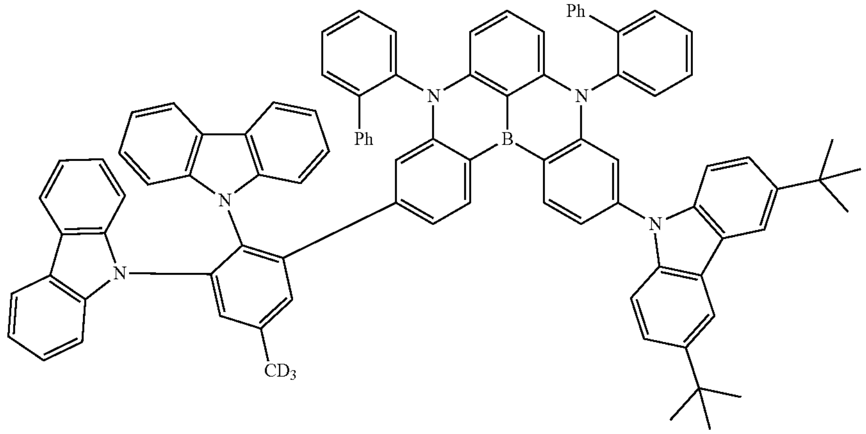

-continued
7
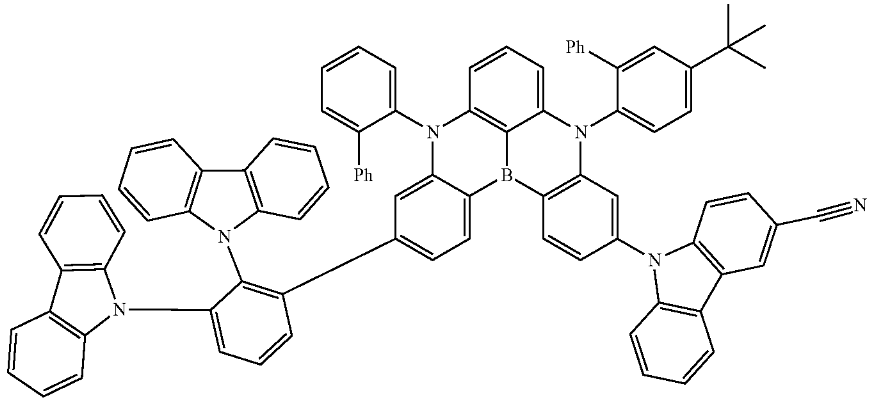
8
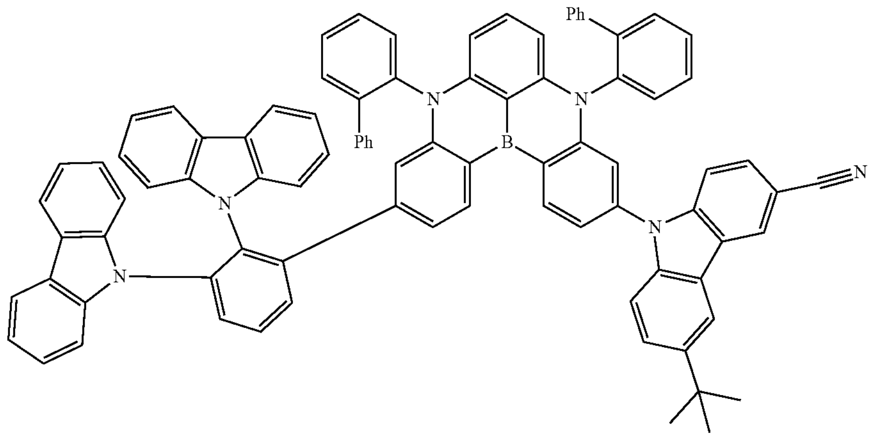
9
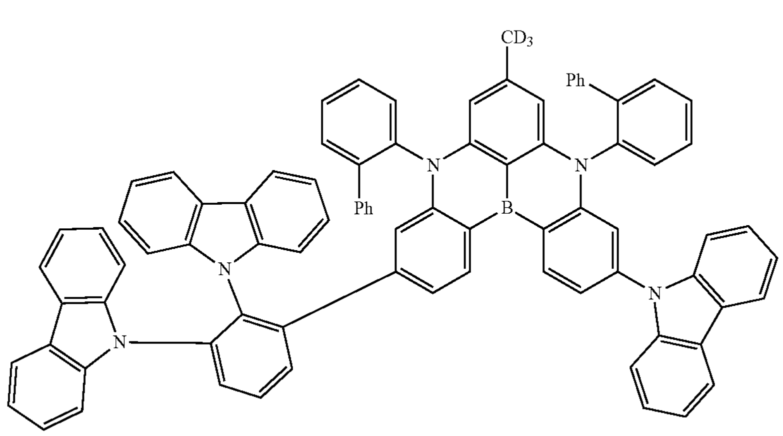

-continued
10
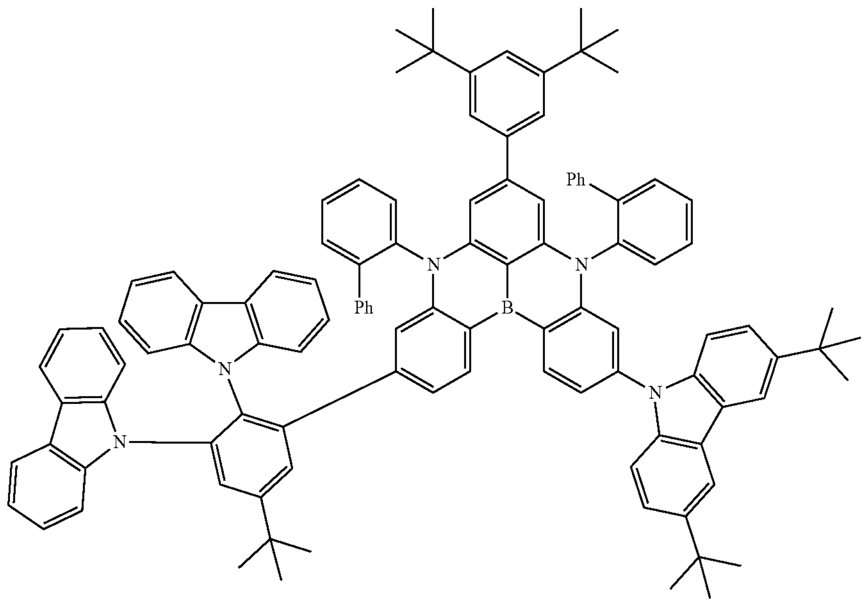
11
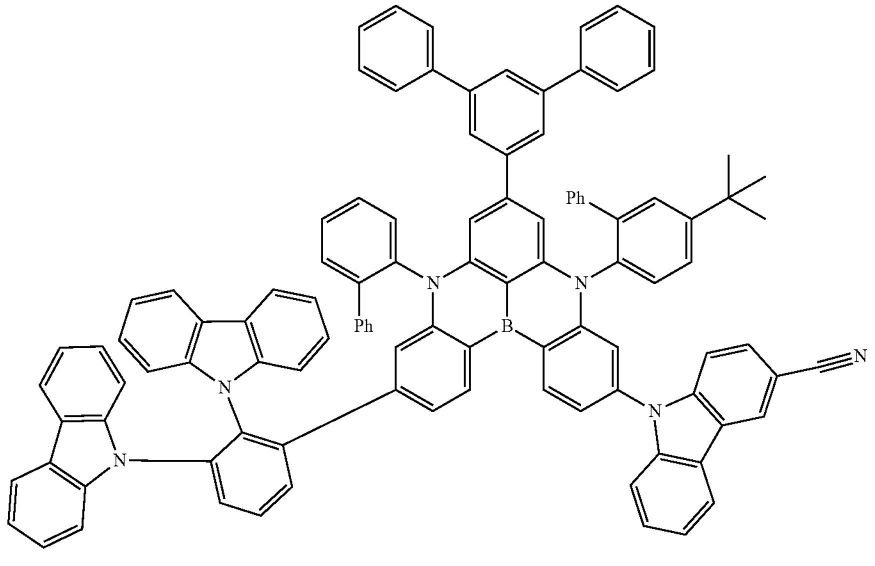

-continued
12
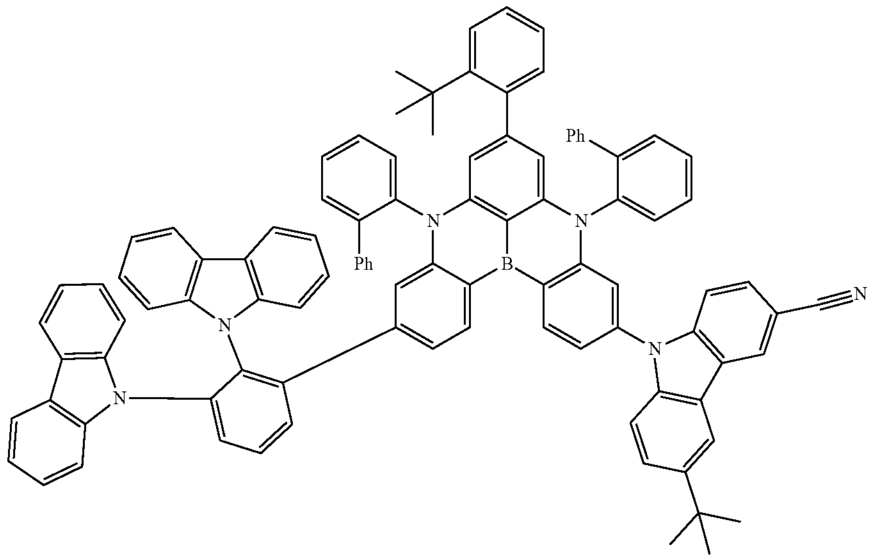
13
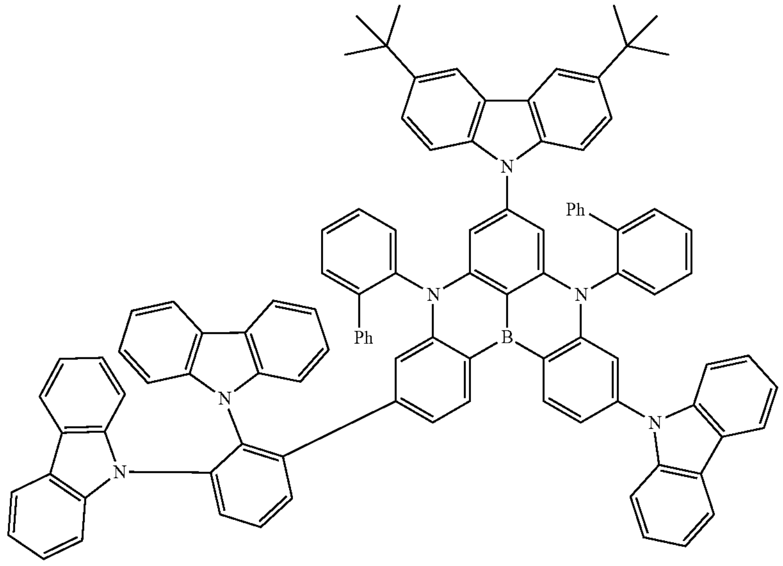

-continued
14
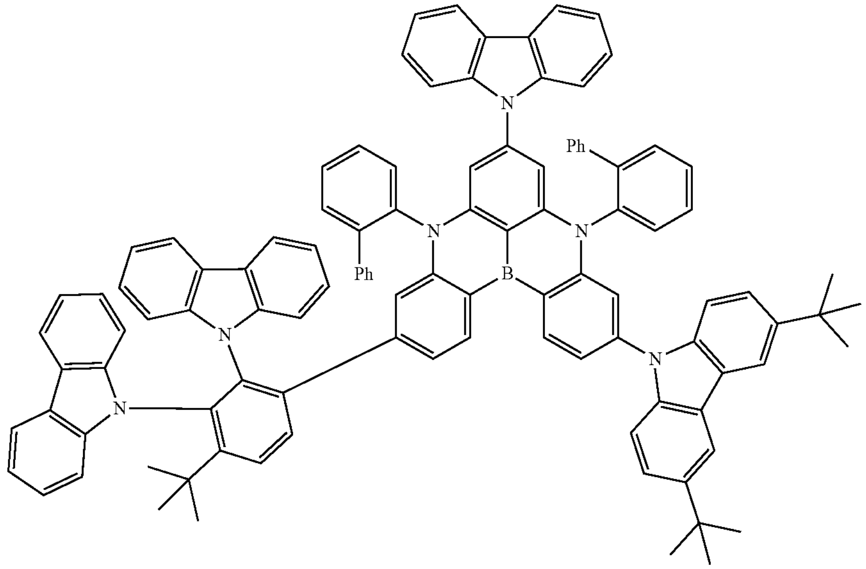
15
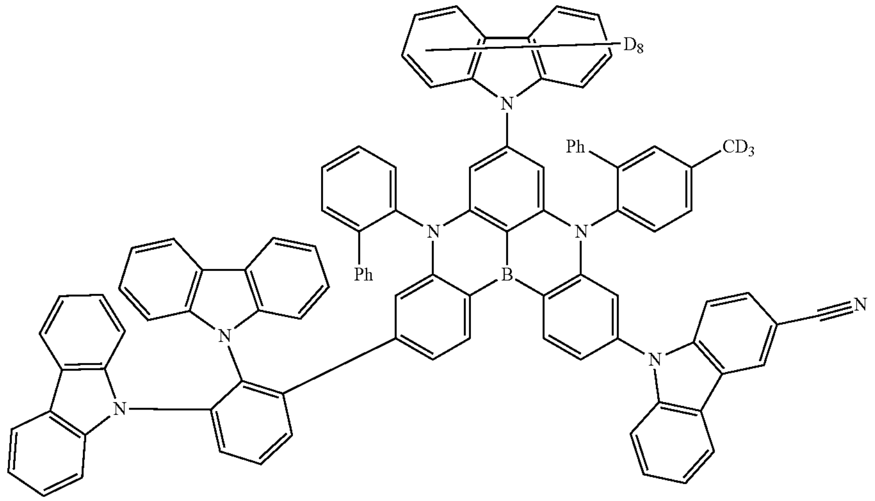
16
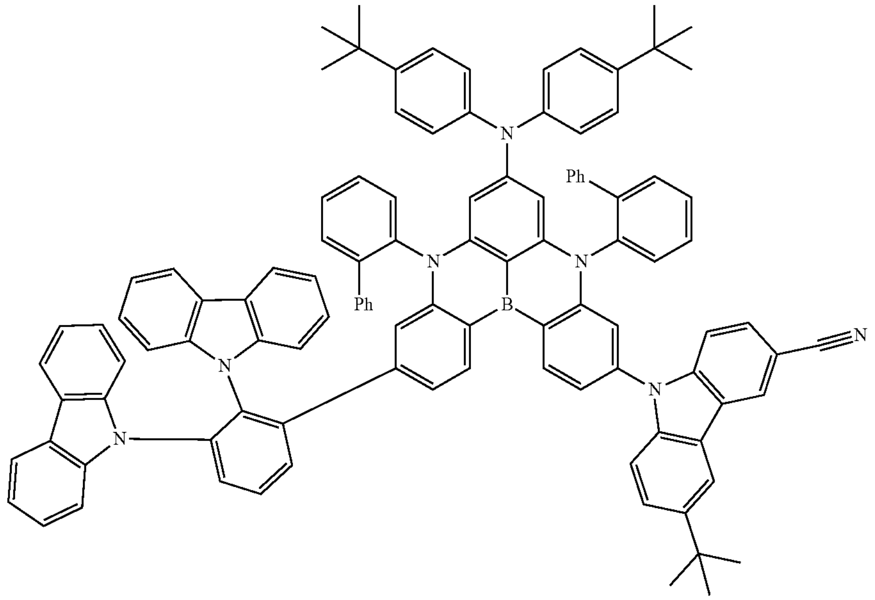

-continued
17
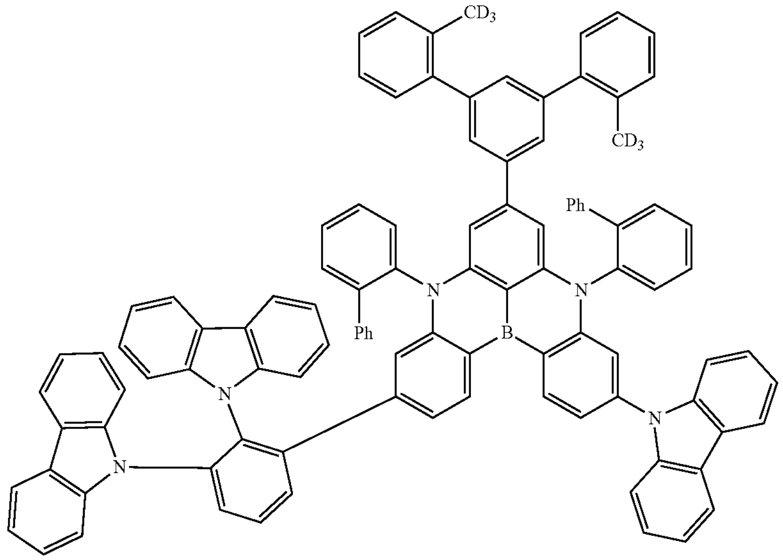
18
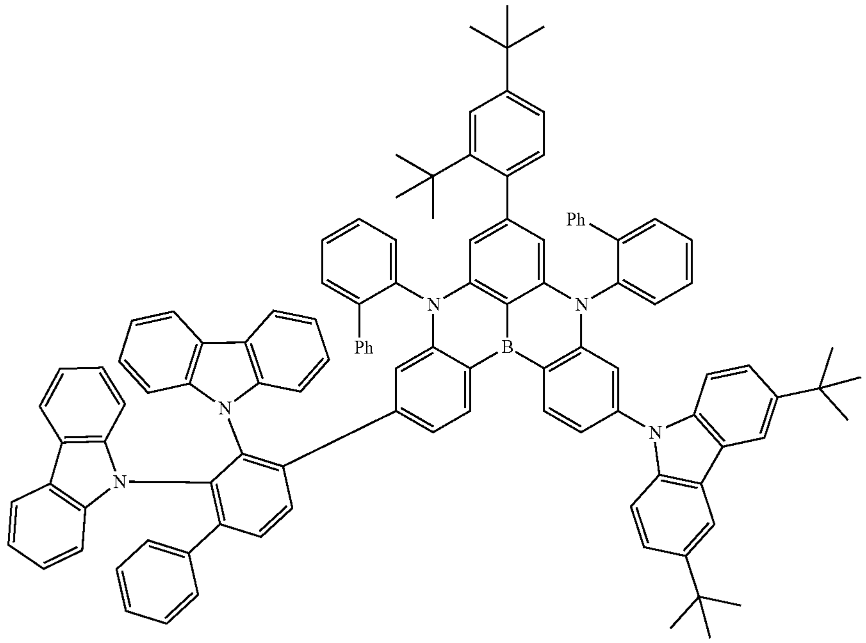
19
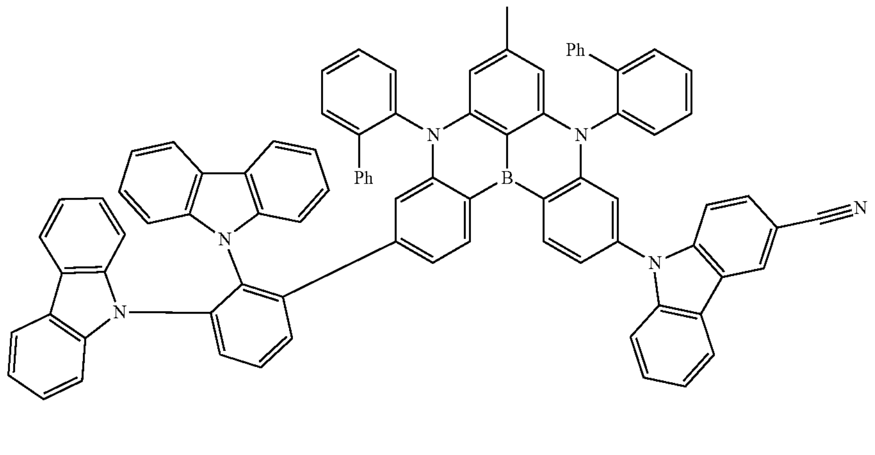

-continued
20
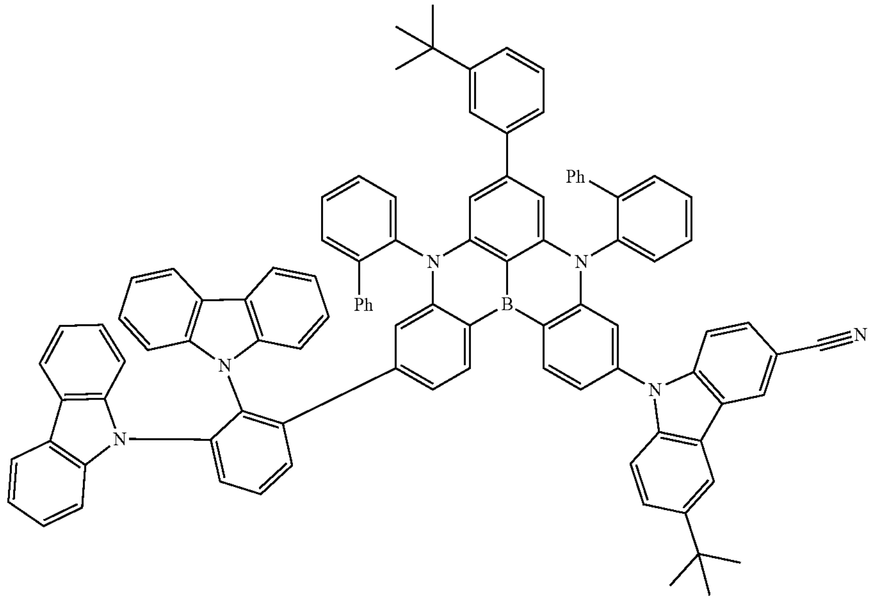
21
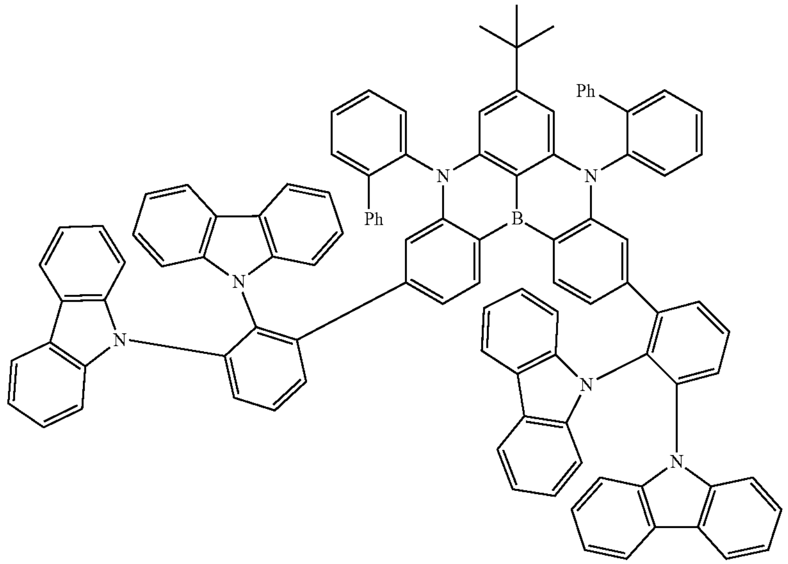
22
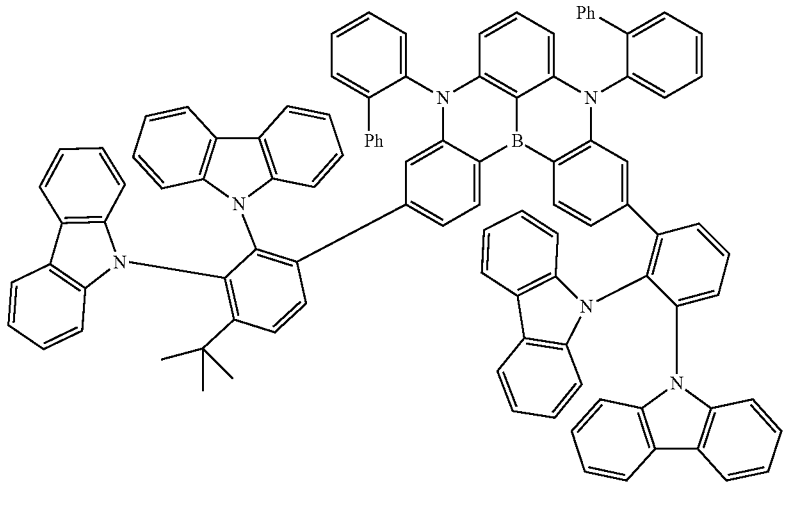

-continued
23
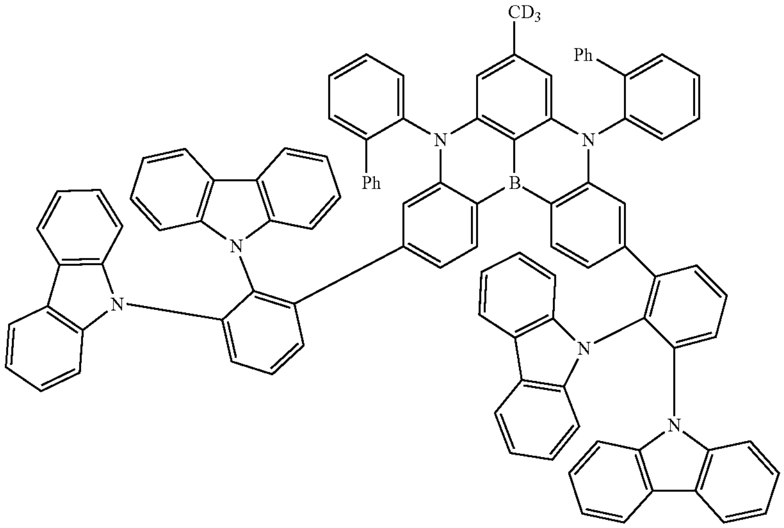
24
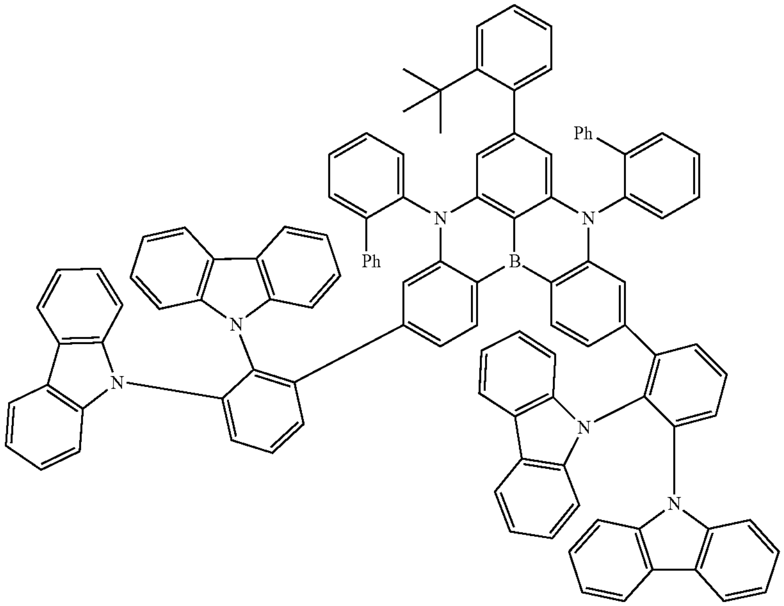

-continued
25
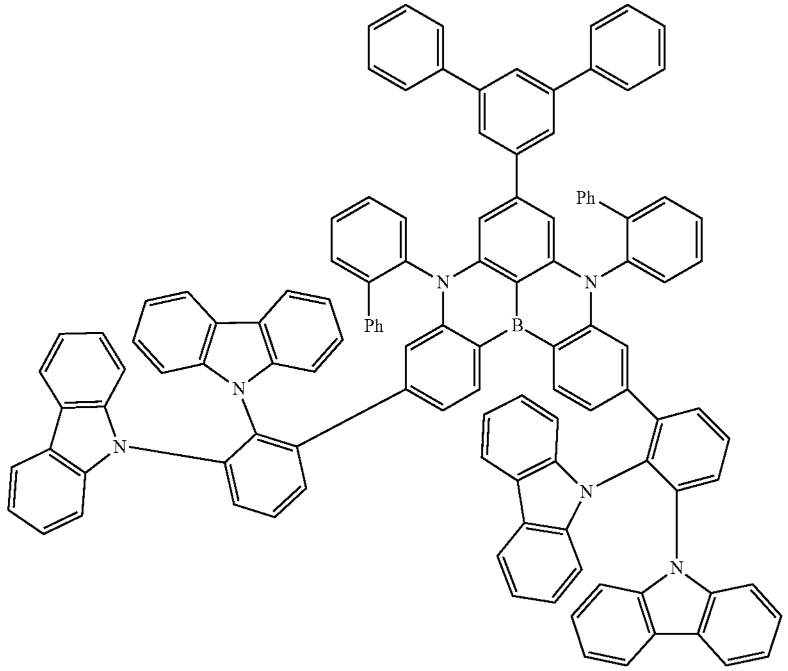
26
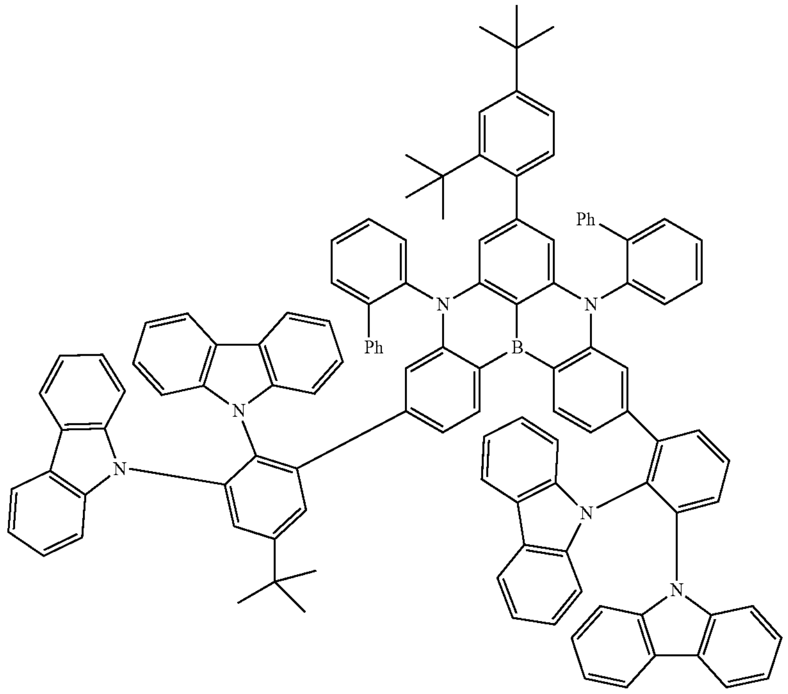

-continued
27
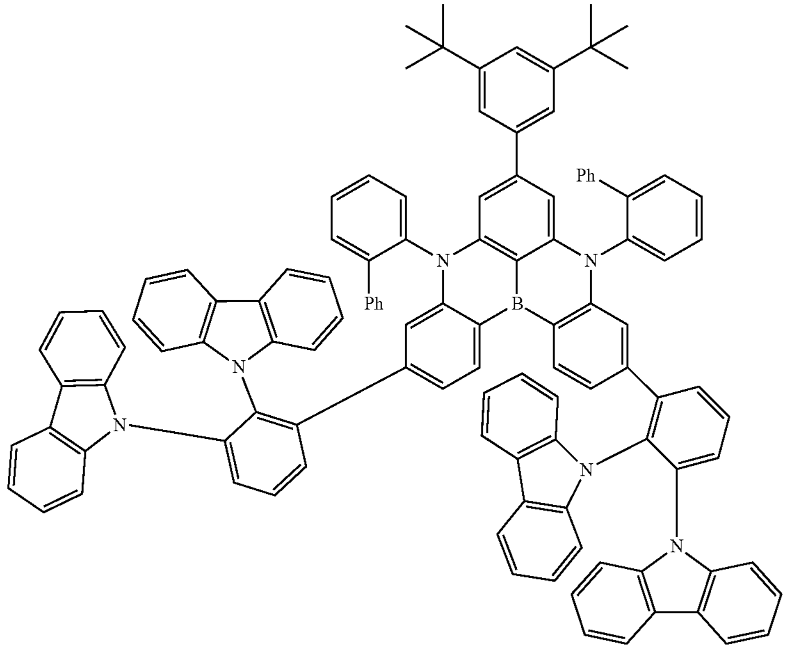
28
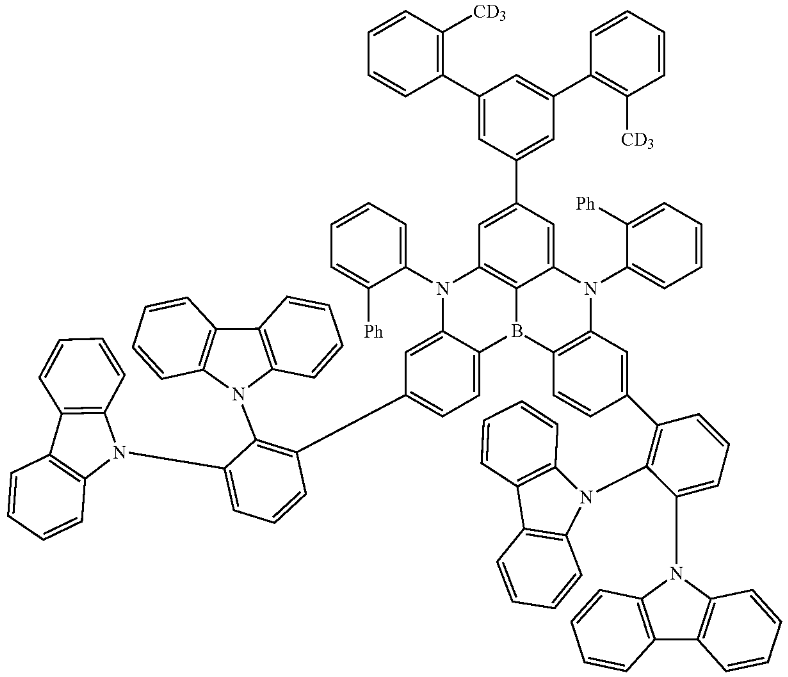

-continued
29
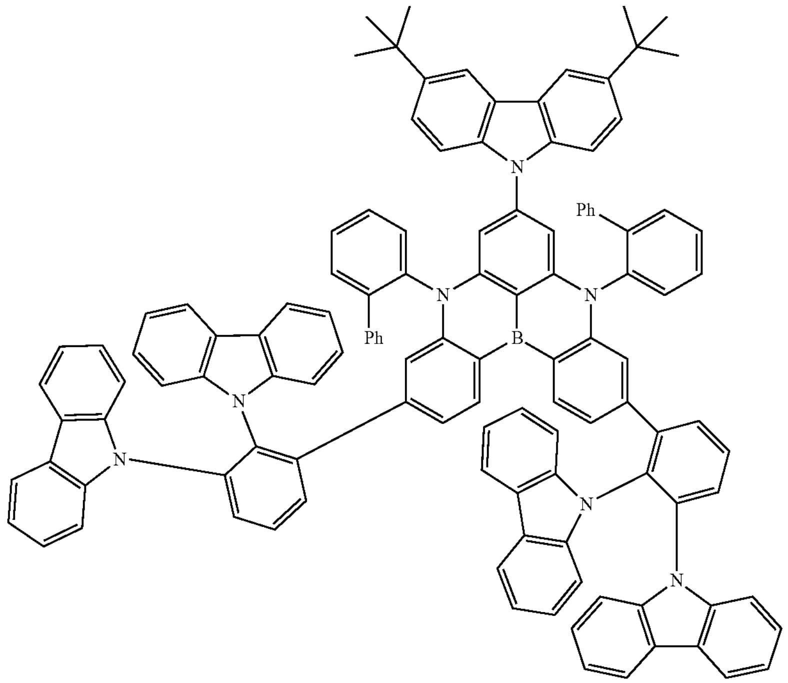
30
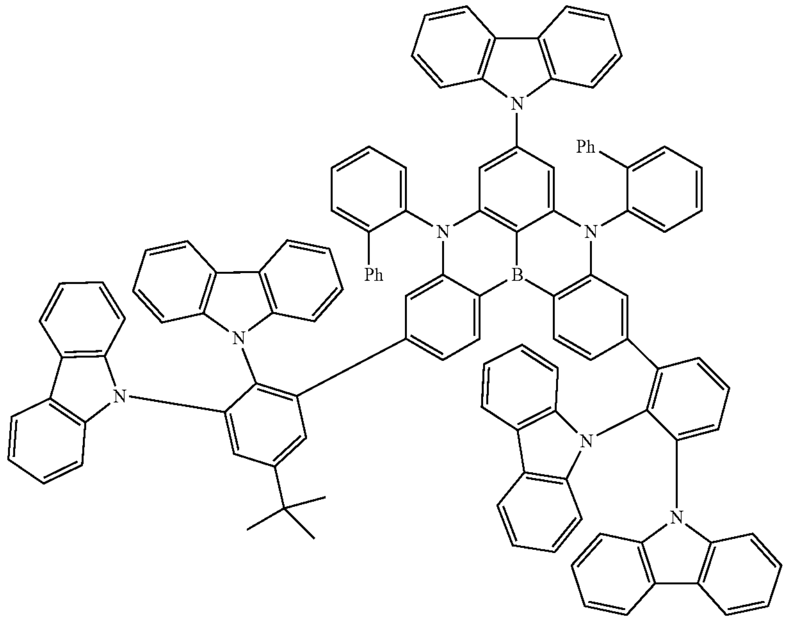

-continued
31
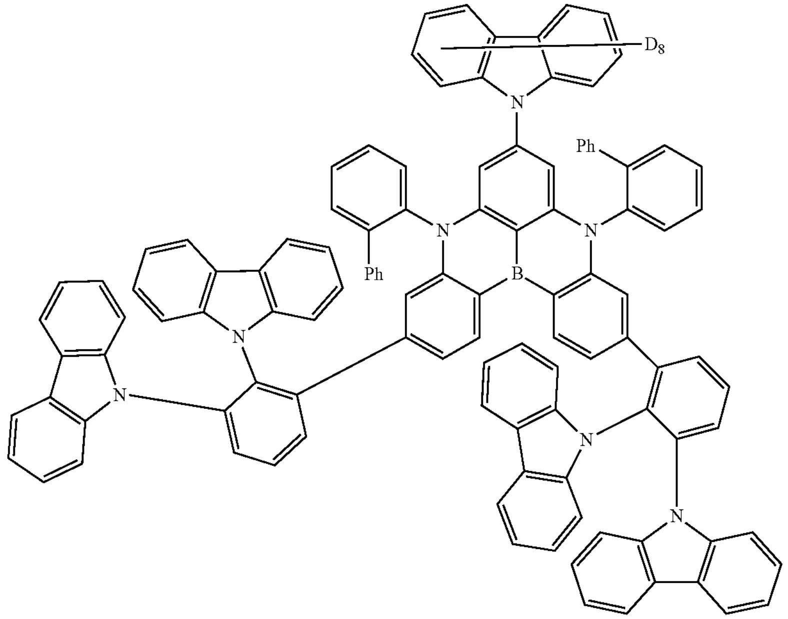
32
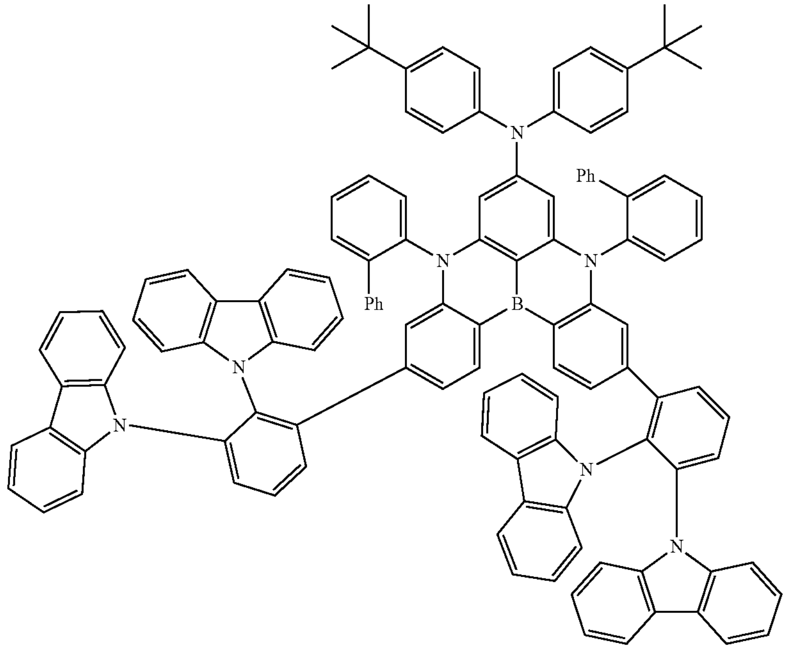

-continued
33
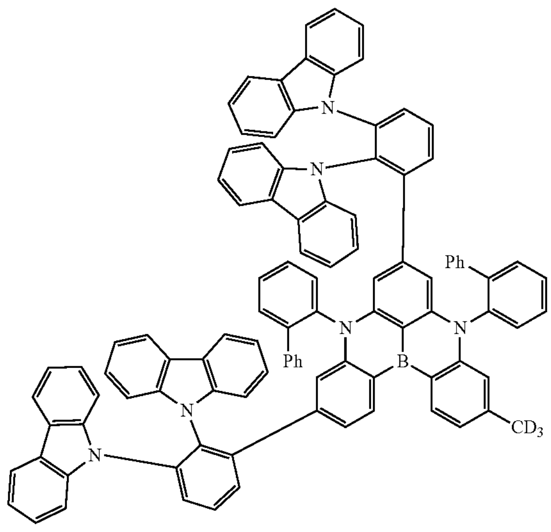
34
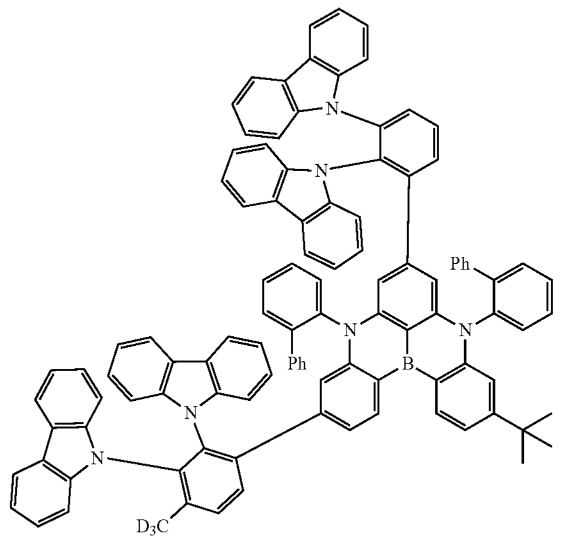
35
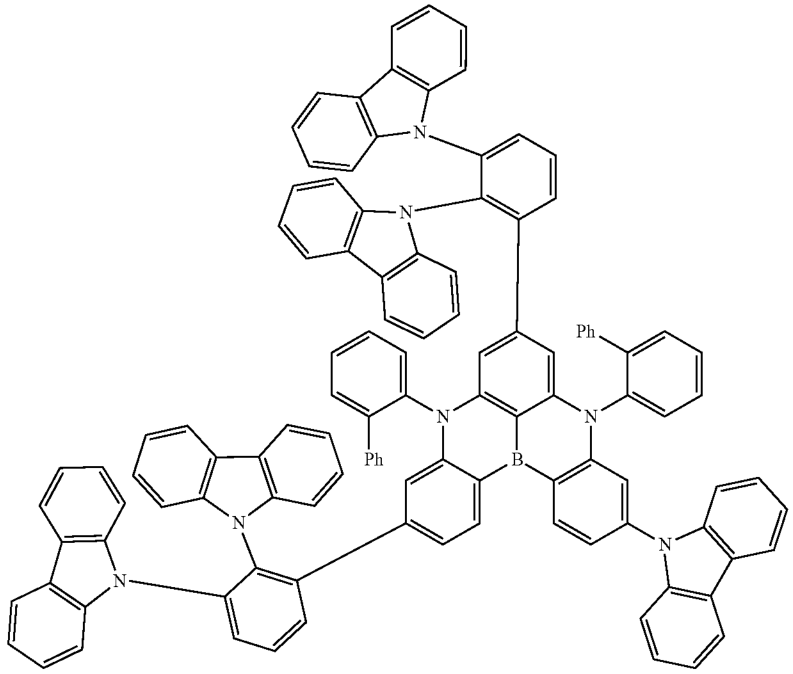

-continued
36
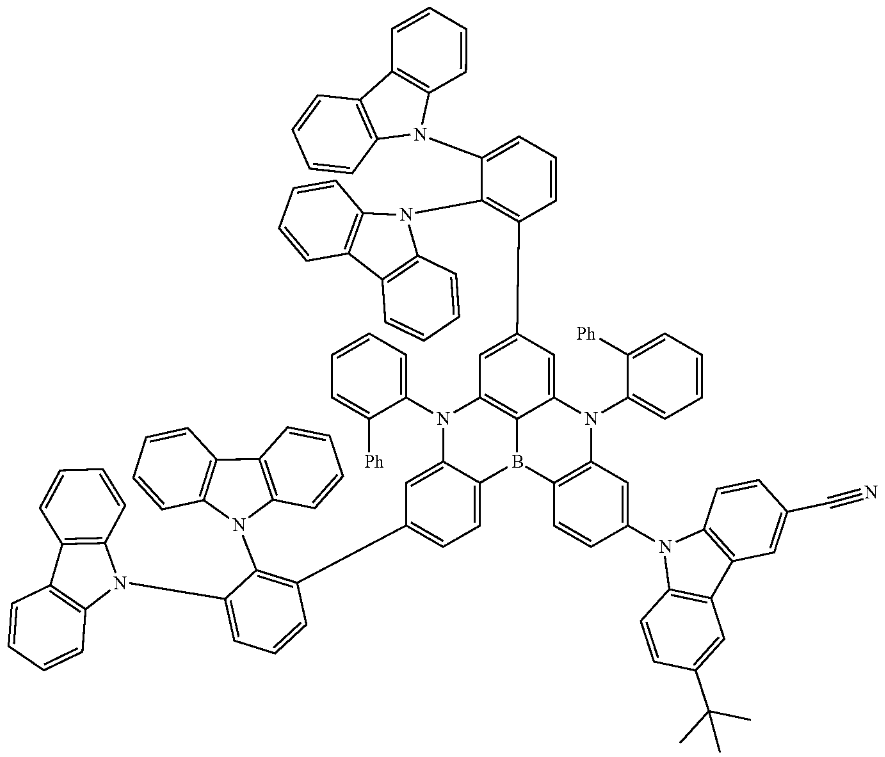
37
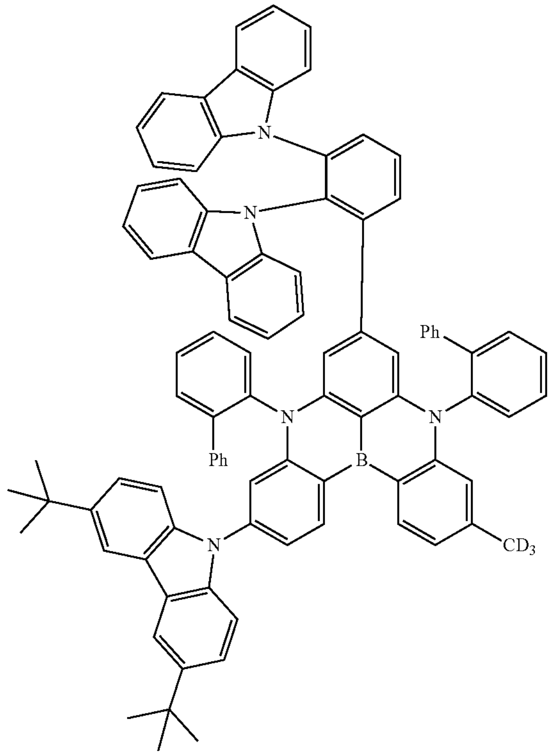
38
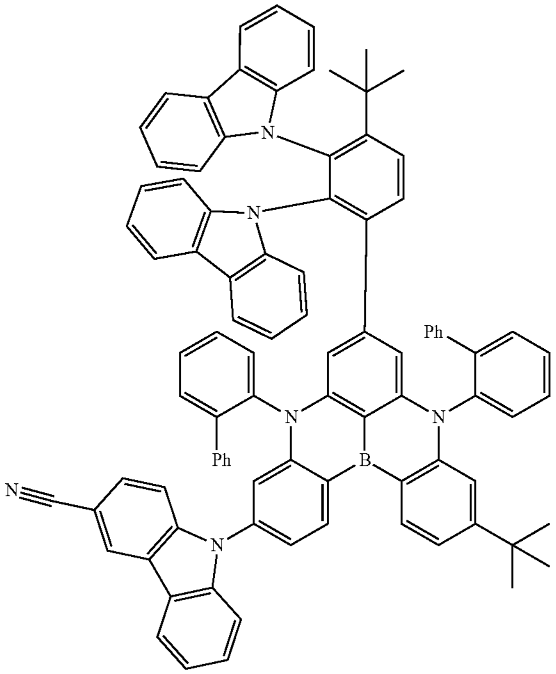

-continued
39
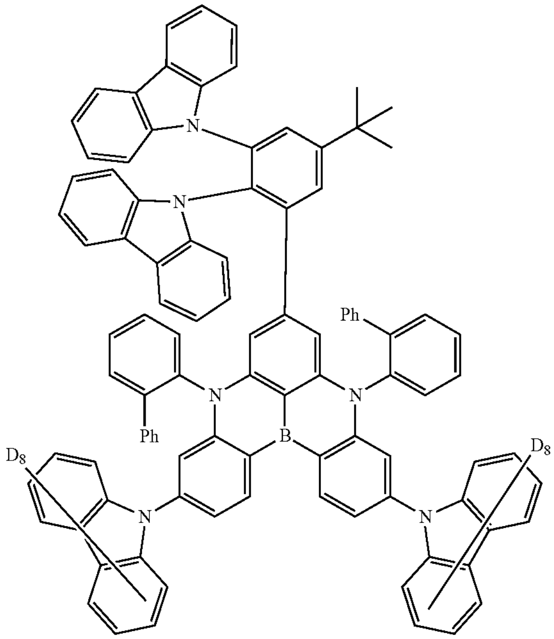
40
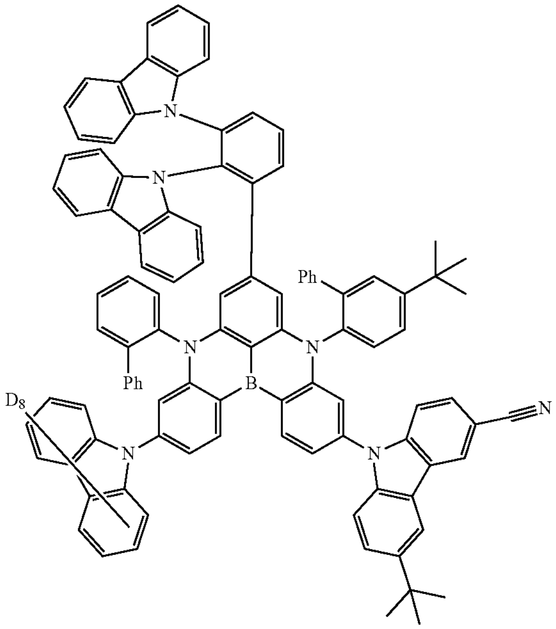
41
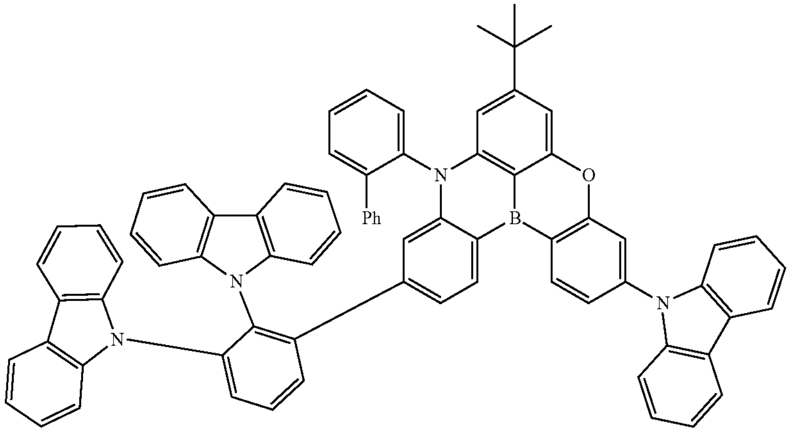
42
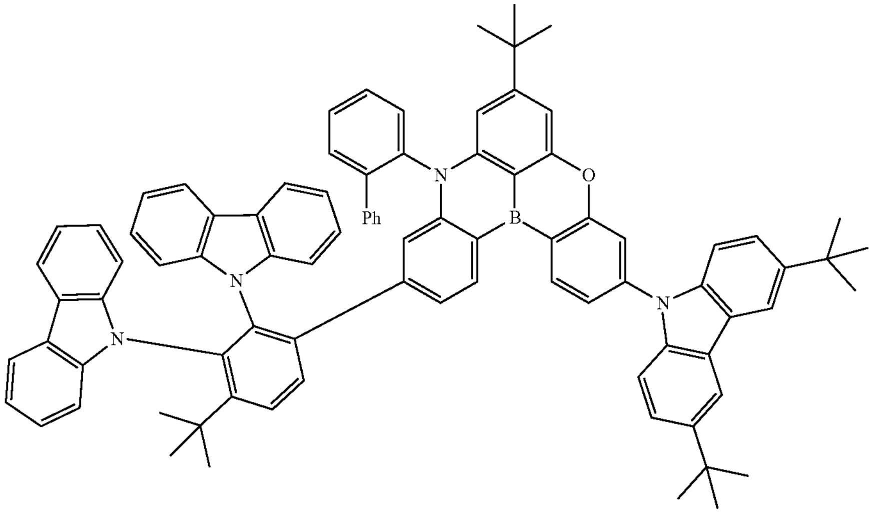

-continued
43
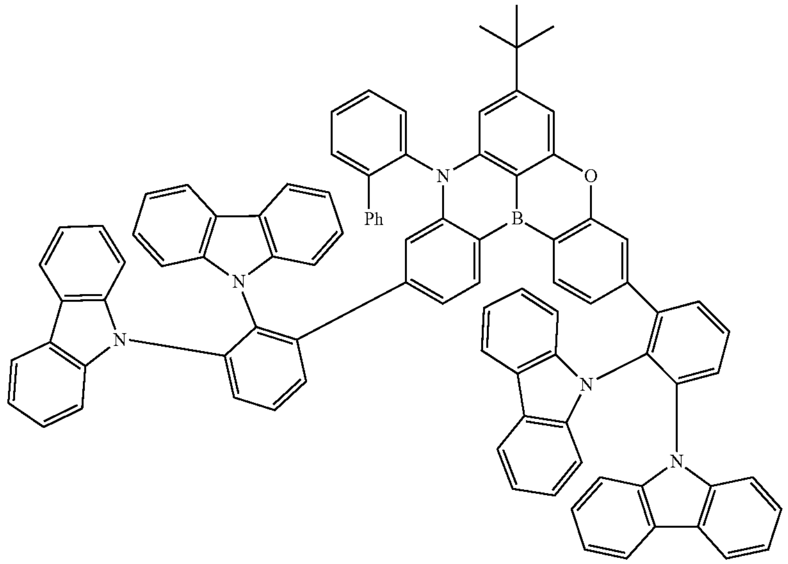
44
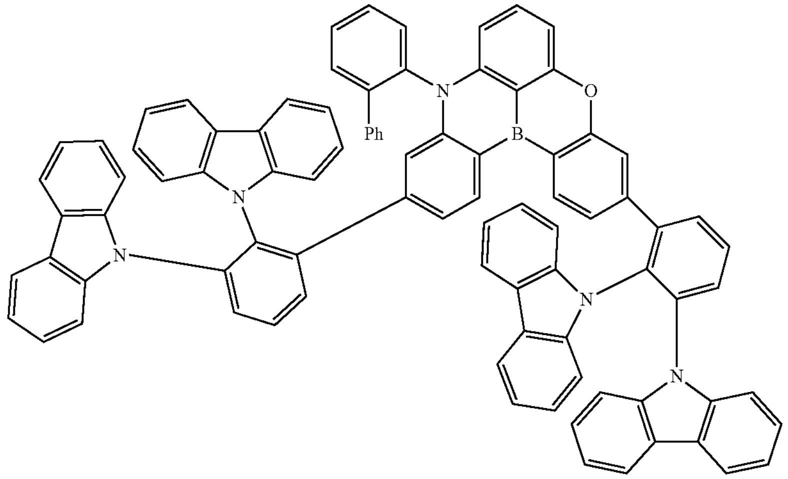
45
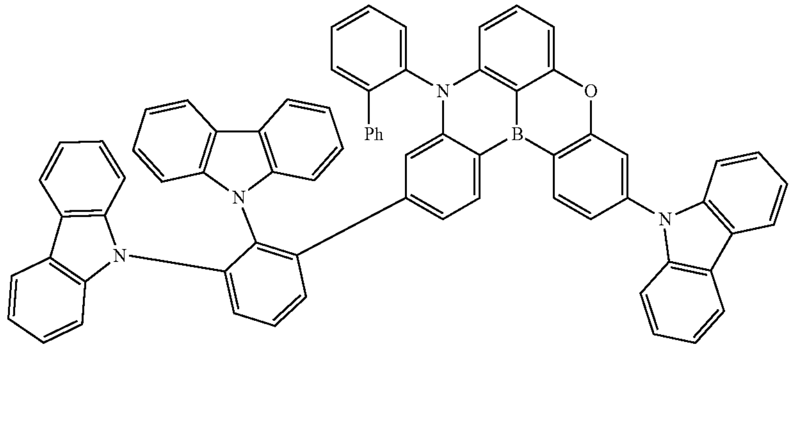

-continued
46
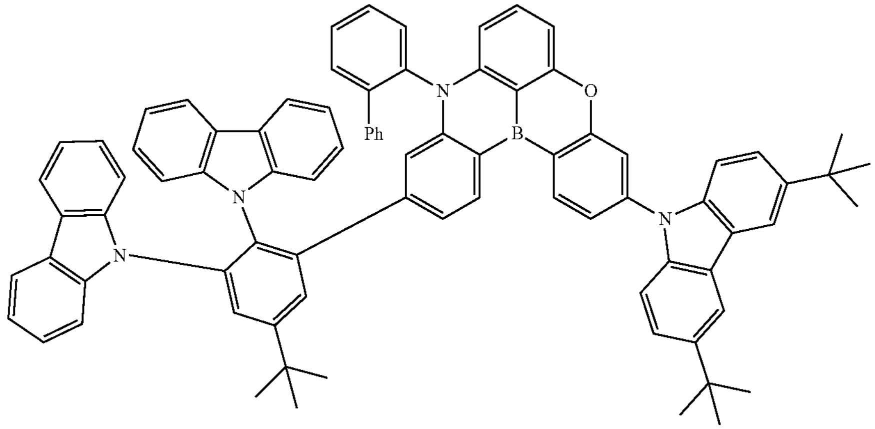
47
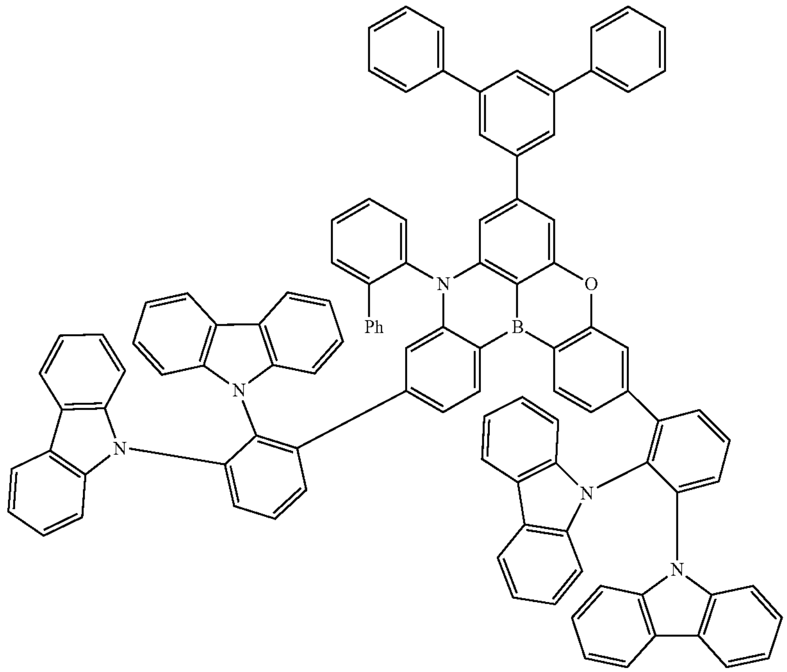

-continued
48
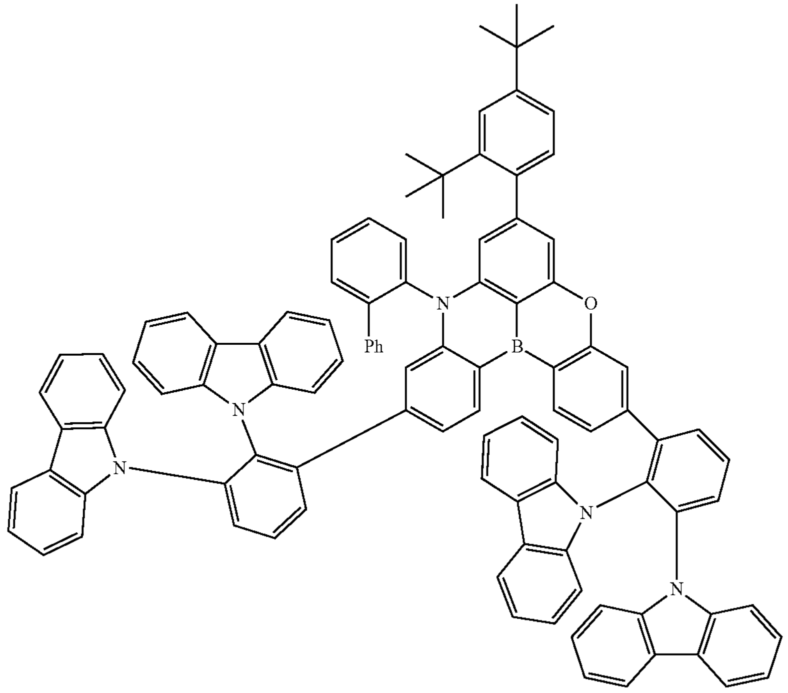
49
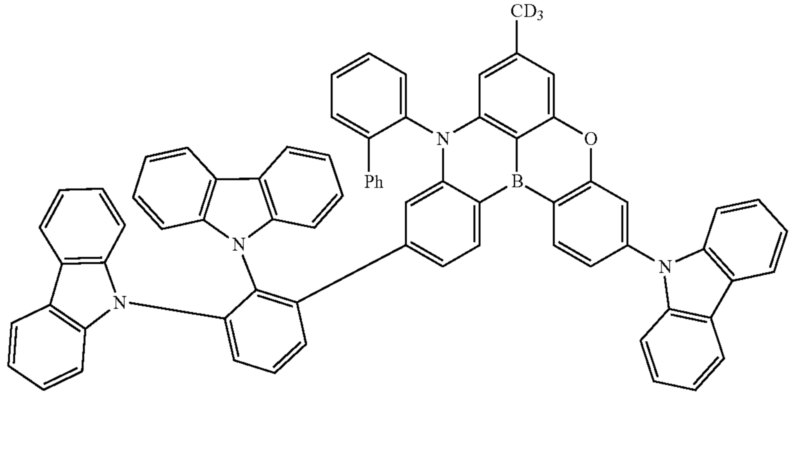

-continued
50
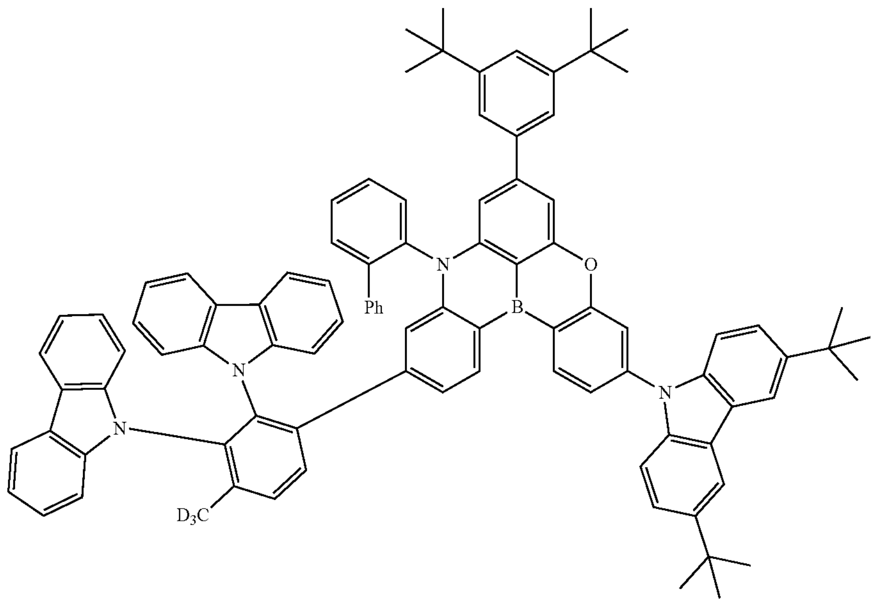
51
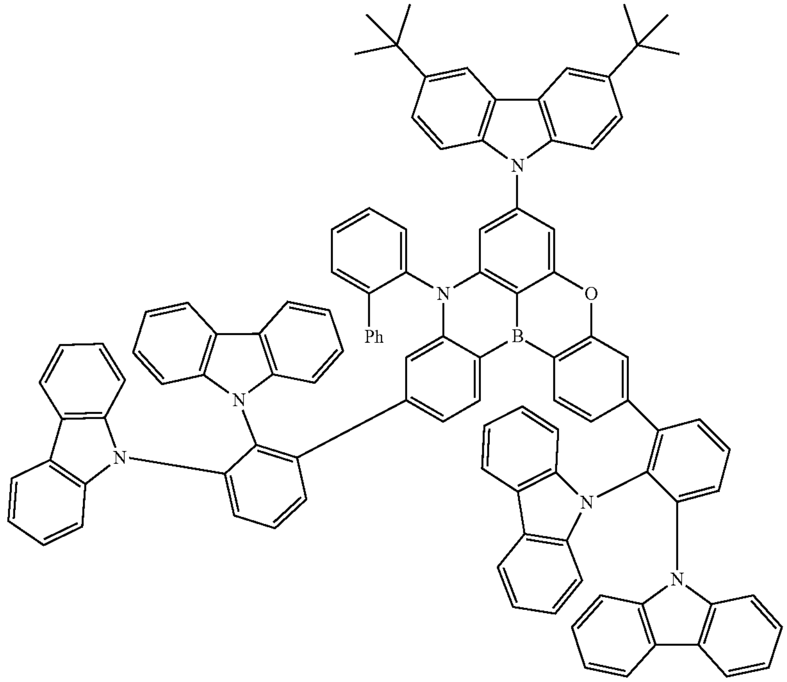

-continued
52
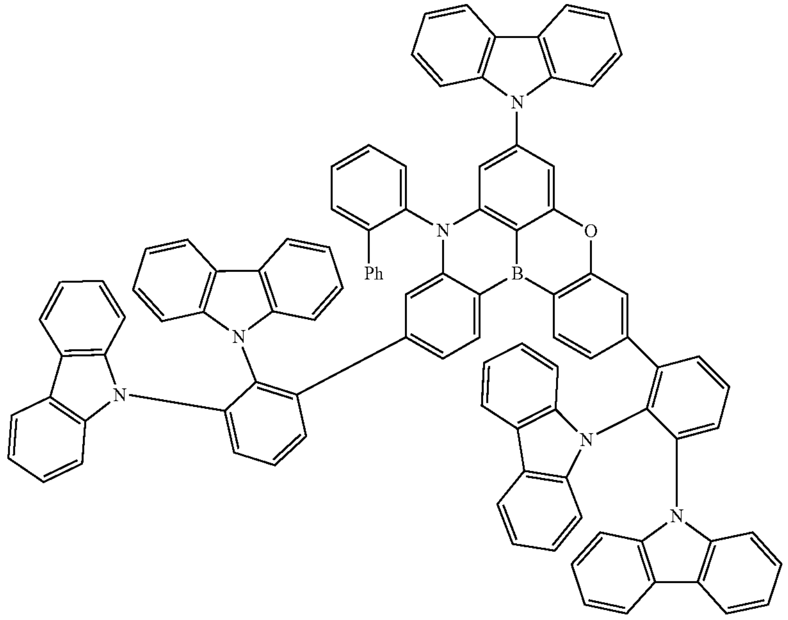
53
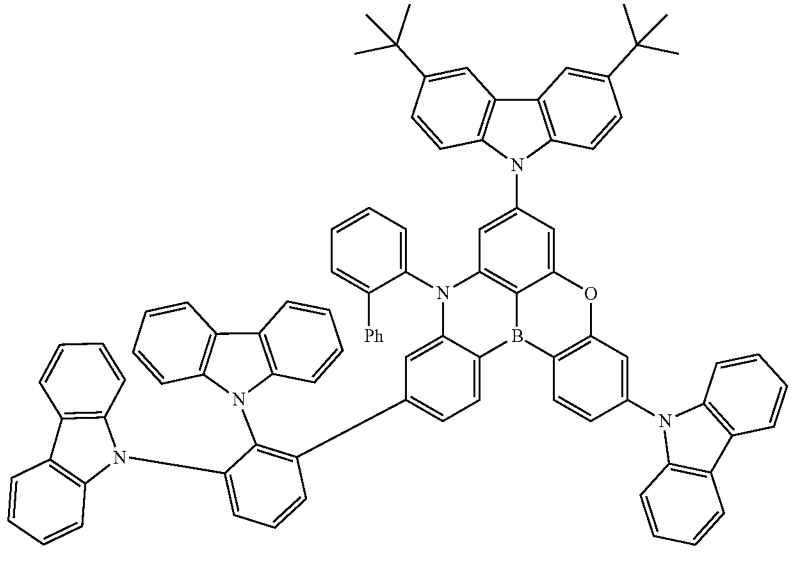

-continued
54
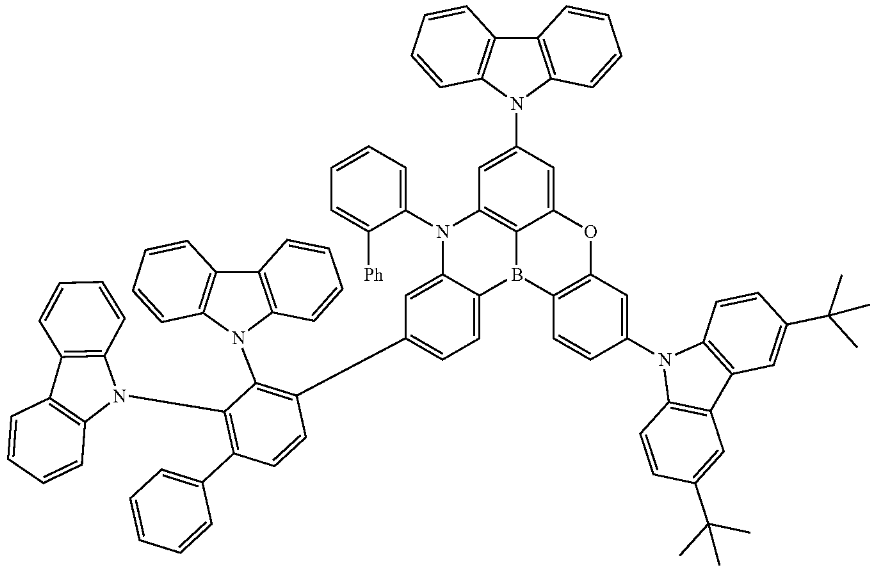
55
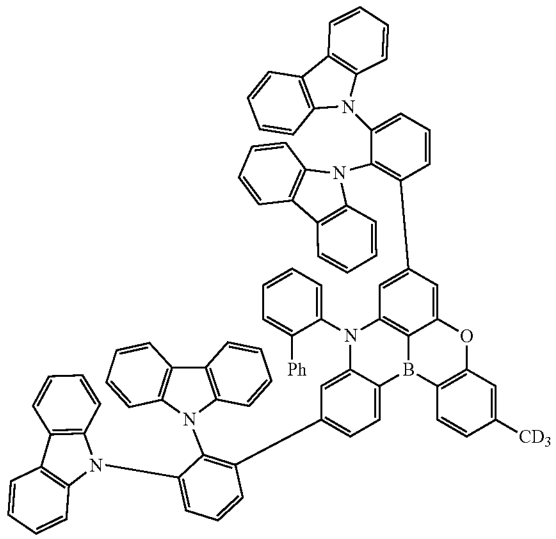
56
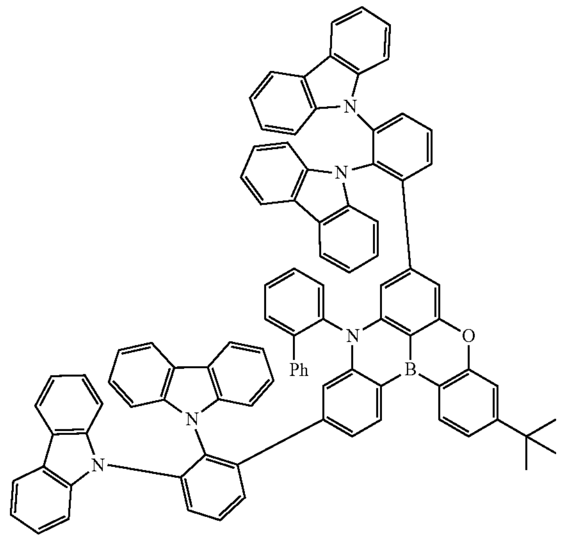
57
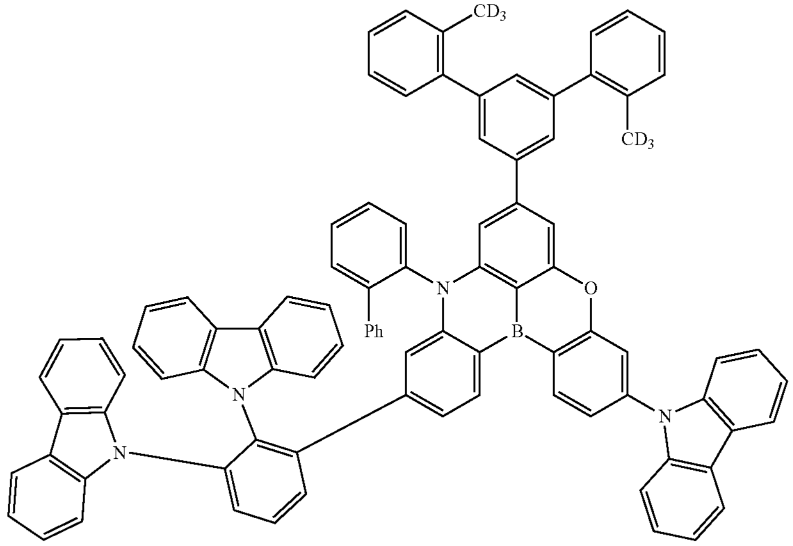

-continued
58
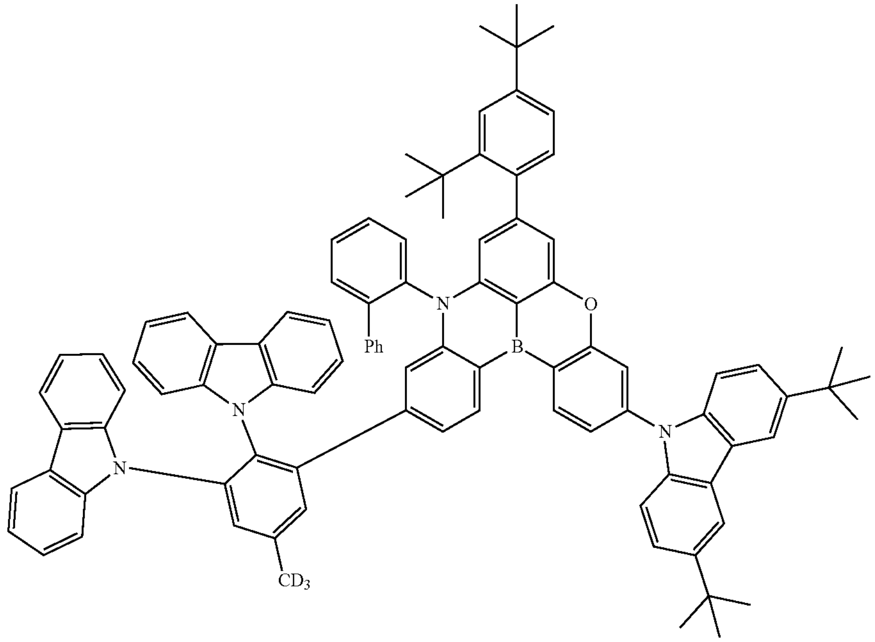
59
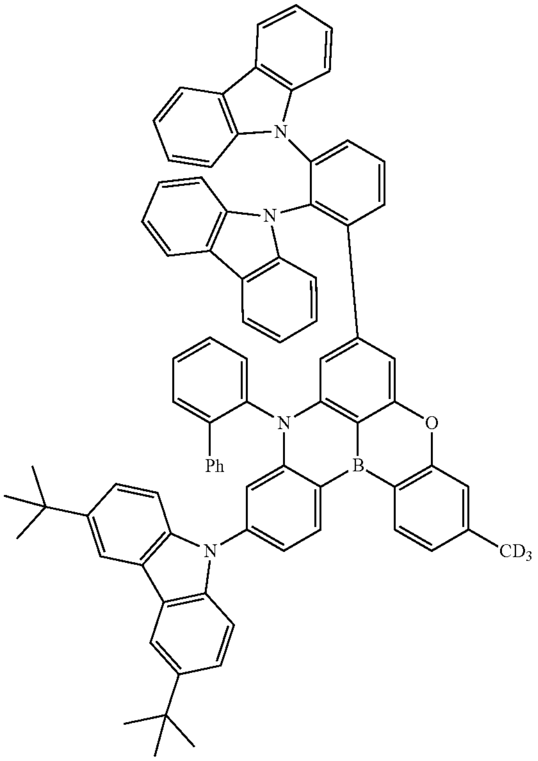
60
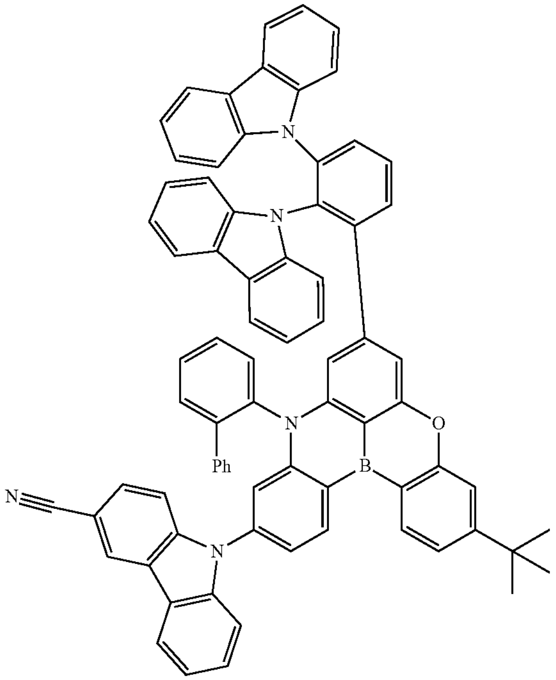

-continued
61
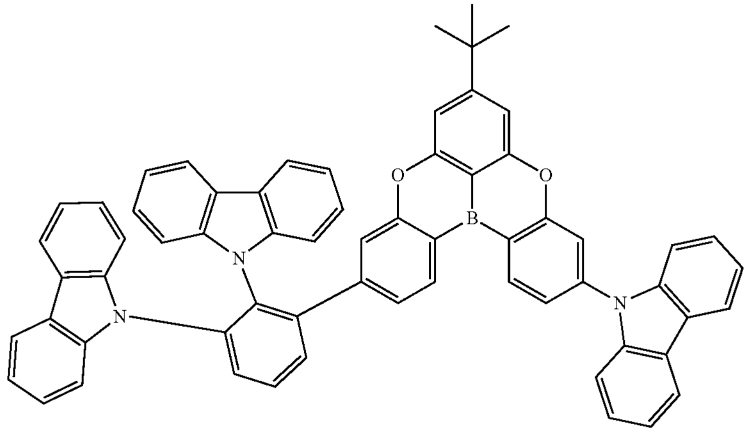
62
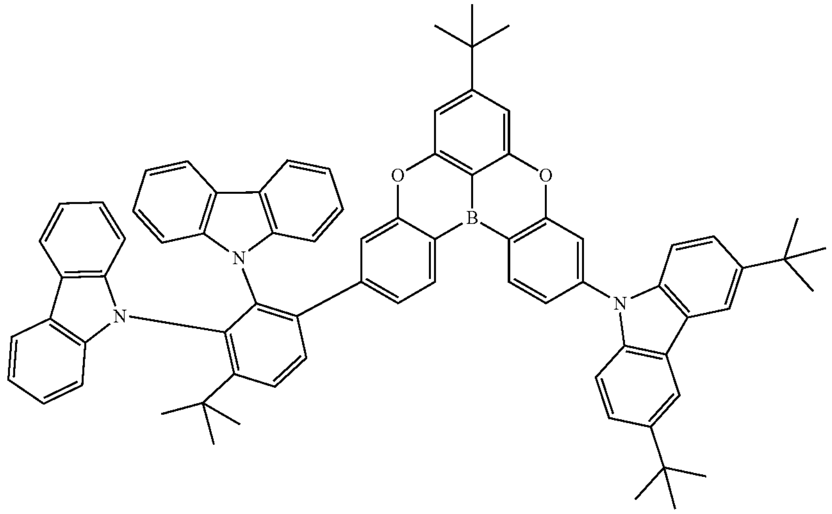
63
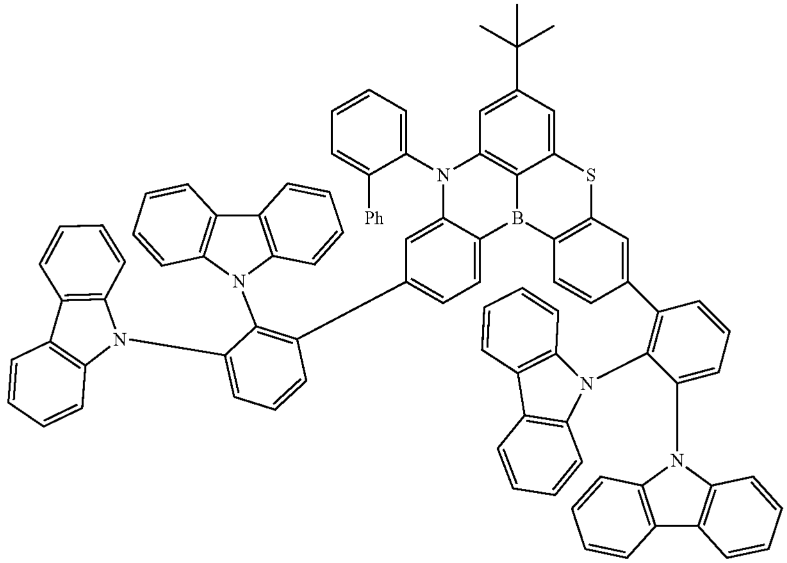

-continued
64
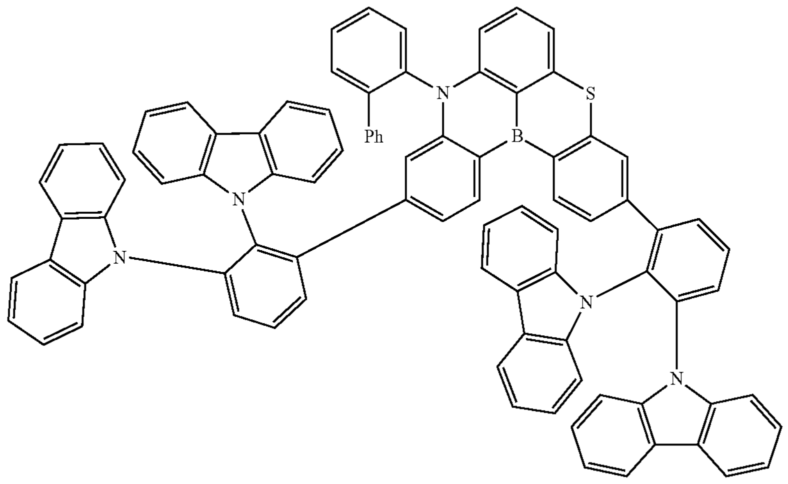
65
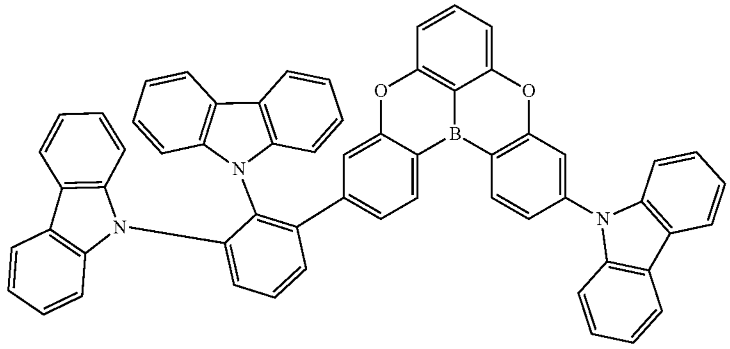
66
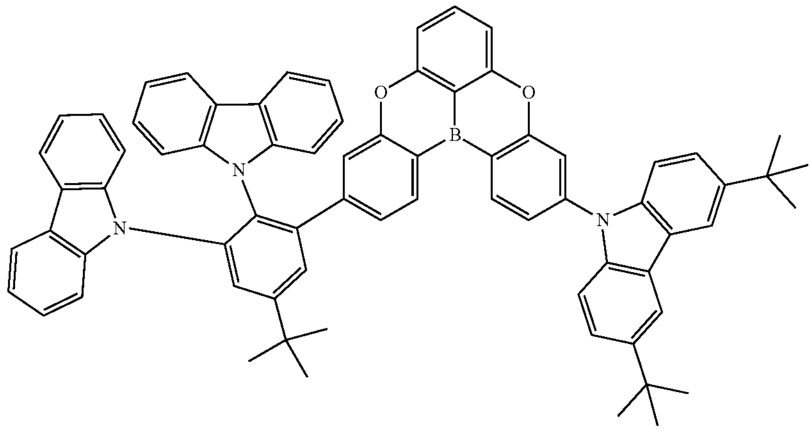

-continued
67
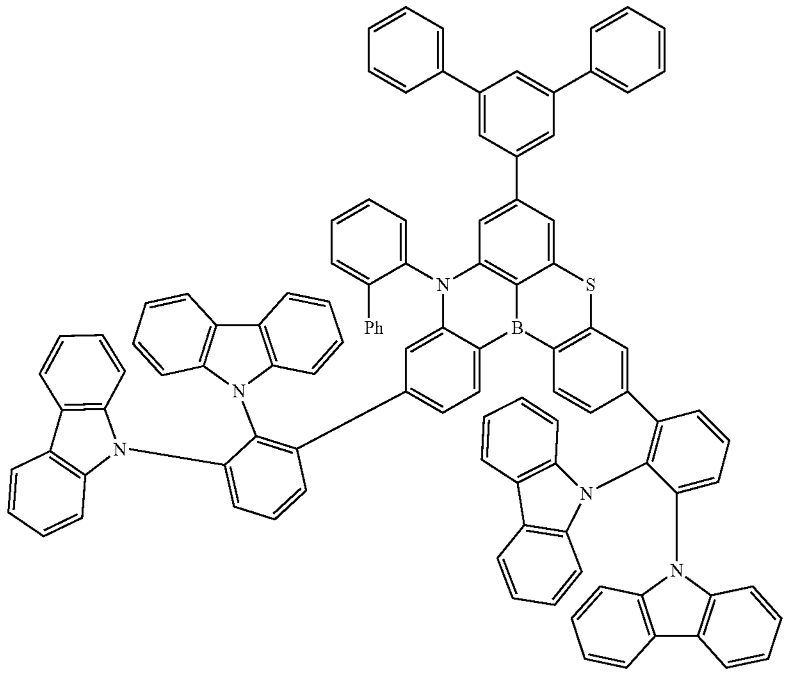
68
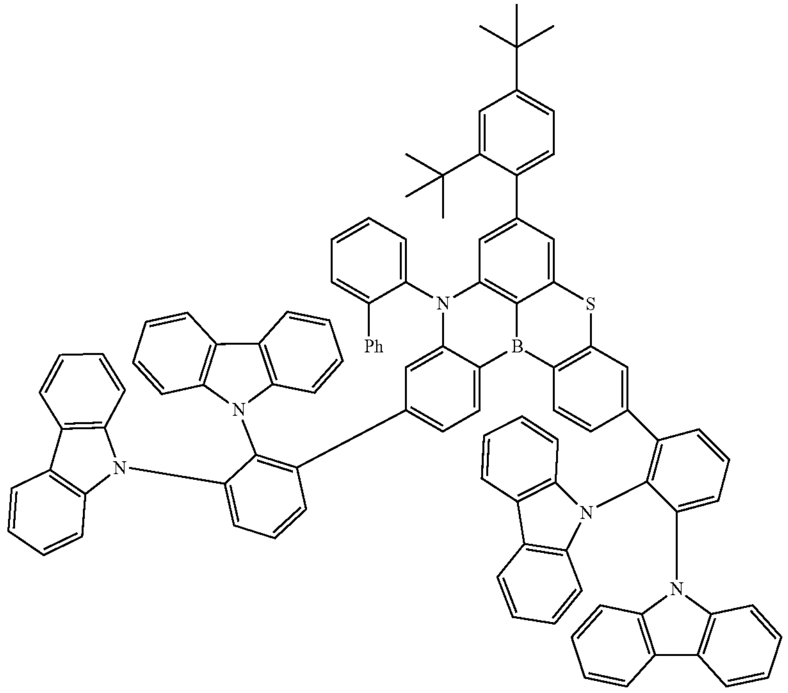

-continued
69
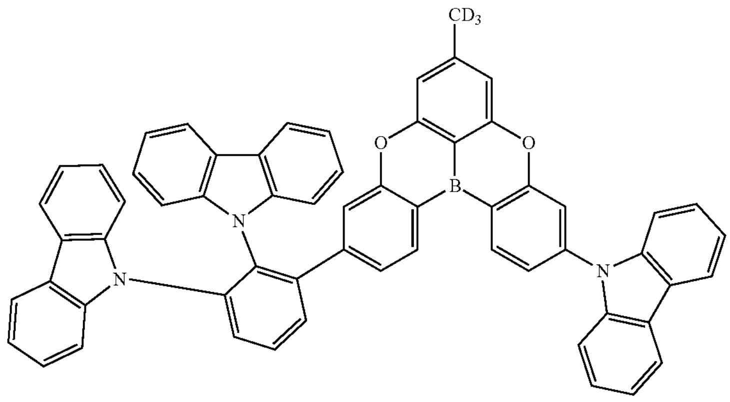
70
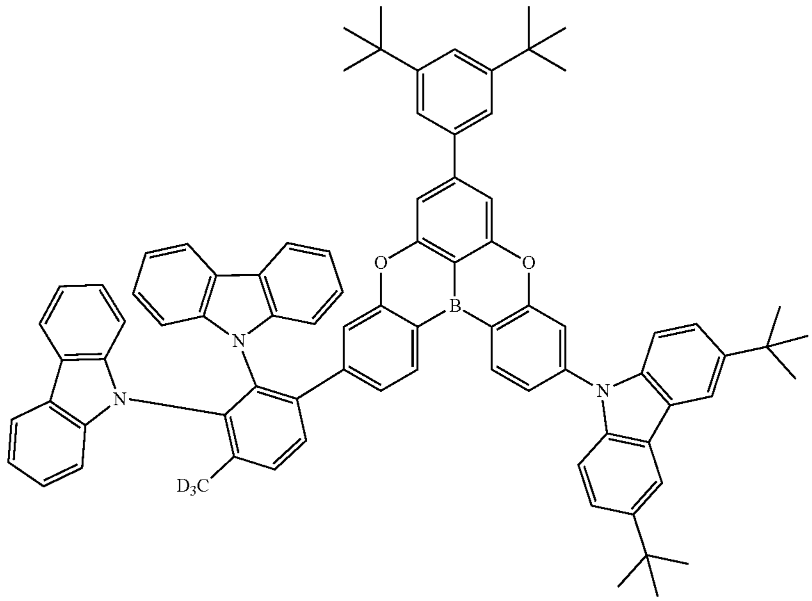

-continued
71
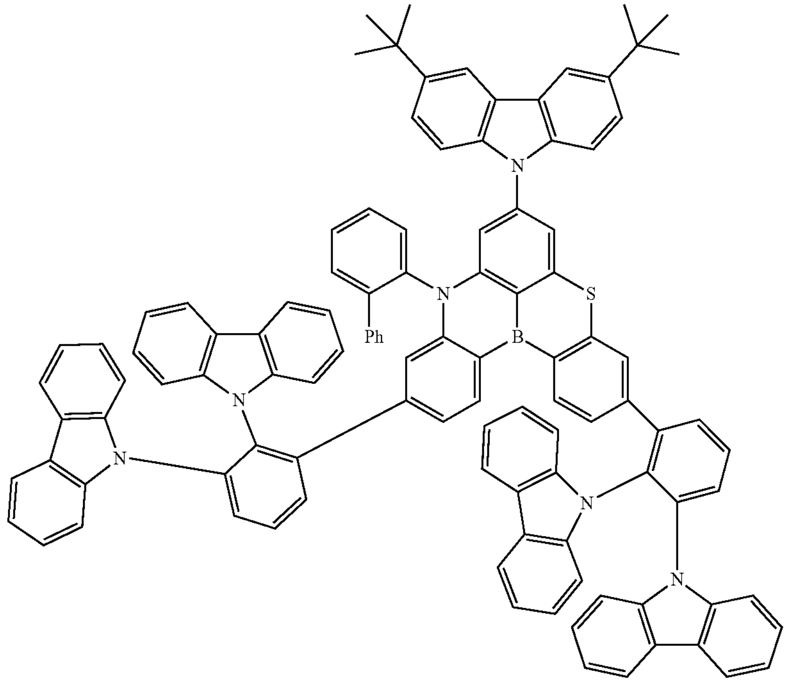
72
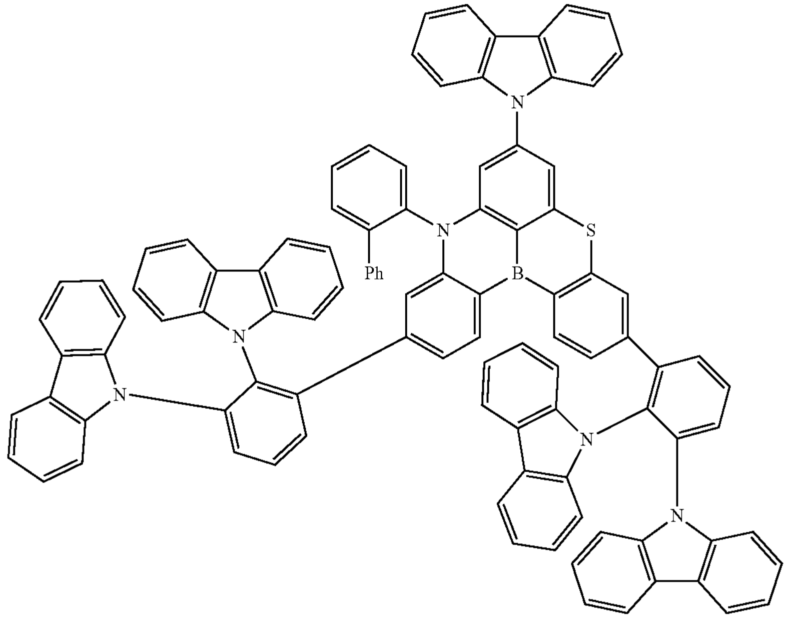

-continued
73
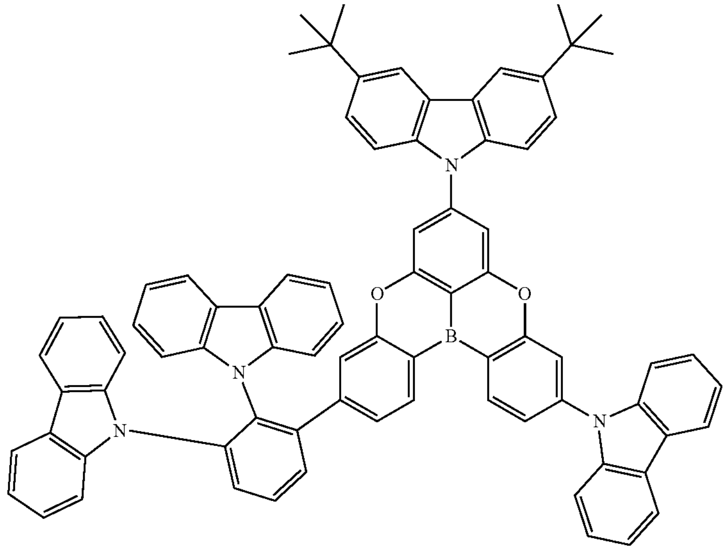
74
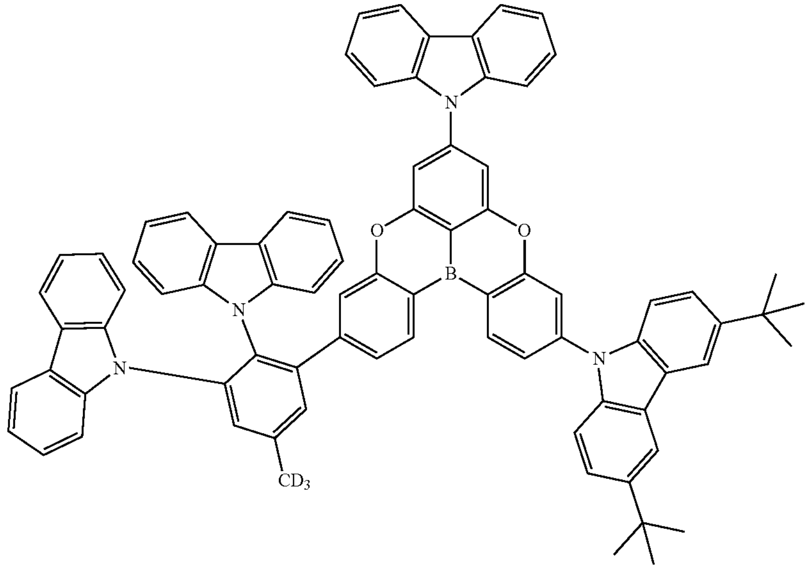
75
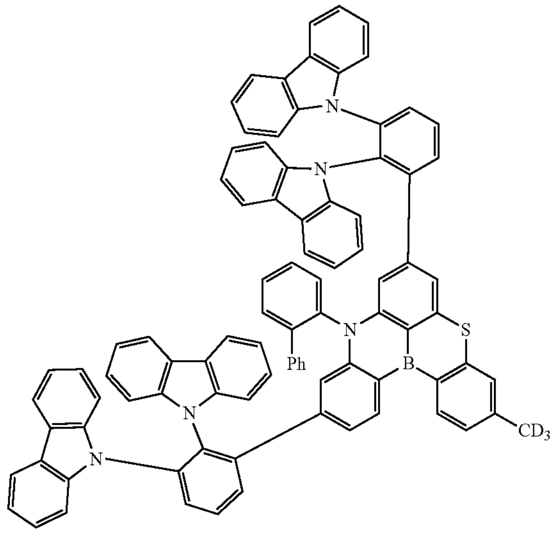
76
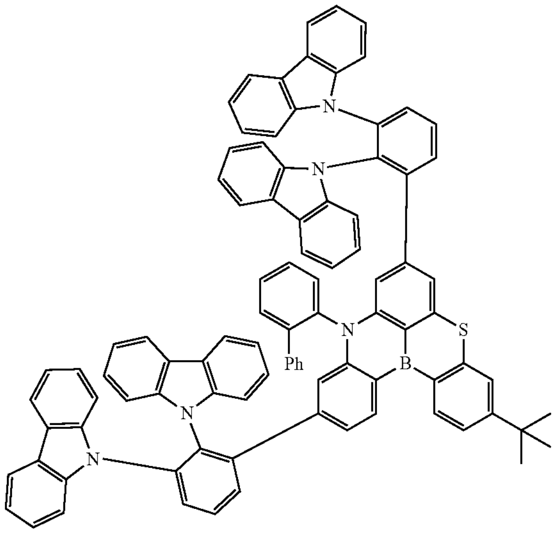

-continued
77
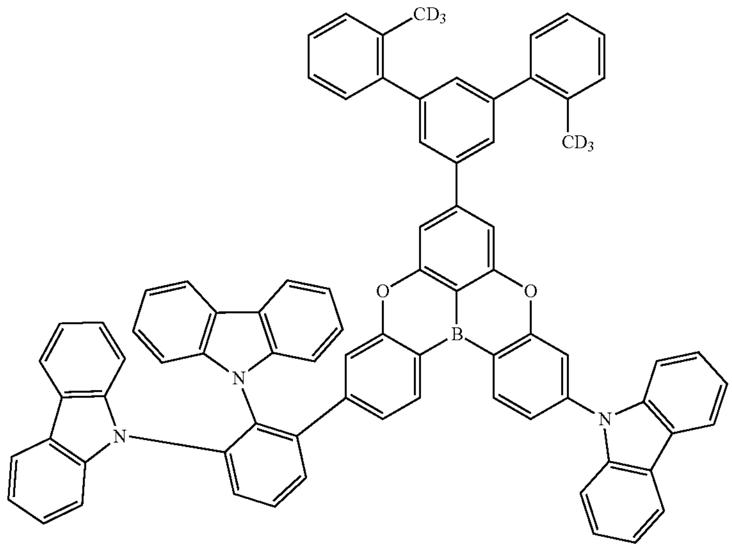
78
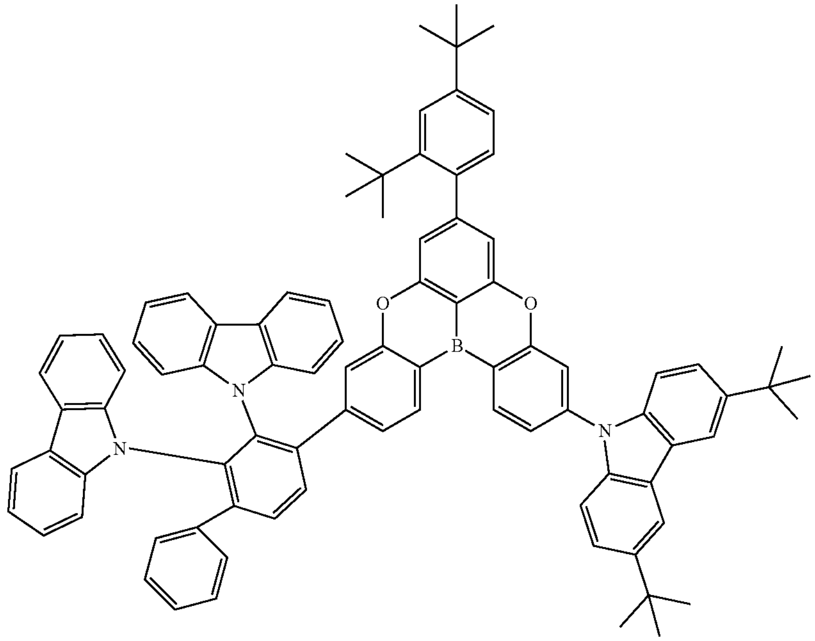

-continued

79

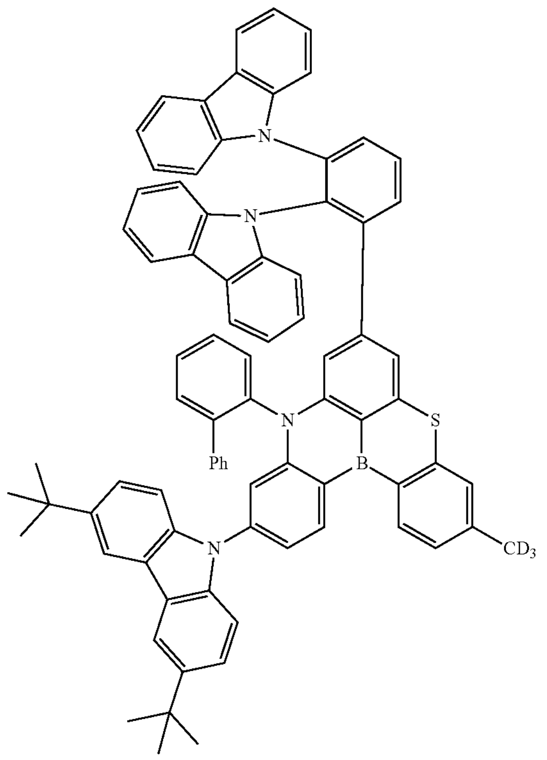

80

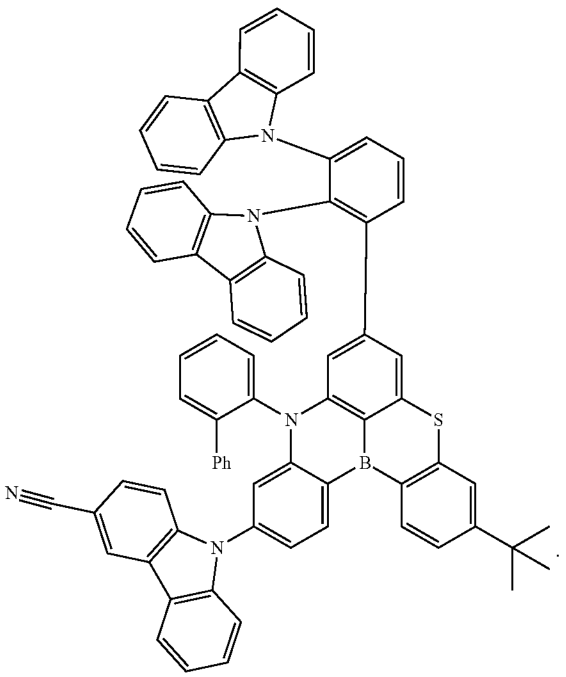

In Compounds 1 to 80, Ph indicates a phenyl group, and D indicates deuterium.

The condensed cyclic compound represented by Formula 1 has a core including two or more heterocyclic groups condensed while sharing $T_1$ (e.g., boron, etc.). In this regard, multiple resonance, and highest occupied molecular orbital (HOMO)/lowest unoccupied molecular orbital (LUMO) separation may occur, and due to short-range charge transfer (CT), excellent delayed fluorescence characteristics may be exhibited.

In the condensed cyclic compound, additional HOMO/LUMO separation occurs due to the introduction of a bulky substituent represented by Formula 2, and thus a very low $\Delta E_{ST}$ value may be obtained through long-range CT. Due to high steric hindrance of the substituent, the condensed cyclic compound may have improved stability, and formation of an excimer and/or formation of an exciplex with a host material may be substantially inhibited in a light-emitting device including the condensed cyclic compound, thereby inhibiting a decrease in luminescence efficiency.

For example, the substituent represented by Formula 2 includes two nitrogen-containing heterocyclic groups that are bonded to a benzene group based on an ortho positional relationship. In this regard, compared to a case having a different positional relationship (e.g., meta, etc.), high absorbance and a high f value may be obtained.

Therefore, in the condensed cyclic compound into which the substituent represented by Formula 2 is introduced, both short-range CT and long-range CT may occur, resulting in high absorbance, a high f value, and a low $\Delta E_{ST}$ value. Accordingly, a light-emitting device (e.g., an organic light-emitting device) including the condensed cyclic compound may have a low driving voltage, excellent luminescence efficiency, maximum quantum efficiency, and a long lifespan.

Synthesis methods of the condensed cyclic compound represented by Formula 1 may be recognizable by one of ordinary skill in the art by referring to the Examples provided below.

At least one condensed cyclic compound represented by Formula 1 may be used in a light-emitting device (for example, an organic light-emitting device).

Another aspect provides a light-emitting device which may include a first electrode, a second electrode facing the first electrode, an interlayer between the first electrode and the second electrode and including an emission layer, and at least one condensed cyclic compound.

In an embodiment, the interlayer may include the at least one condensed cyclic compound.

In an embodiment, the first electrode may be an anode; the second electrode may be a cathode; the interlayer may further include a hole transport region between the emission layer and the first electrode, and an electron transport region between the emission layer and the second electrode; the hole transport region may include a hole injection layer, a hole transport layer, an emission auxiliary layer, an electron blocking layer, or any combination thereof; and the electron transport region may include a buffer layer, a hole blocking layer, an electron control layer, an electron transport layer, an electron injection layer, or any combination thereof.

In an embodiment, the emission layer may include the at least one condensed cyclic compound.

In an embodiment, the emission layer may further include a first compound that is a hole-transporting compound, and a second compound that is an electron-transport compound.

In an embodiment, the first compound may include a group represented by Formula 3:

[Formula 3]

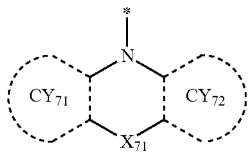

In Formula 3, ring $CY_{71}$ and ring $CY_{72}$ may each independently be a π electron-rich $C_3$-$C_{60}$ cyclic group or a pyridine group, $X_{71}$ may be: a single bond; or a linking group including O, S, N, B, C, Si, or any combination thereof, and

* indicates a binding site to a neighboring atom in the first compound.

In embodiments, the first compound may include a compound represented by Formula 3-1, a compound represented by Formula 3-2, a compound represented by Formula 3-3, a compound represented by Formula 3-4, a compound represented by Formula 3-5, or any combination thereof:

[Formula 3-1]

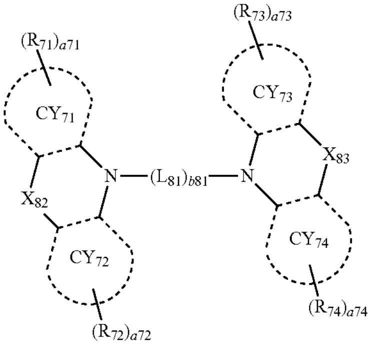

[Formula 3-2]

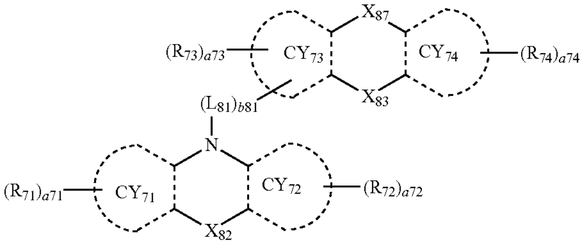

[Formula 3-3]

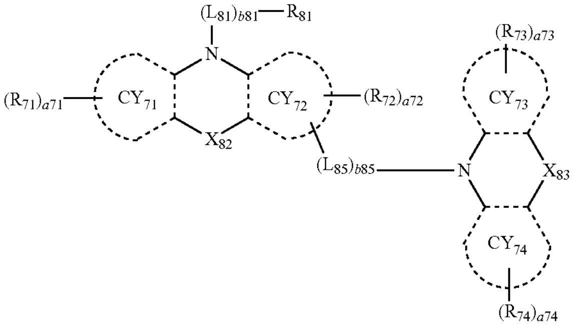

[Formula 3-4]

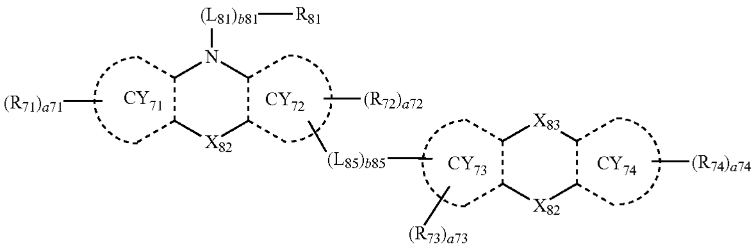

-continued

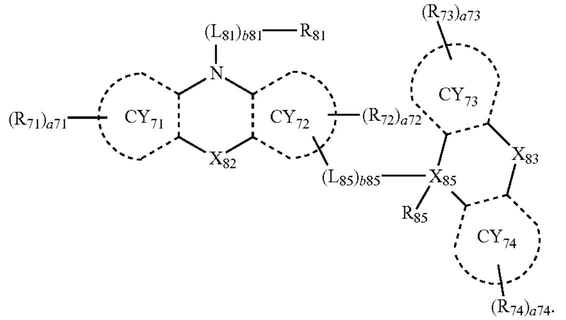

[Formula 3-5]

In Formulae 3-1 to 3-5, ring $CY_{71}$ to ring $CY_{74}$ may each independently be a π electron-rich $C_3$-$C_{60}$ cyclic group or a pyridine group, $X_{82}$ may be a single bond, O, S, N-[$(L_{82})_{b82}$-$R_{82}$], C($R_{82a}$)($R_{82b}$), or Si($R_{82a}$)($R_{82b}$), $X_{83}$ may be a single bond, O, S, N-[$(L_{83})_{b83}$-$R_{83}$], C($R_{83a}$)($R_{83b}$), or Si($R_{83a}$)($R_{83b}$), $X_{84}$ may be O, S, N-[$(L_{84})_{b84}$-$R_{84}$], C($R_{84a}$)($R_{84b}$), or Si($R_{84a}$)($R_{84b}$), $X_{85}$ may be C or Si, $L_{81}$ to $L_{85}$ may each independently be a single bond, *—C($Q_4$)($Q_5$)-*', *—Si($Q_4$)($Q_5$)-*', a π electron-rich $C_3$-$C_{60}$ cyclic group unsubstituted or substituted with at least one $R_{10a}$, or a pyridine group unsubstituted or substituted with at least one $R_{10a}$, wherein $Q_4$ and $Q_5$ may each independently be the same as defined in connection with $Q_1$, b81 to b85 may each independently be an integer from 1 to 5, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ may each be the same as described herein, a71 to a74 may each independently be an integer from 0 to 20, and $R_{10a}$ may be the same as defined herein.

In an embodiment, the second compound may include at least one π electron-deficient nitrogen-containing $C_1$-$C_{60}$ cyclic group.

In an embodiment, the second compound may include a compound represented by Formula 4:

[Formula 4]

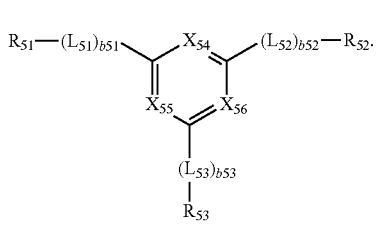

In Formula 4, $L_{51}$ to $L_{53}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, b51 to b53 may each independently be an integer from 1 to 5, $X_{54}$ may be N or C($R_{54}$), $X_{55}$ may be N or C($R_{55}$), $X_{56}$ may be N or C($R_{56}$), and at least one of $X_{54}$ to $X_{56}$ may be N, and $R_{51}$ to $R_{56}$ and $R_{10a}$ may each be the same as described herein.

In Formulae 3, 3-1 to 3-5, and 4, $R_{51}$ to $R_{56}$, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_6$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_2$-$C_{60}$ heteroarylalkyl group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$).

$Q_1$ to $Q_3$ and $R_{10a}$ may each independently be the same as described herein.

In an embodiment, the emission layer may further include a third compound, and the third compound may be a phosphorescent sensitizer.

In an embodiment, the third compound may be a transition metal-containing organometallic compound. For example, the transition metal-containing organometallic compound may include platinum and a tetradentate ligand bound to the platinum.

In an embodiment, the third compound may include an organometallic compound represented by Formula 401. In an embodiment, the emission layer may emit blue light or cyan light.

In an embodiment, the emission layer may emit light having a maximum emission wavelength in a range of about 400 nm to about 500 nm. For example, the emission layer may emit light having a maximum emission wavelength in a range of about 430 nm to about 490 nm. For example, the emission layer may emit light having a maximum emission wavelength in a range of about 440 nm to about 480 nm.

The expression "(the interlayer) includes a condensed cyclic compound" as used herein may be construed as meaning that "(the interlayer) may include one condensed cyclic compound belonging to the category of Formula 1" or meaning that "(the interlayer) may include at least two different condensed cyclic compounds belonging to the category of Formula 1."

In an embodiment, the interlayer may include, as the condensed cyclic compound, only Compound 1. In this regard, Compound 1 may be included in the interlayer of the light-emitting device. In embodiments, the interlayer may include, as the condensed cyclic compound, Compound 1 and Compound 2. In this regard, Compound 1 and Compound 2 may exist in an identical layer (for example, Compound 1 and Compound 2 may all exist in an electron transport layer), or in different layers (for example, Compound 1 may exist in an electron transport layer and Compound 2 may exist in a buffer layer).

The term "interlayer" as used herein refers to a single layer and/or multiple layers between the first electrode and the second electrode of the light-emitting device.

Another aspect provides an electronic apparatus including the light-emitting device.

In an embodiment, the electronic apparatus may further include a thin-film transistor. For example, the electronic apparatus may further include a thin-film transistor including a source electrode and a drain electrode, wherein the first electrode of the light-emitting device may be electrically connected to the source electrode or the drain electrode.

In an embodiment, the electronic apparatus may further include a color filter, a quantum dot color conversion layer, a touch screen layer, a polarizing layer, or any combination thereof. For example, the electronic apparatus may further include a color filter, a quantum dot color conversion layer, a touch screen layer, a polarizing layer, or any combination thereof. Here, the quantum dot color conversion layer may be a quantum dot-containing color conversion layer. For example, the electronic apparatus may be a flat panel display apparatus, but embodiments are not limited thereto.

The electronic apparatus may be the same as defined herein.

[Description of FIG. 1]

FIG. 1 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described with reference to FIG. 1.

[First Electrode 110]

In FIG. 1, a substrate may be further included under the first electrode 110 or on the second electrode 150. In an embodiment, the substrate may be a glass substrate or a plastic substrate. In embodiments, the substrate may be a flexible substrate, and for example, may include plastics with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high-work function material that facilitates injection of holes.

The first electrode 110 may be a reflective electrode, a semi-transmissive electrode, or a transmissive electrode. In an embodiment, when the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In embodiments, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a structure consisting of a single layer or a structure including multiple layers. For example, the first electrode 110 may have a three-layered structure of ITO/Ag/ITO.

[Interlayer 130]

The interlayer 130 is arranged on the first electrode 110. The interlayer 130 may include an emission layer.

The interlayer 130 may further include a hole transport region between the first electrode 110 and the emission layer, and an electron transport region between the emission layer and the second electrode 150.

In an embodiment, the interlayer 130 may further include, in addition to various organic materials, a metal-containing compound such as an organometallic compound, an inorganic material such as quantum dots, and the like.

In embodiments, the interlayer 130 may include two or more emitting units stacked between the first electrode 110 and the second electrode 150, and at least one charge generation layer between the two or more emitting units. When the interlayer 130 includes the two or more emitting units and the at least one charge generation layer, the light-emitting device 10 may be a tandem light-emitting device.

[Hole Transport Region in Interlayer 130]

The hole transport region may have a structure consisting of a layer consisting of a single material, a structure consisting of a layer consisting of different materials, or a structure including multiple layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein the layers of each structure may be stacked from the first electrode 110 in its respective stated order, but the structure of the hole transport region is not limited thereto.

The hole transport region may include a compound represented by Formula 201, a compound represented by Formula 202, or any combination thereof:

[Formula 201]

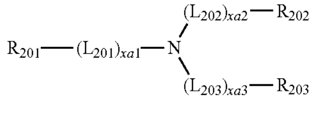

[Formula 202]

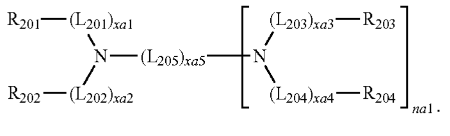

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group, etc.) unsubstituted or substituted with at least one $R_{10a}$ (for example, Compound HT16, etc.), $R_{203}$ and $R_{204}$ may optionally be bonded to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In embodiments, each of Formulae 201 and 202 may include at least one of groups represented by Formulae CY201 to CY217:

CY201

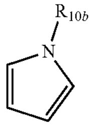

CY202

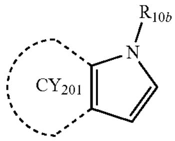

CY203

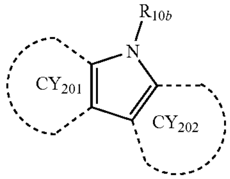

CY204

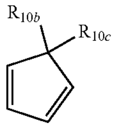

CY205

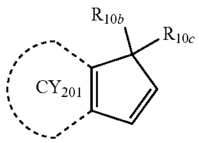

-continued

CY206

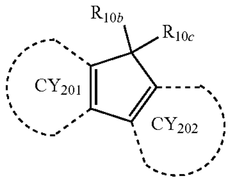

CY207

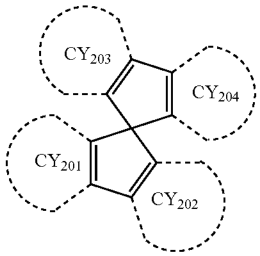

CY208

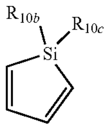

CY209

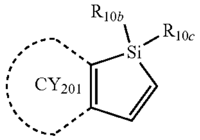

CY210

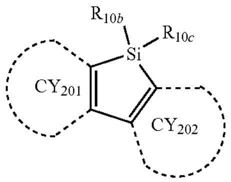

CY211

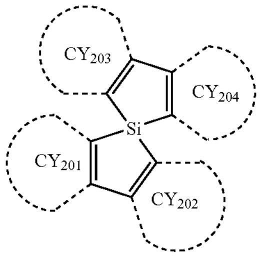

CY212

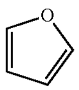

CY213

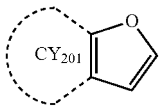

CY214

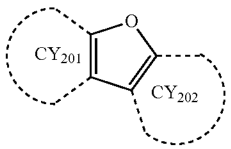

-continued

CY215

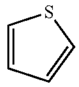

CY216

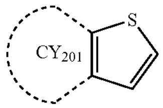

CY217

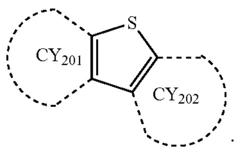

In Formulae CY201 to CY217, $R_{10b}$ and $R_{10c}$ may each independently be the same as defined in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described herein.

In an embodiment, in Formulae CY201 to CY217, ring $CY_{201}$ to ring $CY_{204}$ may each independently be a benzene group, a naphthalene group, a phenanthrene group, or an anthracene group.

In embodiments, each of Formulae 201 and 202 may include at least one of groups represented by Formulae CY201 to CY203.

In embodiments, a compound represented by Formula 201 may include at least one of groups represented by Formulae CY201 to CY203 and at least one of groups represented by Formulae CY204 to CY217.

In embodiments, in Formula 201, xa1 may be 1, $R_{201}$ may be one of groups represented by Formulae CY201 to CY203, xa2 may be 0, and $R_{202}$ may be one of groups represented by Formulae CY204 to CY207.

In embodiments, each of Formulae 201 and 202 may not include groups represented by Formulae CY201 to CY203.

In embodiments, each of Formulae 201 and 202 may not include groups represented by Formulae CY201 to CY203, and may include at least one of groups represented by Formulae CY204 to CY217.

In embodiments, each of Formulae 201 and 202 may not include groups represented by Formulae CY201 to CY217.

For example, the hole transport region may include one of Compounds HT1 to HT52, m-MTDATA, TDATA, 2-TNATA, NPB(NPD), β-NPB, TPD, spiro-TPD, spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), CzSi, or any combination thereof:

HT1

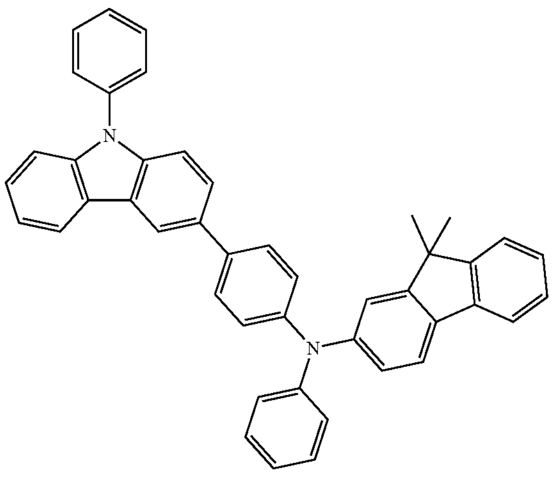

HT2

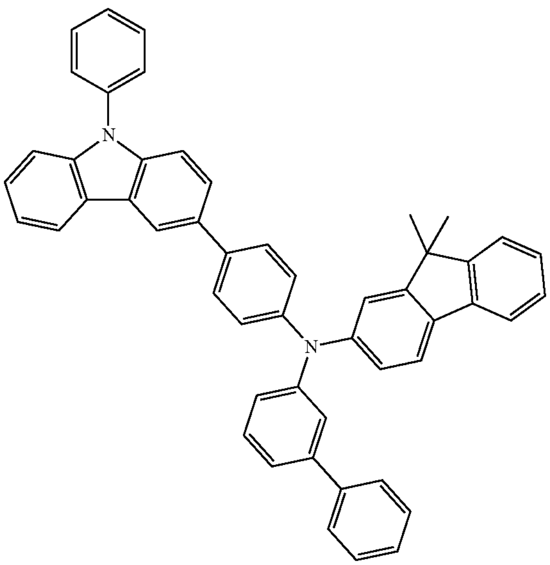

-continued
HT3
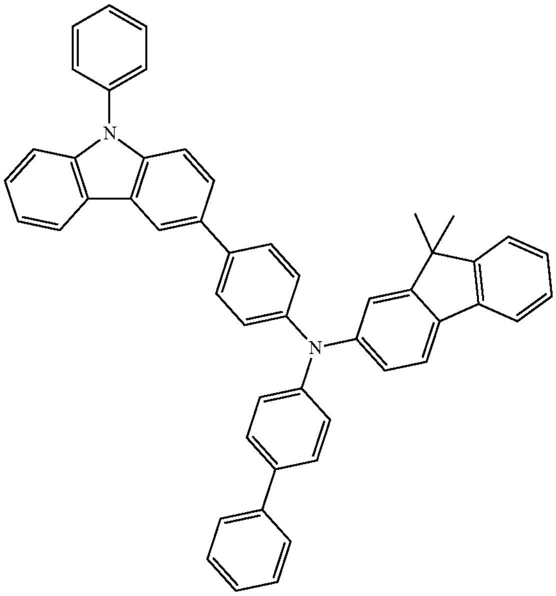
HT4
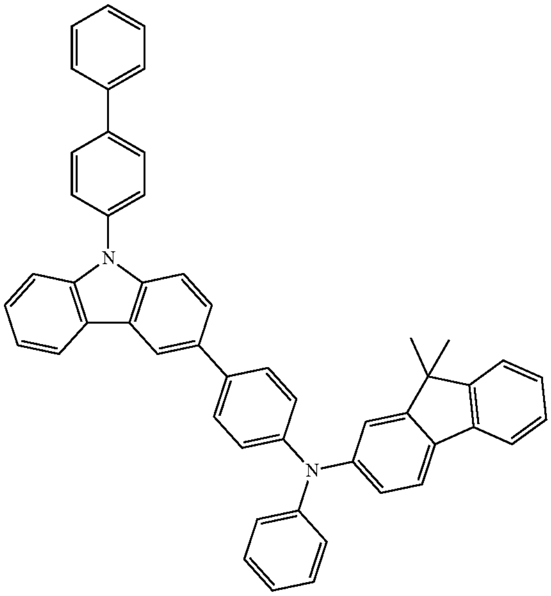
HT5
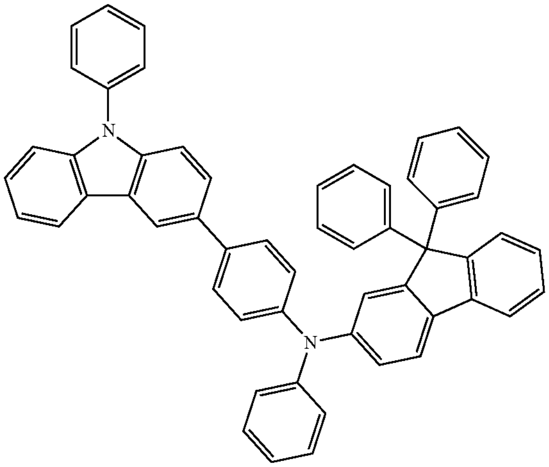
HT6
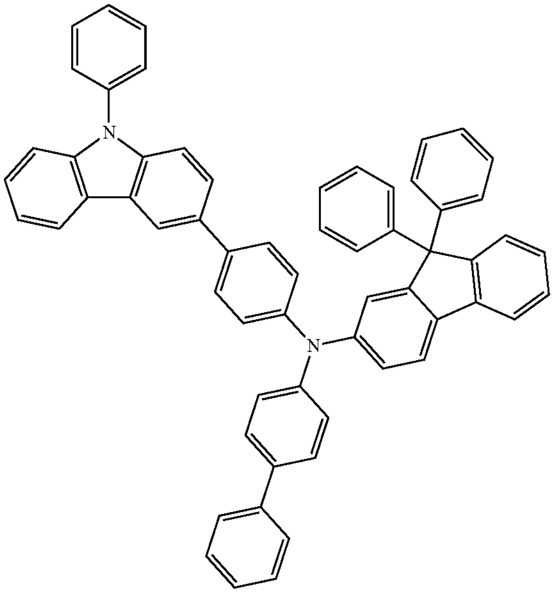

-continued
HT7
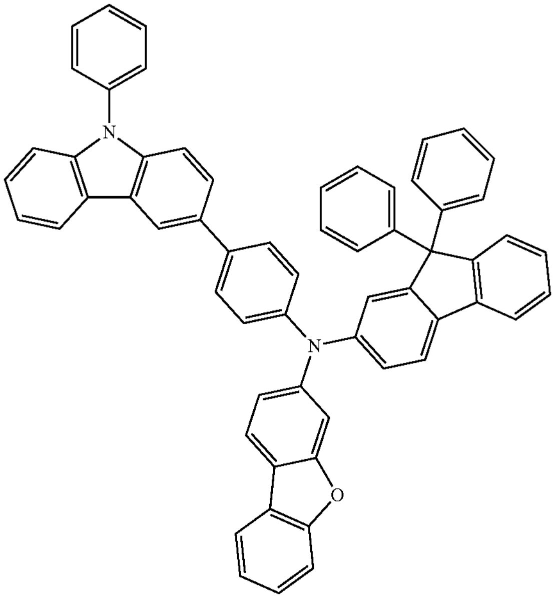
HT8
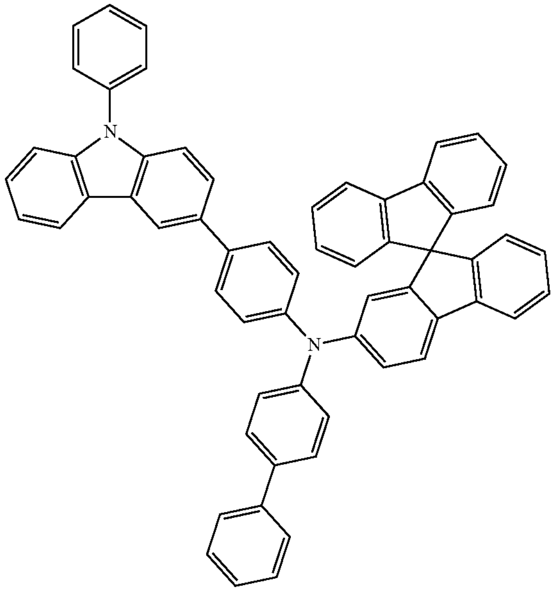
HT9
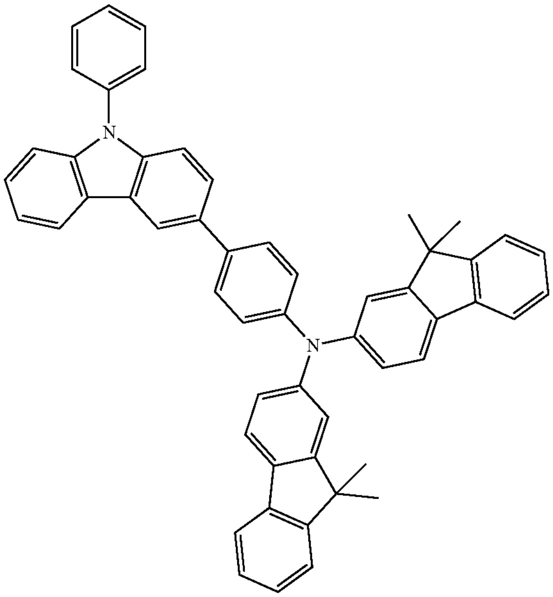
HT10
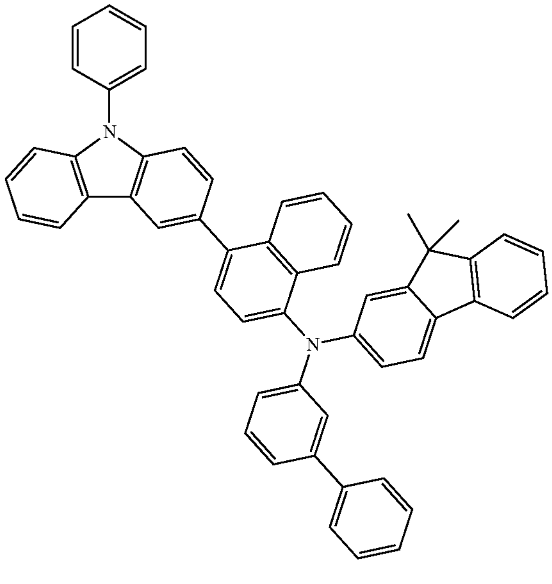

-continued
HT11
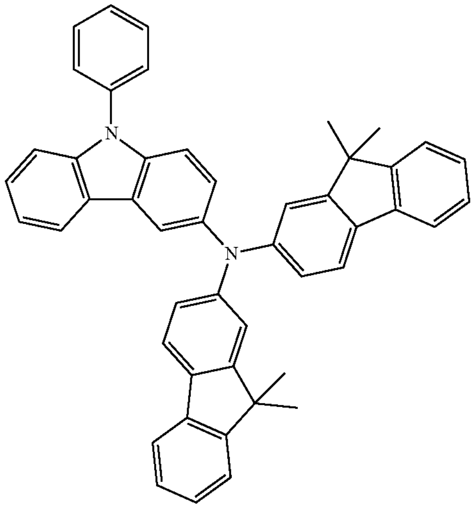
HT12
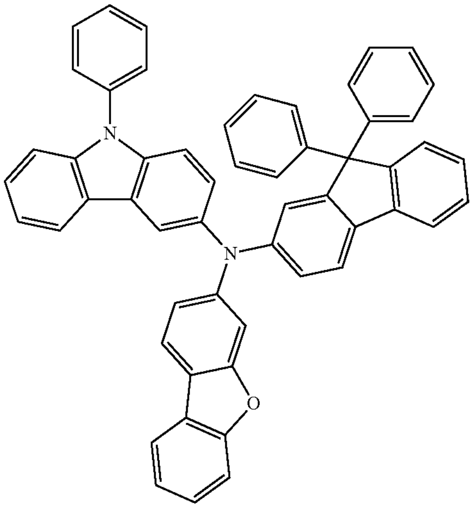
HT13
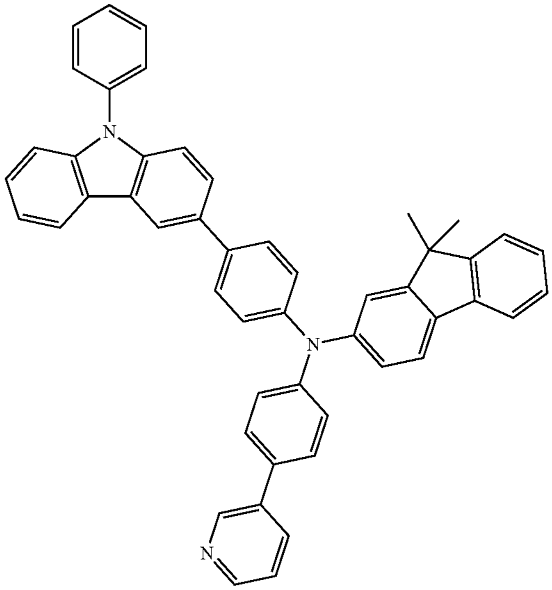
HT14
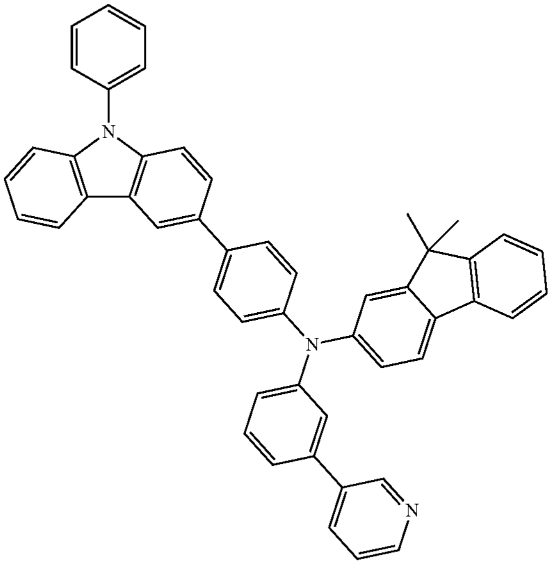
HT15
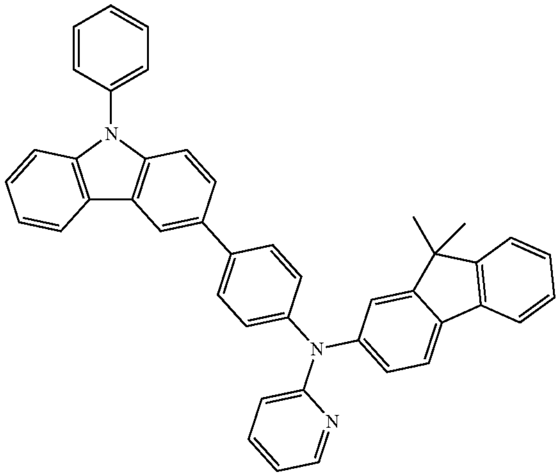
HT16
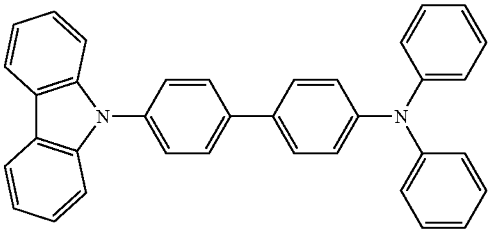

-continued
HT17
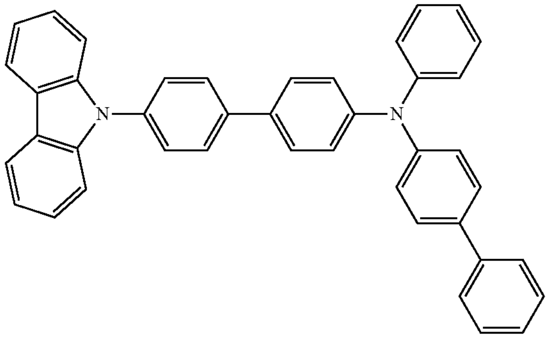
HT18
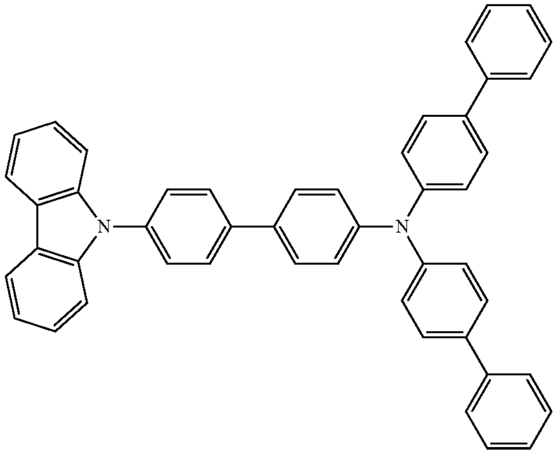
HT19
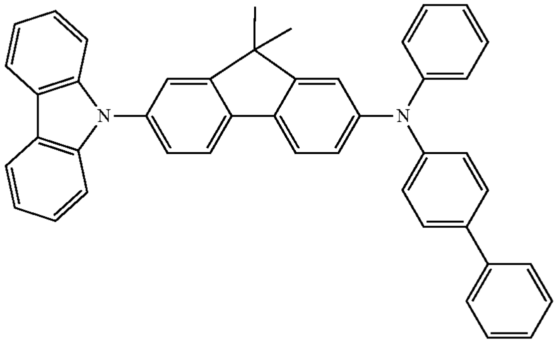
HT20
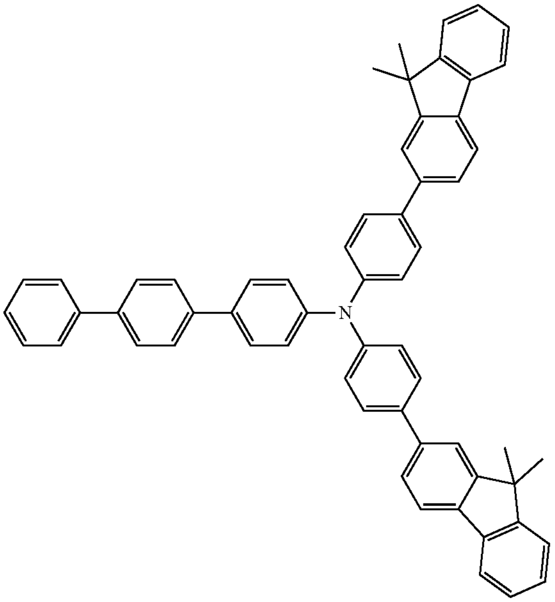

-continued
HT21
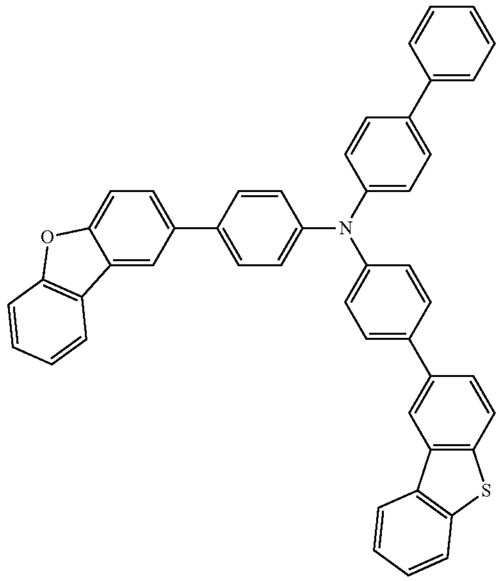
HT22
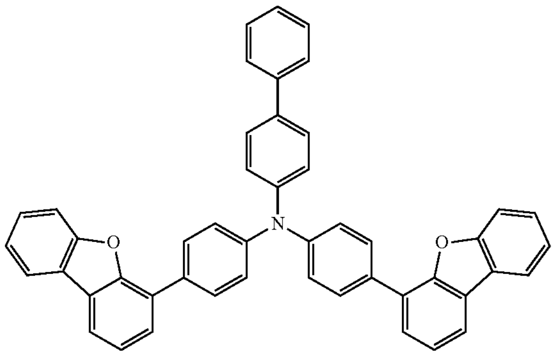
HT23
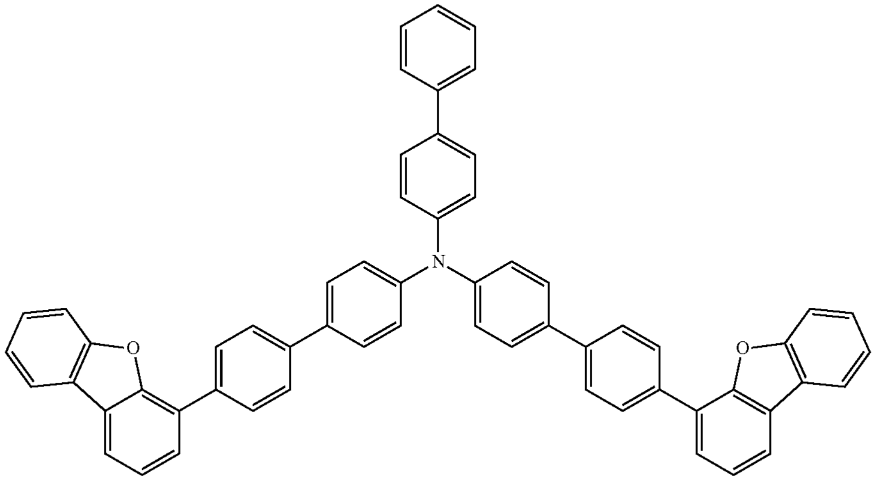
HT24
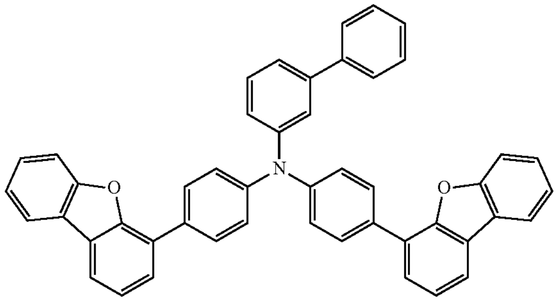
HT25
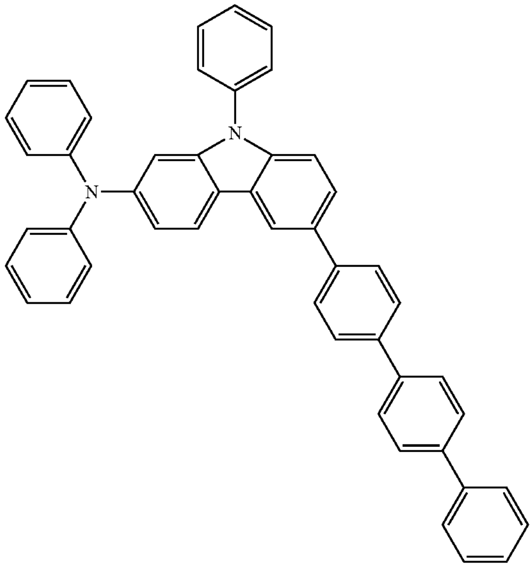

-continued
HT26
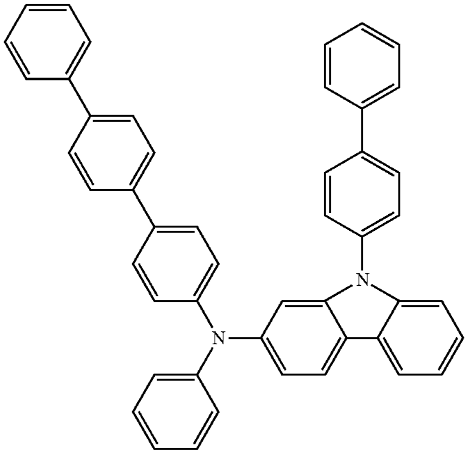
HT27
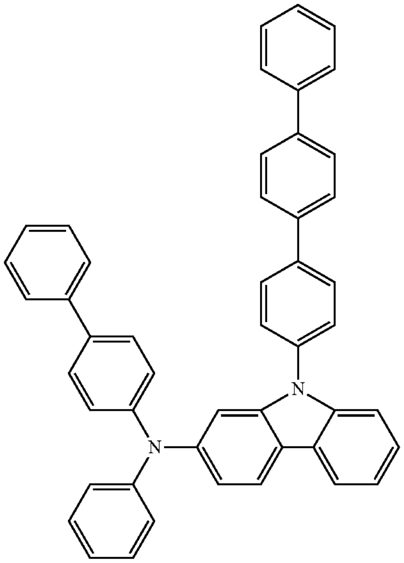
HT28
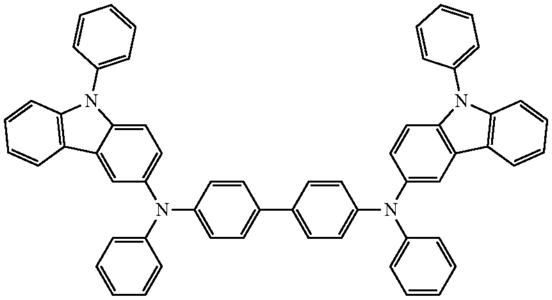
HT29
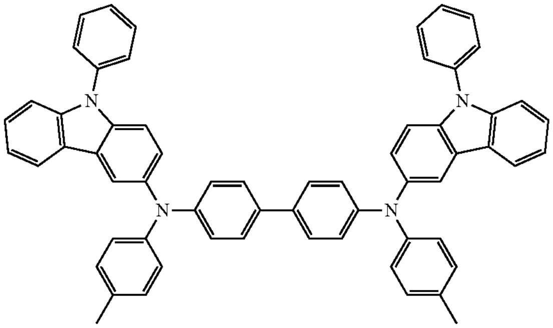
HT30
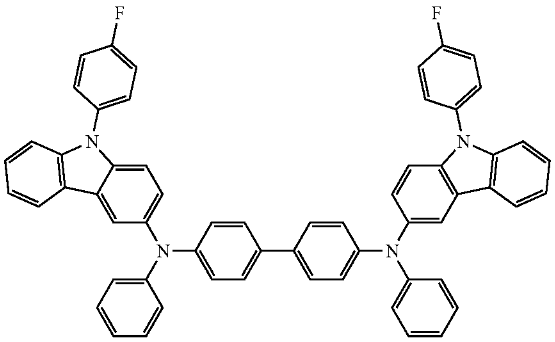
HT31
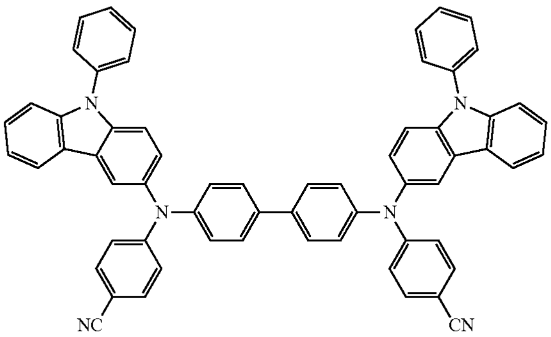

-continued
HT32
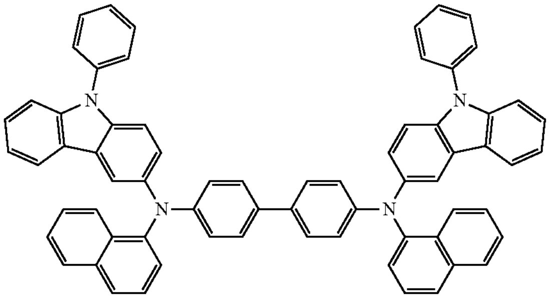
HT33
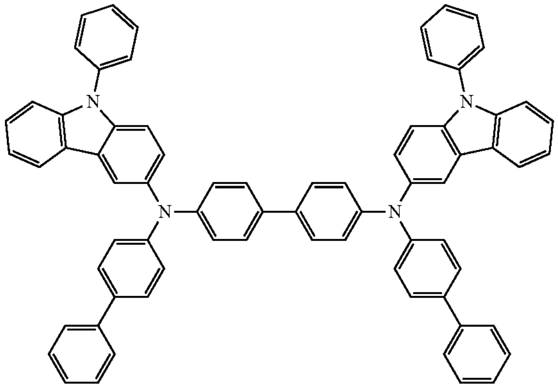
HT34
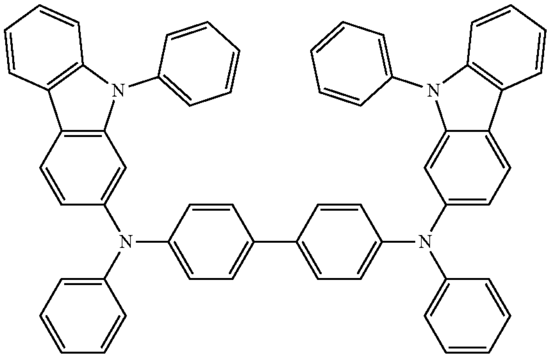
HT35
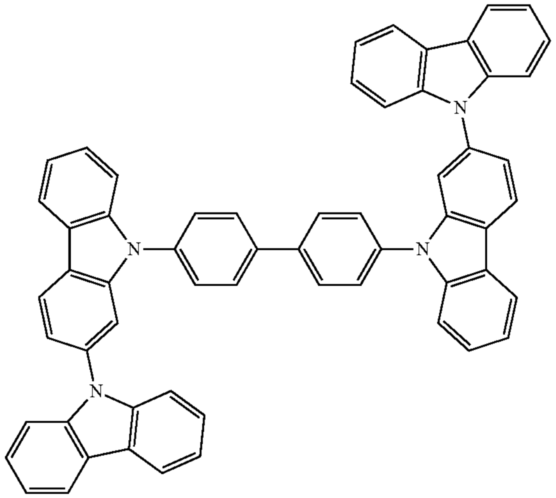
HT36
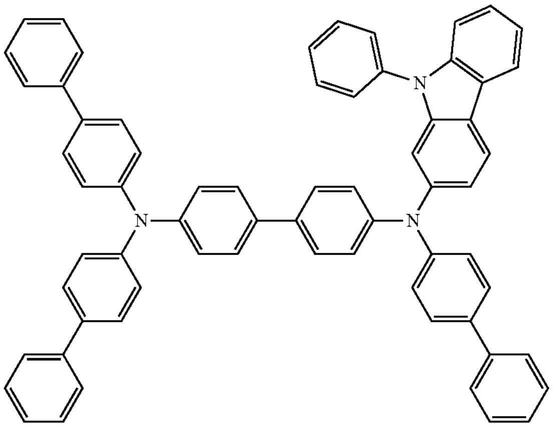
HT37
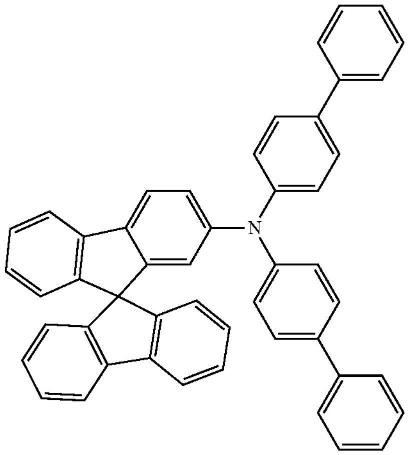

-continued
HT38
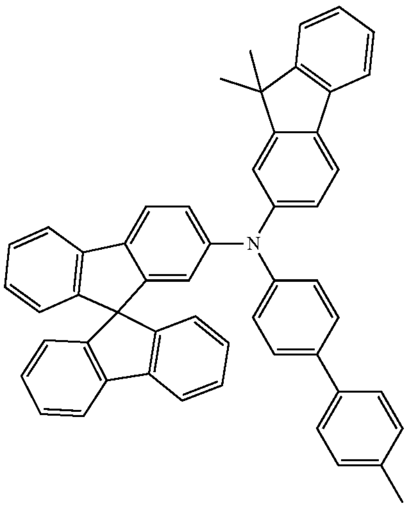
HT39
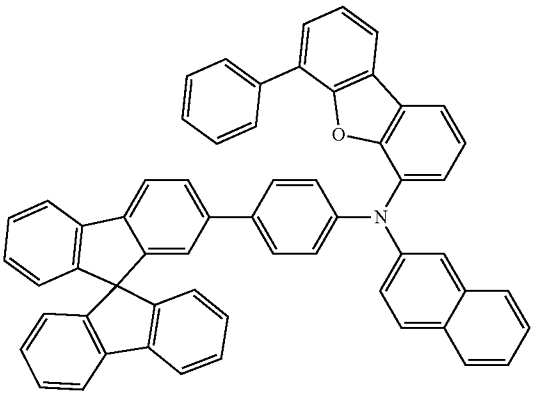
HT40
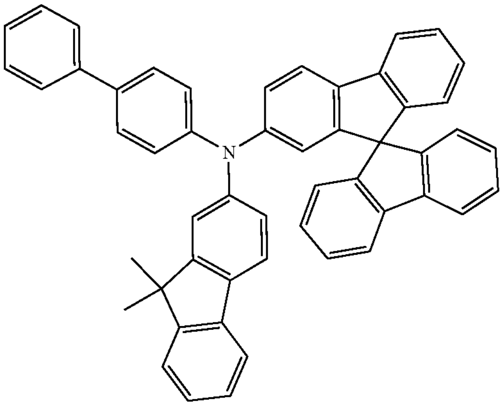
HT41
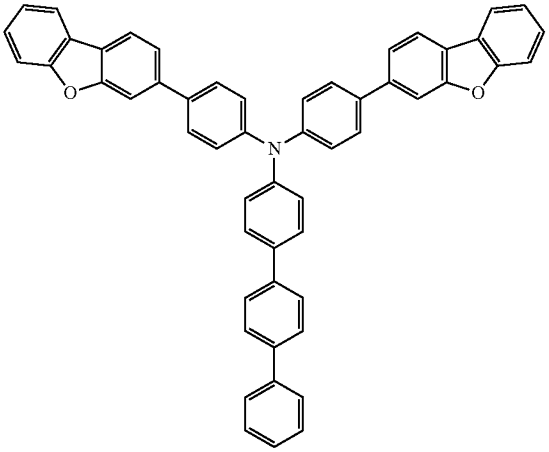
HT42
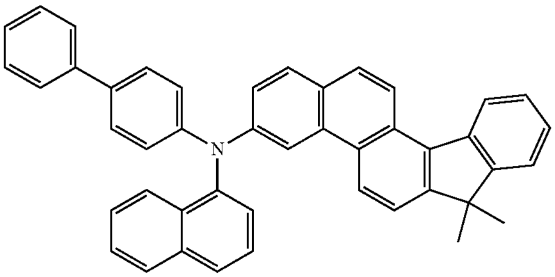
HT43
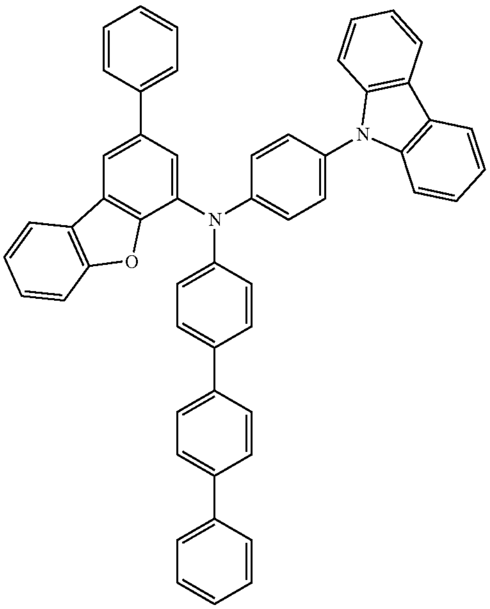

-continued
HT44
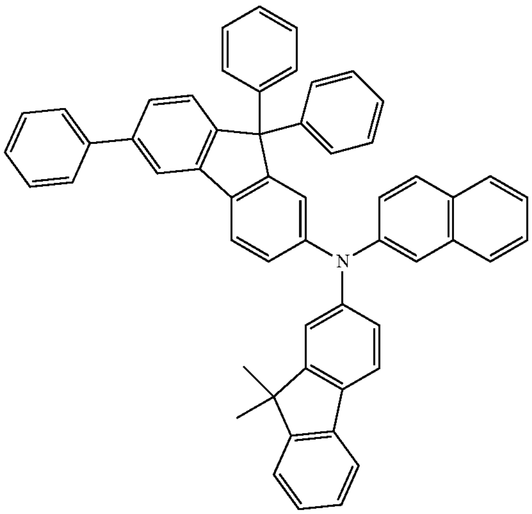
HT45
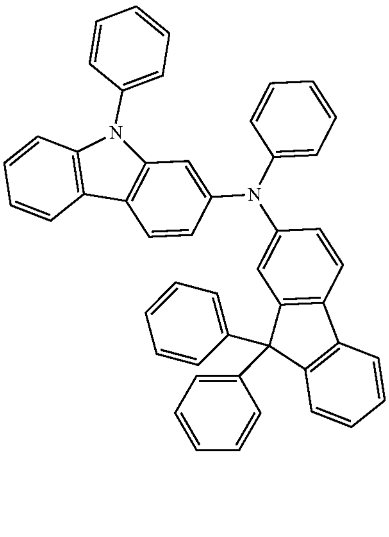
HT46
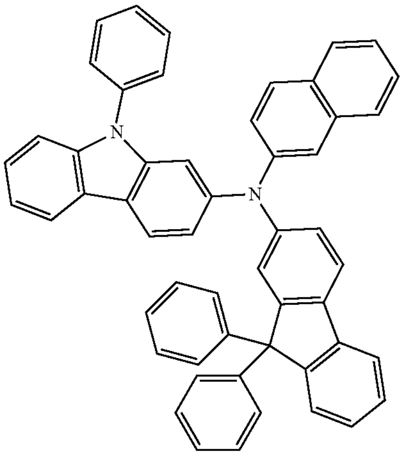
HT47
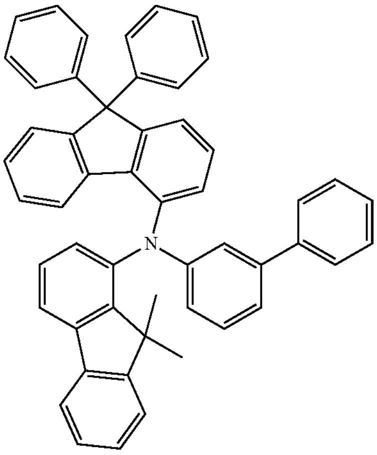
HT48
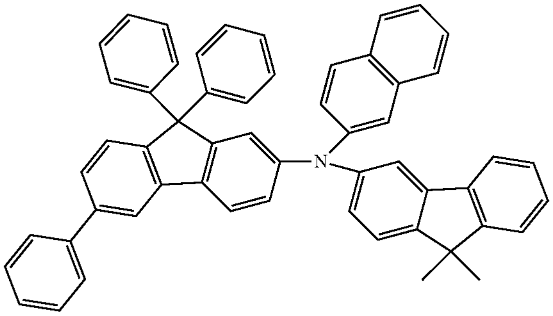
HT49
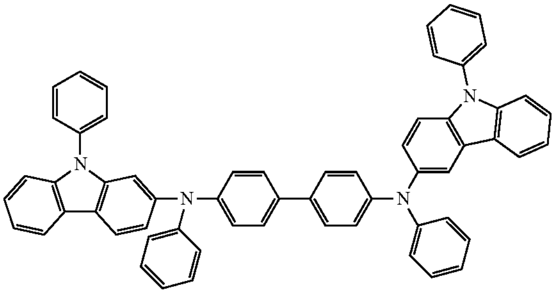

-continued
HT50
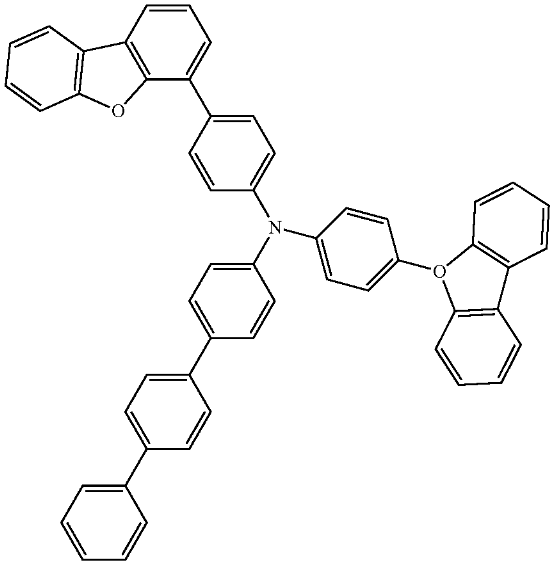
HT51
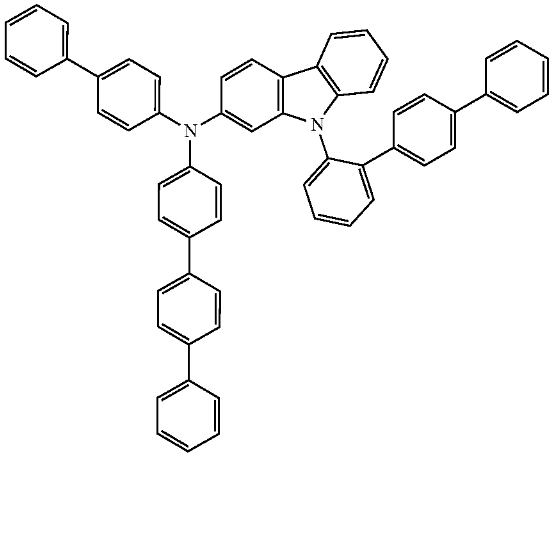
HT52
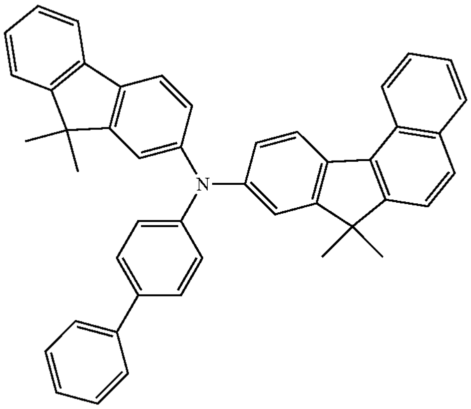
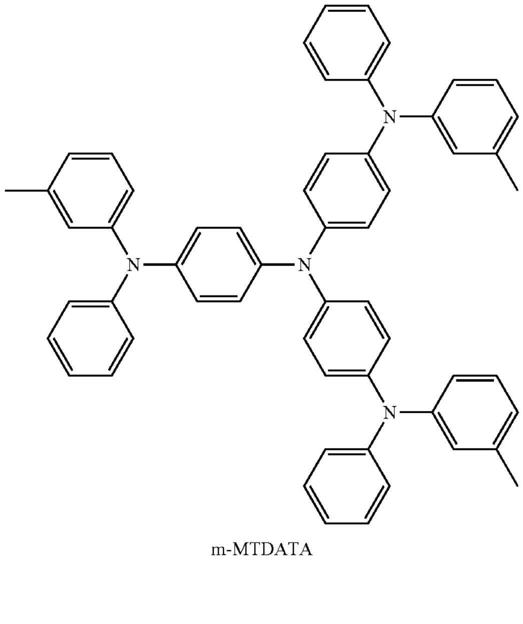
m-MTDATA -continued
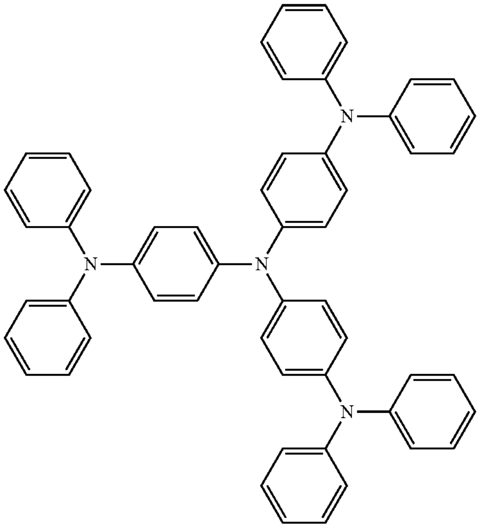
TDATA
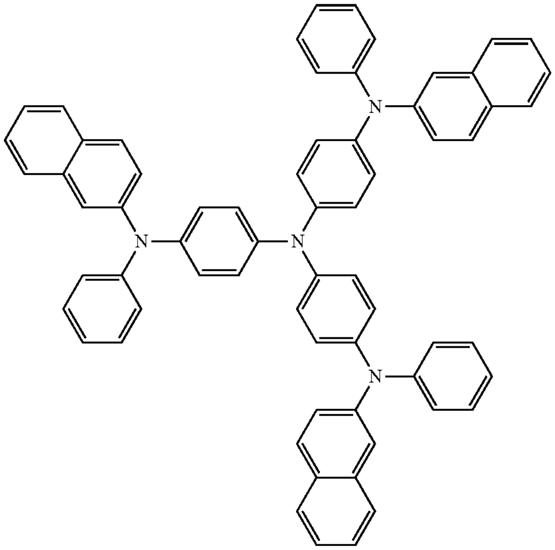
2-TNATA
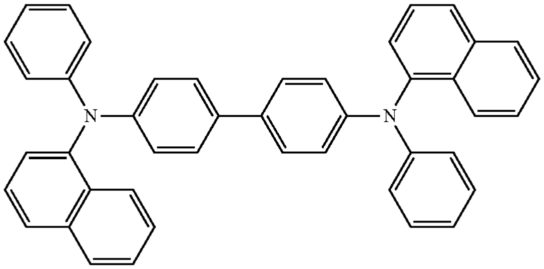
NPB
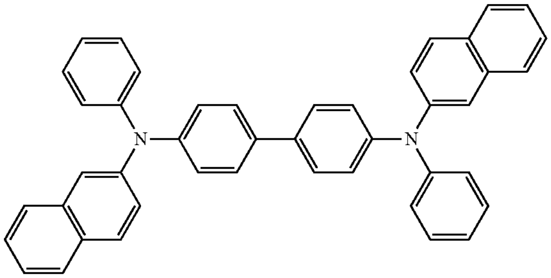
β-NPB
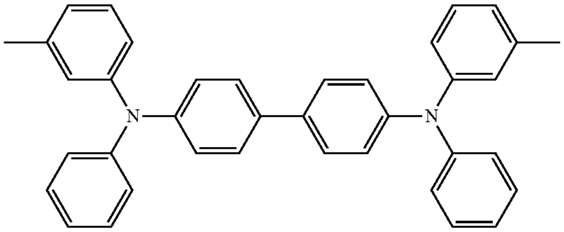
TPD
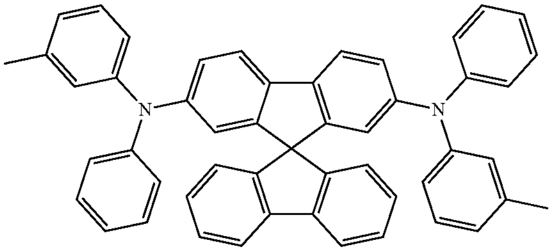
Spiro-TPD
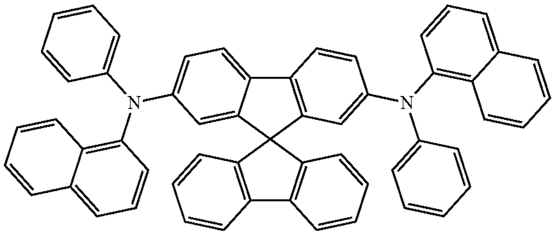
Spiro-NPB
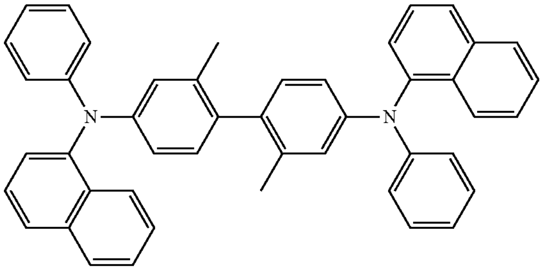
methylated-NPB -continued

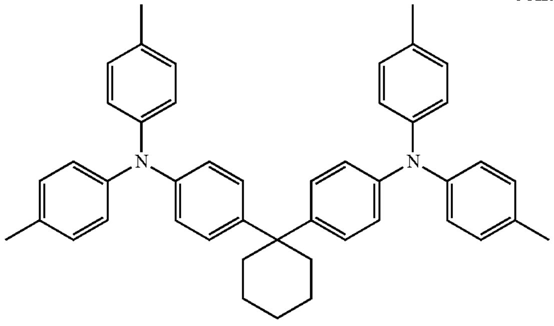

TAPC

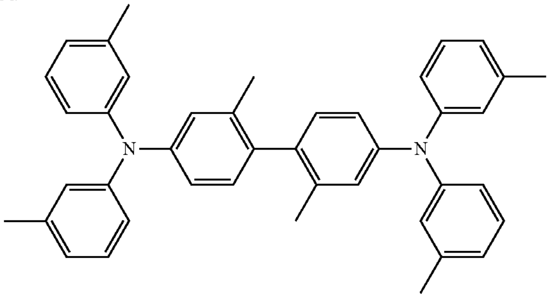

HMTPD

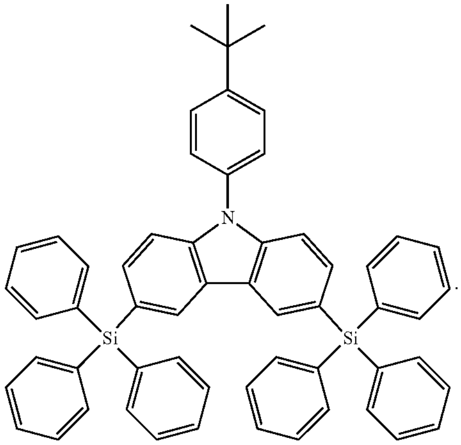

CzSi

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to a wavelength of light emitted by the emission layer, and the electron-blocking layer may block the leakage of electrons from the emission layer to the hole transport region. Materials that may be included in the hole transport region may be included in the emission auxiliary layer and the electron-blocking layer.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

For example, the p-dopant may have a lowest unoccupied molecular orbital (LUMO) energy level of less than or equal to about −3.5 eV.

In an embodiment, the p-dopant may include a quinone derivative, a cyano group-containing compound, a compound including element EL1 and element EL2, or any combination thereof.

Examples of the quinone derivative may include TCNQ, F4-TCNQ, and the like.

Examples of the cyano group-containing compound may include HAT-CN, a compound represented by Formula 221, and the like:

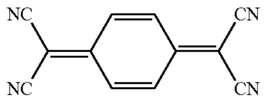

TCNQ

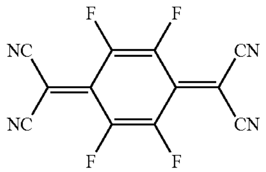

F4-TCNQ

-continued

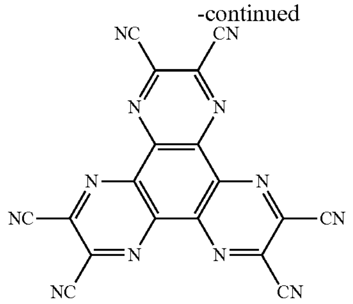

HAT-CN

[Formula 221]

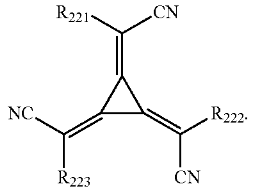

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound including element EL1 and element EL2, element EL1 may be a metal, a metalloid, or any combination thereof, and element EL2 may be a non-metal, a metalloid, or any combination thereof.

Examples of the metal may include an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.); and the like.

Examples of the metalloid may include silicon (Si), antimony (Sb), tellurium (Te), and the like.

Examples of the non-metal may include oxygen (O), a halogen (for example, F, Cl, Br, I, etc.), and the like.

Examples of the compound including element EL1 and element EL2 may include a metal oxide, a metal halide (for example, a metal fluoride, a metal chloride, a metal bromide, a metal iodide, etc.), a metalloid halide (for example, a metalloid fluoride, a metalloid chloride, a metalloid bromide, a metalloid iodide, etc.), a metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), rhenium oxide (for example, $ReO_3$, etc.), and the like.

Examples of the metal halide may include an alkali metal halide, an alkaline earth metal halide, a transition metal halide, a post-transition metal halide, a lanthanide metal halide, and the like.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, $BaI_2$, and the like.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), a gold halide (for example, AuF, AuCl, AuBr, AuI, etc.), and the like.

Examples of the post-transition metal halide may include a zinc halide (for example, $ZnF_2$, $ZnCl_2$, $ZnBr_2$, $ZnI_2$, etc.), an indium halide (for example, $InI_3$, etc.), a tin halide (for example, $SnI_2$, etc.), and the like.

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$ $SmBr_3$, YbI, $YbI_2$, $YbI_3$, $SmI_3$, and the like.

Examples of the metalloid halide may include an antimony halide (for example, $SbCl_5$, etc.) and the like.

Examples of the metal telluride may include an alkali metal telluride (for example, $Li_2Te$, a $na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), a lanthanide metal telluride (for example, LaTe, CeTe, PrTe, NdTe, PmTe, EuTe, GdTe, TbTe, DyTe, HoTe, ErTe, TmTe, YbTe, LuTe, etc.), and the like.

[Emission Layer in Interlayer 130]

When the light-emitting device 10 is a full-color light-emitting device, the emission layer may be patterned into a red emission layer, a green emission layer, and/or a blue emission layer, according to a subpixel. In an embodiment, the emission layer may have a stacked structure of two or more layers of a red emission layer, a green emission layer, and a blue emission layer, in which the two or more layers may contact each other or may be separated from each other to emit white light. In embodiments, the emission layer may include two or more materials of a red light-emitting material, a green light-emitting material, and a blue light-emitting material, in which the two or more materials may be mixed with each other in a single layer to emit white light.

The emission layer may include a host and a dopant. The dopant may include a phosphorescent dopant, a fluorescent dopant, or any combination thereof.

In the emission layer, an amount of the dopant may be in a range of about 0.01 parts by weight to about 15 parts by weight, based on 100 parts by weight of the host.

In embodiments, the emission layer may include a quantum dot.

In embodiments, the emission layer may include a delayed fluorescence material. The delayed fluorescence material may serve as a host or as a dopant in the emission layer.

A thickness of the emission layer may be in a range of about 100 Å to about 1,000 Å. For example, the thickness of the emission layer may be in a range of about 200 Å to about 600 Å. When the thickness of the emission layer is within these ranges, excellent luminescence characteristics may be obtained without a substantial increase in driving voltage.

[Host]

In an embodiment, the host may include a first compound and a second compound.

In embodiments, the host may include a compound represented by Formula 301:

$$[Ar_{301}]_{xb11}\text{-}[(L_{301})_{xb1}\text{-}R_{301}]_{xb21} \qquad \text{[Formula 301]}$$

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer from 1 to 5, and $Q_{301}$ to $Q_{303}$ may each independently be the same as defined in connection with $Q_1$.

In an embodiment, in Formula 301, when xb11 is 2 or more, two or more of $Ar_{301}$(s) may be bonded to each other via a single bond.

In embodiments, the host may include a compound represented by Formula 301-1, a compound represented by Formula 301-2, or any combination thereof:

[Formula 301-1]

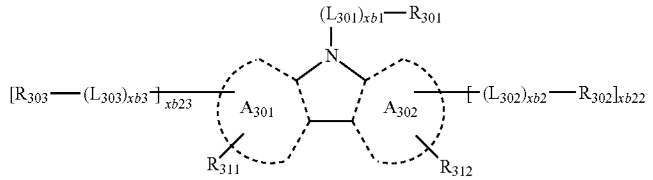

[Formula 301-2]

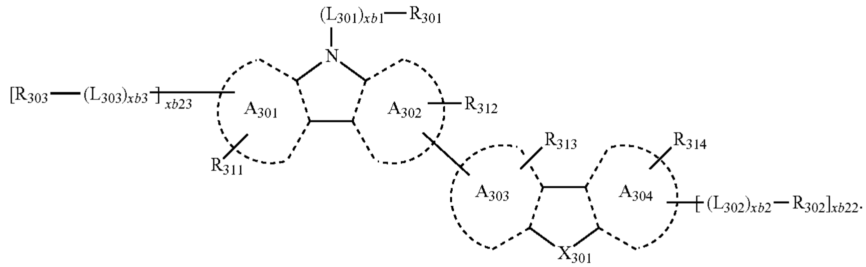

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-$[(L_{304})_{xb4}$-$R_{304}]$, $C(R_{304})(R_{305})$, or $Si(R_{304})(R_{305})$, xb22 and xb23 may each independently be 0, 1, or 2, $L_{301}$, xb1, and $R_{301}$ may each be the same as described herein, $L_{302}$ to $L_{304}$ may each independently be the same as defined in connection with $L_{301}$, xb2 to xb4 may each independently be the same as defined in connection with xb1, and $R_{302}$ to $R_{305}$ and $R_{311}$ to $R_{314}$ may each independently be the same as defined in connection with $R_{301}$.

In embodiments, the host may include an alkali earth metal complex, a post-transition metal complex, or any combination thereof. For example, the host may include a Be complex (for example, Compound H55), an Mg complex, a Zn complex, or any combination thereof.

In embodiments, the host may include one of Compounds H1 to H131, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:
H1
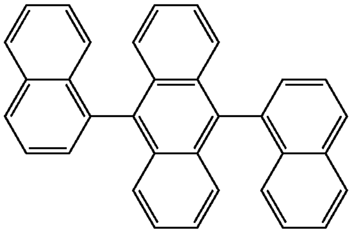
H2
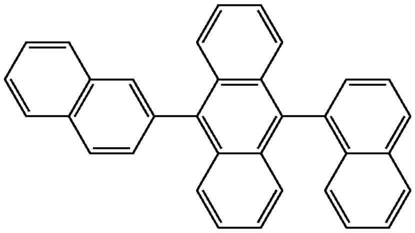
H3
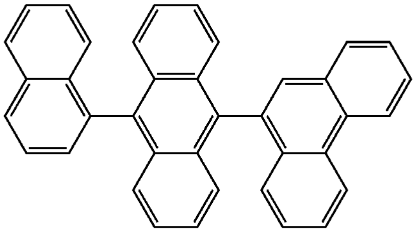
H4
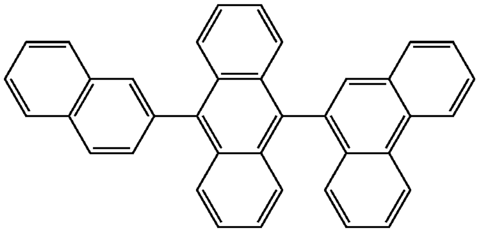
H5
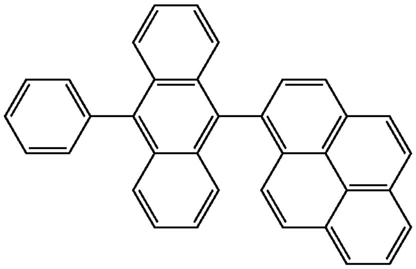
H6
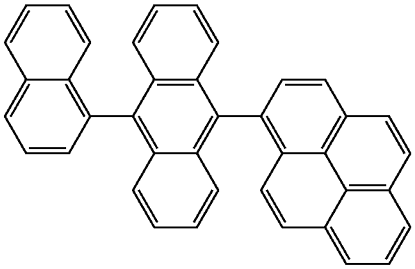
H7
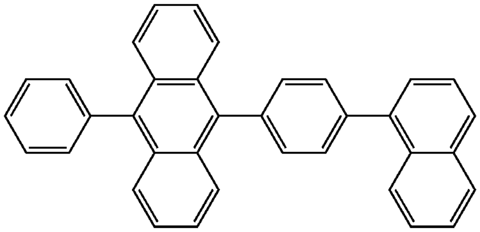
H8
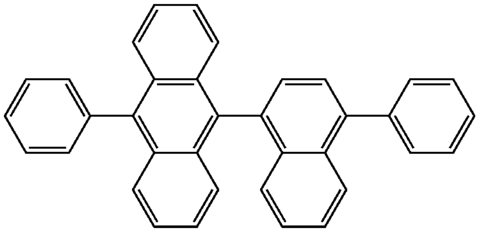
H9
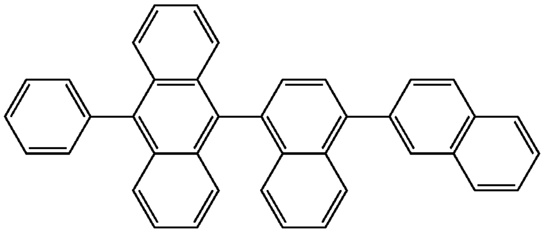
H10
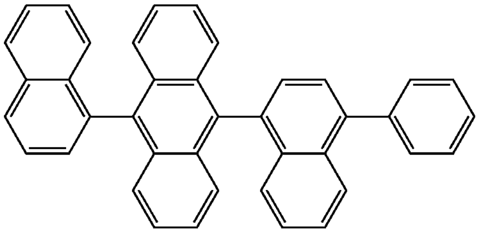

-continued
H11
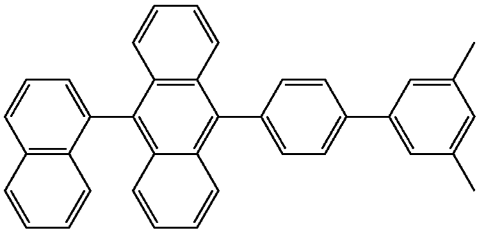
H12
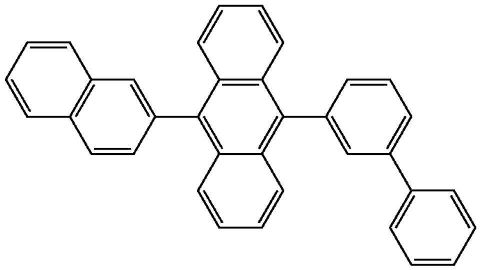
H13
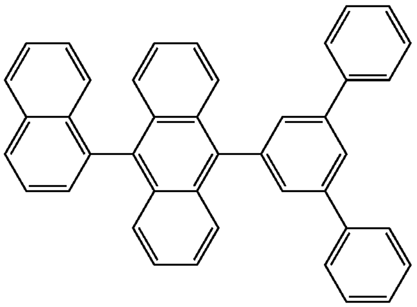
H14
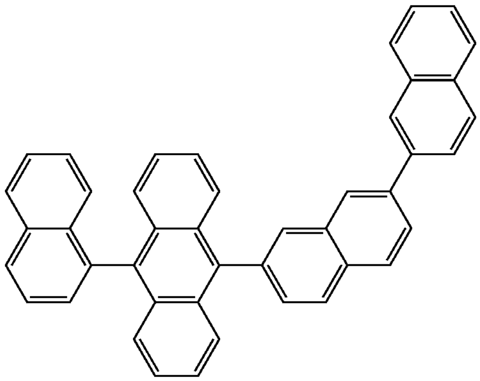
H15
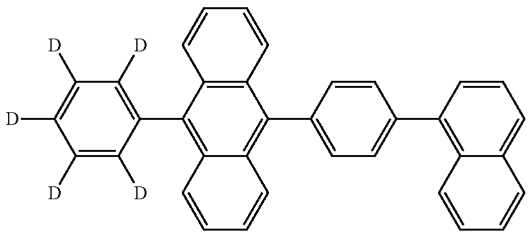
H16
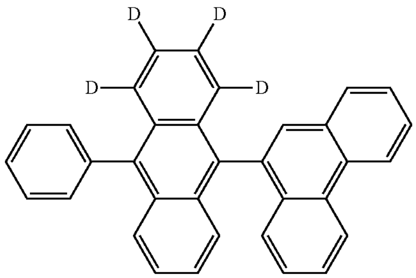
H17
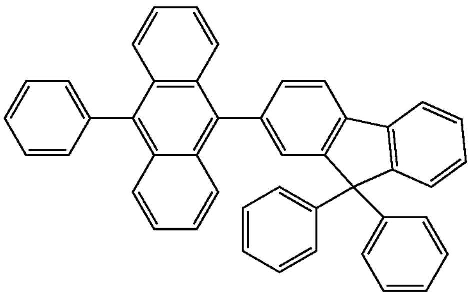
H18
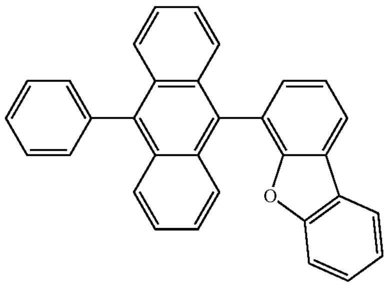
H19
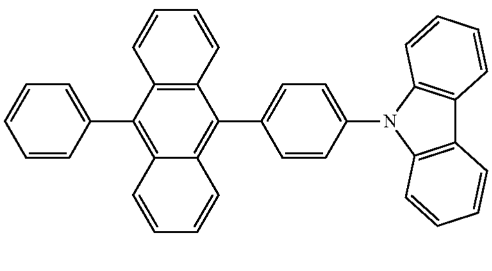
H20
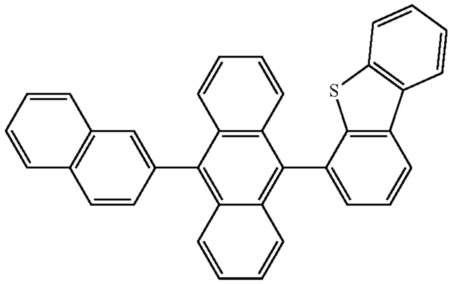

-continued
H21
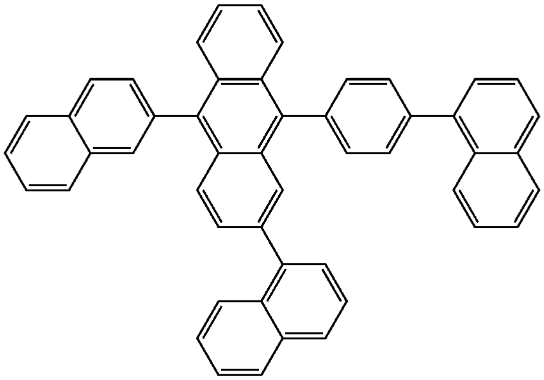
H22
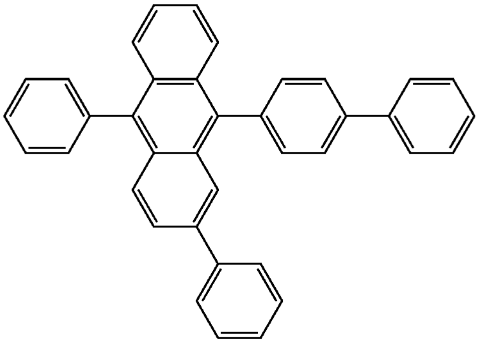
H23
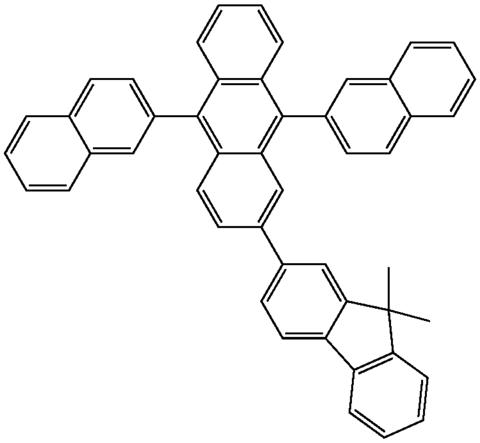
H24
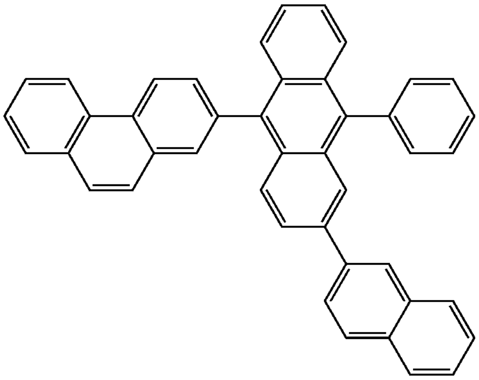
H25
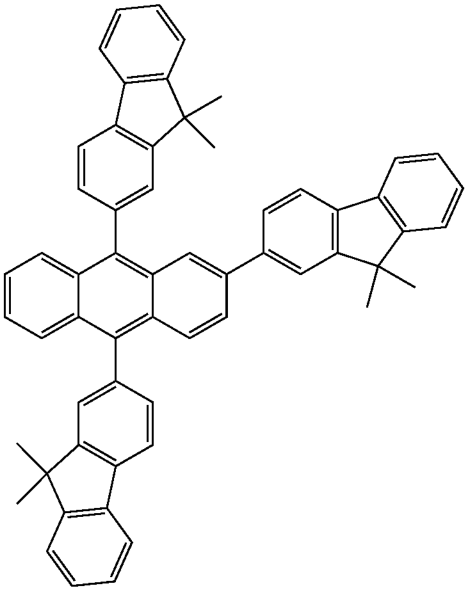
H26
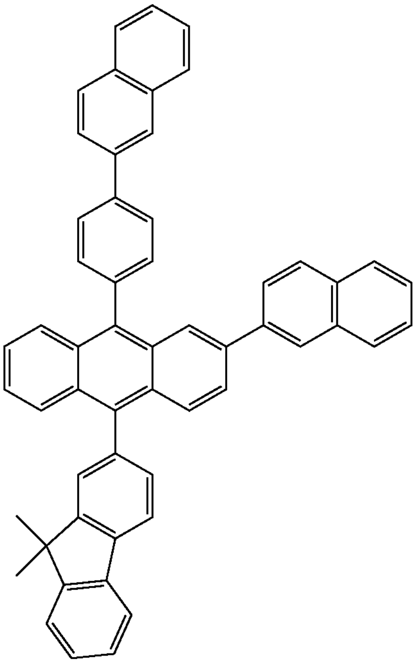

-continued
H27
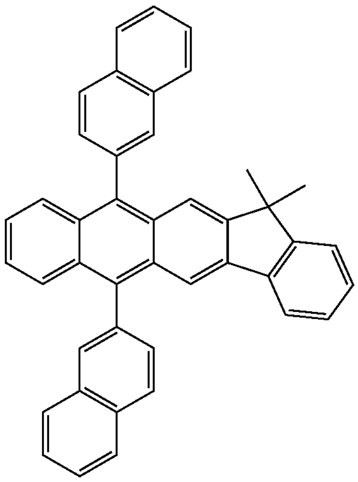
H28
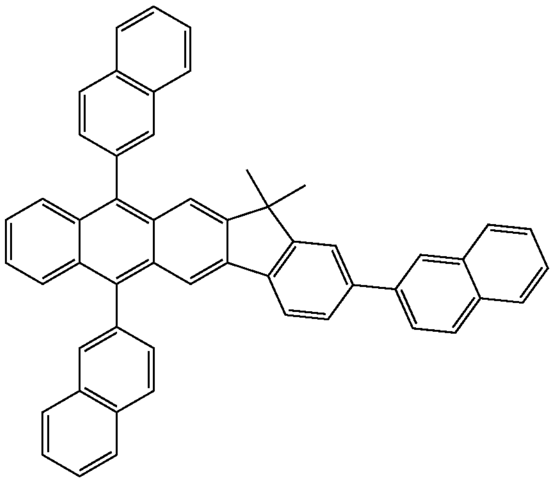
H29
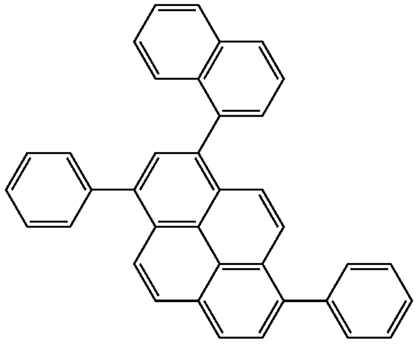
H30
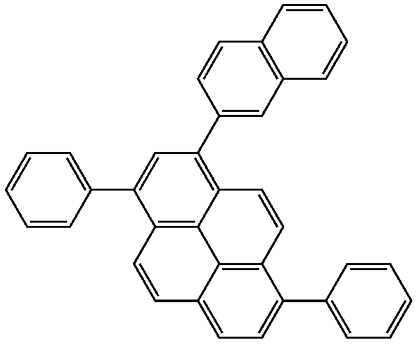
H31
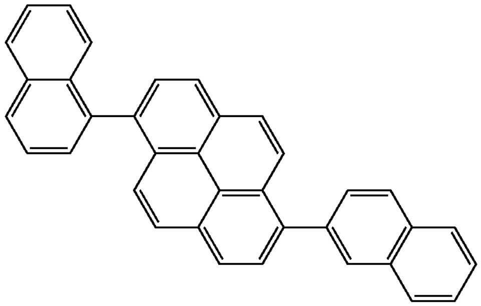
H32
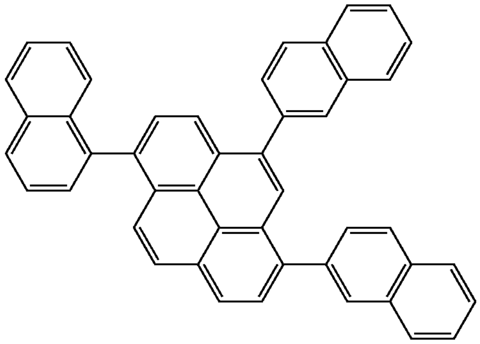
H33
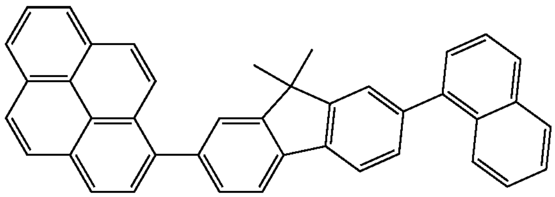
H34
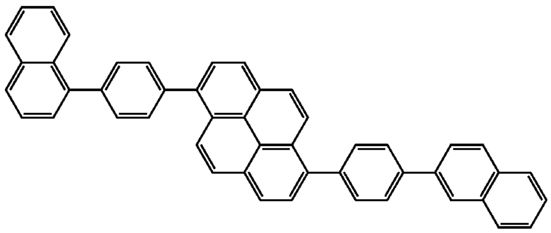

-continued
H35
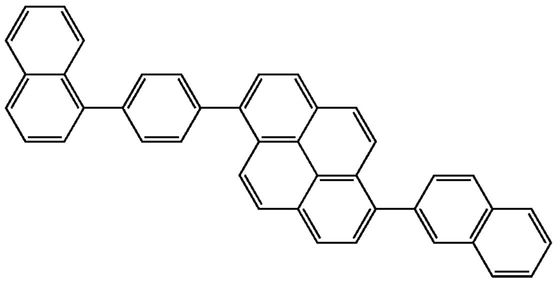
H36
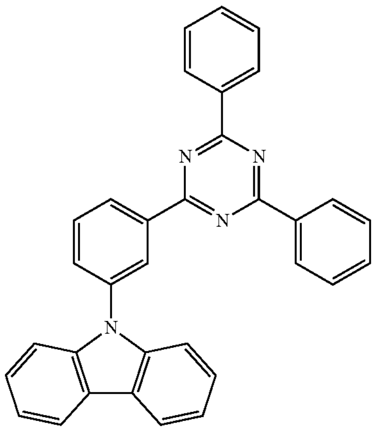
H37
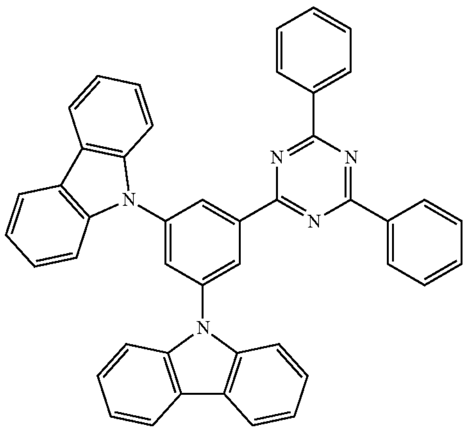
H38
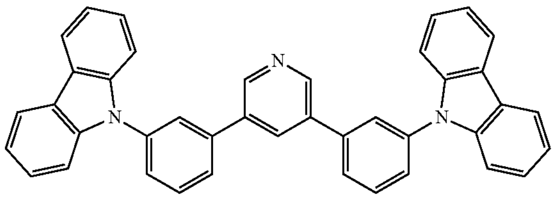
H39
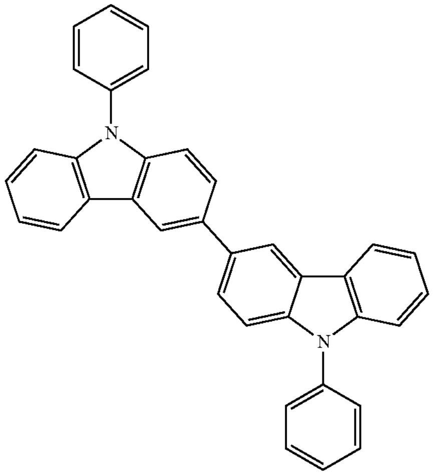
H40
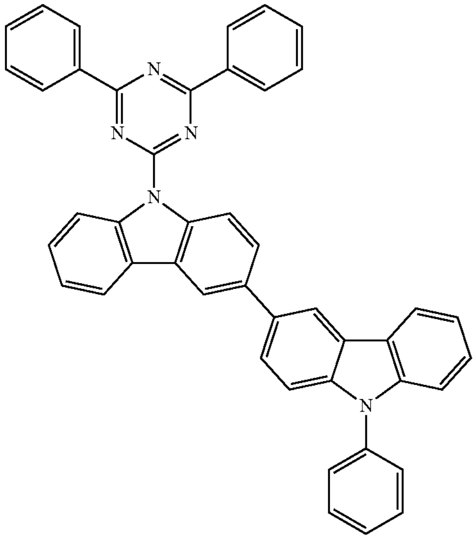

-continued
H41
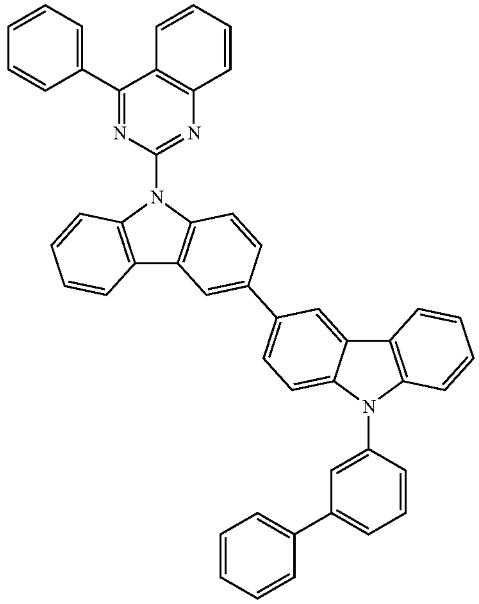
H42
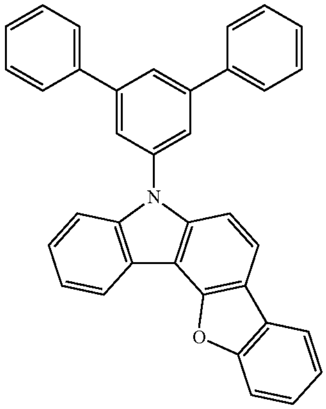
H43
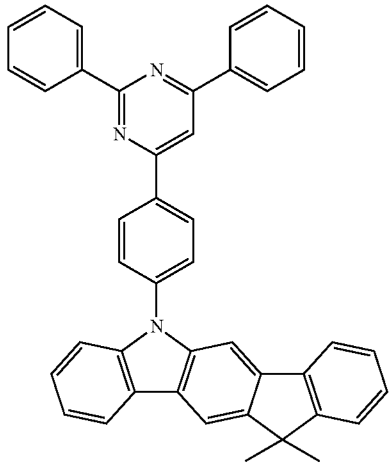
H44
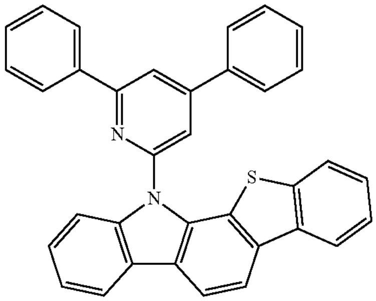
H45
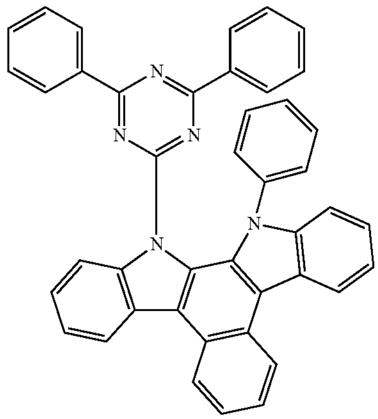
H46
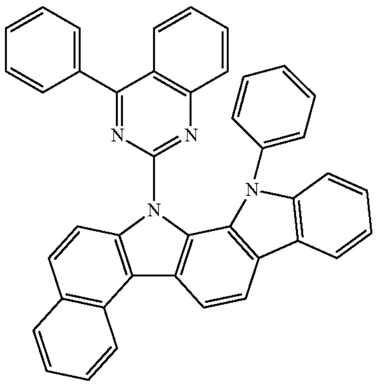

-continued
H47
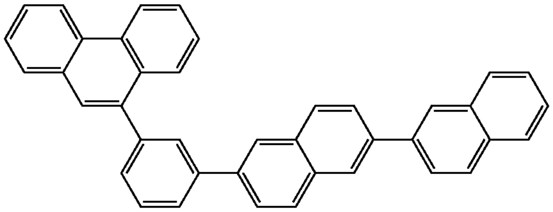
H48
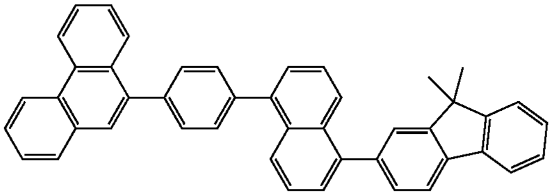
H49
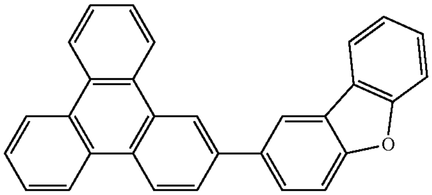
H50
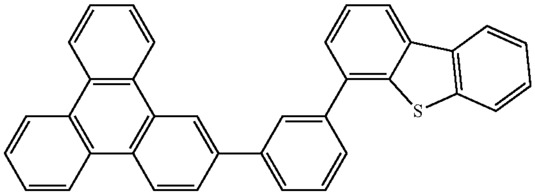
H51
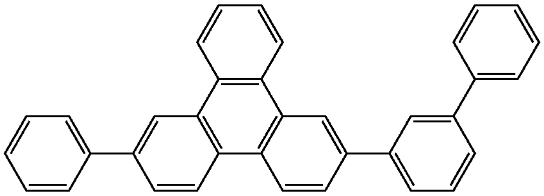
H52
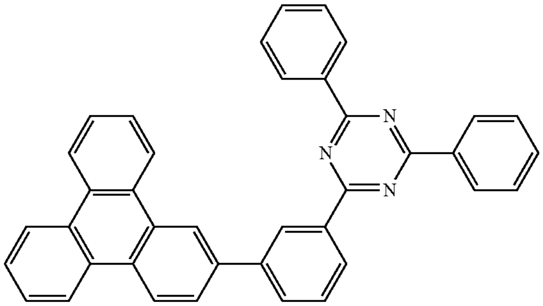
H53
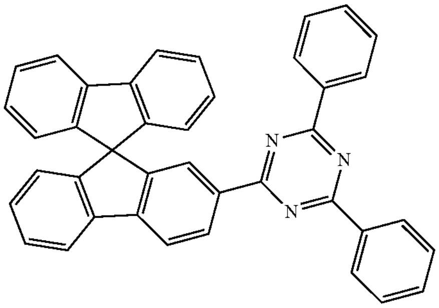
H54
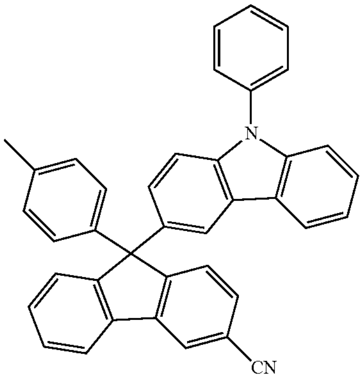
H55
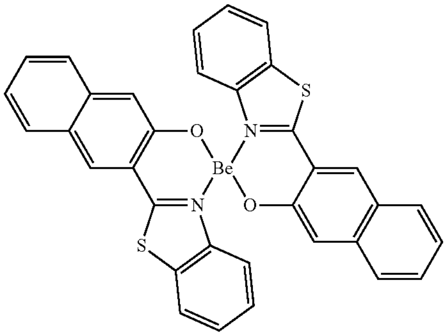
H56
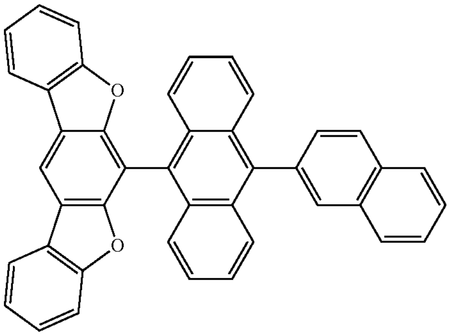

-continued
H57
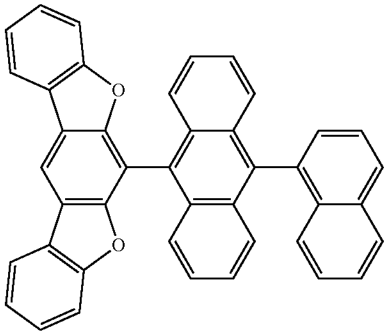
H58
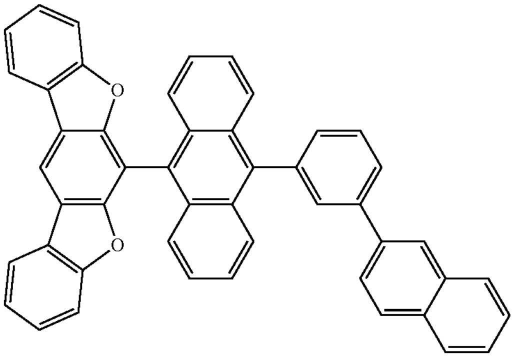
H59
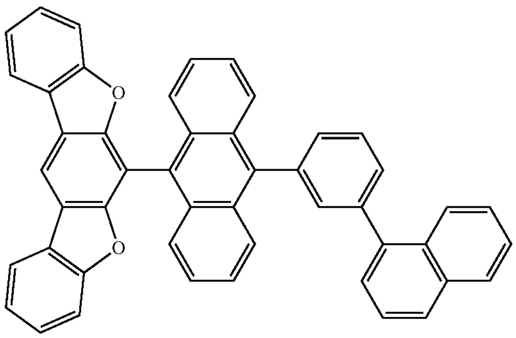
H60
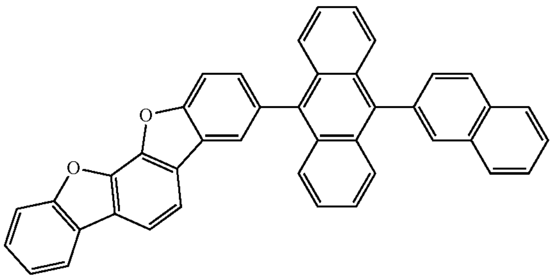
H61
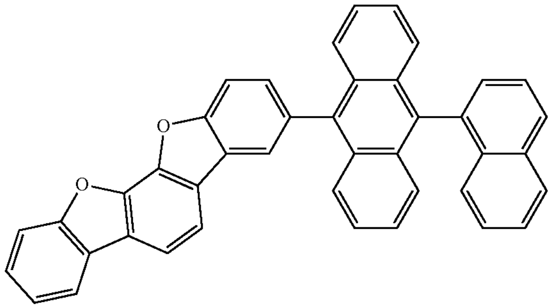
H62
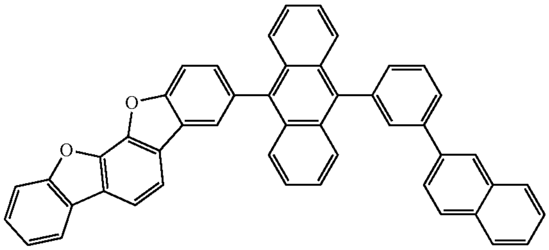
H63
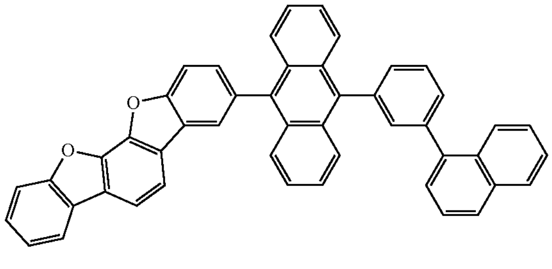
H64
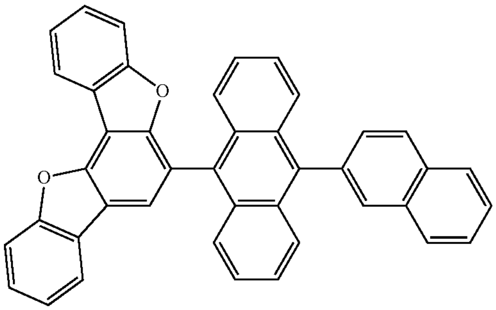

-continued
H65
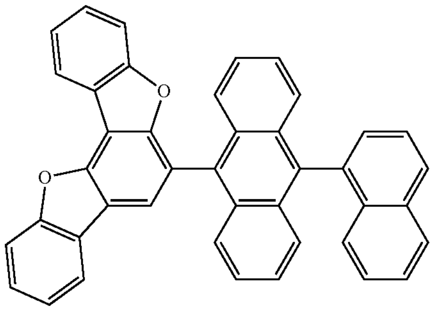
H66
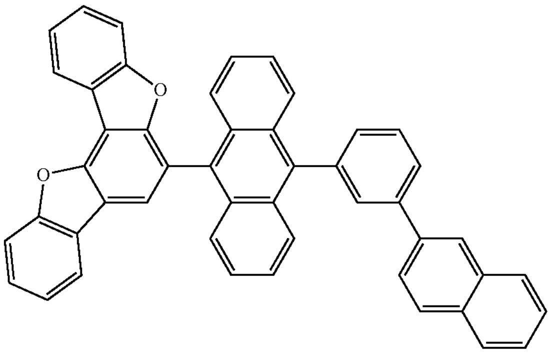
H67
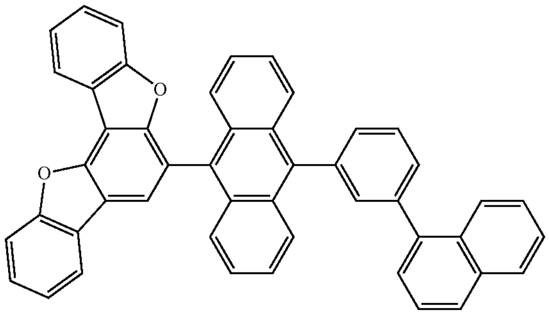
H68
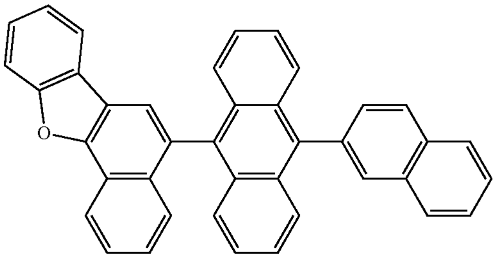
H69
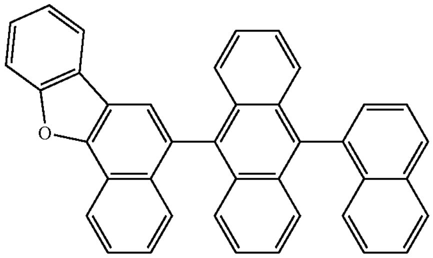
H70
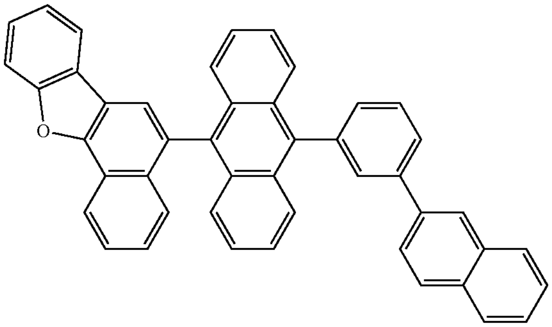
H71
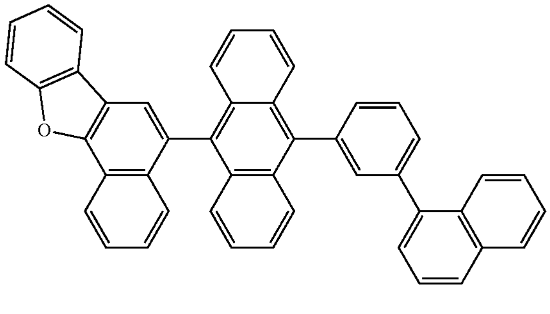
H72
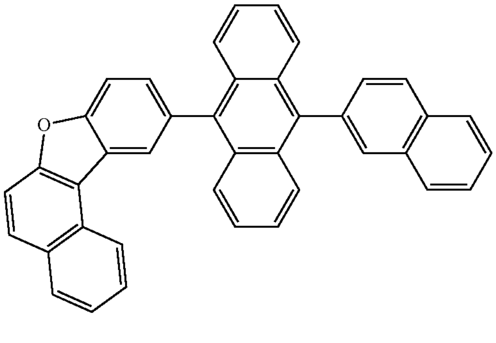

-continued
H73
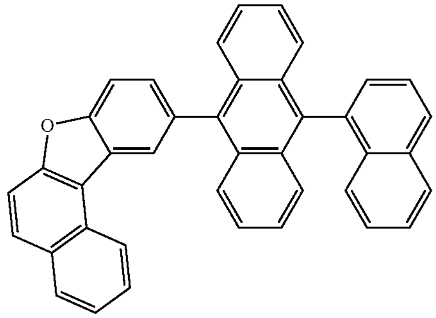
H74
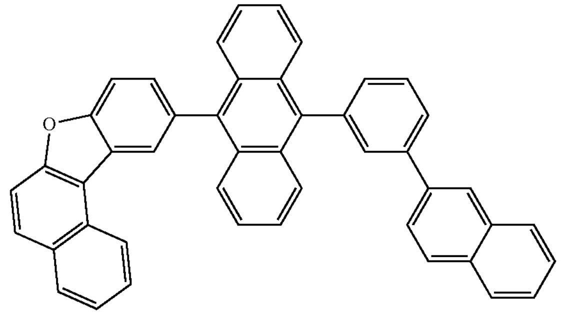
H75
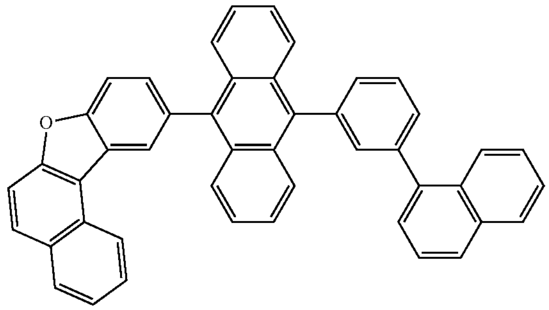
H76
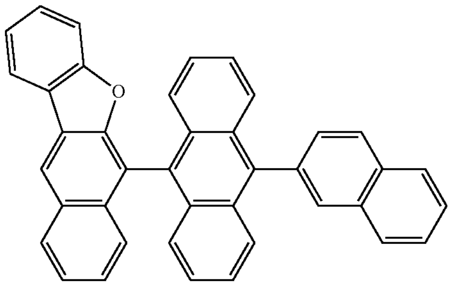
H77
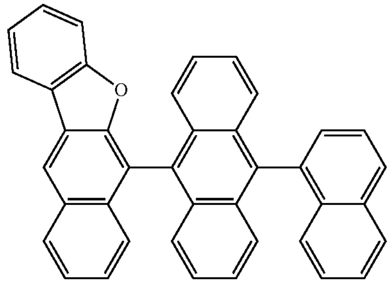
H78
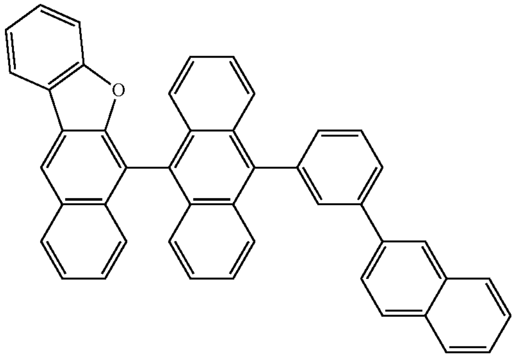
H79
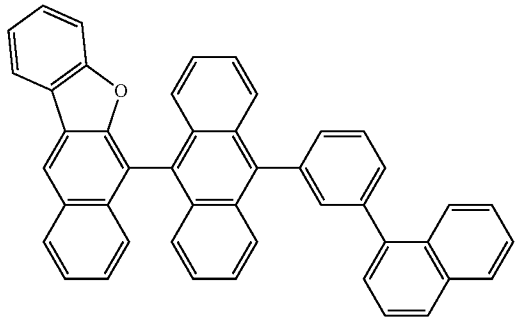
H80
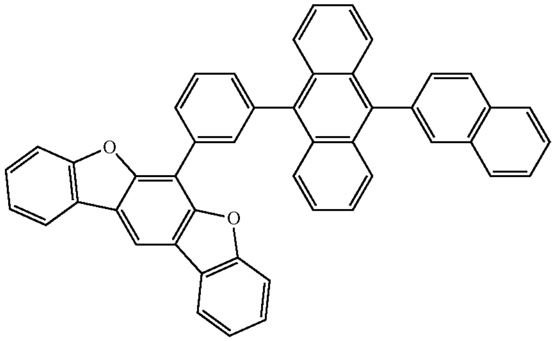

-continued
H81
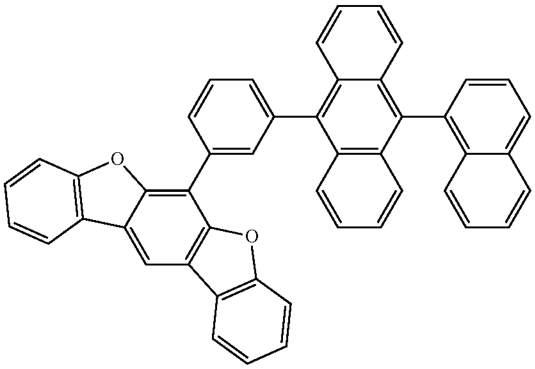
H82
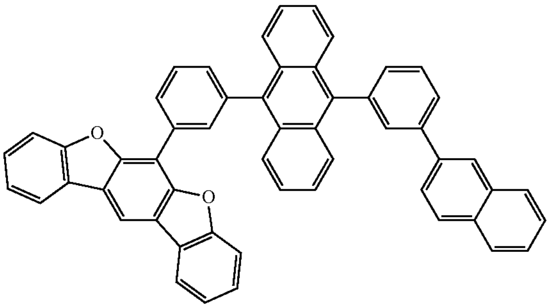
H83
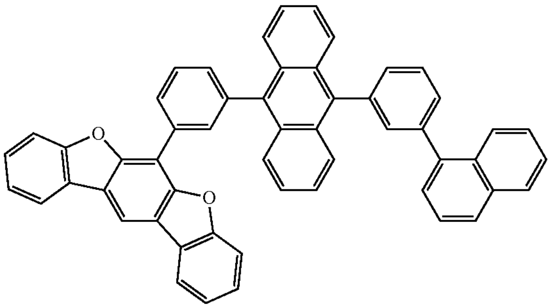
H84
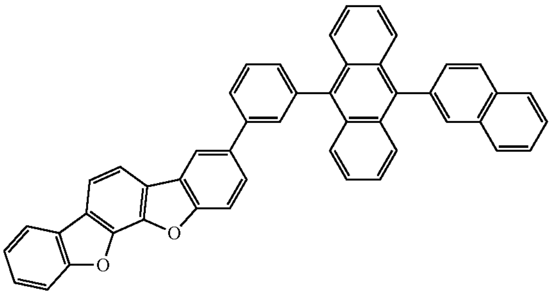
H85
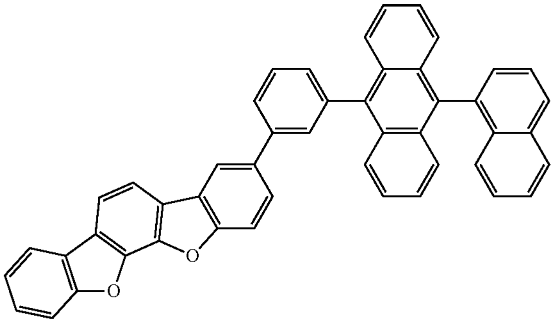
H86
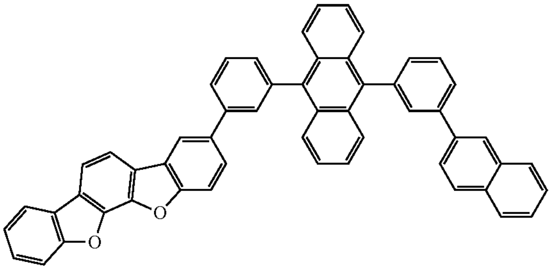
H87
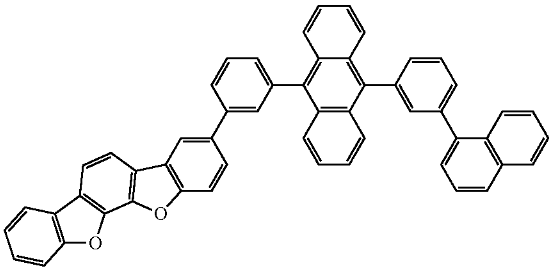
H88
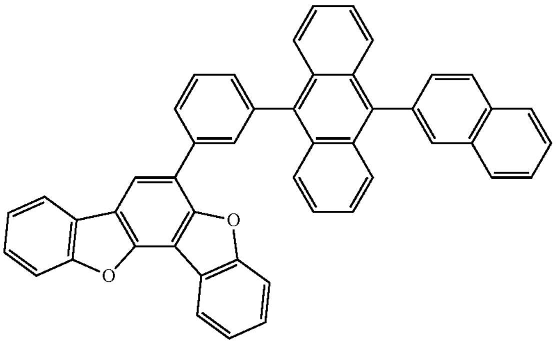

-continued
H89
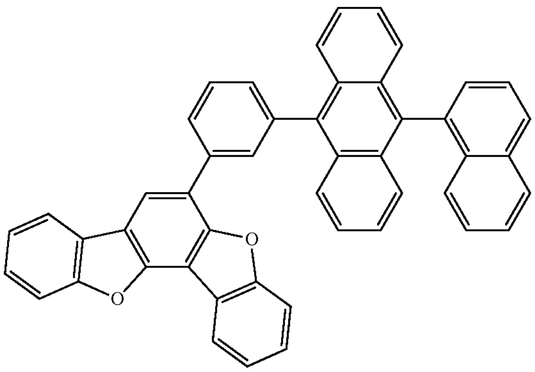
H90
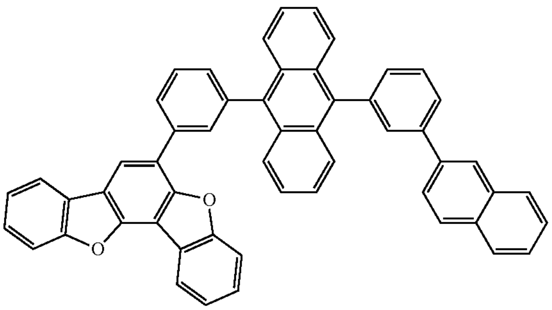
H91
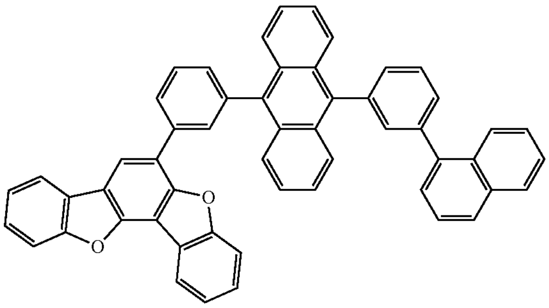
H92
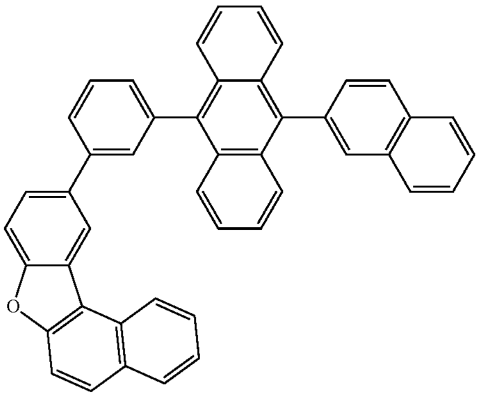
H93
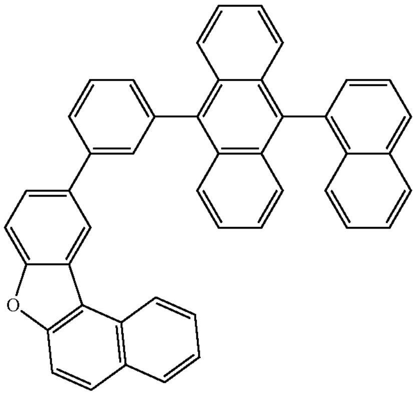
H94
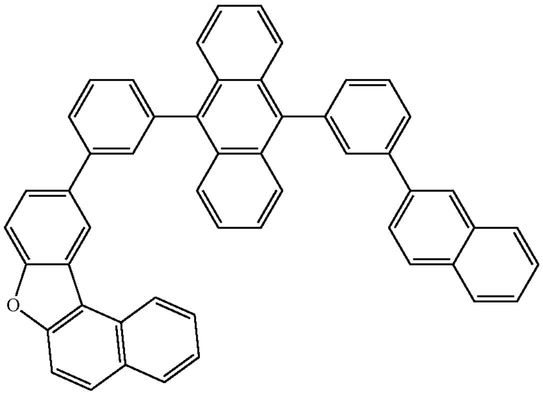
H95
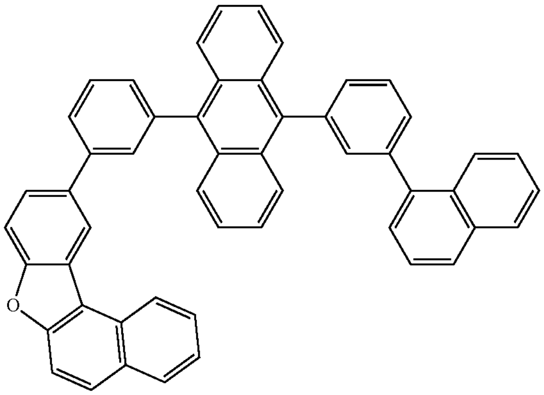
H96
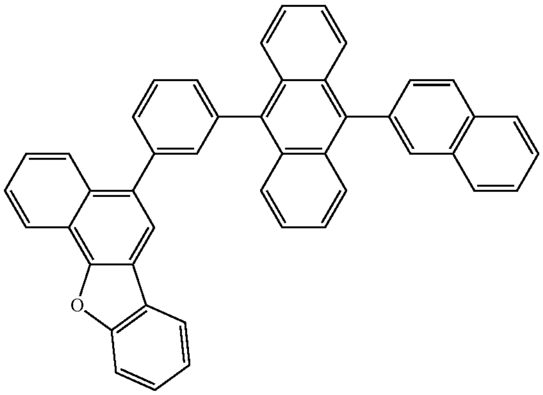

-continued
H97
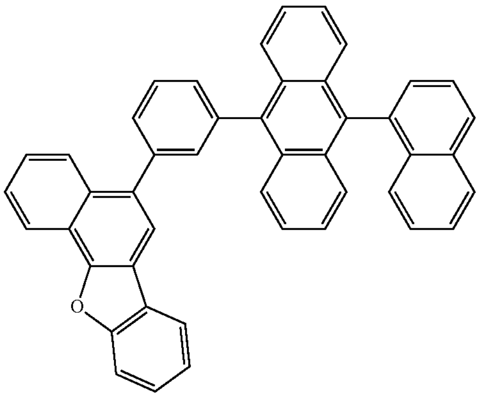
H98
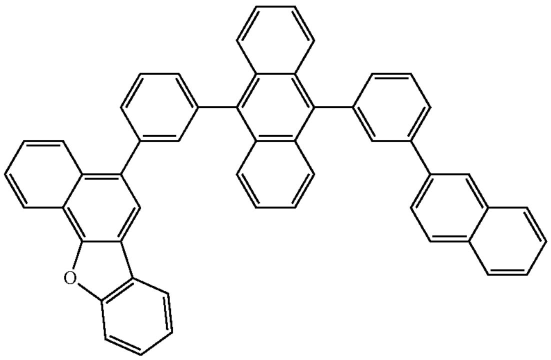
H99
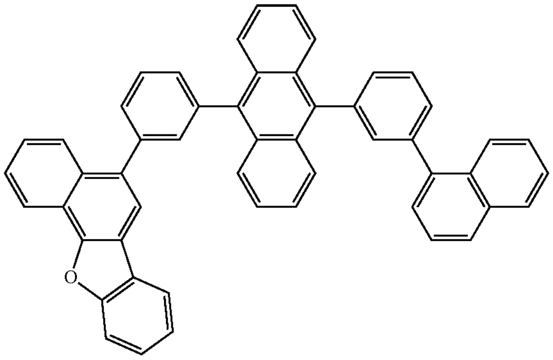
H100
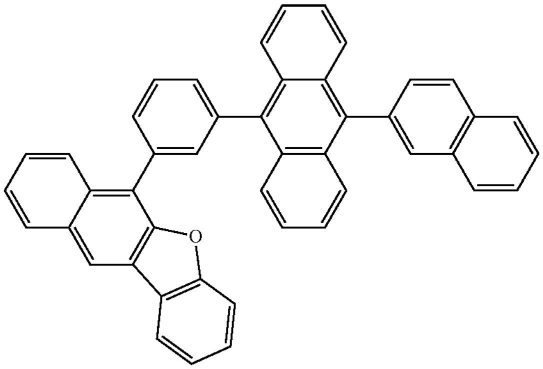
H101
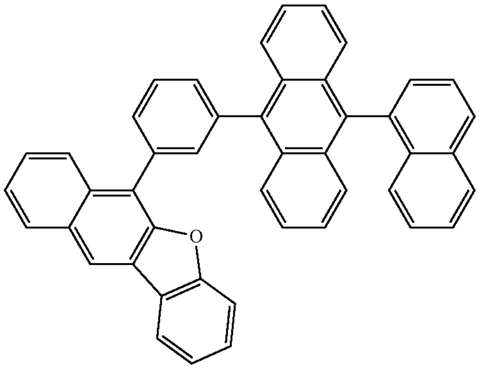
H102
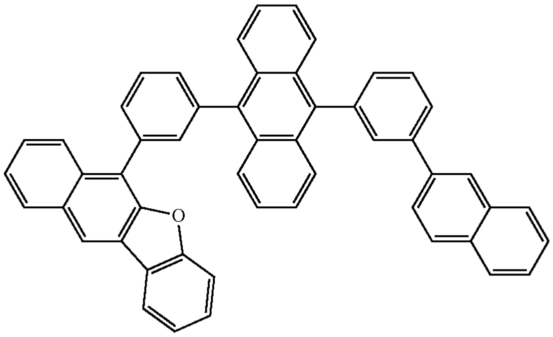

-continued
H103
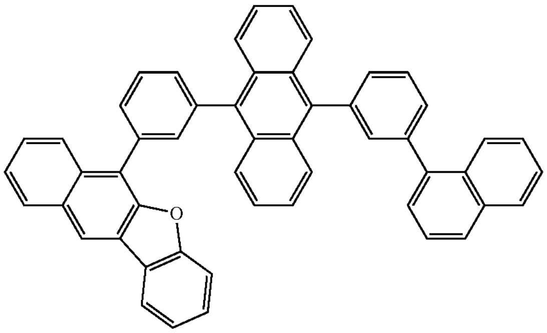
H104
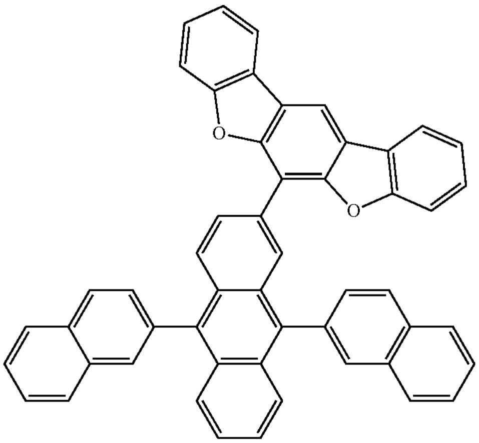
H105
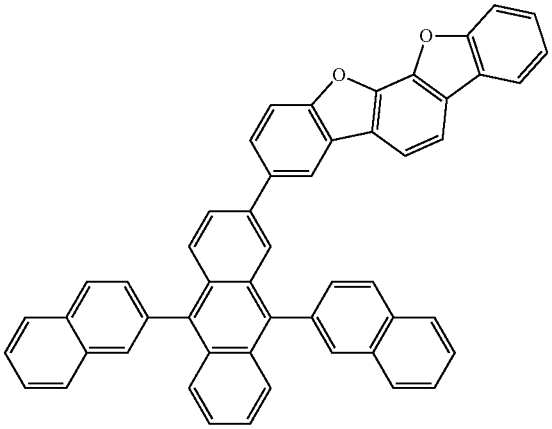
H106
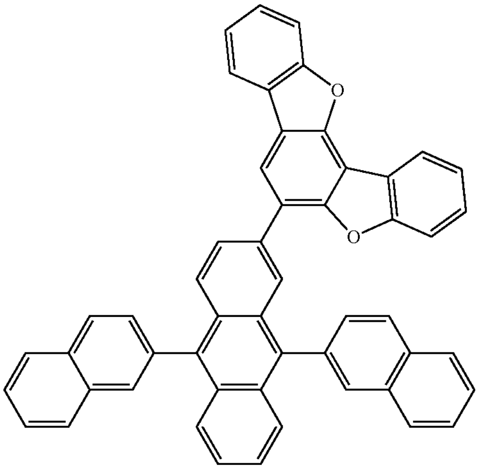
H107
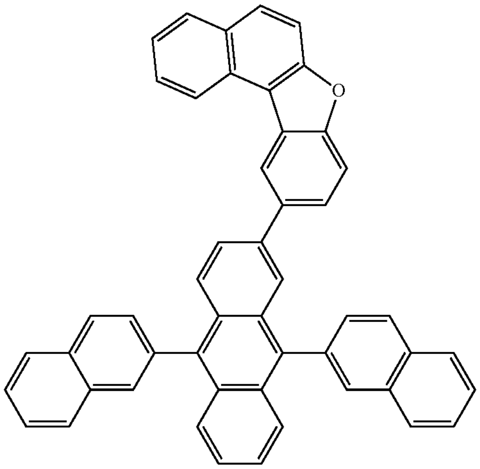
H108
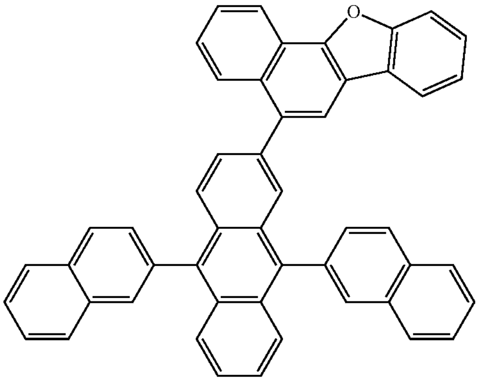

-continued
H109
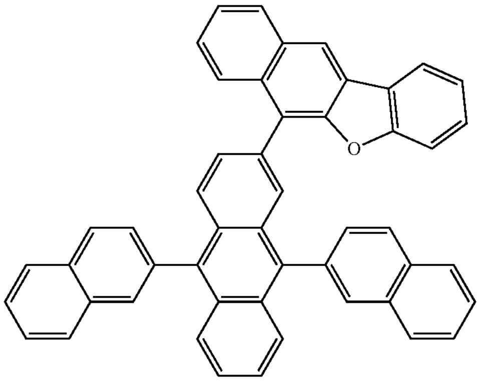
H110
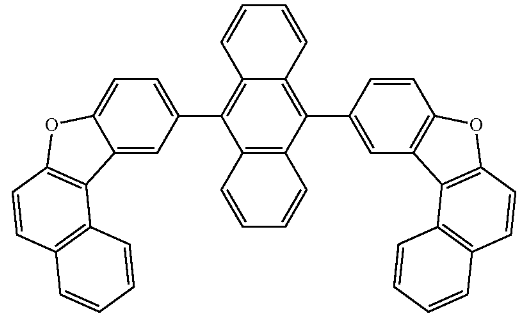
H111
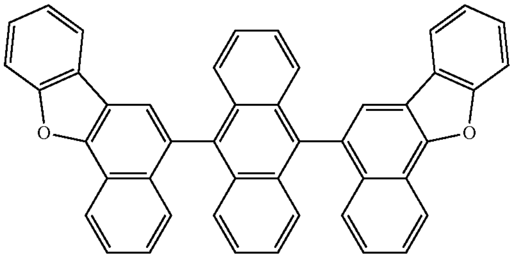
H112
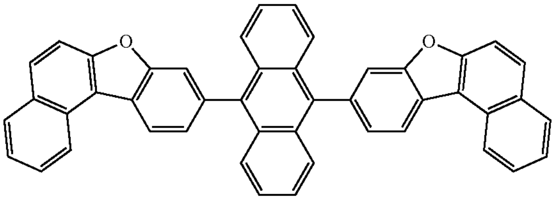
H113
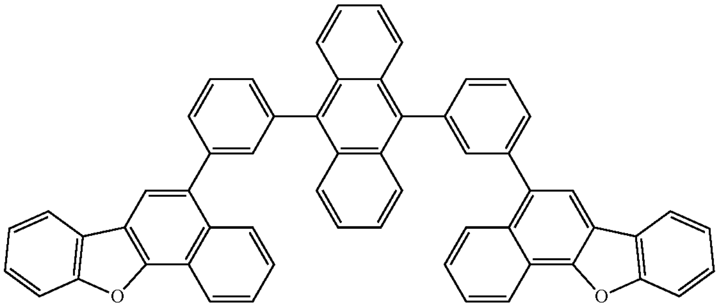
H114
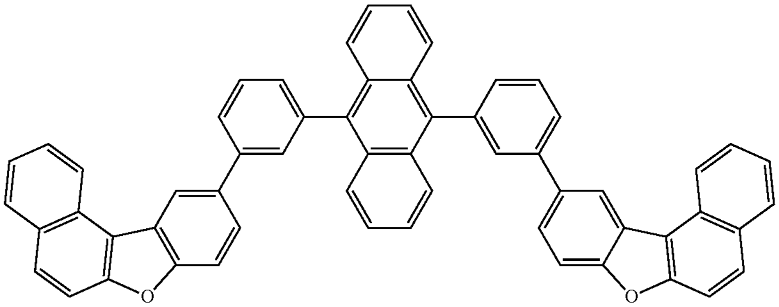

-continued
H115
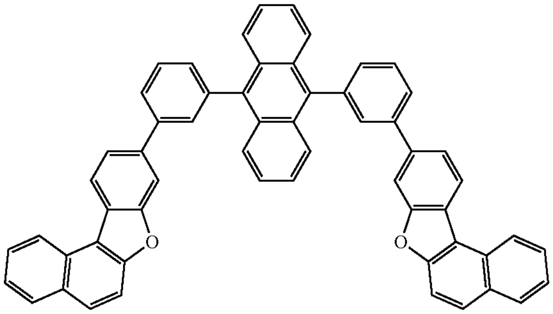
H116
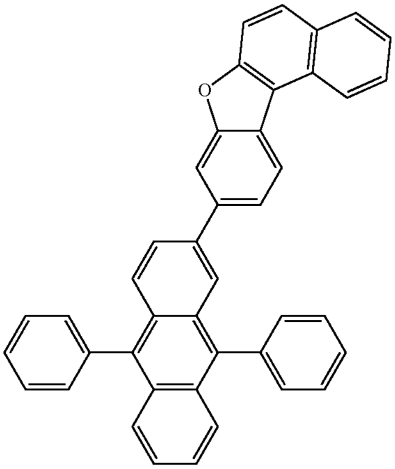
H117
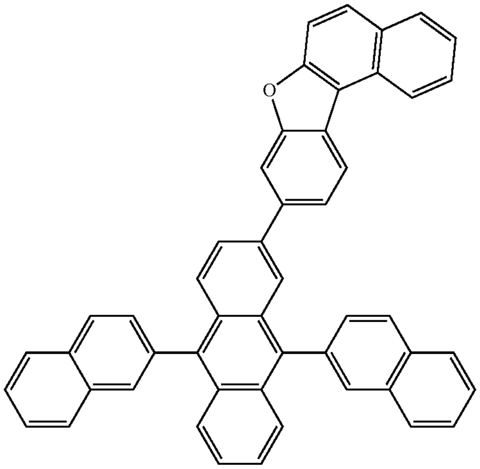
H118
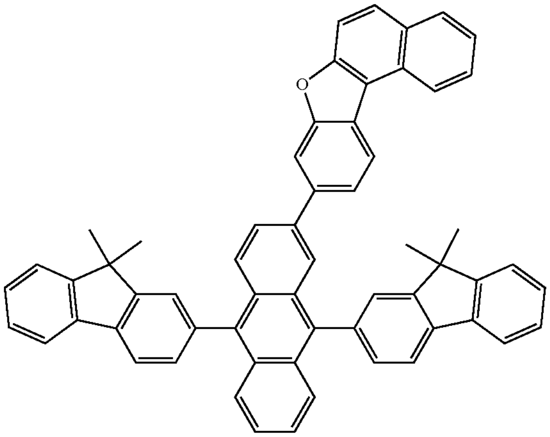
H119
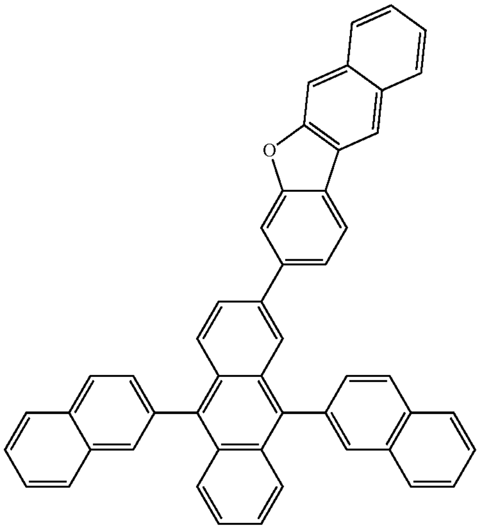
H120
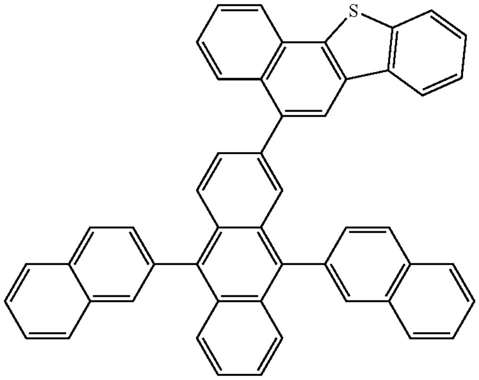

-continued
H121
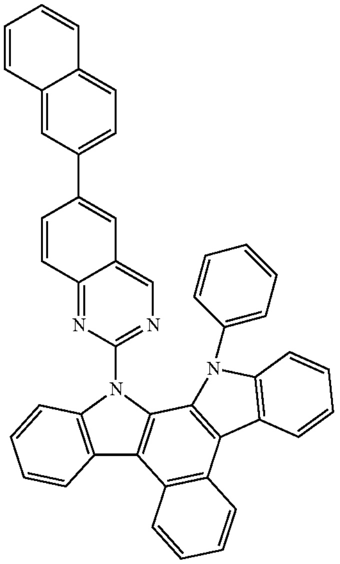
H122
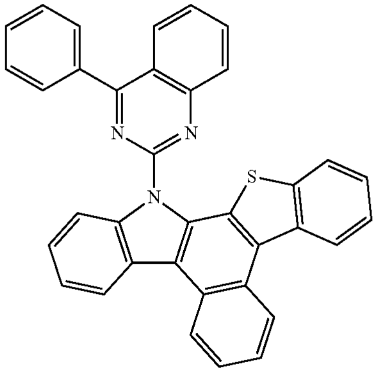
H123
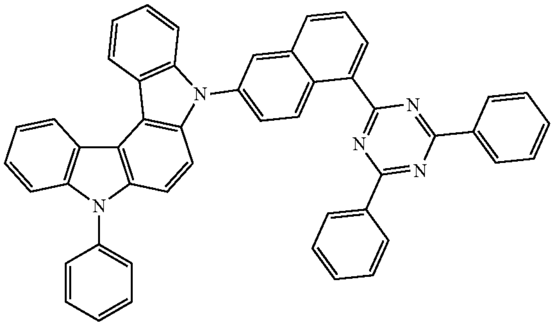
H124
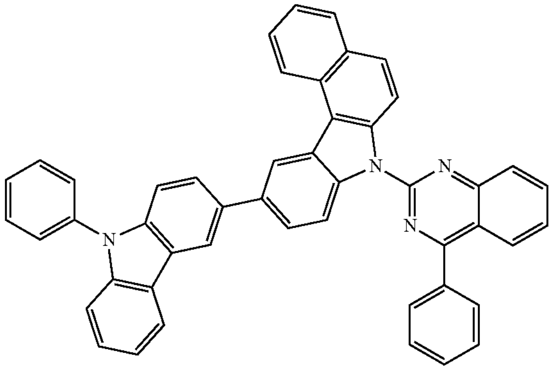
H125
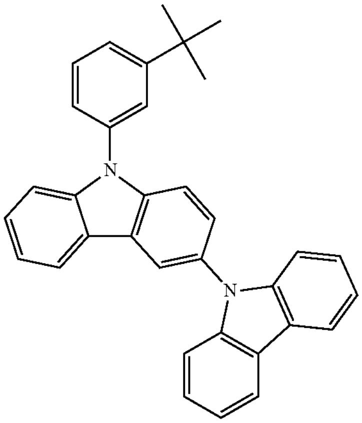
H126
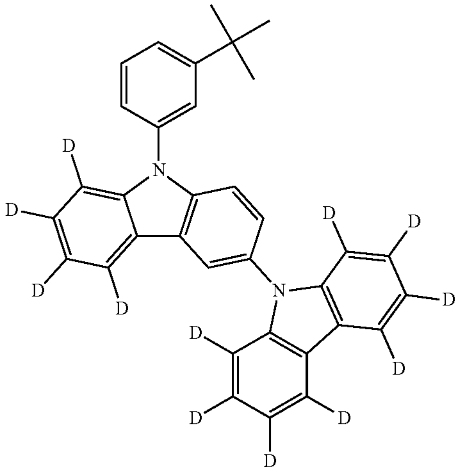

-continued
H127
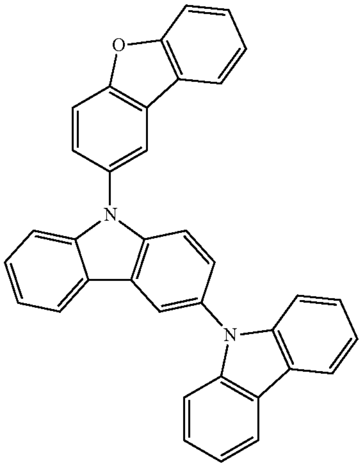
H128
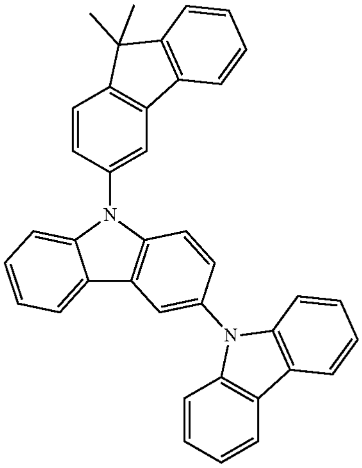
H129
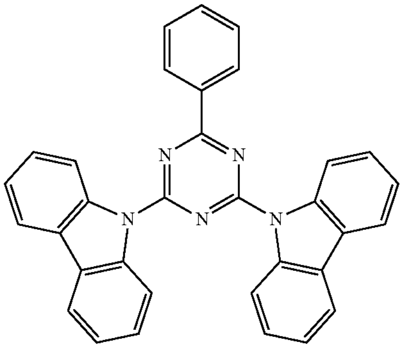
H130
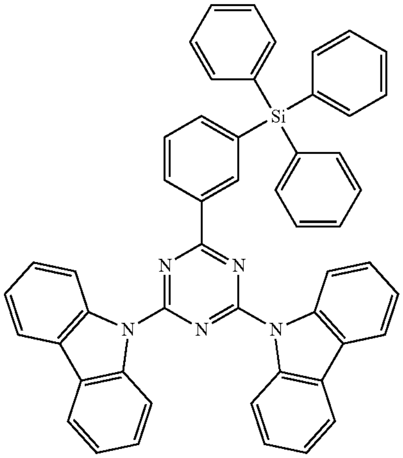
H131
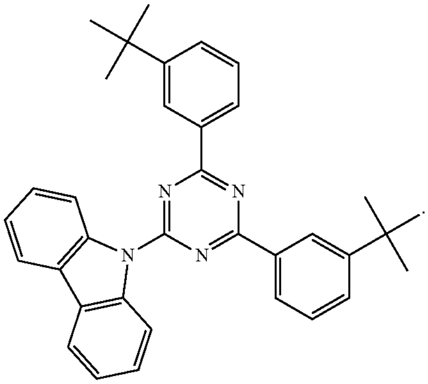

[Phosphorescent Dopant]

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In embodiments, the phosphorescent dopant may include an organometallic compound represented by Formula 401:

[Formula 401]

$M(L_{401})_{xc1}(L_{402})_{xc2}$

[Formula 402]

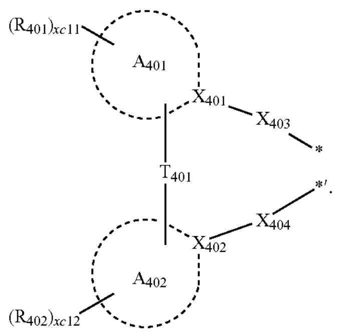

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is 2 or more, two or more of $L_{401}$(s) may be identical to or different from each other, $L_{402}$ may be an organic ligand, and xc2 may be 0, 1, 2, 3, or 4, wherein when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordination bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as defined in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as defined in connection with $Q_1$, xc11 and xc12 may each independently be an integer from 0 to 10, and

* and *' in Formula 402 each indicate a binding site to M in Formula 401.

For example, in Formula 402, $X_{401}$ may be nitrogen and $X_{402}$ may be carbon, or each of $X_{401}$ and $X_{402}$ may be nitrogen.

In embodiments, in Formula 401, when xc1 is 2 or more, two ring $A_{401}$(s) in two or more of $L_{401}$(s) may be optionally linked to each other via $T_{402}$, which is a linking group, or two ring $A_{402}$(s) may be optionally linked to each other via $T_{403}$, which is a linking group (see Compounds PD1 to PD4 and PD7). $T_{402}$ and $T_{403}$ may each independently be the same as defined in connection with $T_{401}$.

In Formula 401, $L_{402}$ may be an organic ligand. For example, $L_{402}$ may include a halogen group, a diketone group (for example, an acetylacetonate group), a carboxylic acid group (for example, a picolinate group), —C(=O), an isonitrile group, a —CN group, a phosphorus group (for example, a phosphine group, a phosphite group, etc.), or any combination thereof.

The phosphorescent dopant may be, for example, one of Compounds PD1 to PD41, or any combination thereof:

PD1

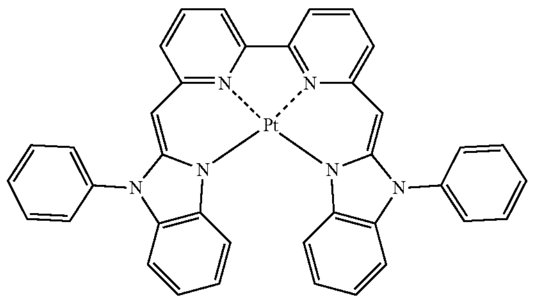

PD2

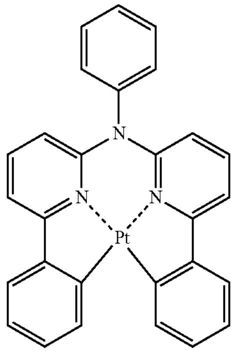

PD3

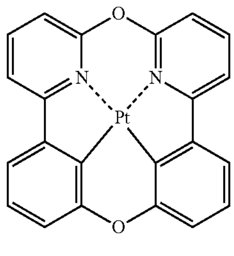

-continued
PD4
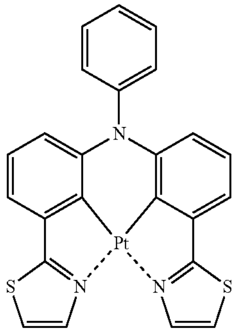
PD5
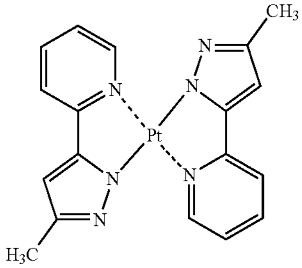
PD6
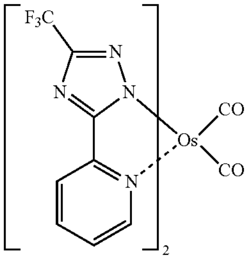
PD7
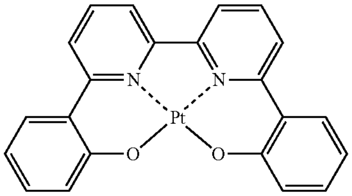
PD8
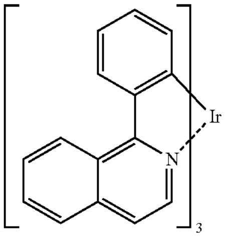
PD9
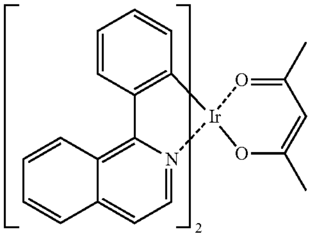
-continued
PD10
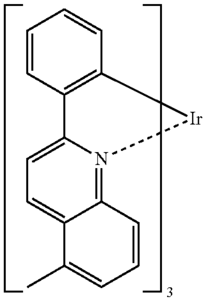
PD11
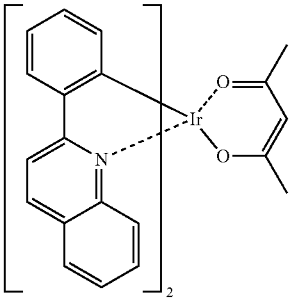
PD12
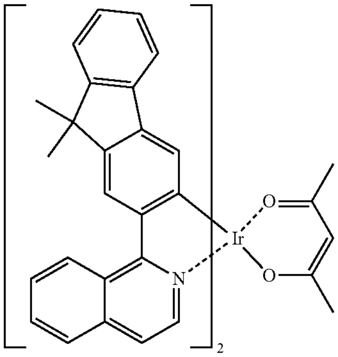
PD13
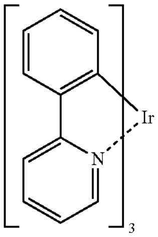
PD14
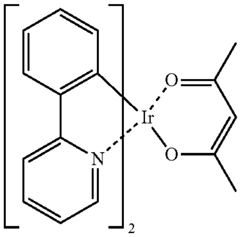

-continued
PD15
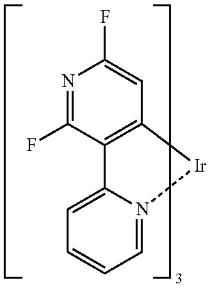
PD16
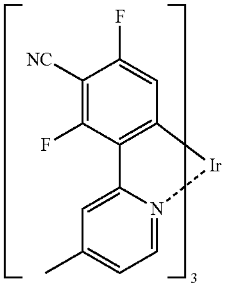
PD17
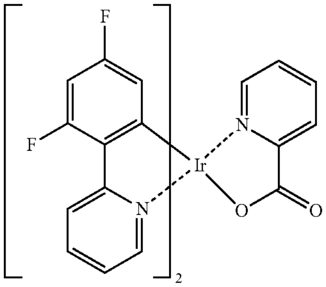
PD18
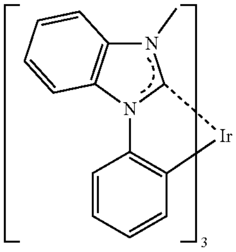
PD19
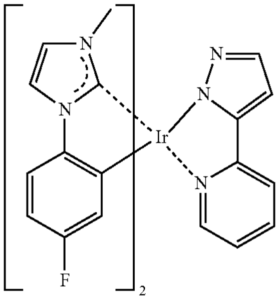
-continued
PD20
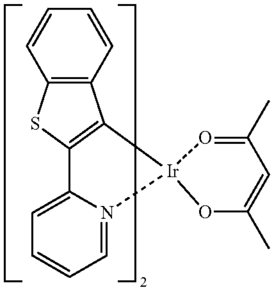
PD21
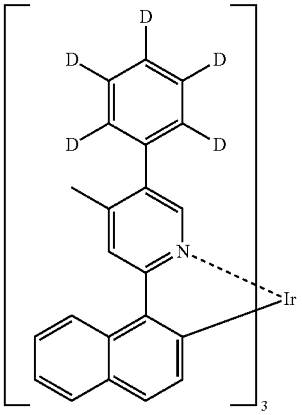
PD22
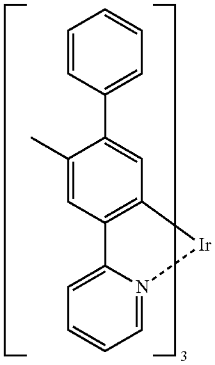
PD23
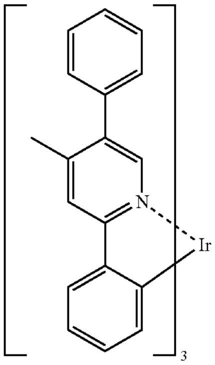

-continued
PD24
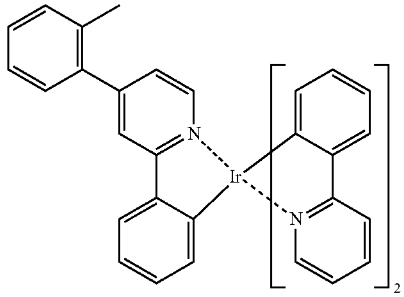
PD25
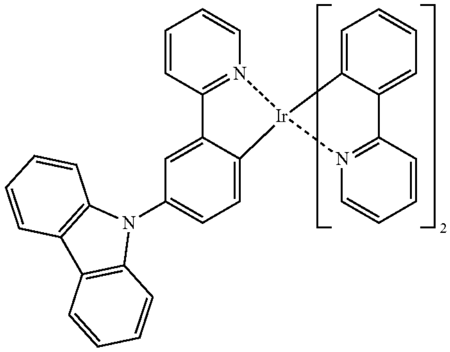
PD26
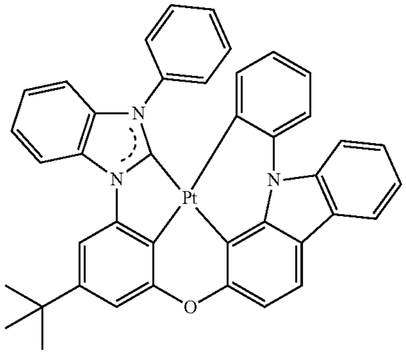
PD27
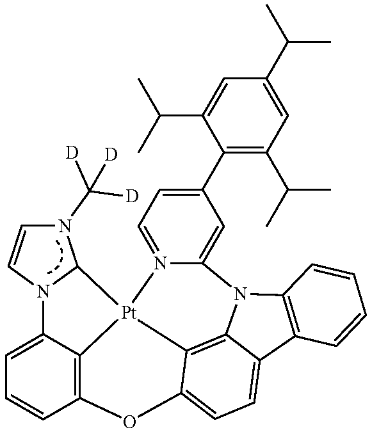
-continued
PD28
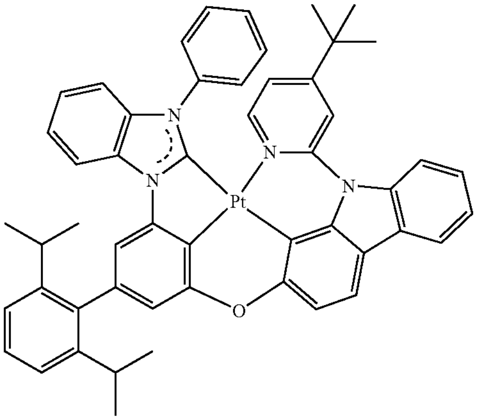
PD29
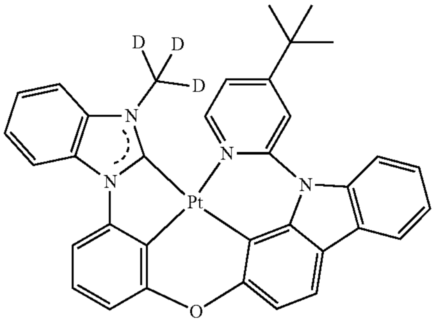
PD30
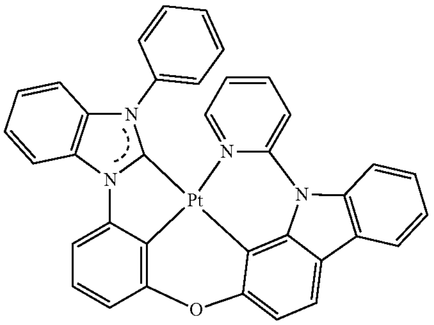

PD31
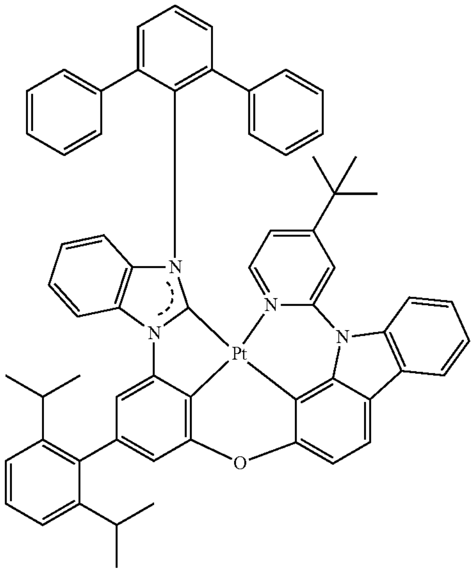
PD32
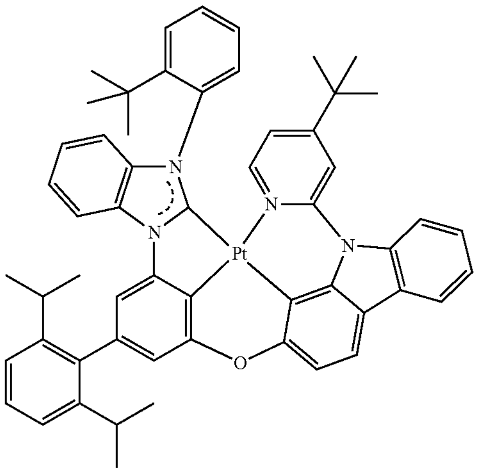
PD33
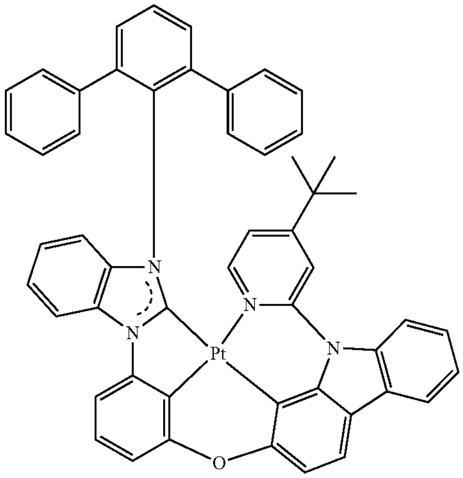
PD34
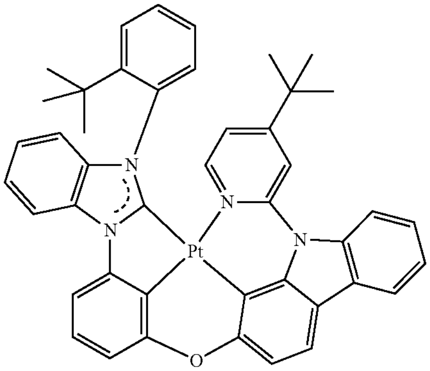
PD35
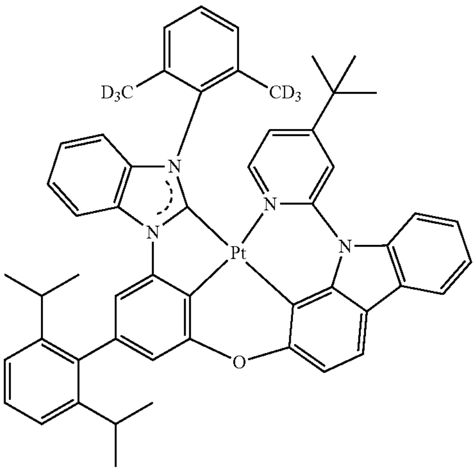
PD36
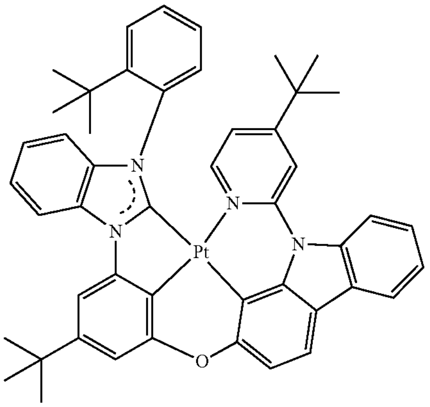

-continued

PD37

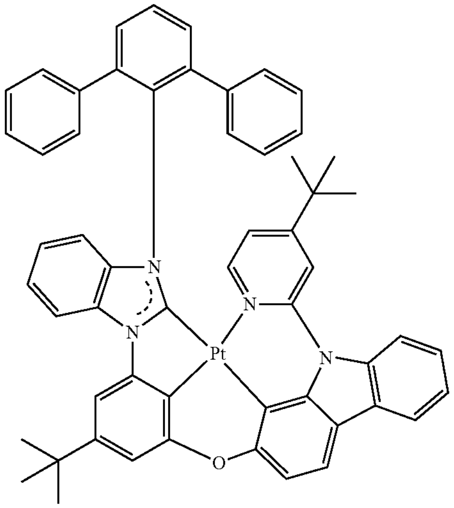

PD38

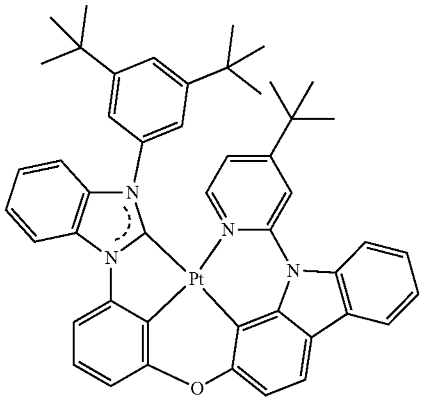

PD39

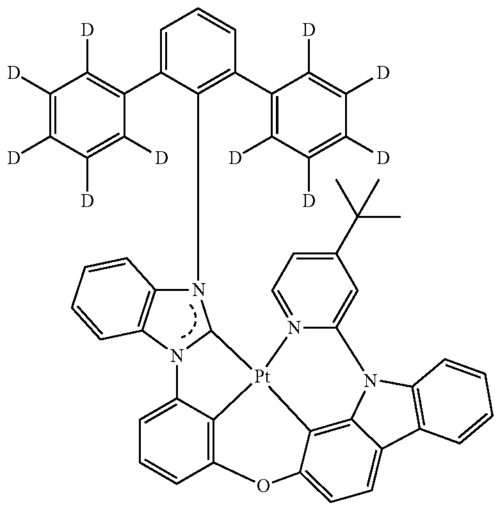

-continued

PD40

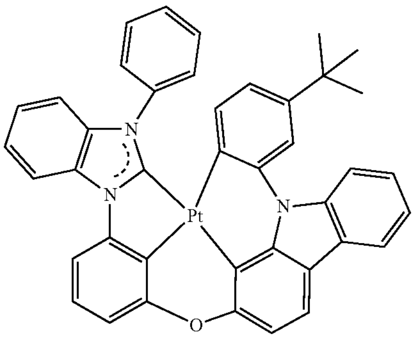

PD41

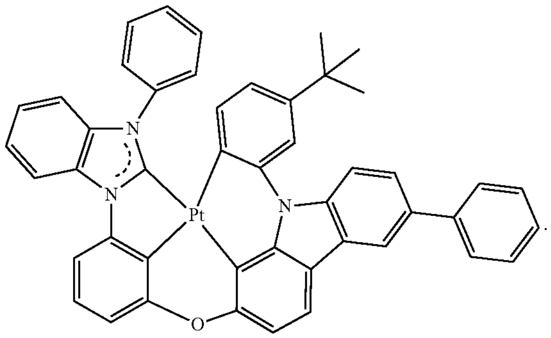

[Fluorescent Dopant]

The fluorescent dopant may include an amine group-containing compound, a styryl group-containing compound, or any combination thereof.

In embodiments, the fluorescent dopant may include a compound represented by Formula 501:

[Formula 501]

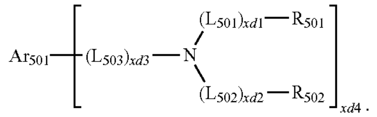

In Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, in Formula 501, $Ar_{501}$ may be a condensed cyclic group (for example, an anthracene group, a chrysene group, a pyrene group, etc.) in which three or more monocyclic groups are condensed together.

In an embodiment, in Formula 501, xd4 may be 2.

For example, the fluorescent dopant may include one of Compounds FD1 to FD36, DPVBi, DPAVBi, or any combination thereof:

-continued
FD1
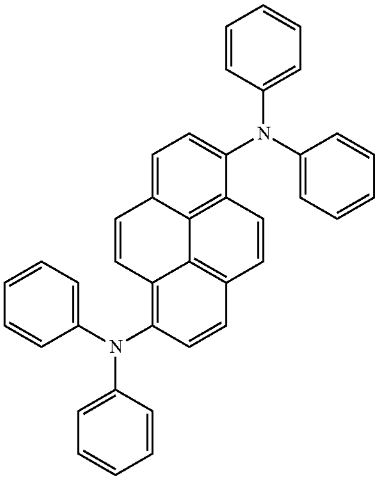
FD2
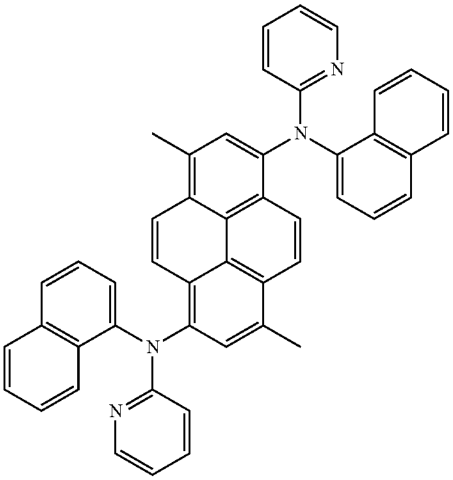
FD3
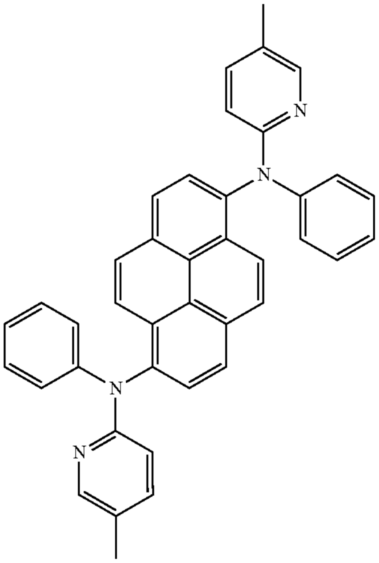
FD4
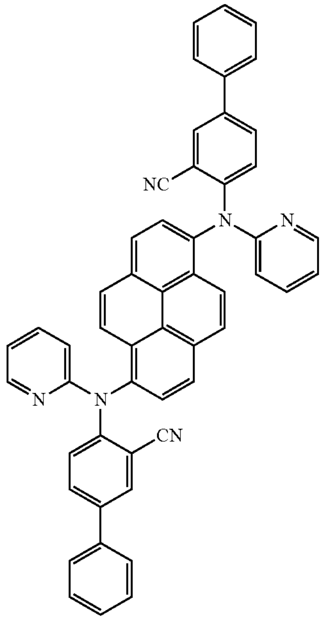
FD5
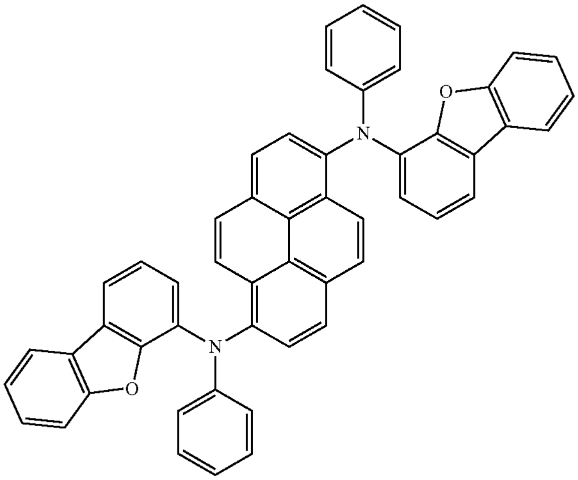
FD6
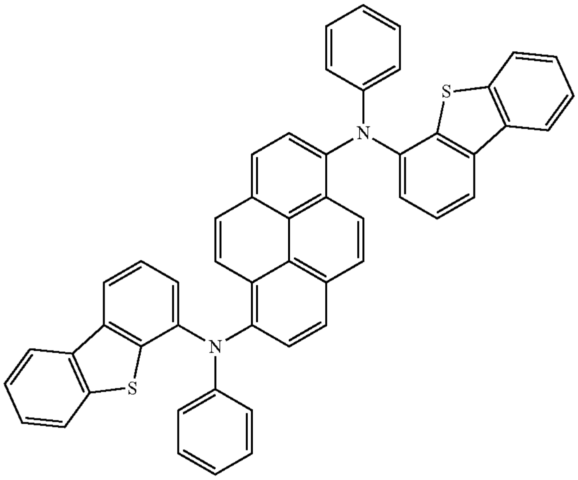

-continued
FD7
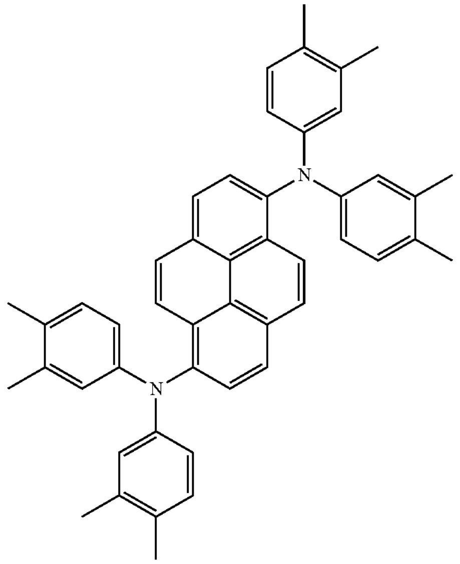
FD8
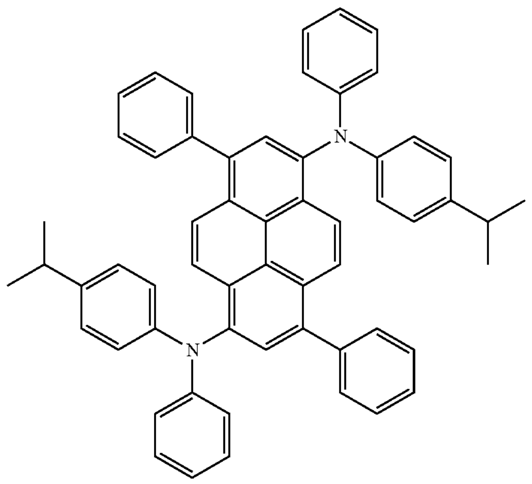
FD9
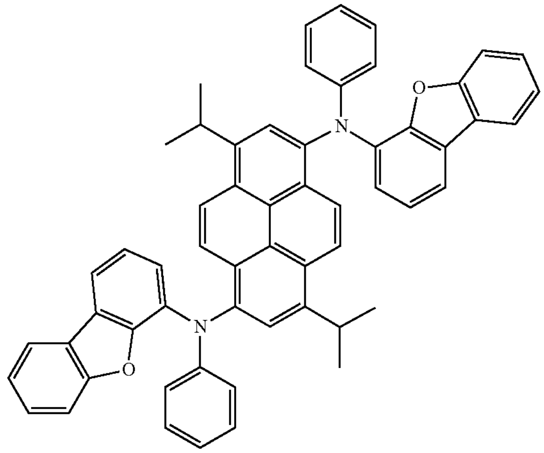
FD10
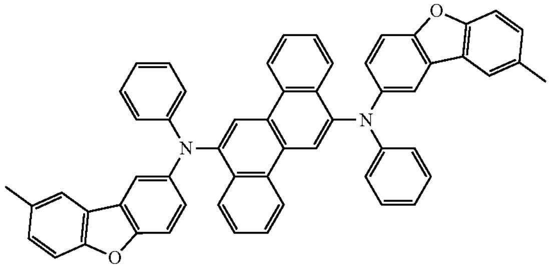
FD11
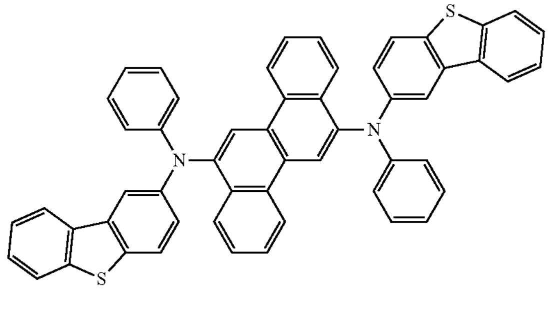
FD12
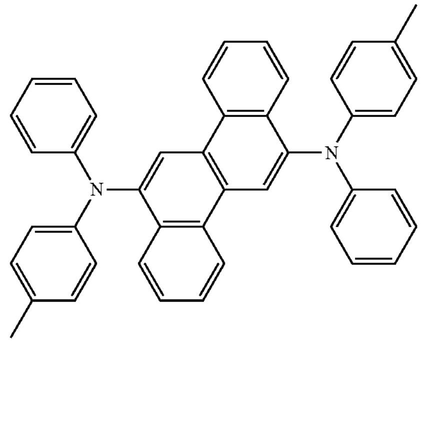

-continued
FD13
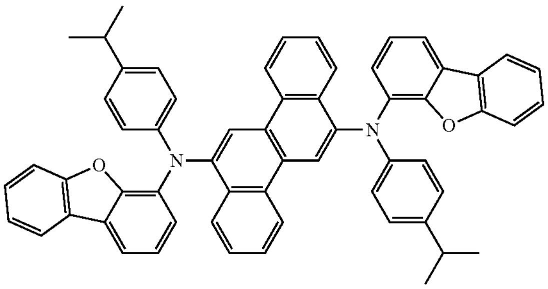
FD14
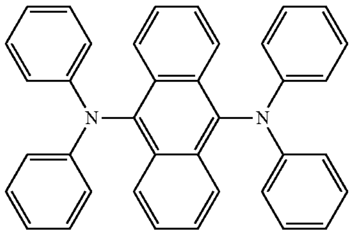
FD15
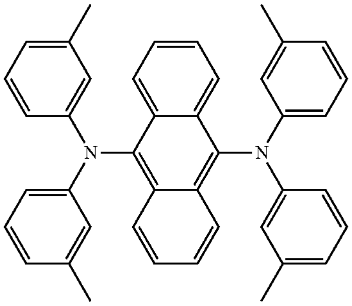
FD16
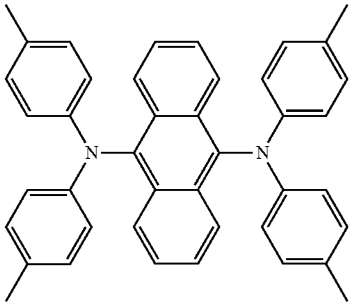
FD17
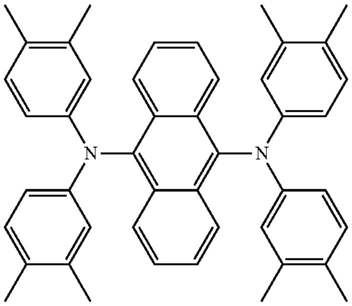
FD18
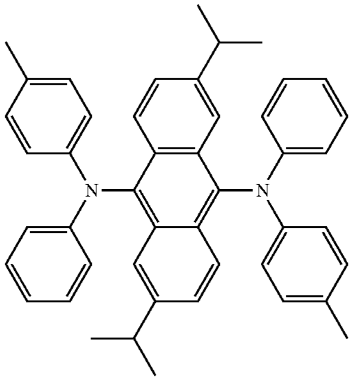
FD19
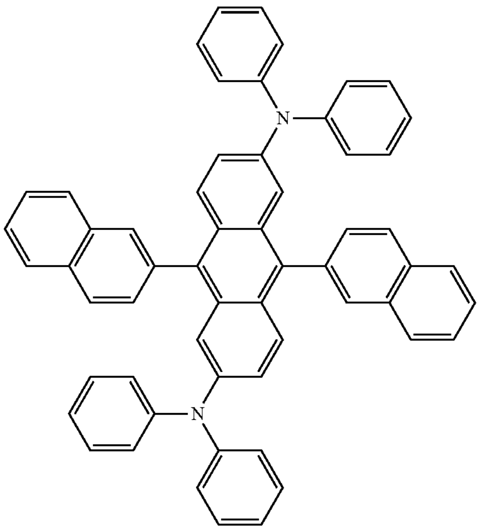
FD20
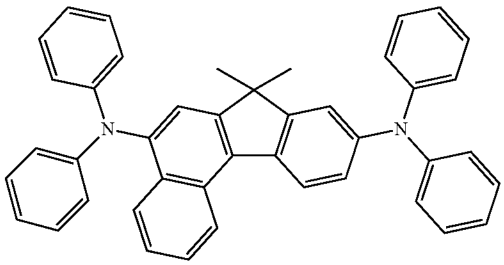

-continued
FD21
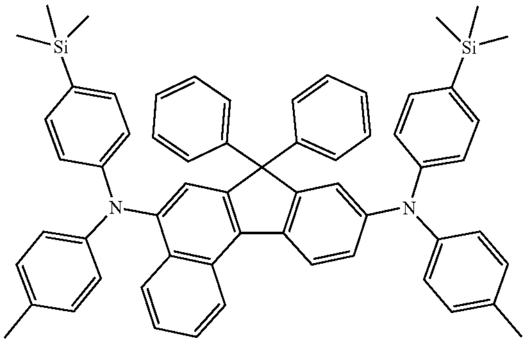
FD22
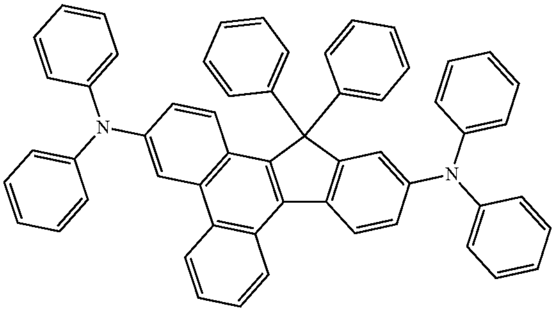
FD23
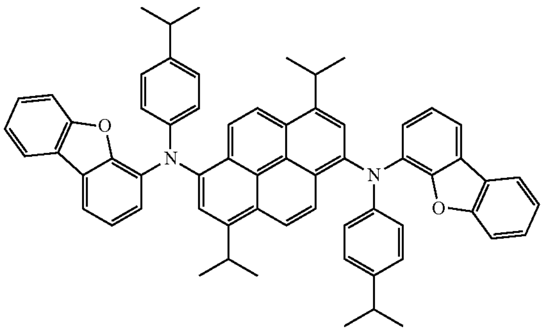
FD24
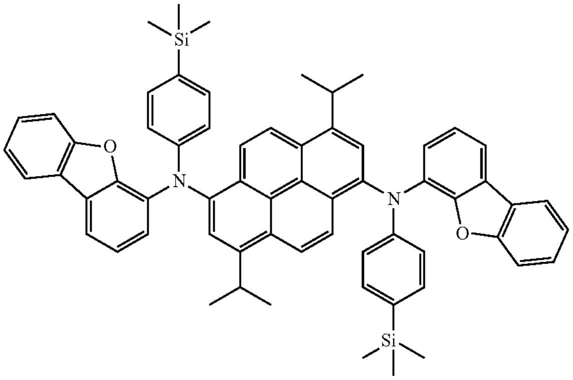
FD25
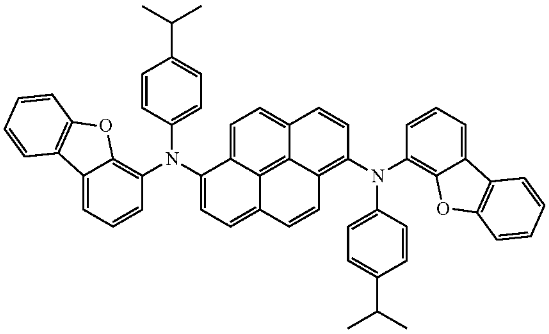
FD26
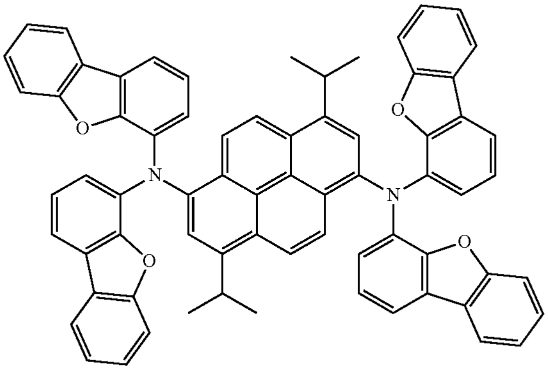
FD27
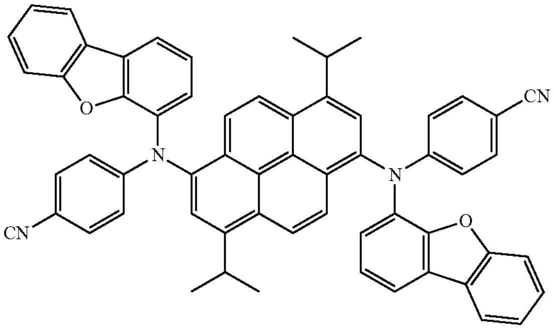
FD28
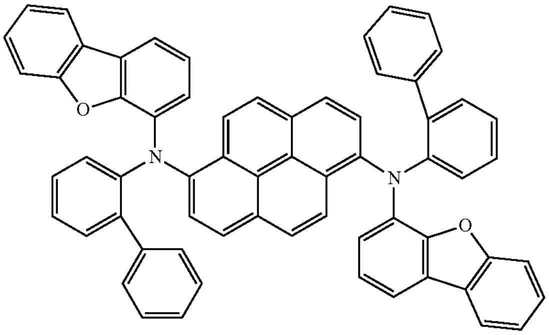

-continued
FD29
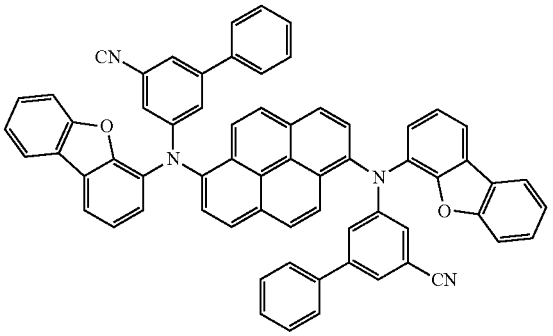
FD30
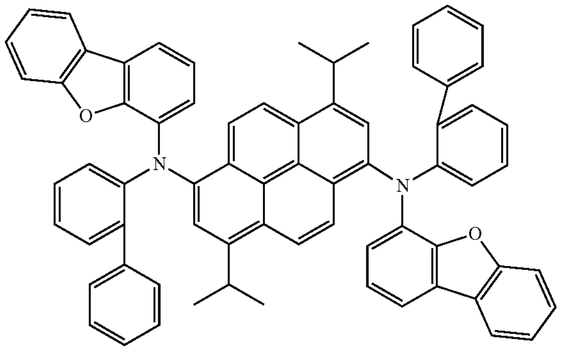
FD31
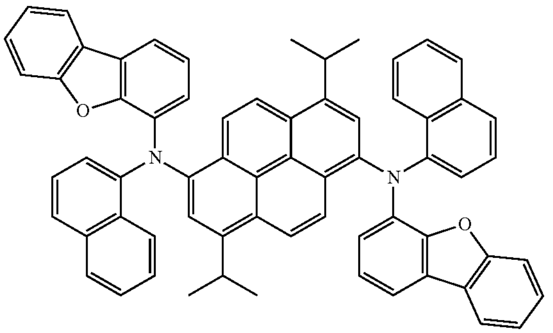
FD32
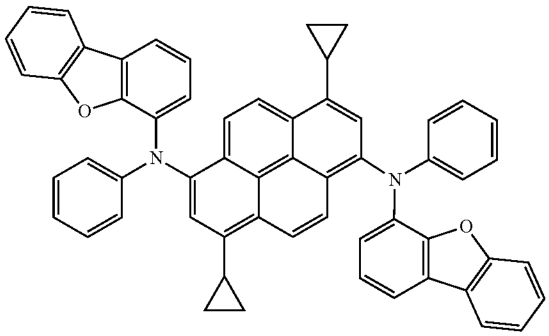
FD33
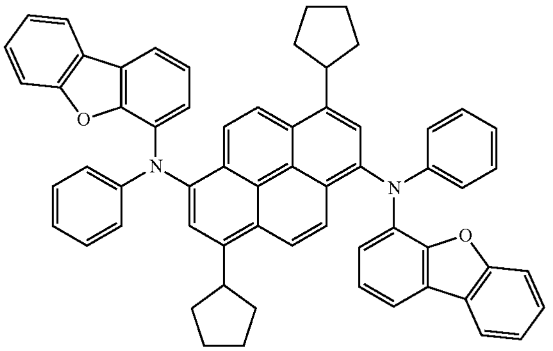
FD34
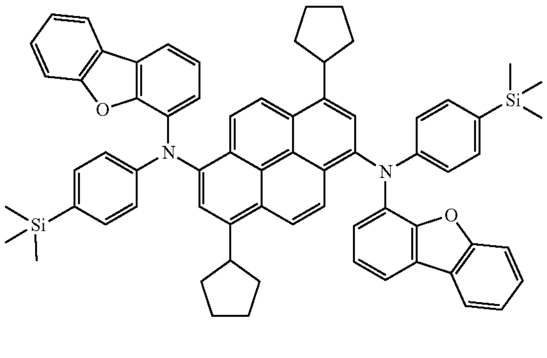
FD35
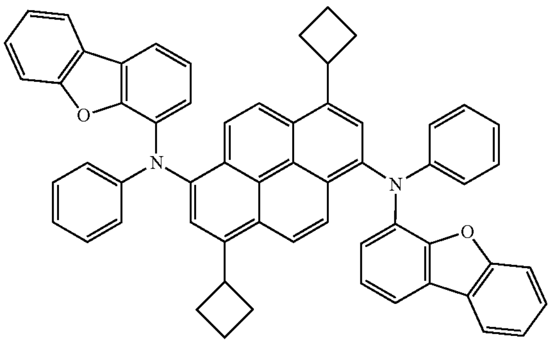
FD36
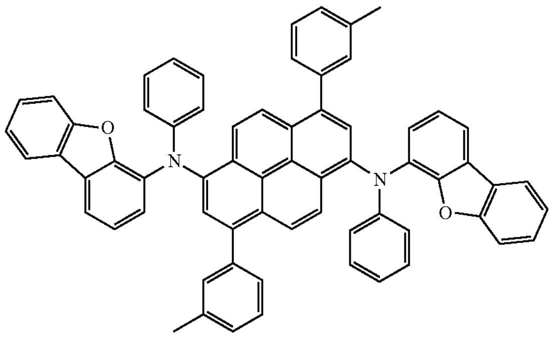

-continued

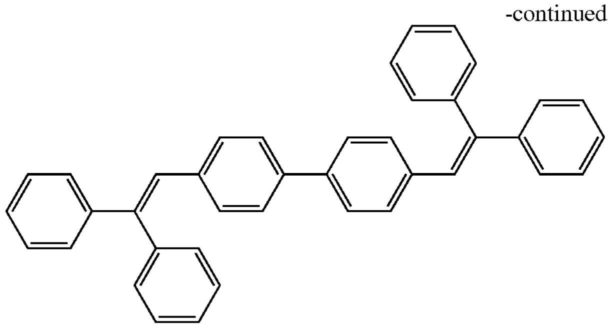

DPVBi

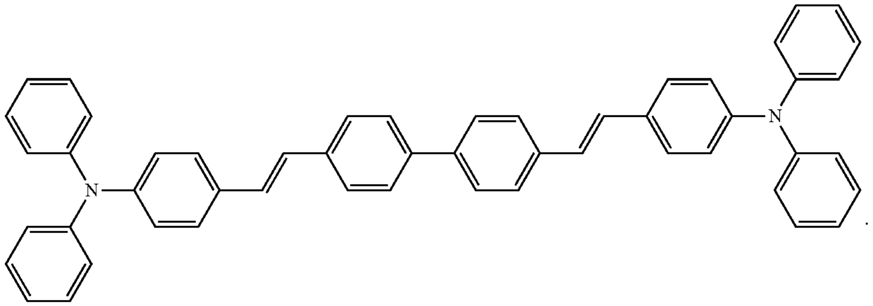

DPAVBi

[Delayed Fluorescence Material]

The emission layer may include a delayed fluorescence material.

In the specification, the delayed fluorescence material may be selected from compounds capable of emitting delayed fluorescence based on a delayed fluorescence emission mechanism.

The delayed fluorescence material included in the emission layer may serve as a host or as a dopant, depending on the type of other materials included in the emission layer.

In an embodiment, a difference between a triplet energy level (eV) of the delayed fluorescence material and a singlet energy level (eV) of the delayed fluorescence material may be about 0 eV or more and about 0.5 eV or less. When the difference between the triplet energy level (eV) of the delayed fluorescence material and the singlet energy level (eV) of the delayed fluorescence material satisfies the range above, up-conversion from the triplet state to the singlet state of the delayed fluorescence materials may effectively occur, and thus, the light-emitting device 10 may have improved luminescence efficiency.

In an embodiment, the delayed fluorescence material may include the condensed cyclic compound represented by Formula 1.

In embodiments, the delayed fluorescence material may include: a material including at least one electron donor (for example, a π electron-rich $C_3$-$C_{60}$ cyclic group and the like, such as a carbazole group) and at least one electron acceptor (for example, a sulfoxide group, a cyano group, a π electron-deficient nitrogen-containing $C_1$-$C_{60}$ cyclic group, and the like); a material including a $C_8$-$C_{60}$ polycyclic group that is different from the condensed cyclic compound represented by Formula 1 and includes two or more cyclic groups condensed to each other while sharing boron (B); or the like.

Examples of the delayed fluorescence material may include at least one of Compounds DF1 to DF9:

DF1

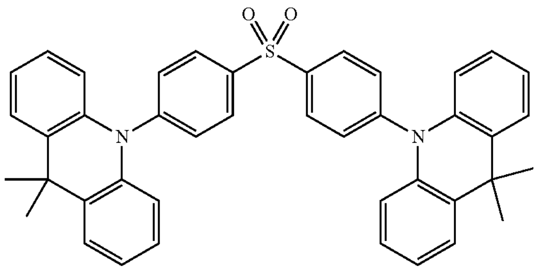

(DMAC-DPS)

DF2

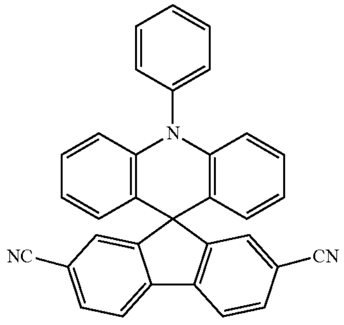

(ACRFLCN)

-continued

DF3

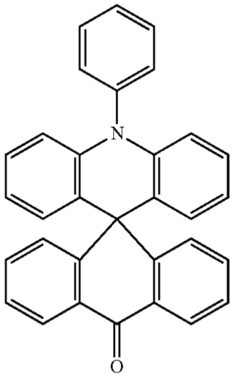

(ACRSA)

DF4

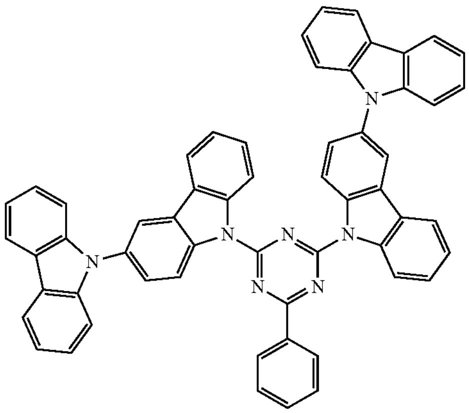

(CC2TA)

DF5

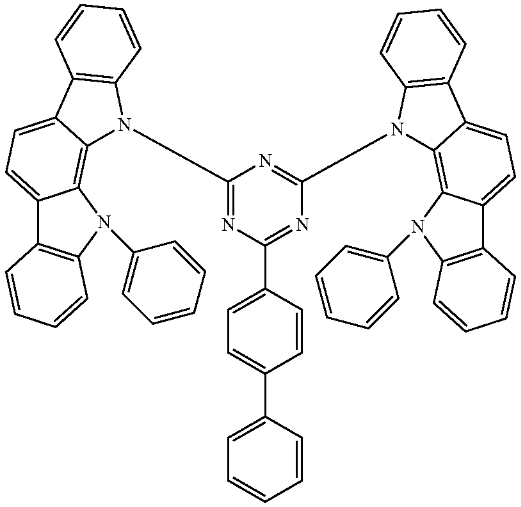

(PIC-TRZ)

-continued

DF6

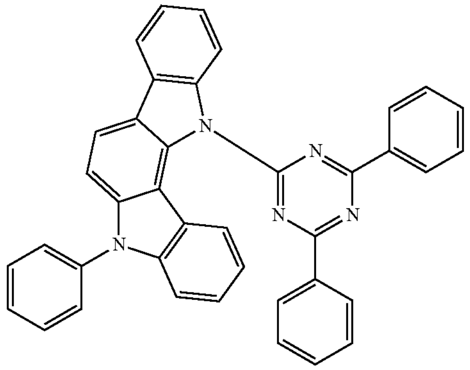

(PIC-TRZ2)

DF7

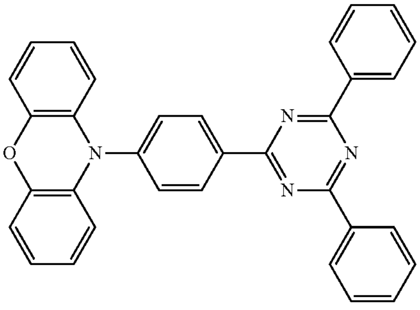

(PXZ-TRZ)

DF8

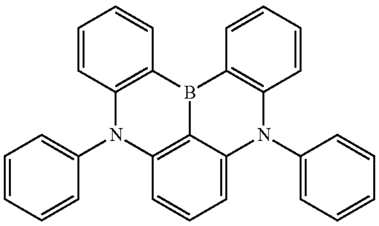

(DABNA-1)

DF9

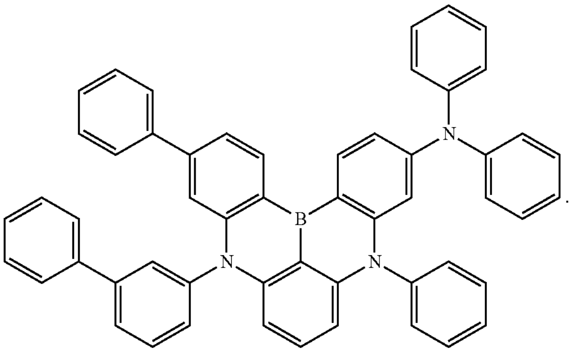

(DABNA-2)

[Quantum Dot]

The emission layer may include a quantum dot.

In the specification, a quantum dot may be a crystal of a semiconductor compound, and may include any material capable of emitting light of various emission wavelengths according to a size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

The wet chemical process is a method including mixing a precursor material with an organic solvent and growing quantum dot particle crystals. When the crystal grows, the organic solvent naturally acts as a dispersant coordinated on the surface of the quantum dot crystal and controls the growth of the crystal so that the growth of quantum dot particles can be controlled through a process which costs lower, and may be more readily performed than vapor deposition methods, such as metal organic chemical vapor deposition (MOCVD) or molecular beam epitaxy (MBE).

The quantum dot may include a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

Examples of the Group II-VI semiconductor compound may include: a binary compound, such as CdS, CdSe, CdTe, ZnS, ZnSe, ZnTe, ZnO, HgS, HgSe, HgTe, MgSe, MgS, and the like; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and the like; a quaternary compound, such as CdZnSeS, CdZnSeTe, CdZnSTe, CdHgSeS, CdHgSeTe, CdHgSTe, HgZnSeS, HgZnSeTe, HgZnSTe, and the like; or any combination thereof.

Examples of the Group III-V semiconductor compound may include: a binary compound, such as GaN, GaP, GaAs, GaSb, AlN, AlP, AlAs, AlSb, InN, InP, InAs, InSb, and the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the like; or any combination thereof. In an embodiment, the Group III-V semiconductor compound may further include a Group II element. Examples of the Group III-V semiconductor compound further including the Group II element may include InZnP, InGaZnP, InAlZnP, and the like.

Examples of the Group III-VI semiconductor compound may include: a binary compound, such as GaS, GaSe, $Ga_2Se_3$, GaTe, InS, InSe, $In_2S_3$, $In_2Se_3$, InTe, and the like; a ternary compound, such as $InGaS_3$, $InGaSe_3$, and the like; or any combination thereof.

Examples of the Group I-III-VI semiconductor compound may include: a ternary compound, such as AgInS, $AgInS_2$, CuInS, $CuInS_2$, $CuGaO_2$, $AgGaO_2$, $AgAlO_2$, and the like; or any combination thereof.

Examples of the Group IV-VI semiconductor compound may include: a binary compound, such as SnS, SnSe, SnTe, PbS, PbSe, PbTe, and the like; a ternary compound, such as SnSeS, SnSeTe, SnSTe, PbSeS, PbSeTe, PbSTe, SnPbS, SnPbSe, SnPbTe, and the like; a quaternary compound, such as SnPbSSe, SnPbSeTe, SnPbSTe, and the like; or any combination thereof.

Examples of the Group IV element or compound may include: a single element material, such as Si, Ge, and the like; a binary compound, such as SiC, SiGe, and the like; or any combination thereof.

Each element included in a multi-element compound, such as a binary compound, a ternary compound, or a quaternary compound, may be present in a particle at a uniform concentration or at a non-uniform concentration.

In an embodiment, the quantum dot may have a single structure in which the concentration of each element in the quantum dot may be uniform, or the quantum dot may have a core-shell structure. For example, when the quantum dot has a core-shell structure, a material included in the core and a material included in the shell may be different from each other.

The shell of the quantum dot may serve as a protective layer which prevents chemical denaturation of the core to maintain semiconductor characteristics, and/or may serve as a charging layer which impart electrophoretic characteristics to the quantum dot. The shell may be a single layer or a multi-layer. An interface between the core and the shell may have a concentration gradient in which the concentration of a material that is present in the shell decreases toward the core.

Examples of the shell of the quantum dot may include a metal oxide, a metalloid oxide, a non-metal oxide, a semiconductor compound, or any combination thereof. Examples of the metal oxide, the metalloid oxide, or the non-metal oxide may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like; a ternary compound, such as $MgAl_2O_4$, $CoFe_2O_4$, $NiFe_2O_4$, $CoMn_2O_4$, and the like; or any combination thereof.

Examples of the semiconductor compound may include, as described herein, a Group II-VI semiconductor compound, a Group III-V semiconductor compound, a Group III-VI semiconductor compound, a Group I-III-VI semiconductor compound, a Group IV-VI semiconductor compound, or any combination thereof. Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dot may have a full width of half maximum (FWHM) of an emission wavelength spectrum equal to or less than about 45 nm. For example, the quantum dot may have a FWHM of an emission wavelength spectrum equal to or less than about 40 nm. For example, the quantum dot may have a FWHM of an emission wavelength spectrum equal to or less than about 30 nm. When the FWHM of the quantum dot is within these ranges, the quantum dot may have improved color purity or color reproducibility. Light emitted through the quantum dot may be emitted in all directions, so that a wide viewing angle may be improved.

The quantum dot may be in the form of a spherical particle, a pyramidal particle, a multi-arm particle, a cubic nanoparticle, a nanotube particle, a nanowire particle, a nanofiber particle, or a nanoplate particle.

Since the energy band gap may be adjusted by controlling the size of the quantum dot, light having various wavelength bands may be obtained from the quantum dot emission layer. Accordingly, by using quantum dot of different sizes, a light-emitting device that emits light of various wavelengths may be implemented. In an embodiment, the size of the quantum dot may be selected to emit red, green, and/or blue light. For example, the size of the quantum dot may be configured to emit white light by combination of light of various colors.

[Electron Transport Region in Interlayer 130]

The electron transport region may have a structure consisting of a layer consisting of a single material, a structure consisting of a layer consisting of different materials, or a structure including multiple layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein the layers of each structure may be stacked from an emission layer in its respective stated order, but the structure of the electron transport region is not limited thereto.

In an embodiment, the electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

For example, the electron transport region may include a compound represented by Formula 601:

$$[Ar_{601}]_{xe11}\text{-}[(L_{601})_{xe1}\text{-}R_{601}]_{xe21} \quad \text{[Formula 601]}$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ may each independently be the same as defined in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, in Formula 601, when xe11 is 2 or more, two or more of $Ar_{601}$(s) may be linked to each other via a single bond.

In an embodiment, in Formula 601, $Ar_{601}$ may be a substituted or unsubstituted anthracene group.

In embodiments, the electron transport region may include a compound represented by Formula 601-1:

[Formula 601-1]

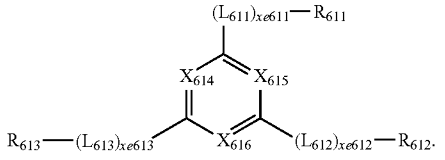

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be the same as defined in connection with $L_{601}$, xe611 to xe613 may each independently be the same as defined in connection with xe1, $R_{611}$ to $R_{613}$ may each independently be the same as defined in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, TSPO1, TPBi, or any combination thereof:

ET1

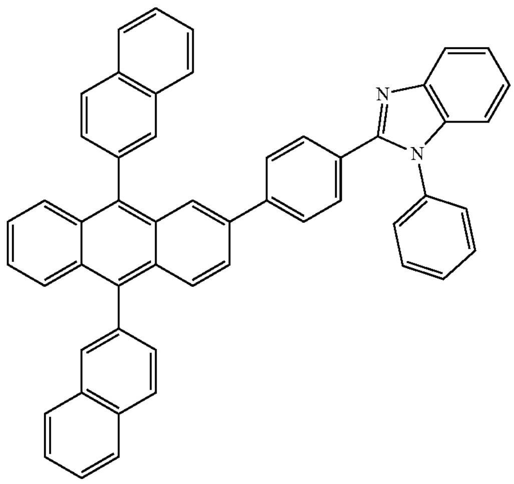

-continued
ET2
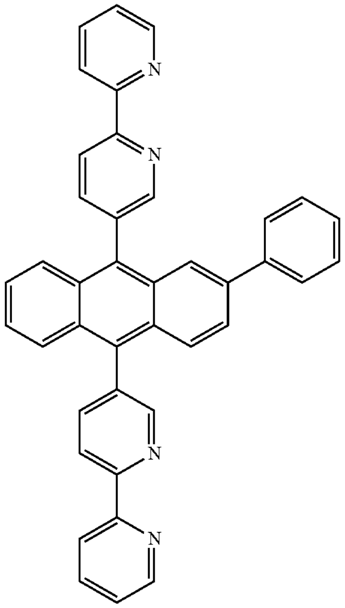
ET3
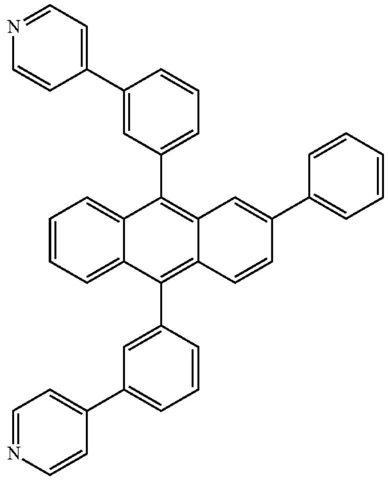
ET4
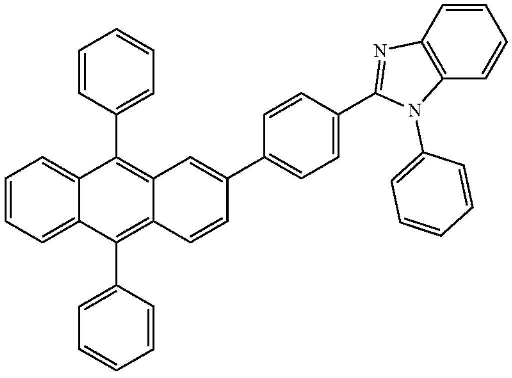
-continued
ET5
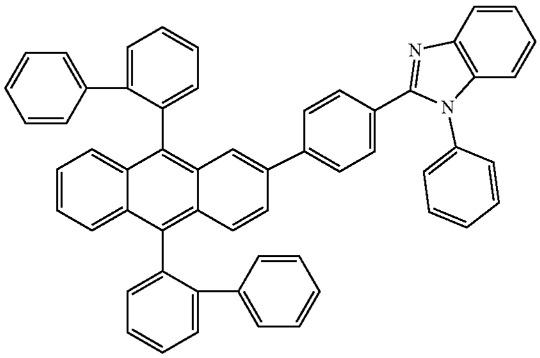
ET6
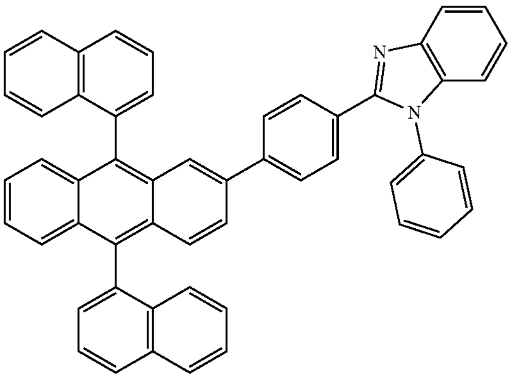
ET7
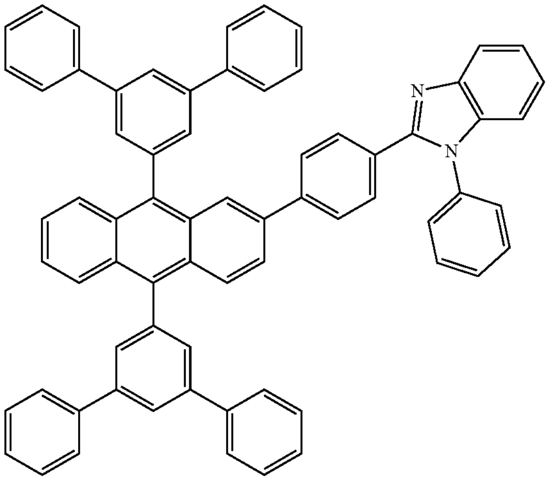

-continued
ET8
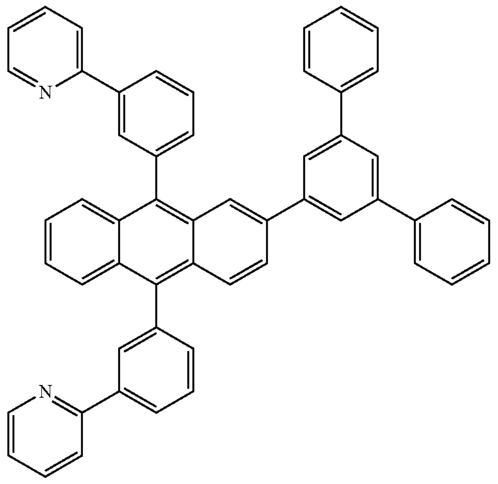
ET9
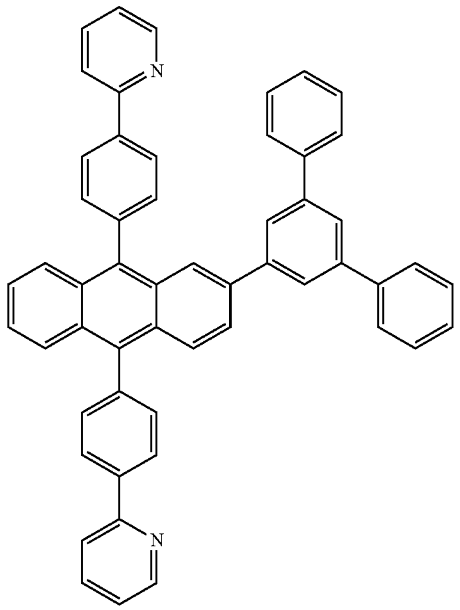
-continued
ET10
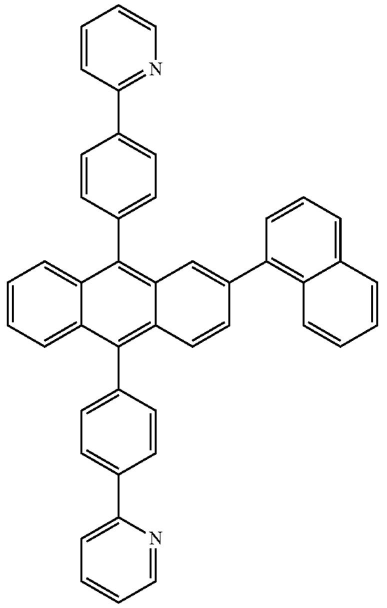
ET11
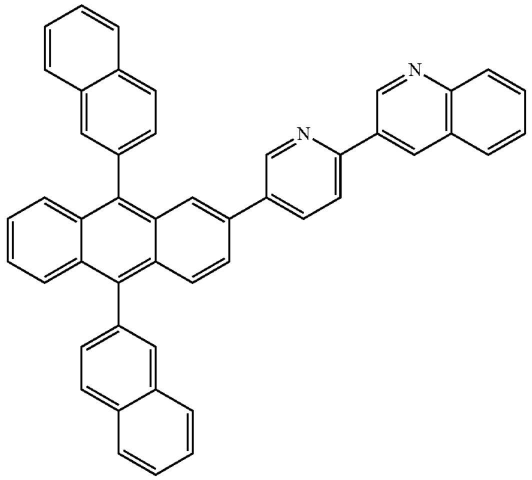
ET12
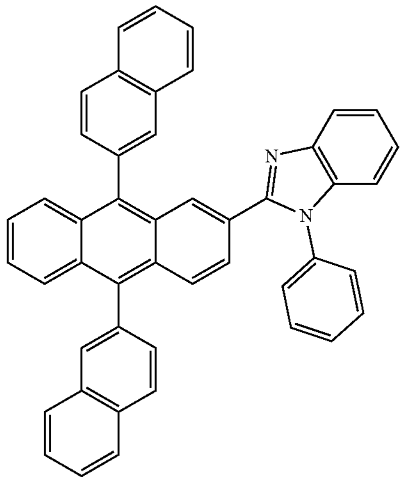

-continued
ET13
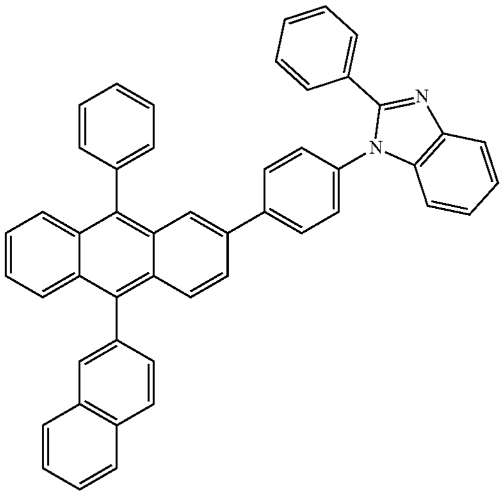
ET14
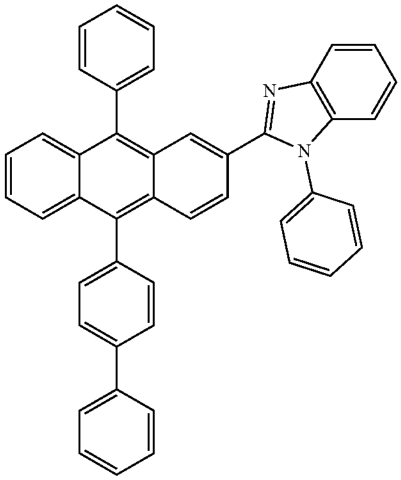
ET15
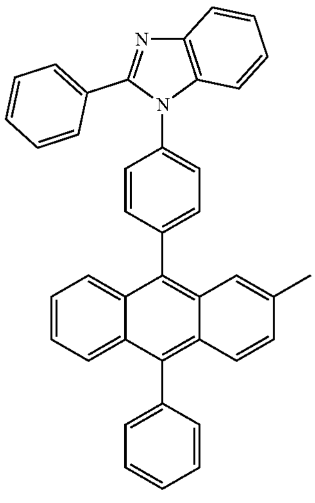
-continued
ET16
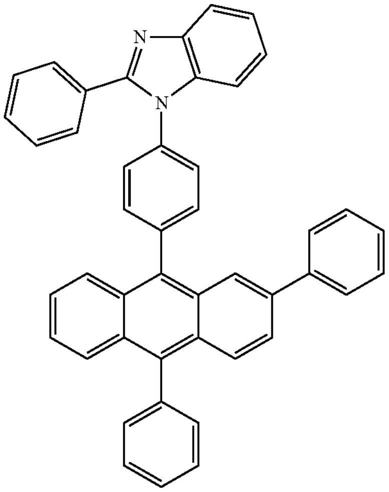
ET17
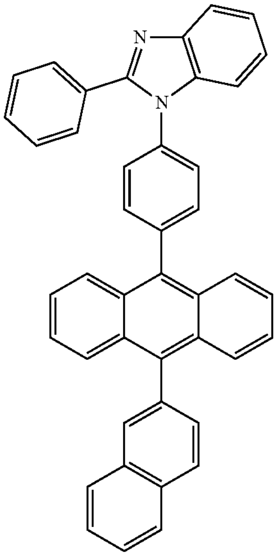
ET18
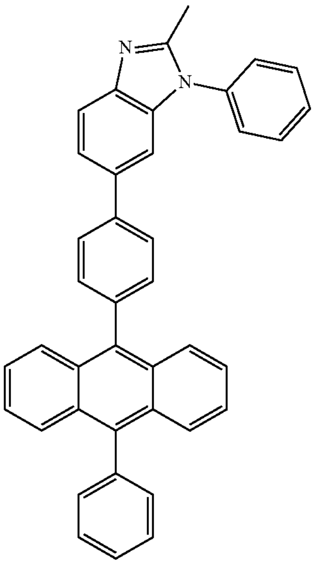

-continued
ET19
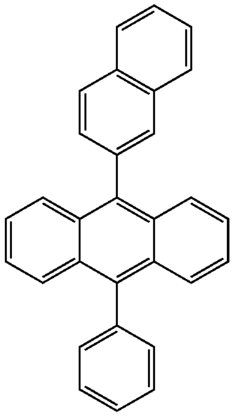
ET20
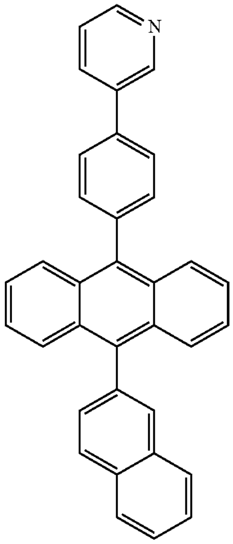
ET21
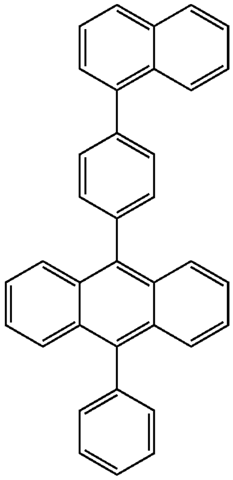
-continued
ET22
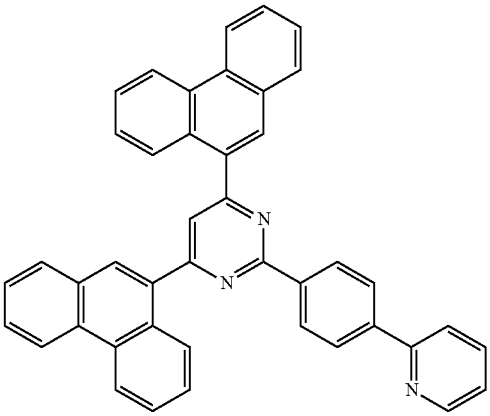
ET23
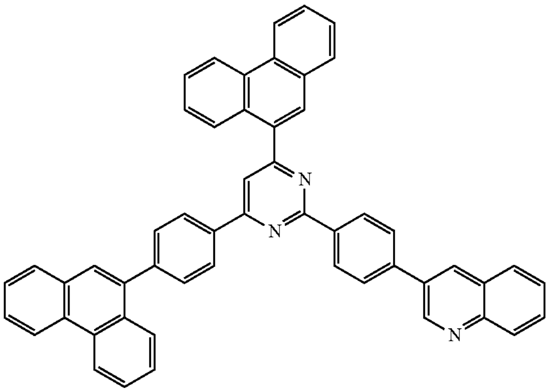
ET24
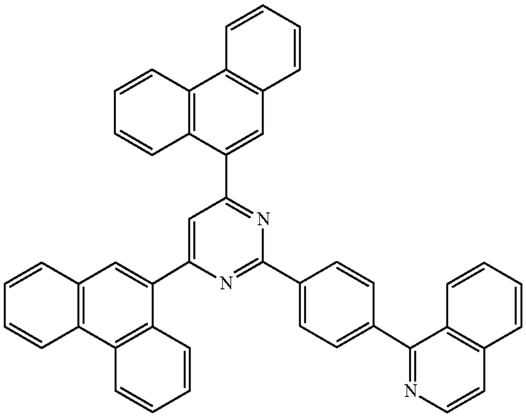

-continued
ET25
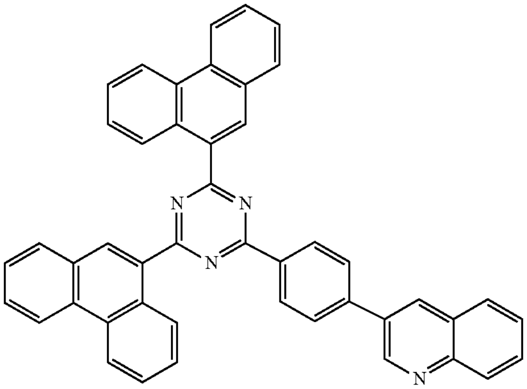
ET26
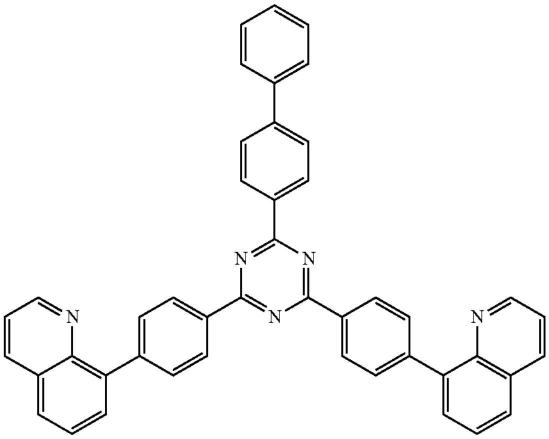
ET27
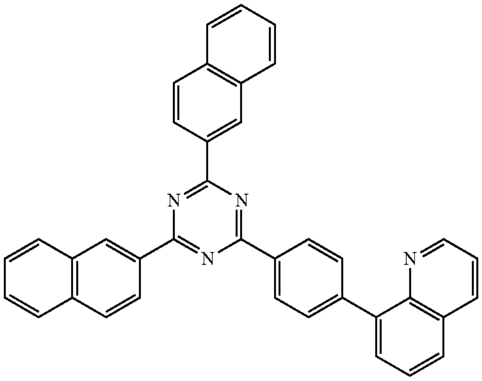
ET28
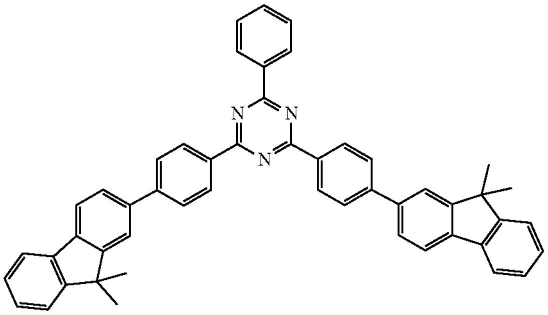
-continued
ET29
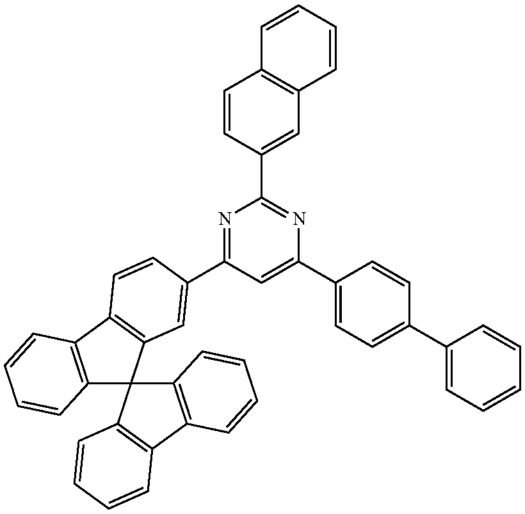
ET30
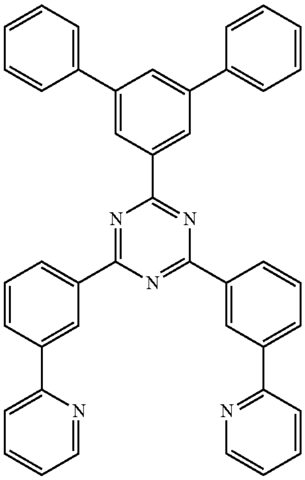
ET31
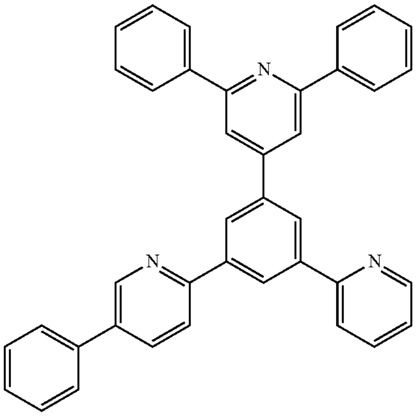

-continued
ET32
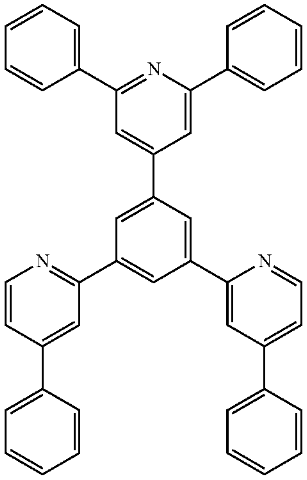
ET33
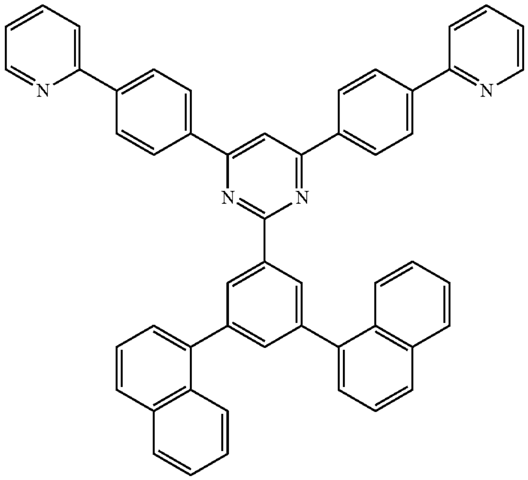
ET34
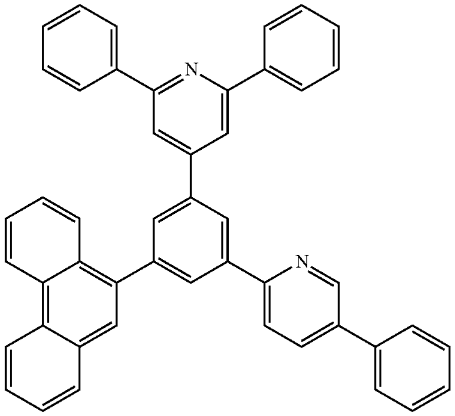
-continued
ET35
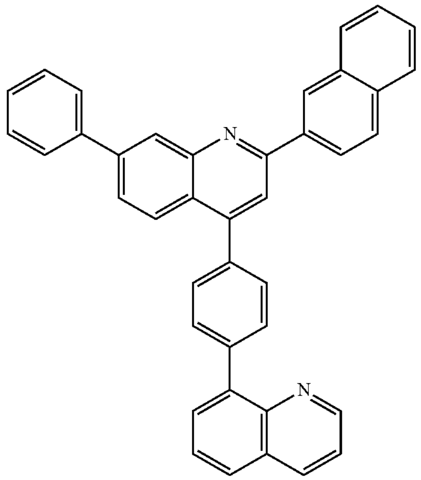
ET36
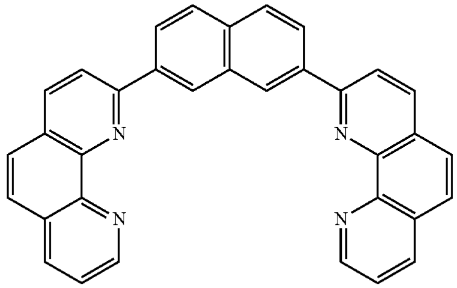
ET37
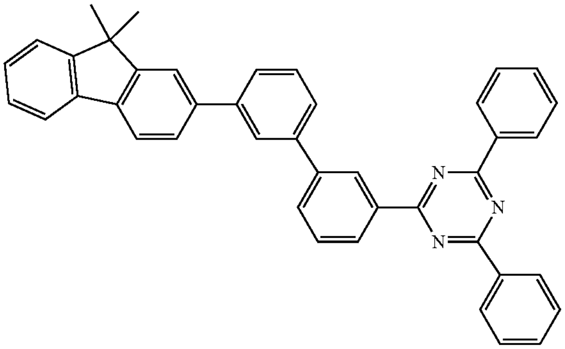
ET38
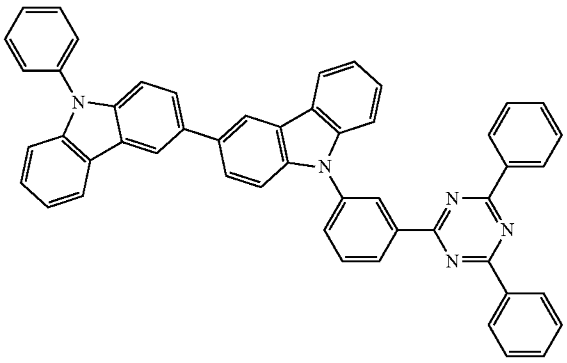

-continued
ET39
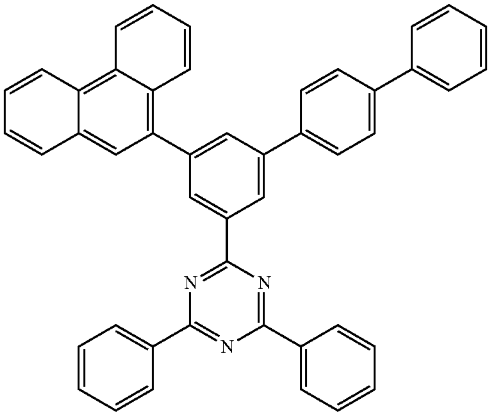
ET40
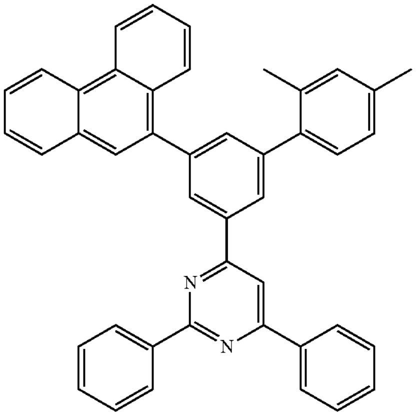
ET41
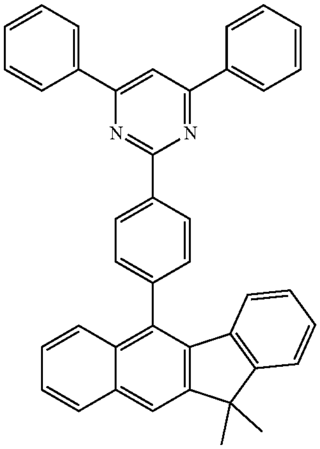
-continued
ET42
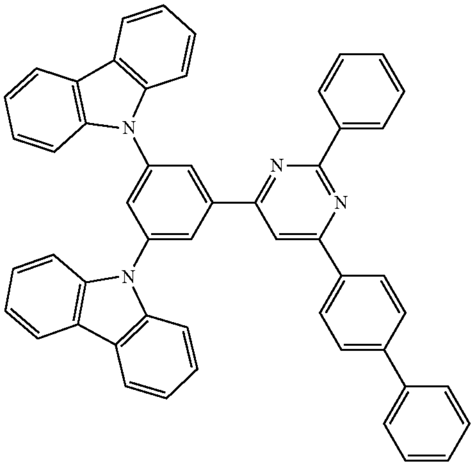
ET43
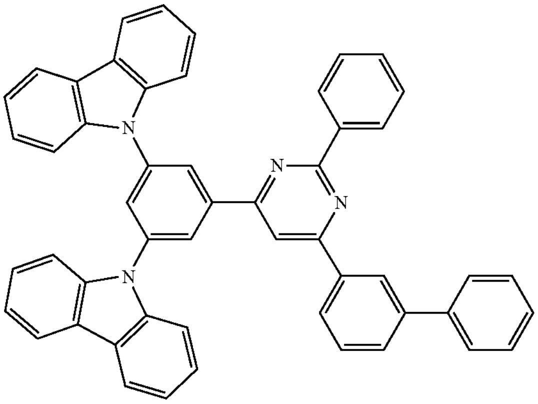
ET44
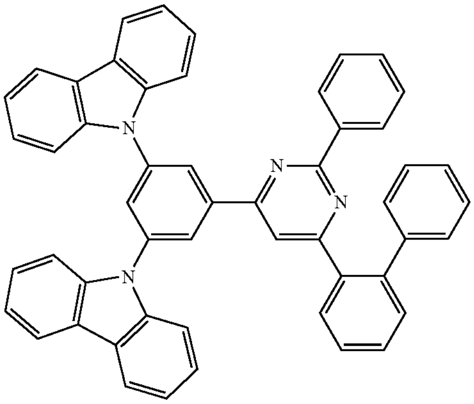
ET45
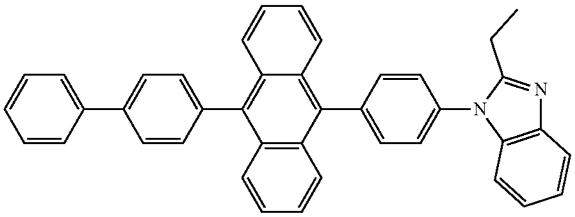

-continued

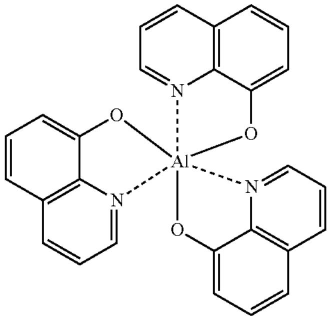

Alq3

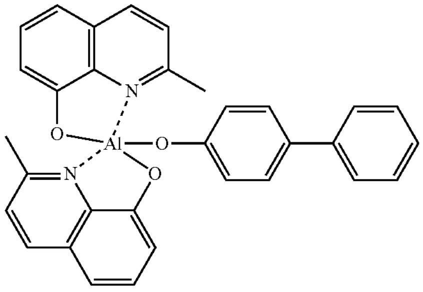

BAlq3

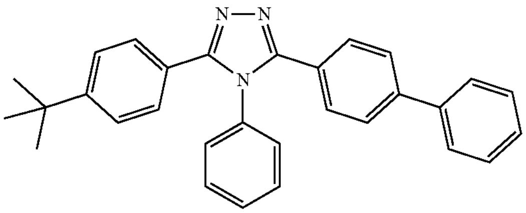

TAZ

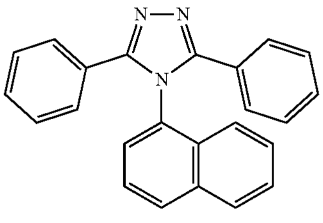

NTAZ

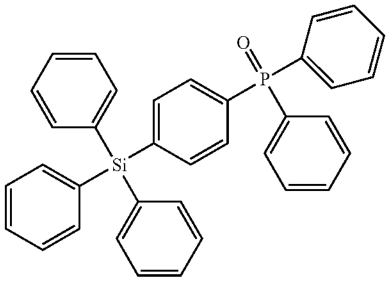

TSPO1

-continued

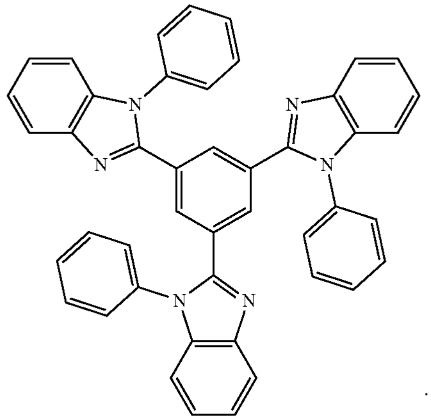

TPBi

A thickness of the electron transport region may be in a range of about 100 Å to about 5,000 Å. For example, the thickness of the electron transport region may be in a range of about 160 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range of about 20 Å to about 1,000 Å, and a thickness of the electron transport layer may be in a range of about 100 Å to about 1,000 Å. For example, the thickness of the buffer layer, the hole blocking layer, or the electron control layer may each independently be in a range of about 30 Å to about 300 Å. For example, the thickness of the electron transport layer may be in a range of about 150 Å to about 500 Å. When the thicknesses of the buffer layer, the hole blocking layer, the electron control layer, the electron transport layer, and/or the electron transport region are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of an alkali metal complex may be a Li ion, a Na ion, a K ion, a Rb ion, or a Cs ion, and a metal ion of an alkaline earth metal complex may be a Be ion, a Mg ion, a Ca ion, a Sr ion, or a Ba ion. A ligand coordinated with the metal ion of the alkali metal complex or with the metal ion of the alkaline earth-metal complex may each independently include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or Compound ET-D2:

ET-D1

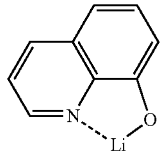

ET-D2

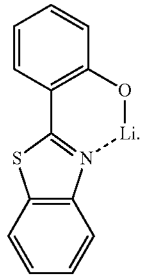

The electron transport region may include an electron injection layer that facilitates the injection of electrons from the second electrode 150. The electron injection layer may directly contact the second electrode 150.

The electron injection layer may have a structure consisting of a layer consisting of a single material, a structure consisting of a layer consisting of different materials, or a structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, iodides, etc.), or tellurides of the alkali metal, the alkaline earth metal, and the rare earth metal, or any combination thereof.

The alkali metal-containing compound may include: an alkali metal oxide, such as $Li_2O$, $Cs_2O$, $K_{20}$, and the like; alkali metal halides, such as LiF, NaF, CsF, KF, LiI, NaI, CsI, KI, and the like; or any combination thereof. The alkaline earth metal-containing compound may include an alkaline earth metal compound, such as BaO, SrO, CaO, $Ba_xSr_{1-x}O$ (wherein x is a real number satisfying $0<x<1$), $Ba_xCa_{1-x}O$ (wherein x is a real number satisfying $0<x<1$), and the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, $Lu_2Te_3$, and the like.

The alkali metal complex, the alkaline earth-metal complex, and the rare earth metal complex may include one of ions of the alkali metal, ions of the alkaline earth metal, and ions of the rare earth metal, and a ligand bonded to the metal ion (for example, hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenyl benzimidazole, hydroxyphenylbenzothiazole, bipyridine, phenanthroline, cyclopentadiene, or any combination thereof).

In an embodiment, the electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In embodiments, the electron injection layer may further include an organic material (for example, a compound represented by Formula 601).

In an embodiment, the electron injection layer may consist of an alkali metal-containing compound (for example, alkali metal halide); or the electron injection layer may consist of an alkali metal-containing compound (for example, alkali metal halide), and an alkali metal, an alkaline earth metal, a rare earth metal, or any combination thereof. For example, the electron injection layer may be a KI:Yb co-deposited layer, an RbI:Yb co-deposited layer, a LiF:Yb co-deposited layer, or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be uniformly or non-uniformly dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the ranges described above, satisfactory electron injection characteristics may be obtained without a substantial increase in driving voltage.

[Second Electrode 150]

The second electrode 150 may be arranged on the interlayer 130 having a structure as described herein. The second electrode 150 may be a cathode, which is an electron injection electrode. The second electrode 150 may include a material having a low-work function, for example, a metal, an alloy, an electrically conductive compound, or any combination thereof.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure.

[Capping Layer]

The light-emitting device 10 may include a first capping layer outside the first electrode 110, and/or a second capping layer outside the second electrode 150. For example, the light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

Light generated in an emission layer of the interlayer 130 of the light-emitting device 10 may be extracted toward the outside through the first electrode 110, which may be a semi-transmissive electrode or a transmissive electrode, and through the first capping layer. Light generated in an emission layer of the interlayer 130 of the light-emitting device 10 may be extracted toward the outside through the second electrode 150, which may be a semi-transmissive electrode or a transmissive electrode, and through the second capping layer.

The first capping layer and the second capping layer may each increase external emission efficiency according to the principle of constructive interference. Accordingly, the light extraction efficiency of the light-emitting device 10 is increased, so that the luminescence efficiency of the light-emitting device 10 may be improved.

The first capping layer and the second capping layer may each include a material having a refractive index greater than or equal to about 1.6 (with respect to a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may optionally be substituted with a substituent including O, N, S, Se, Si, F, Cl, Br, I, or any combination thereof.

In an embodiment, at least one of the first capping layer and the second capping layer may each independently include an amine group-containing compound.

In embodiments, at least one of the first capping layer and the second capping layer may each independently include a compound represented by Formula 201, a compound represented by Formula 202, or any combination thereof.

In embodiments, at least one of the first capping layer and the second capping layer may each independently include one of Compounds HT28 to HT33, one of Compounds CP1 to CP6, β-NPB, or any combination thereof:

CP1

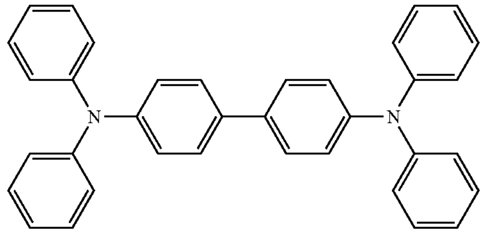

-continued

CP2

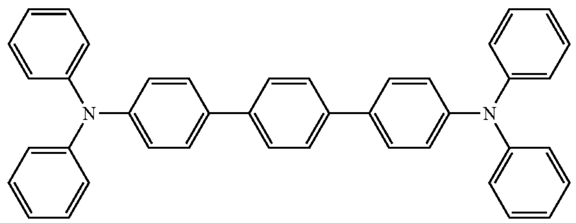

CP3

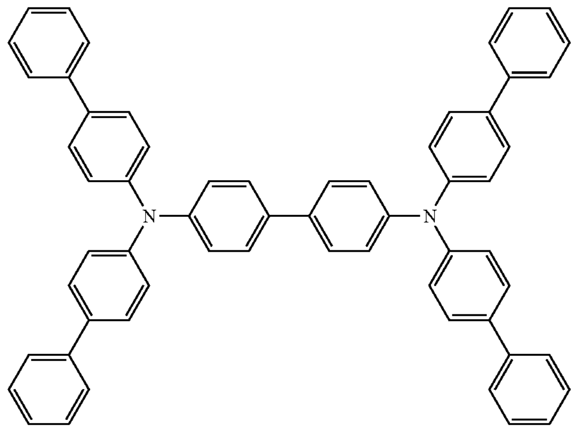

CP4

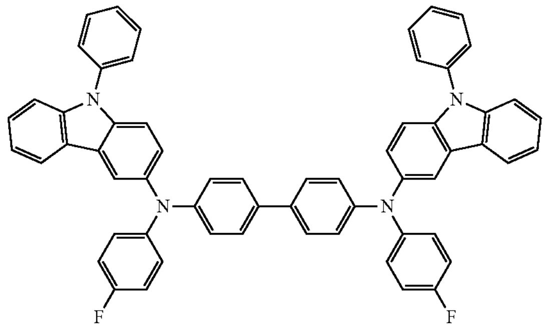

CP5

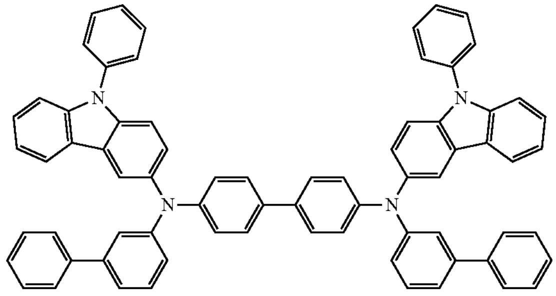

-continued

CP6

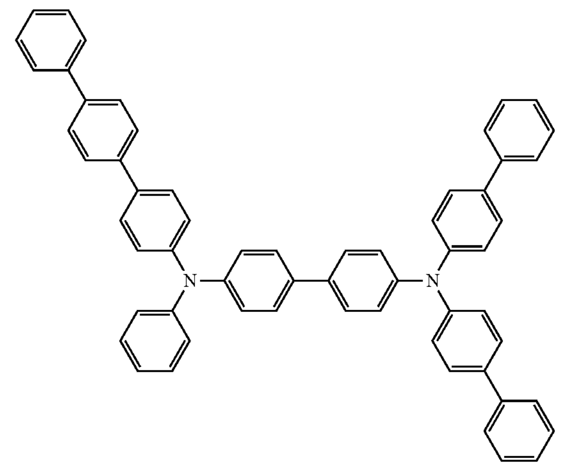

β-NPB

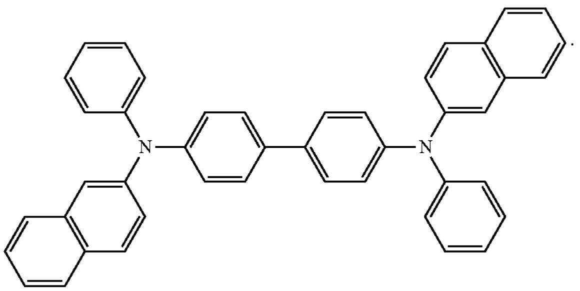

[Film]

The condensed cyclic compound represented by Formula 1 may be included in various films. Accordingly, another aspect provides a film including the condensed cyclic compound represented by Formula 1. The film may be, for example, an optical member (or a light control means) (for example, a color filter, a color conversion member, a capping layer, a light extraction efficiency enhancement layer, a selective light absorbing layer, a polarizing layer, a quantum dot-containing layer, or like), a light-blocking member (for example, a light reflective layer, a light absorbing layer, or the like), or a protective member (for example, an insulating layer, a dielectric layer, or the like).

[Electronic Apparatus]

The light-emitting device may be included in various electronic apparatuses. For example, the electronic apparatus including the light-emitting device may be a light-emitting apparatus, an authentication apparatus, and the like.

The electronic apparatus (for example, a light-emitting apparatus) may further include, in addition to the light-emitting device, a color filter, a color conversion layer, or a color filter and a color conversion layer. The color filter and/or the color conversion layer may be arranged in at least one traveling direction of light emitted from the light-emitting device. For example, the light emitted from the light-emitting device may be blue light or white light. The light-emitting device may be the same as defined therein. In an embodiment, the color conversion layer may include a quantum dot. The quantum dot may be, for example, a quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be arranged between the subpixels to define each subpixel.

The color filter may further include color filter areas and light-shielding patterns arranged between the color filter areas, and the color conversion layer may further include color conversion areas and light-shielding patterns arranged between the color conversion areas.

The color filter areas (or the color conversion areas) may include a first area emitting first color light, a second area emitting second color light, and/or a third area emitting third color light, wherein the first color light, the second color light, and/or the third color light may have different maximum emission wavelengths from one another. For example, the first color light may be red light, the second color light may be green light, and the third color light may be blue light. In embodiments, the color filter areas (or the color conversion areas) may include quantum dots. For example, the first area may include a red quantum dot, the second area may include a green quantum dot, and the third area may not include a quantum dot. The quantum dot may be the same as described herein. The first area, the second area, and/or the third area may each include a scatterer.

For example, the light-emitting device may emit first light, the first area may absorb the first light to emit first-first color light, the second area may absorb the first light to emit second-first color light, and the third area may absorb the first light to emit third-first color light. The first-first color light, the second-first color light, and the third-first color light may have different maximum emission wavelengths from one another. For example, the first light may be blue light, the first-first color light may be red light, the second-first color light may be green light, and the third-first color light may be blue light.

The electronic apparatus may further include a thin-film transistor, in addition to the light-emitting device as described herein. The thin-film transistor may include a source electrode, a drain electrode, and an active layer, wherein any one of the source electrode and the drain electrode may be electrically connected to any one of the first electrode and the second electrode of the light-emitting device.

The thin-film transistor may further include a gate electrode, a gate insulating film, or the like.

The active layer may include crystalline silicon, amorphous silicon, an organic semiconductor, an oxide semiconductor, or the like.

The electronic apparatus may further include a sealing portion for sealing the light-emitting device. The sealing portion may be arranged between the color filter and/or the color conversion layer, and the light-emitting device. The sealing portion may allow light from the light-emitting device to be extracted to the outside, and may simultaneously prevent ambient air and moisture from penetrating into the light-emitting device. The sealing portion may be a sealing substrate including a transparent glass substrate or a plastic substrate. The sealing portion may be a thin-film encapsulation layer including an organic layer and/or an inorganic layer. When the sealing portion is a thin-film encapsulation layer, the electronic apparatus may be flexible.

Various functional layers may be further included on the sealing portion, in addition to the color filter and/or the color conversion layer, according to the use of the electronic apparatus. Examples of the functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device as described herein, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
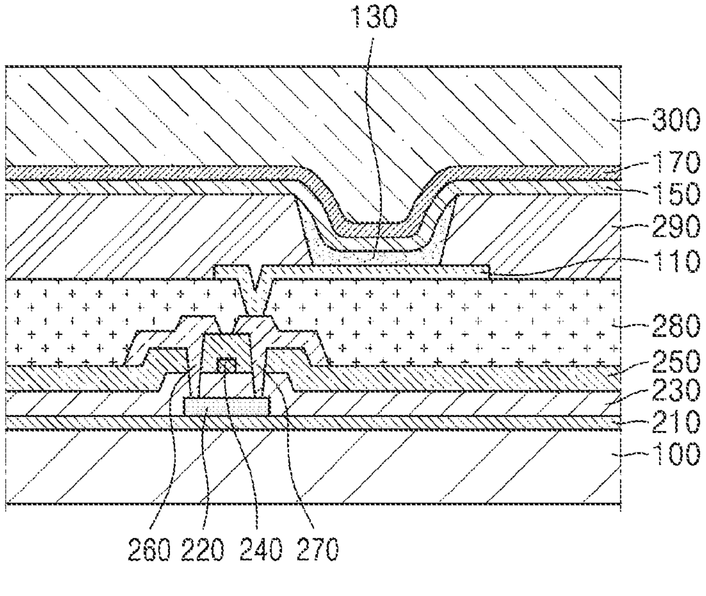
FIG. 2 is a schematic cross-sectional view of an electronic apparatus according to an embodiment.
Figure 3:
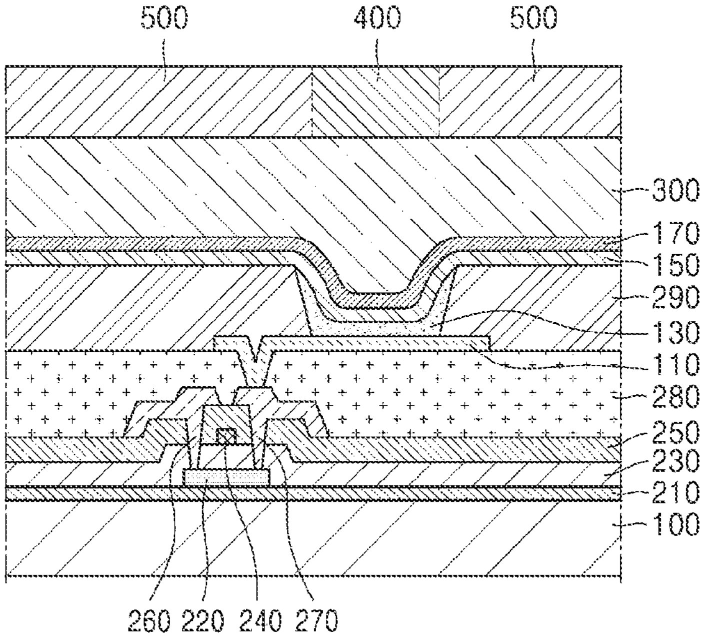
FIG. 3 is a schematic cross-sectional view of an electronic apparatus according to another embodiment.

[Description of FIGS. 2 and 3]

FIG. 2 is a schematic cross-sectional view showing an electronic apparatus according to an embodiment.

The electronic apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be arranged on the substrate 100. The buffer layer 210 may prevent penetration of impurities through the substrate 100 and may provide a flat surface on the substrate 100.

A TFT may be arranged on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be arranged on the active layer 220, and the gate electrode 240 may be arranged on the gate insulating film 230.

An interlayer insulating film 250 may be arranged on the gate electrode 240. The interlayer insulating film 250 may be arranged between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be arranged on the interlayer insulating film 250. The interlayer insulating film 250 and the gate insulating film 230 may expose the source region and the drain region of the active layer 220, and the source electrode 260 and the drain electrode 270 may respectively contact the exposed portions of the source region and the drain region of the active layer 220.

The TFT may be electrically connected to a light-emitting device to drive the light-emitting device, and may be covered and protected by a passivation layer 280. The passivation layer 280 may include an inorganic insulating film, an organic insulating film, or any combination thereof. A light-emitting device may be provided on the passivation layer 280. The light-emitting device may include a first electrode 110, an interlayer 130, and a second electrode 150.

The first electrode 110 may be arranged on the passivation layer 280. The passivation layer 280 does not fully cover the drain electrode 270 and may expose a portion of the drain electrode 270, and the first electrode 110 may electrically connected to the exposed portion of the drain electrode 270.

A pixel defining layer 290 including an insulating material may be arranged on the first electrode 110. The pixel defining layer 290 may expose a region of the first electrode 110, and an interlayer 130 may be formed in the exposed region of the first electrode 110. The pixel defining layer 290 may be a polyimide or polyacrylic organic film. Although not shown in FIG. 2, at least some layers of the interlayer 130 may extend beyond the upper portion of the pixel defining layer 290 to be provided in the form of a common layer.

The second electrode 150 may be arranged on the interlayer 130, and a capping layer 170 may be further included on the second electrode 150. The capping layer 170 may cover the second electrode 150.

The encapsulation portion 300 may be arranged on the capping layer 170. The encapsulation portion 300 may be arranged on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or any combination thereof; or any combination of the inorganic films and the organic films.

FIG. 3 is a schematic cross-sectional view showing an electronic apparatus according to another embodiment.

The electronic apparatus of FIG. 3 may differ from the electronic apparatus of FIG. 2, at least in that a light-shielding pattern 500 and a functional region 400 are further included on the encapsulation portion 300. The functional region 400 may be a color filter area, a color conversion area, or a combination of the color filter area and the color conversion area. In an embodiment, the light-emitting device included in the electronic apparatus of FIG. 3 may be a tandem light-emitting device.

[Manufacturing Method]

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, laser-induced thermal imaging, and the like.

When respective layers included in the hole transport region, the emission layer, and respective layers included in the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

[Definitions of terms]

The term "$C_3$-$C_{60}$ carbocyclic group" as used herein may be a cyclic group consisting of carbon as the only ring-forming atoms and having three to sixty carbon atoms, and the term "$C_1$-$C_{60}$ heterocyclic group" as used herein may be a cyclic group that has one to sixty carbon atoms and further has, in addition to carbon, at least one heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. For example, the number of ring-forming atoms of the $C_1$-$C_{60}$ heterocyclic group may be from 3 to 61.

The term "cyclic group" as used herein may include the $C_3$-$C_{60}$ carbocyclic group, or the $C_1$-$C_{60}$ heterocyclic group.

The term "π electron-rich $C_3$-$C_{60}$ cyclic group" as used herein may be a cyclic group that has three to sixty carbon atoms and may not include *—N═*' as a ring-forming moiety, and the term "π electron-deficient nitrogen-containing $C_1$-$C_{60}$ cyclic group" as used herein may be a heterocyclic group that has one to sixty carbon atoms and may include *—N═*' as a ring-forming moiety.

In embodiments, the $C_3$-$C_{60}$ carbocyclic group may be a T1 group, or a cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a cyclic group in which at least two T2 groups are condensed with each other, or a cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, or the like), the π electron-rich $C_3$-$C_{60}$ cyclic group may be a T1 group, a cyclic group in which at least two T1 groups are condensed with each other, a T3 group, a cyclic group in which at least two T3 groups are condensed with each other, or a condensed cyclic group in which at least one T3 group and at least one T1 group are condensed with each other (for example, a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, or the like), the π electron-deficient nitrogen-containing $C_1$-$C_{60}$ cyclic group may be a T4 group, a cyclic group in which at least two T4 groups are condensed with each other, a cyclic group in which at least one T4 group and at least one T1 group are condensed with each other, a cyclic group in which at least one T4 group and at least one T3 group are condensed with each other, or a cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may each be a group condensed to any cyclic group, a monovalent group, or a polyvalent group (for example, a divalent group, a trivalent group, a tetravalent group, etc.), according to the structure of a formula for which the corresponding term is used. For example, a "benzene group" may be a benzo group, a phenyl group, a phenylene group, or the like, which may be readily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein may be a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at a terminus of a $C_2$-$C_{60}$ alkyl group, and examples thereof may include an ethenyl group, a propenyl group, a butenyl group, and the like. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at a terminus of a $C_2$-$C_{60}$ alkyl group, and examples thereof may include an ethynyl group, a propynyl group, and the like. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by —$O(A_{101})$ (wherein $A_{101}$ may be a $C_1$-$C_{60}$ alkyl group), and examples thereof may include a methoxy group, an ethoxy group, an isopropyloxy group, and the like.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, a bicyclo[2.2.2]octyl group, and the like. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group of 1 to 10 carbon atoms, further including, in addition to carbon atoms, at least one heteroatom, as ring-forming atoms, and examples thereof may include a 1,2,3,4-oxatriazolidinyl group, a tetrahydrofuranyl group, a tetrahydrothiophenyl group, and the like. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" as used herein may be a monovalent cyclic group that has three to ten carbon atoms and at least one carbon-carbon double bond in the ring thereof and no aromaticity, and examples thereof may include a cyclopentenyl group, a cyclohexenyl group, a cycloheptenyl group, and the like. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group of 1 to 10 carbon atoms, further including, in addition to carbon atoms, at least one heteroatom, as ring-forming atoms, and having at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, a 2,3-dihydrothiophenyl group, and the like. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system of 6 to 60 carbon atoms, and the term "$C_6$-$C_{60}$ arylene group" as used herein may be a divalent group having a carbocyclic aromatic system of 6 to 60 carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, an ovalenyl group, and the like. When the $C_6$-$C_{60}$ aryl group and the $C_6$-$C_{60}$ arylene group each include two or more rings, the respective rings may be condensed with each other.

The term "$C_1$-$C_{60}$ heteroaryl group" as used herein may be a monovalent group having a heterocyclic aromatic system of 1 to 60 carbon atoms, further including, in addition to carbon atoms, at least one heteroatom, as ring-forming atoms. The term "$C_1$-$C_{60}$ heteroarylene group" as used herein may be a divalent group having a heterocyclic aromatic system of 1 to 60 carbon atoms, further including, in addition to carbon atoms, at least one heteroatom, as ring-forming atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the respective rings may be condensed with each other.

The term "monovalent non-aromatic condensed polycyclic group" as used herein may be a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group may include an indenyl group, a fluorenyl group, a spiro-bifluorenyl group, a benzofluorenyl group, an indenophenanthrenyl group, an indeno anthracenyl group, and the like. The term "divalent non-aromatic condensed polycyclic group" as used herein may be a divalent group having a same structure as the monovalent non-aromatic condensed polycyclic group described above.

The term "monovalent non-aromatic condensed heteropolycyclic group" as used herein may be a monovalent group (for example, having 1 to 60 carbon atoms) having two or more rings condensed to each other, further including, in addition to carbon atoms, at least one heteroatom, as ring-forming atoms, and having non-aromaticity in its entire molecular structure. Examples of the monovalent non-aromatic condensed heteropolycyclic group may include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, a benzothienodibenzothiophenyl group, and the like. The term "divalent non-aromatic condensed heteropolycyclic group" as used herein may be a divalent group having a same structure as the monovalent non-aromatic condensed heteropolycyclic group described above.

The term "$C_6$-$C_{60}$ aryloxy group" as used herein may be a group represented by —$O(A_{102})$ (wherein $A_{102}$ may be a $C_6$-$C_{60}$ aryl group), and the term "$C_6$-$C_{60}$ arylthio group" as used herein may be a group represented by —$S(A_{103})$ (wherein $A_{103}$ may be a $C_6$-$C_{60}$ aryl group).

The term "$C_7$-$C_{60}$ arylalkyl group" as used herein may be a group represented by -$(A_{104})(A_{105})$ (wherein $A_{104}$ may be a $C_1$-$C_{54}$ alkylene group, and $A_{105}$ may be a $C_6$-$C_{59}$ aryl group), and the term "$C_2$-$C_{60}$ heteroarylalkyl group" as used herein may be a group represented by -$(A_{106})(A_{107})$ (wherein $A_{106}$ may be a $C_1$-$C_{59}$ alkylene group, and $A_{107}$ may be a $C_1$-$C_{59}$ heteroaryl group).

The group "$R_{10a}$" as used herein may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{00}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

In the specification, $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ arylalkyl group; or a $C_2$-$C_{60}$ heteroarylalkyl group.

The term "heteroatom" as used herein may be any atom other than a carbon atom or a hydrogen atom. Examples of the heteroatom may include O, S, N, P, Si, B, Ge, Se, or any combination thereof.

The term "third-row transition metal" as used herein may include hafnium (Hf), tantalum (Ta), tungsten (W), rhenium (Re), osmium (Os), iridium (Ir), platinum (Pt), gold (Au), and the like.

The term "Ph" as used herein refers to a phenyl group, the term "Me" as used herein refers to a methyl group, the term "Et" as used herein refers to an ethyl group, the terms "tert-Bu" or "Bu$^t$" as used herein each refer to a tert-butyl group, and the term "OMe" as used herein refers to a methoxy group.

The term "biphenyl group" as used herein may be a "phenyl group substituted with a phenyl group." For example, the "biphenyl group" may be a substituted phenyl group having a $C_6$-$C_{60}$ aryl group as a substituent.

The term "terphenyl group" as used herein may be a "phenyl group substituted with a biphenyl group." For example, the "terphenyl group" may be a substituted phenyl group having, as a substituent, a $C_6$-$C_{60}$ aryl group substituted with a $C_6$-$C_{60}$ aryl group.

The symbols * and *' as used herein, unless defined otherwise, each refer to a binding site to a neighboring atom in a corresponding formula or moiety.

Hereinafter, compounds according to embodiments and light-emitting devices according to embodiments will be described in detail with reference to the Synthesis Examples and Examples. The wording "B was used instead of A" used in describing Synthesis Examples means that an identical molar equivalent of B was used in place of A.

EXAMPLES

Synthesis Example

Synthesis Example 1: Synthesis of Compound 11

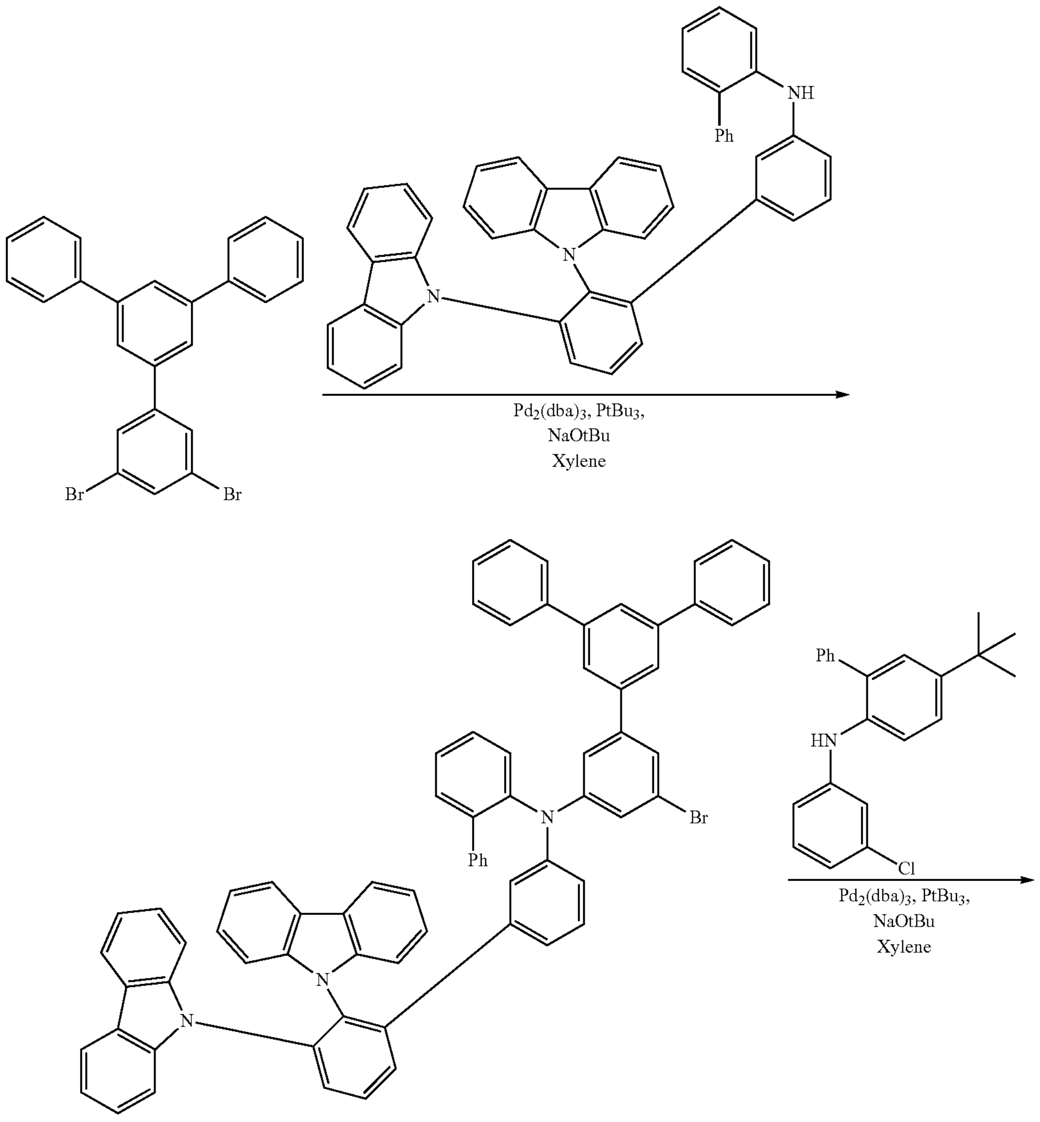

11-1

-continued
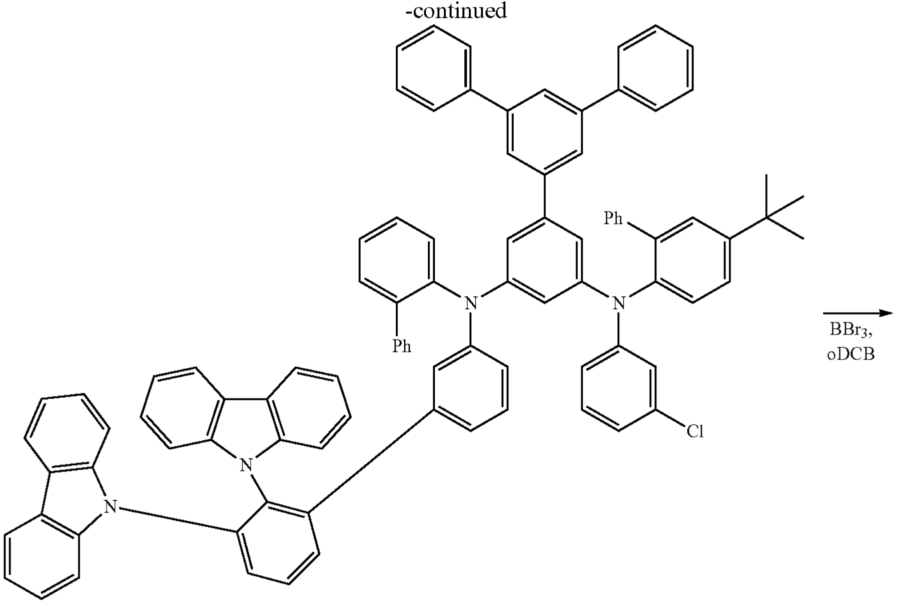
11-2
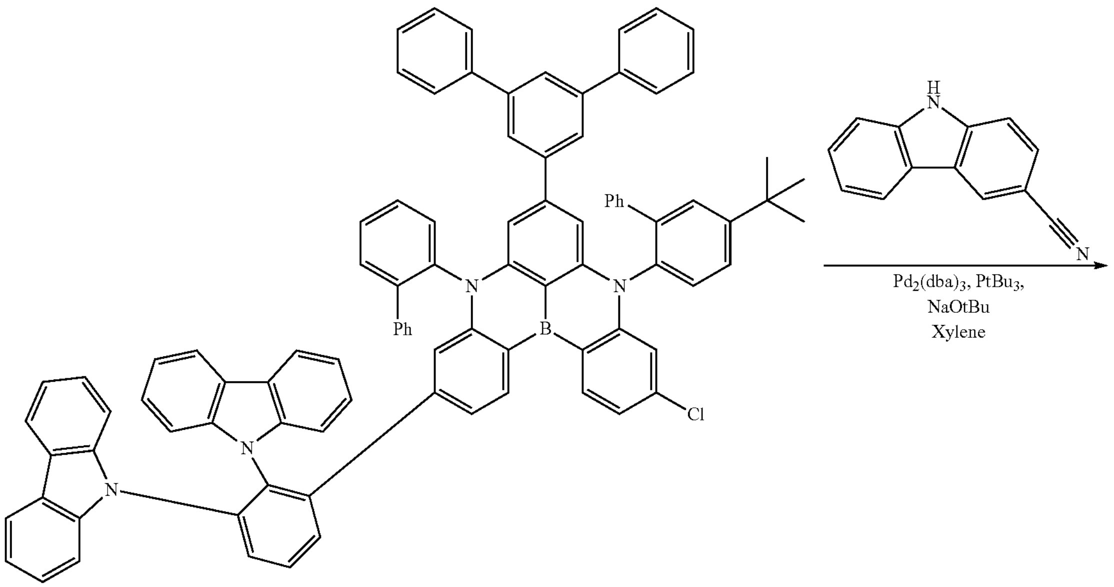
11-3

-continued

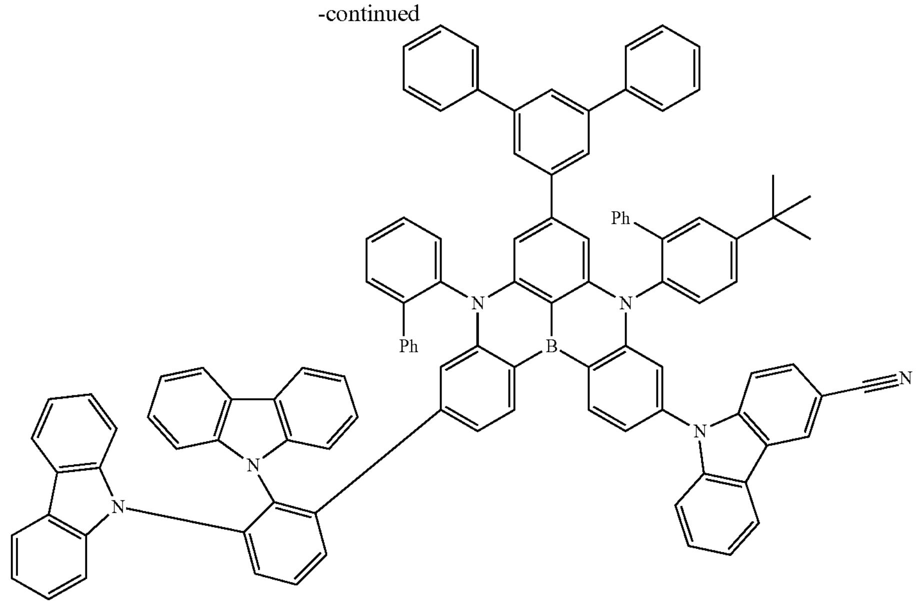

11

Synthesis of Intermediate 11-1

3,5-dibromo-5'-phenyl-1,1':3',1"-terphenyl (1 eq), N-(2',3'-di(9H-carbazol-9-yl)-[1,1'-biphenyl]-3-yl)-[1,1'-biphenyl]-2-amine (1 eq), tris(dibenzylideneacetone)dipalladium (0) (0.05 eq), tri-tert-butylphosphine (0.10 eq), and sodium tert-butoxide (1.5 eq) were dissolved in o-xylene, and stirred in a nitrogen atmosphere at 110° C. for 24 hours. The mixed solution was cooled and dried under reduced pressure to remove o-xylene. A washing process was performed thereon three times by using ethyl acetate and water, and an organic layer thus obtained was dried by using $MgSO_4$ under reduced pressure. The resulting product was purified by column chromatography (dichloromethane:n-Hexane), and recrystallized to obtain Intermediate 11-1. (Yield: 69%)

Synthesis of Intermediate 11-2

Intermediate 11-1 (1 eq), 5-(tert-butyl)-N-(3-chlorophenyl)-[1,1'-biphenyl]-2-amine (1 eq), tris(dibenzylideneacetone)dipalladium(0) (0.05 eq), tri-tert-butylphosphine (0.10 eq), and sodium tert-butoxide (3 eq) were dissolved in o-xylene, and stirred in a nitrogen atmosphere at 150° C. for 24 hours. The mixed solution was cooled and dried under reduced pressure to remove o-xylene. A washing process was performed thereon three times by using ethyl acetate and water, and an organic layer thus obtained was dried by using $MgSO_4$ under reduced pressure. The resulting product was purified by column chromatography (dichloromethane: n-Hexane), and recrystallized to obtain Intermediate 11-2. (Yield: 58%)

Synthesis of Intermediate 11-3

In a flask, Intermediate 11-2 (1 eq) was dissolved in ortho dichlorobenzene (oDCB). The flask was cooled to 0° C. in a nitrogen atmosphere, and $BBr_3$ (2.5 eq) dissolved in ortho dichlorobenzene was slowly injected thereto. After completion of adding dropwise, the temperature was raised to 180° C., followed by stirring for 20 hours. After cooling to 0° C., triethylamine was slowly added dropwise to the flask to terminate the reaction until the exotherm stopped. Hexane was added thereto to cause precipitation, and the filtrate was filtered to obtain a solid. The solid thus obtained was purified by silica filtration, and purified again by recrystallization using methylene chloride (MC)/hexane (Hex) to obtain Intermediate 11-3. Final purification was performed thereon by using column (dichloromethane:n-Hexane). (Yield: 14%)

Synthesis of Compound 11

Intermediate 11-3 (1 eq), 9H-carbazole-3-carbonitrile (1 eq), tris(dibenzylideneacetone)dipalladium (0) (0.05 eq), tri-tert-butylphosphine (0.10 eq), and sodium tert-butoxide (3 eq) were dissolved in o-xylene, and stirred in a nitrogen atmosphere at 150° C. for 24 hours. The mixed solution was cooled and dried under reduced pressure to remove o-xylene. A washing process was performed thereon three times by using ethyl acetate and water, and an organic layer thus obtained was dried by using $MgSO_4$ under reduced pressure. The resulting product was purified by column chromatography (dichloromethane:n-Hexane), and recrystallized to obtain Compound 11. The compound was finally purified by sublimation purification. (Yield after sublimation purification: 34%)

Synthesis Example 2: Synthesis of Compound 31
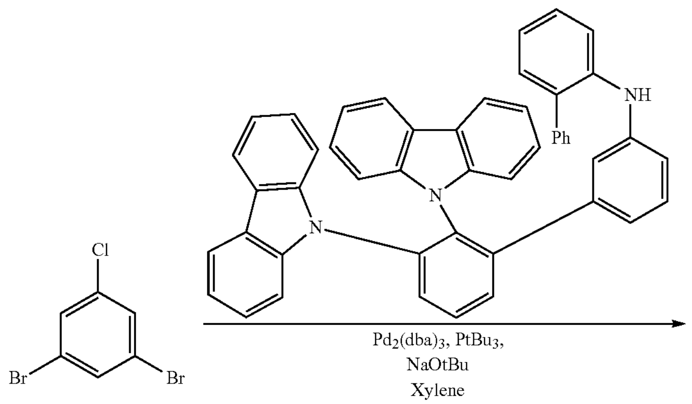
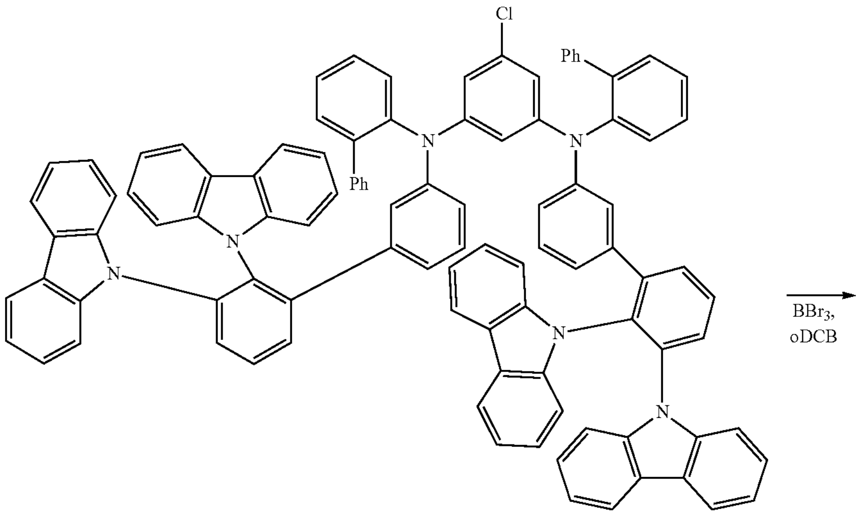
31-1
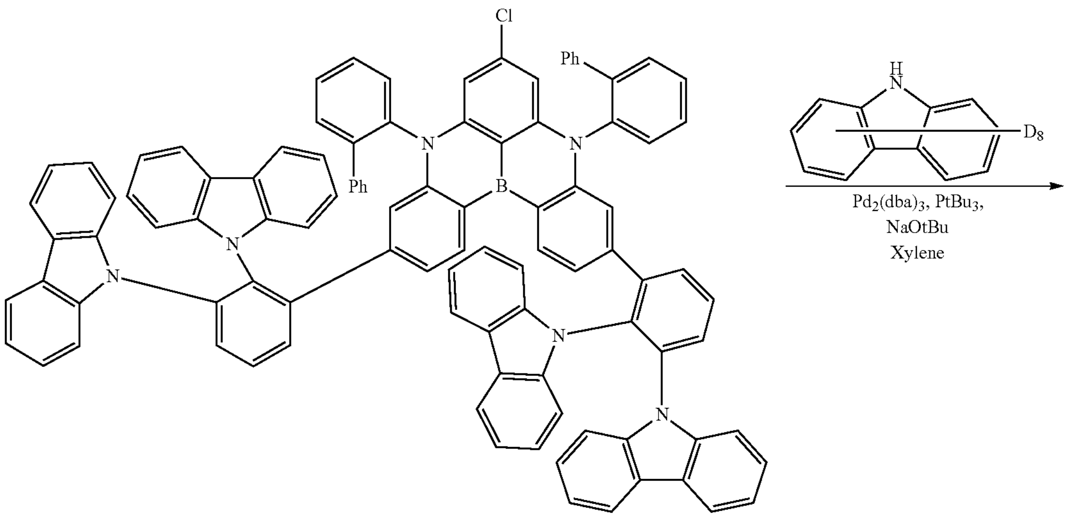
31-2

-continued

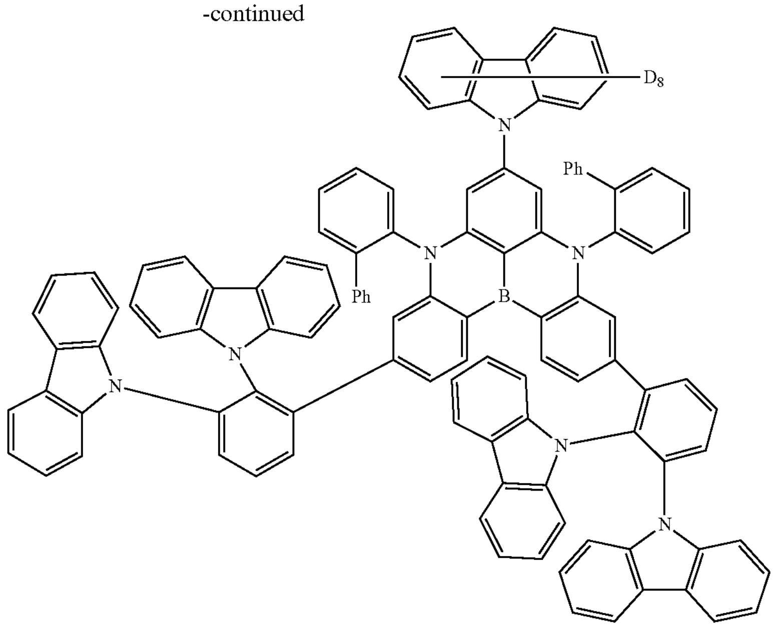

31

Synthesis of Intermediate 31-1

N-(2',3'-di(9H-carbazol-9-yl)-[1,1'-biphenyl]-3-yl)-[1,1'-biphenyl]-2-amine (1 eq), 1-chloro-3,5-dibromobenzene (0.9 eq), tris(dibenzylideneacetone)dipalladium(0) (0.05 eq), tri-tert-butylphosphine (0.1 eq), and sodium tert-butoxide (1 eq) were dissolved in o-xylene, and stirred in a nitrogen atmosphere at 80° C. for 6 hours. The mixed solution was cooled and dried under reduced pressure to remove o-xylene. A washing process was performed thereon three times by using ethyl acetate and water, and an organic layer thus obtained was dried by using $MgSO_4$ under reduced pressure. The resulting product was purified by column chromatography (dichloromethane:n-Hexane), and recrystallized to obtain Intermediate 31-1. (Yield: 64%)

Synthesis of Intermediate 31-2

In a flask, Intermediate 31-1 (1 eq) was dissolved in oDCB. The flask was cooled to 0° C. in a nitrogen atmosphere, and $BBr_3$ (2.5 eq) dissolved in ortho dichlorobenzene was slowly injected thereto. After completion of adding dropwise, the temperature was raised to 180° C., followed by stirring for 204 hours. After cooling to 0° C., triethylamine was slowly added dropwise to the flask to terminate the reaction until the exotherm stopped. Hexane was added thereto to cause precipitation, and the filtrate was filtered to obtain a solid. The solid thus obtained was purified by silica filtration, and purified again by recrystallization using MC/Hex to obtain Intermediate 31-2. Final purification was performed thereon by using column (dichloromethane:n-Hexane). (Yield: 11%)

Synthesis of Compound 31

Intermediate 31-2 (1 eq), 9H-carbazole-d8 (1 eq), tris(dibenzylideneacetone)dipalladium (0) (0.05 eq), tri-tert-butylphosphine (0.10 eq), and sodium tert-butoxide (3 eq) were dissolved in o-xylene, and stirred in a nitrogen atmosphere at 150° C. for 24 hours. The mixed solution was cooled and dried under reduced pressure to remove o-xylene. A washing process was performed thereon three times by using ethyl acetate and water, and an organic layer thus obtained was dried by using $MgSO_4$ under reduced pressure. The resulting product was purified by column chromatography (dichloromethane:n-Hexane), and recrystallized to obtain Compound 31. The compound was finally purified by sublimation purification (Yield after sublimation purification: 61%).

Synthesis Example 3: Synthesis of Compound 48
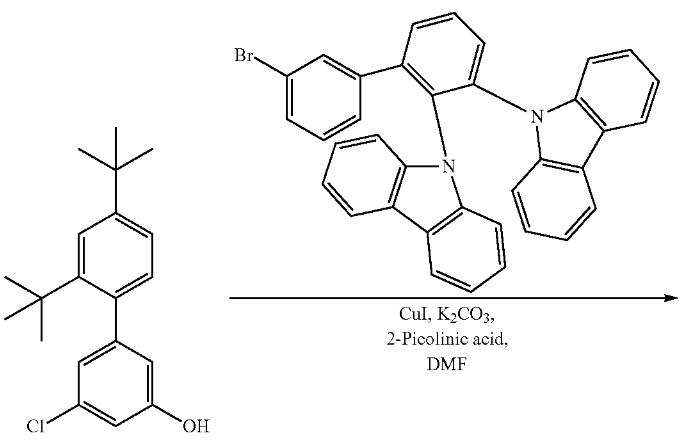
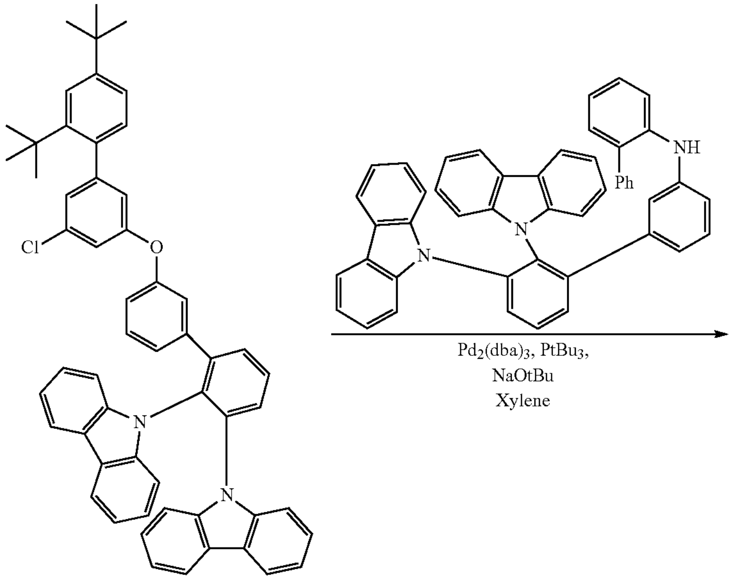
48-1
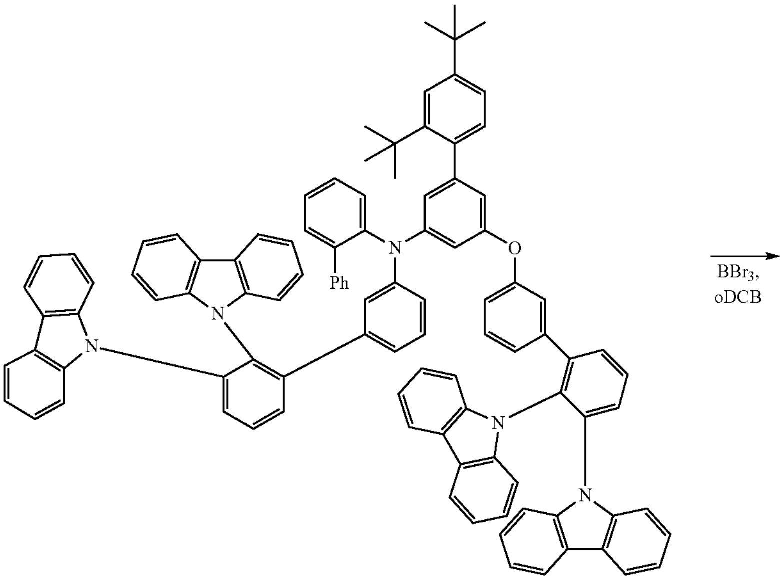
48-2

-continued

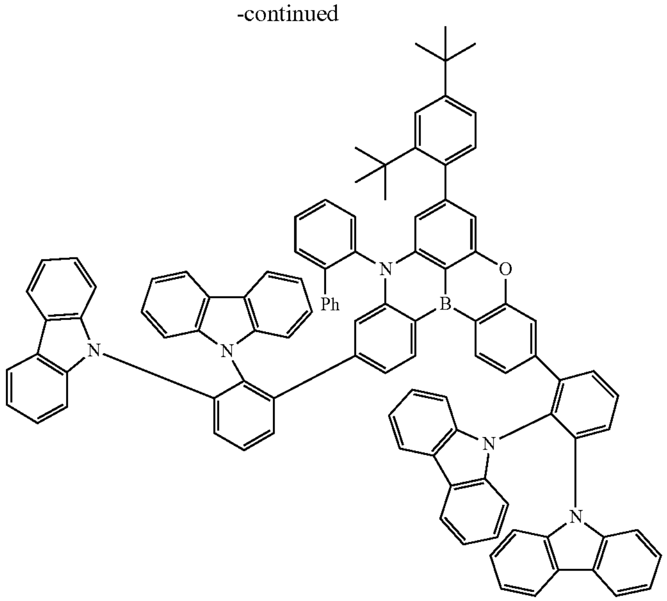

48

Synthesis of Intermediate 48-1

2',4'-di-tert-butyl-5-chloro-[1,1'-biphenyl]-3-ol (1 eq), 9,9'-(3'-bromo-[1,1'-biphenyl]-2,3-diyl)bis(9H-carbazole) (1 eq), Copper(I) iodide (0.5 eq), potassium carbonate (3 eq), and 2-picolinic acid (1 eq) were dissolved in N,N-dimethylformamide anhydrous, and stirred in a nitrogen atmosphere at 150° C. for 24 hours. After completion of the reaction, the mixed solution was cooled and dried under reduced pressure to remove N,N-dimethylformamide anhydrous. A washing process was performed thereon three times by using ethyl acetate and water, and an organic layer thus obtained was dried by using $MgSO_4$ under reduced pressure. The resulting product was purified by column chromatography (dichloromethane:n-Hexane), and recrystallized to obtain Intermediate 48-1. (Yield: 53%)

Synthesis of Intermediate 48-2

Intermediate 48-1 (1 eq), N-(2',3'-di(9H-carbazol-9-yl)-[1,1'-biphenyl]-3-yl)-[1,1'-biphenyl]-2-amine (1 eq), tris (dibenzylideneacetone)dipalladium(0) (0.05 eq), tri-tert-butylphosphine (0.10 eq), and sodium tert-butoxide (1.5 eq) were dissolved in o-xylene, and stirred in a nitrogen atmosphere at 110° C. for 24 hours. After completion of the reaction, the mixed solution was cooled and dried under reduced pressure to remove o-xylene. A washing process was performed thereon three times by using ethyl acetate and water, and an organic layer thus obtained was dried by using $MgSO_4$ under reduced pressure. The resulting product was purified by column chromatography (dichloromethane: n-Hexane), and recrystallized to obtain Intermediate 48-2. (Yield: 67%)

Synthesis of Compound 48

In a flask, Intermediate 48-2 (1 eq) was dissolved in oDCB. The flask was cooled to 0° C. in a nitrogen atmosphere, and $BBr_3$ (2.5 eq) dissolved in ortho dichlorobenzene was slowly injected thereto. After completion of adding dropwise, the temperature was raised to 180° C., followed by stirring for 20 hours. After cooling to 0° C., triethylamine was slowly added dropwise to the flask to terminate the reaction until the exotherm stopped. Hexane was added thereto to cause precipitation, and the filtrate was filtered to obtain a solid. The solid thus obtained was purified by silica filtration, and purified again by recrystallization using MC/Hex to obtain Compound 48.

The compound was finally purified by sublimation purification. (Yield after sublimation purification: 15%)

Synthesis Example 4: Synthesis of Compound 78

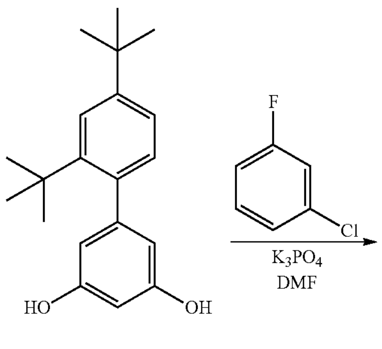

-continued
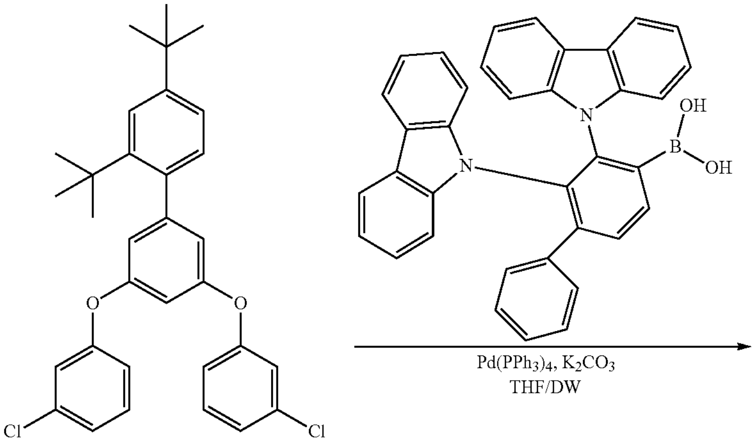
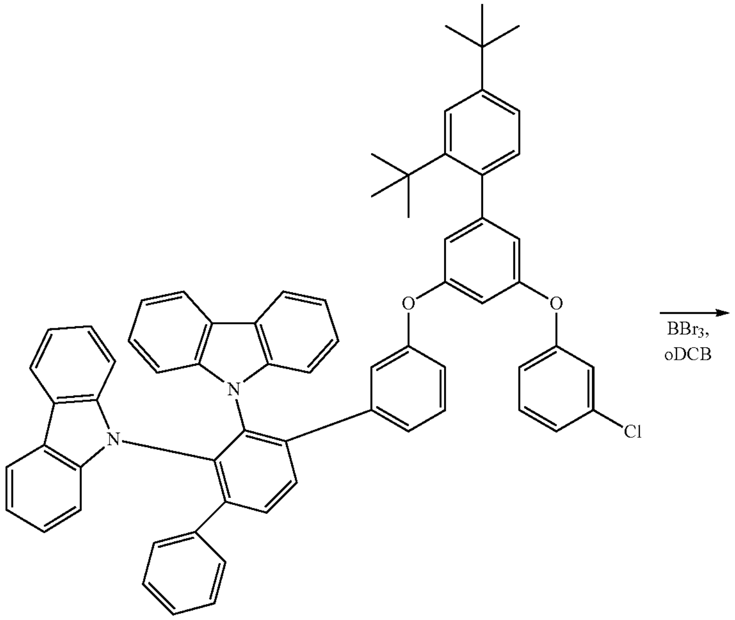
78-2

-continued

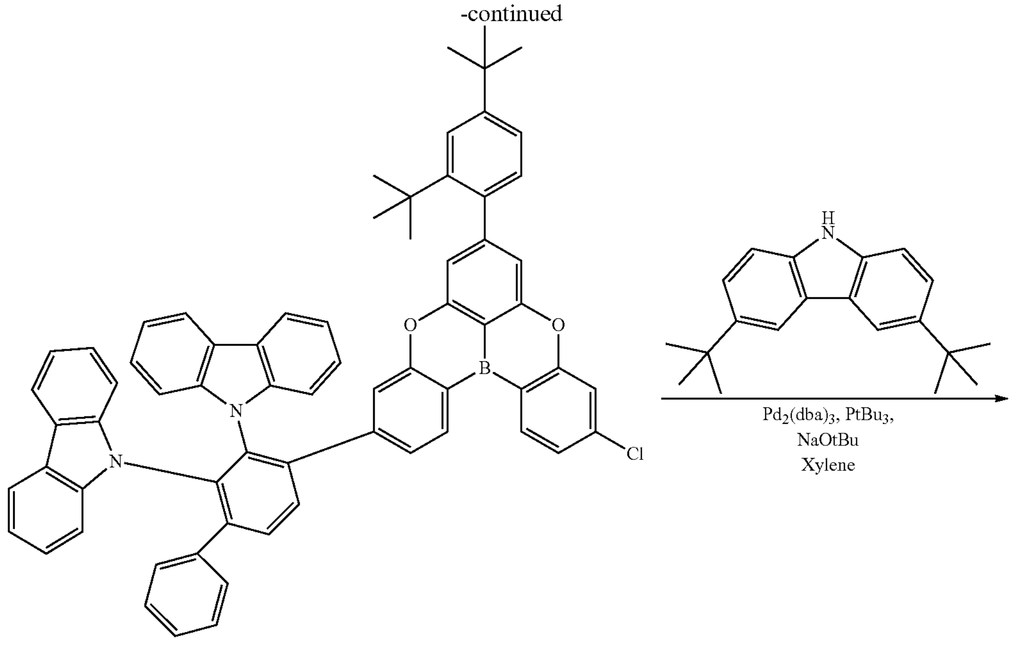

78-3

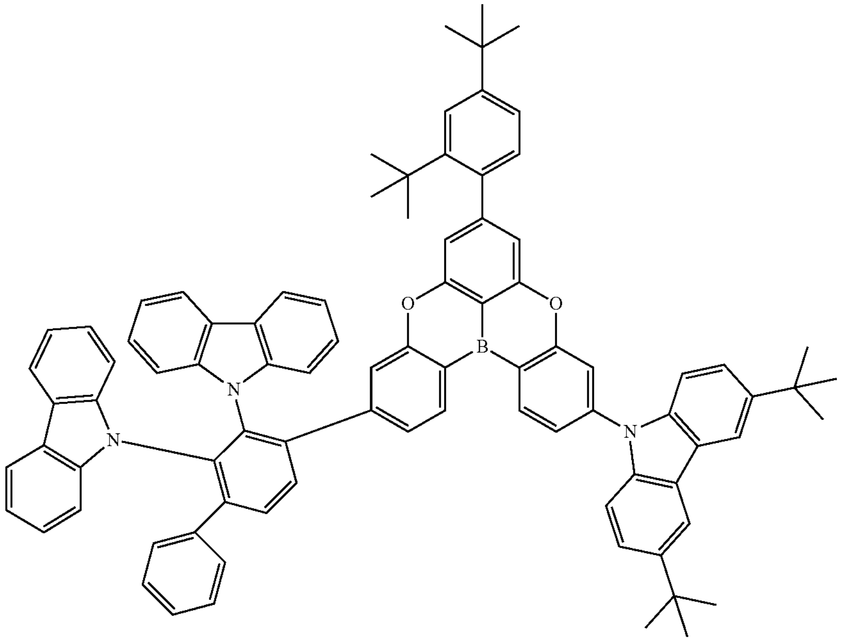

78

Synthesis of Intermediate 78-1

2',4'-di-tert-butyl-[1,1'-biphenyl]-3,5-diol (1 eq), 1-chloro-3-fluorobenzene (1 eq), and potassium phosphate (5 eq) were dissolved in N,N-dimethylformamide anhydrous, and stirred in a nitrogen atmosphere at 150° C. for 24 hours. After completion of the reaction, the mixed solution was cooled and dried under reduced pressure to remove N,N-dimethylformamide anhydrous. A washing process was performed thereon three times by using ethyl acetate and water, and an organic layer thus obtained was dried by using $MgSO_4$ under reduced pressure. The resulting product was purified by column chromatography (dichloromethane:n-Hexane), and recrystallized to obtain Intermediate 78-1. (Yield: 69%)

Synthesis of Intermediate 78-2

Intermediate 78-1 (1 eq), (2,3-di(9H-carbazol-9-yl)-[1,1'-biphenyl]-4-yl)boronic acid (1 eq), potassium carbonate (3 eq), and tetrakis(triphenylphosphine)palladium(0) were dissolved in a mixed solution containing tetrahydrofuran and distilled water (at a volume ratio of 3:1), and stirred at 100° C. for 24 hours. After completion of the reaction, the mixed solution was cooled, and a washing process was performed thereon three times by using ethyl acetate and water. An organic layer thus obtained was dried by using $MgSO_4$ under reduced pressure. The resulting product was purified by column chromatography (dichloromethane:n-Hexane), and recrystallized to obtain Intermediate 78-2. (Yield: 50%)

Synthesis of Intermediate 78-3

In a flask, Intermediate 78-2 (1 eq) was dissolved in oDCB. The flask was cooled to 0° C. in a nitrogen atmosphere, and $BBr_3$ (2.5 eq) dissolved in ortho dichlorobenzene was slowly injected thereto. After completion of adding dropwise, the temperature was raised to 180° C., followed by stirring for 20 hours. After cooling to 0° C., triethylamine was slowly added dropwise to the flask to terminate the reaction until the exotherm stopped. Hexane was added thereto to cause precipitation, and the filtrate was filtered to obtain a solid. The solid thus obtained was purified by silica filtration, and purified again by recrystallization using MC/Hex to obtain Intermediate 78-3. Final purification was performed thereon by using column (dichloromethane:n-Hexane). (Yield after final purification: 12%)

Synthesis of Compound 78

Intermediate 78-3 (1 eq), 3,6-di-tert-butyl-9H-carbazole (1 eq), tris(dibenzylideneacetone)dipalladium (0) (0.05 eq), tri-tert-butylphosphine (0.10 eq), and sodium tert-butoxide (3 eq) were dissolved in o-xylene, and stirred in a nitrogen atmosphere at 150° C. for 24 hours. After completion of the reaction, the mixed solution was cooled and dried under reduced pressure to remove o-xylene. A washing process was performed thereon three times by using ethyl acetate and water, and an organic layer thus obtained was dried by using $MgSO_4$ under reduced pressure. The resulting product was purified by column chromatography (dichloromethane: n-Hexane), and recrystallized to obtain Compound 78. The compound was finally purified by sublimation purification (yield after sublimation purification: 54%).

Table 1 shows $^1$H NMR and MS/FAB of the synthesized compounds. Synthesis methods for compounds other than the compounds shown in Table 1 may be readily recognized by those skilled in the technical field by referring to the synthesis paths and source materials described above.

TABLE 1

| Compound | $^1$H-NMR ($CDCl_3$, 500 MHz) | MS/FAB calc. | MS/FAB Found[M + 1] |
|---|---|---|---|
| Compound 11 | 9.12 (1H, d), 9.04 (1H, d), 7.91 (2H, d), 7.86-7.72 (4H, m), 7.61-7.49 (18H, m), 7.41-7.20 (17H, m), 6.83-6.67 (19H, m), 6.32-6.29 (2H, m), 1.31 (9H, s) | 1452.60 | 1453.14 |
| Compound 31 | 9.01 (2H, d), 7.89 (4H, d), 7.86 (4H, d), 7.62-7.43 (4H, m), 7.41-7.19 (15H, m), 7.05-6.81 (16H, m), 6.62-6.47 (17H, m), 6.40-6.26 (2H, m) | 1557.64 | 1558.42 |
| Compound 48 | 8.91 (1H, d), 8.84 (1H, d), 7.87 (2H, d), 7.85 (2H, d), 7.82-7.76 (4H, m), 7.69-7.54 (16H, m), 7.46-7.32 (17H, m), 7.23-7.06 (13H, m), 6.47 (1H, s), 6.29 (1H, s), 1.39 (9H, s), 1.34 (9H, s) | 1421.61 | 1422.36 |
| Compound 78 | 8.83 (1H, d), 8.76 (1H, d), 7.97 (2H, d), 7.86 (2H, d), 7.82 (2H, d), 7.78 (2H, s), 7.70-7.64 (9H, m), 7.56-7.33 (8H, m), 7.26-7.07 (11H, m), 6.32 (1H, s), 6.21 (1H, s), 1.36 (9H, s), 1.33 (9H, s), 1.31 (18H, s) | 1217.60 | 1218.12 |

Evaluation Example 1

Regarding the compounds of Synthesis Examples 1 to 4 and Comparative Compounds 1 and 2, highest occupied molecular orbital (HOMO) and lowest unoccupied molecular orbital (LUMO) energy levels and $\Delta E_{ST}$ and f values (representing oscillator strength) were evaluated, and the results are shown in Table 3.

The HOMO and LUMO energy levels were each evaluated according to the methods described in Table 2, and the $\Delta E_{ST}$ value was calculated according to Equation 1:

$$\Delta E_{ST} = S1 - T1 \qquad \text{[Equation 1]}$$

In Equation 1, S1 is a lowest excitation singlet energy level (eV) of the compound, and $T_1$ is a lowest excitation triplet energy level (eV) of the compound.

S1, T1, and f values were calculated by simulation using a density functional theory (DFT) method based on B3LYP.

TABLE 2

| | |
|---|---|
| HOMO energy level evaluation method | By using cyclic voltammetry (CV) (electrolyte: 0.1M $BU_4NPF_6$/solvent: dimethylforamide (DMF)/electrode: 3-electrode system (working electrode: GC, reference electrode: Ag/AgCl, and auxiliary electrode: Pt)), the potential (V)-current (A) graph of each compound was obtained, and from the oxidation onset of the graph, the HOMO energy level of each compound was calculated. |
| LUMO energy level evaluation method | By using cyclic voltammetry (CV) (electrolyte: 0.1M $BU_4NPF_6$/solvent: dimethylforamide (DMF)/electrode: 3-electrode system (working electrode: GC, reference electrode: Ag/AgCl, and auxiliary electrode: Pt)), the potential (V)-current (A) graph of each compound was obtained, and from the reduction onset of the graph, the LUMO energy level of each compound was calculated. |

TABLE 3

| Compound | HOMO (eV) | LUMO (eV) | ΔEst | f value |
|---|---|---|---|---|
| Compound 11 | −5.38 | −1.95 | 0.42 | 0.30 |
| Compound 31 | −5.30 | −1.85 | 0.40 | 0.26 |
| Compound 48 | −5.43 | −1.94 | 0.41 | 0.22 |
| Compound 78 | −5.48 | −2.13 | 0.43 | 0.21 |
| Comparative Compound 1 | −5.45 | −1.69 | 0.45 | 0.15 |
| Comparative Compound 2 | −5.19 | −1.74 | 0.49 | 0.18 |

Example 1

As an anode, a glass substrate (product of Corning Inc.) with a 15 Ω/cm$^2$ (1,200 Å) ITO electrode formed thereon was cut to a size of 50 mm×50 mm×0.7 mm, sonicated using isopropyl alcohol and pure water each for 5 minutes, and cleaned by irradiation of ultraviolet rays and exposure of ozone thereto for 30 minutes. The resultant glass substrate was mounted on a vacuum deposition apparatus.

NPD(NPB) was deposited on the anode to form a hole injection layer having a thickness of 300 Å, HT48 was deposited on the hole injection layer to form a hole transport layer having a thickness of 200 Å, and CzSi was deposited on the hole transport layer to form an emission auxiliary layer having a thickness of 100 Å.

On the emission auxiliary layer, a mixture of Compound H126 and Compound H129 (at a weight ratio of 5:5) as a host, Compound PD40 as a sensitizer, and Compound 11 as a dopant were co-deposited at a weight ratio of 85:14:1 to form an emission layer having a thickness of 200 Å.

TSPO1 was deposited on the emission layer to form a hole blocking layer having a thickness of 200 Å, TPBi was deposited on the hole blocking layer to form an electron transport layer having a thickness of 300 Å, LiF was deposited on the electron transport layer to form an electron injection layer having a thickness of 10 Å, A1 was deposited on the electron injection layer to form a cathode having a thickness of 3,000 Å, and HT28 was deposited on the cathode to form a capping layer having a thickness of 700 Å, thereby completing the manufacture of a light-emitting device.

Materials used in the above-described light-emitting device may be represented by the formulae below:

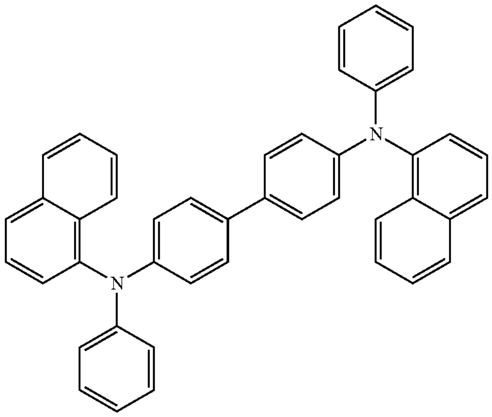

NPB

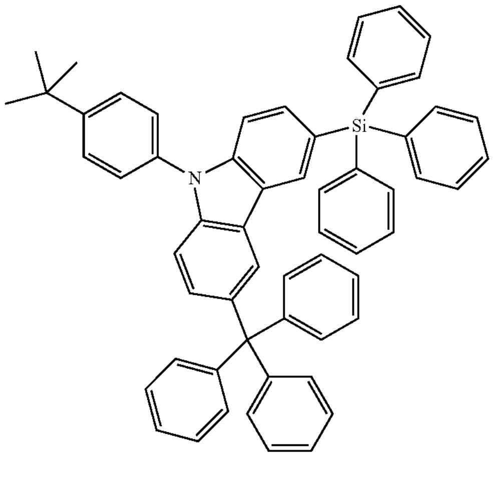

CzSi

-continued

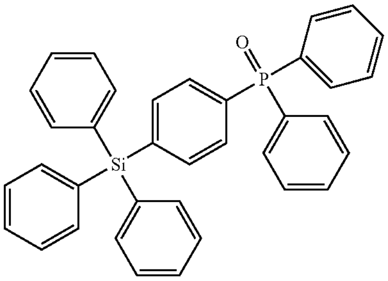

TSPO1

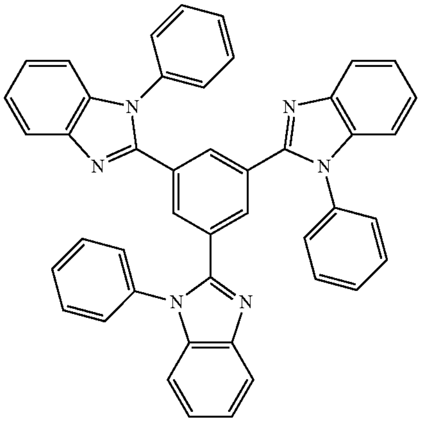

TPBi

HT48

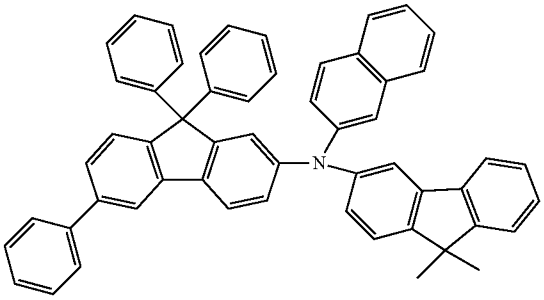

HT28

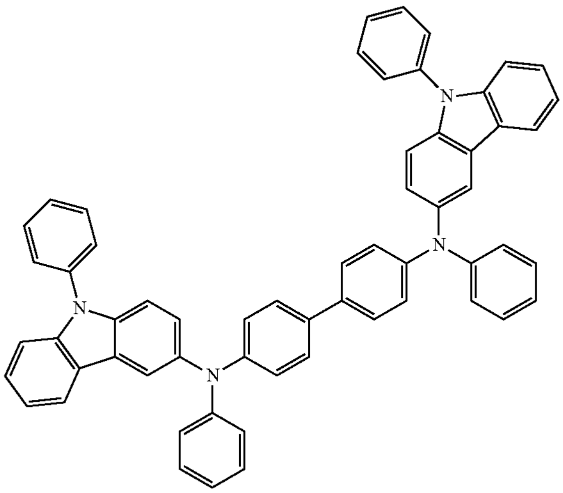

-continued

H126

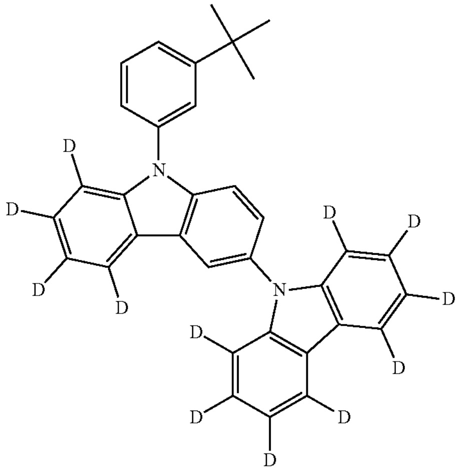

H129

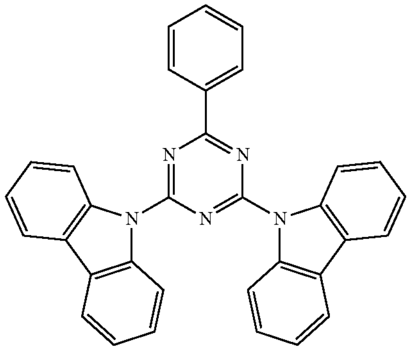

.

Examples 2 to 4 and Comparative Examples 1 and 2

Light-emitting devices were manufactured in the same manner as in Example 1, except that compounds shown in Table 4 were used to form a hole transport layer and an emission layer.

Table 4 also shows weight ratios of the first compound to the second compound.

Evaluation Example 2

To evaluate the characteristics of the light-emitting devices of Examples 1 to 4 and Comparative Examples 1 and 2, the driving voltage (V) at a luminance of 1,000 cd/m$^2$, luminescence efficiency (Cd/A), and emission color were each measured by using Keithley MU 236 and luminance meter PR650. The time taken for the luminance to become 95% compared to the initial luminance was measured as a lifespan ($T_{95}$). Based on the device of Comparative Example 1 (reference), the lifespan was calculated, and results are shown in Table 5.

The maximum external quantum efficiency was measured by using an external quantum efficiency measuring meter (C9920-2-12 by Hamamatsu Photonics Co.). In evaluating the maximum external quantum efficiency, the luminance/current density was measured using a luminance meter that was calibrated for wavelength sensitivity, and the measured luminance/current density was converted into the maximum external quantum efficiency by assuming an angular luminance distribution (Lambertian) which introduced a perfect reflecting diffuser. Results are shown in Table 5.

TABLE 4

| | Hole transport layer | Host (first compound/second compound) | Sensitizer | Dopant |
|---|---|---|---|---|
| Example 1 | HT48 | H126/H129 (5:5) | PD40 | Compound 11 |
| Example 2 | HT43 | H125/H130 (5:5) | PD41 | Compound 31 |
| Example 3 | HT47 | H127/H130 (5:5) | PD40 | Compound 48 |
| Example 4 | HT52 | H125/H131 (5:5) | PD41 | Compound 78 |
| Comparative Example 1 | HT52 | H125/H131 (5:5) | PD40 | Comparative Compound 1 |
| Comparative Example 2 | HT43 | H126/H130 (5:5) | PD41 | Comparative Compound 2 |

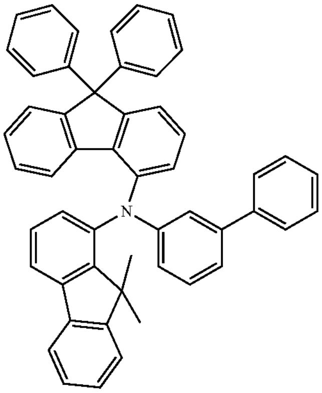

HT47

TABLE 4-continued
| | Hole transport layer | Host (first compound/second compound) | Sensitizer | Dopant |
|---|---|---|---|---|
| 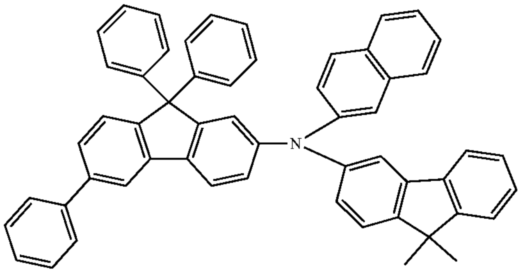 HT48 | | | | |
| 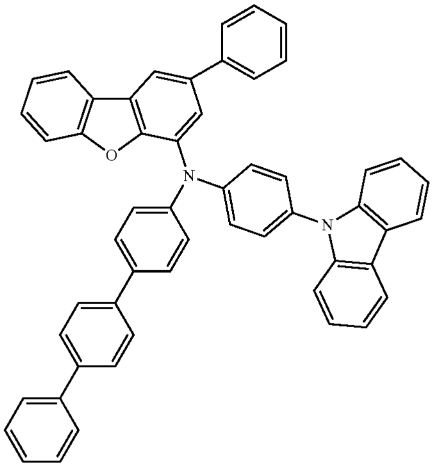 HT43 | | | | |
| 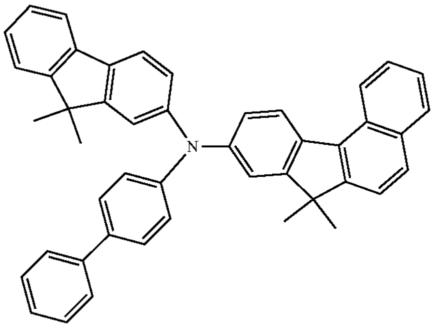 HT52 | | | | |
| 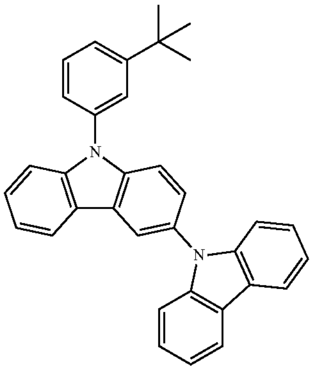 H125 | | | | |

TABLE 4-continued
| | Hole transport layer | Host (first compound/second compound) | Sensitizer | Dopant |
|---|---|---|---|---|
| 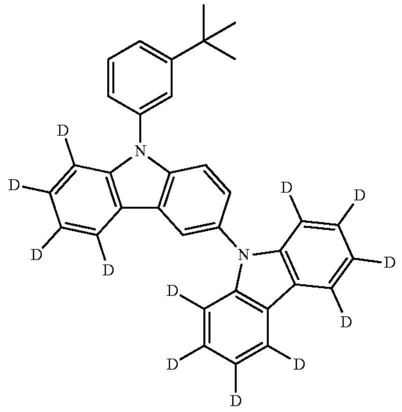 H126 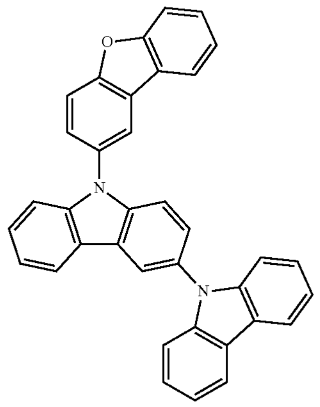 H127 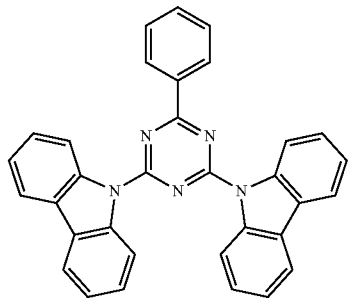 H129 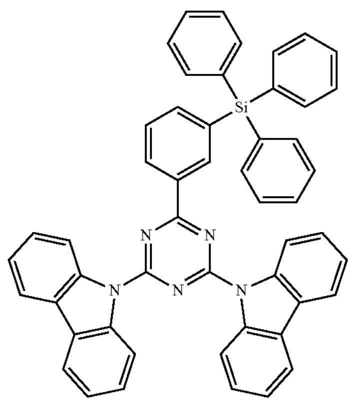 H130 | | | | |

TABLE 4-continued
| Hole transport layer | Host (first compound/second compound) | Sensitizer | Dopant |
|---|---|---|---|
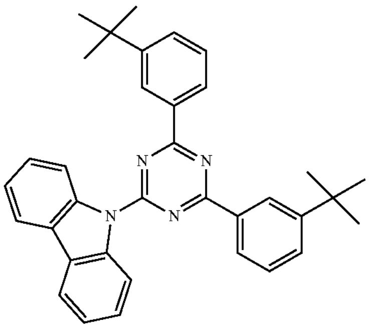
H131
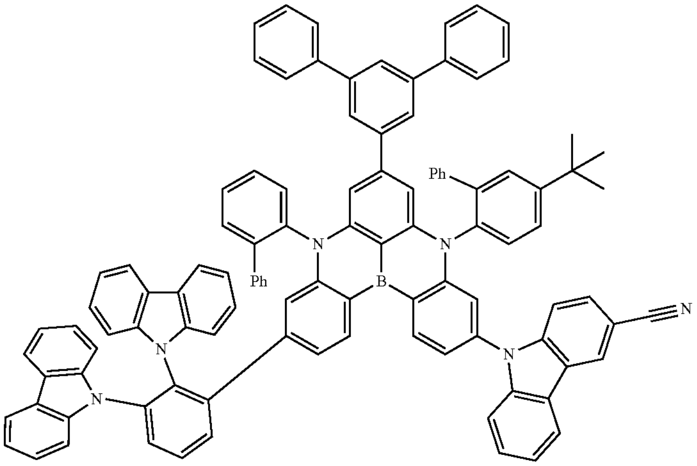
11
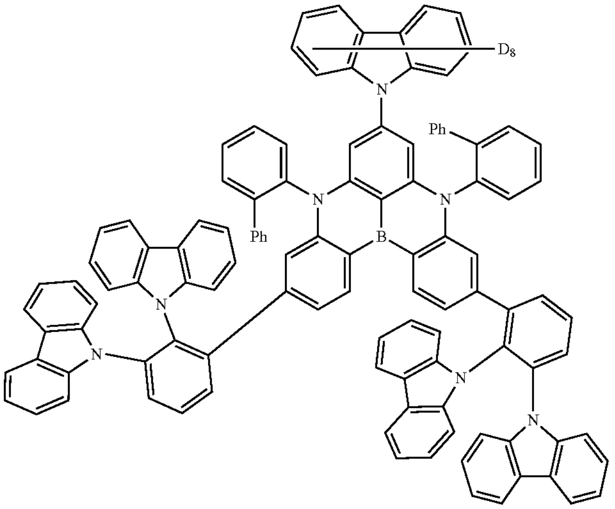
31

TABLE 4-continued
| Hole transport layer | Host (first compound/second compound) | Sensitizer | Dopant |
|---|---|---|---|
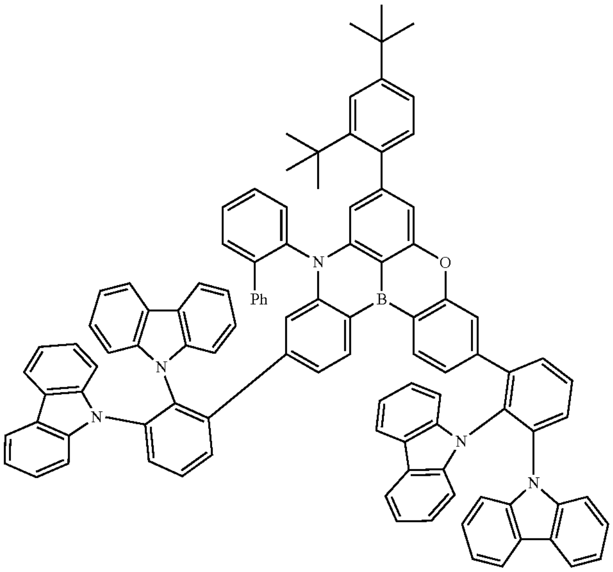
48
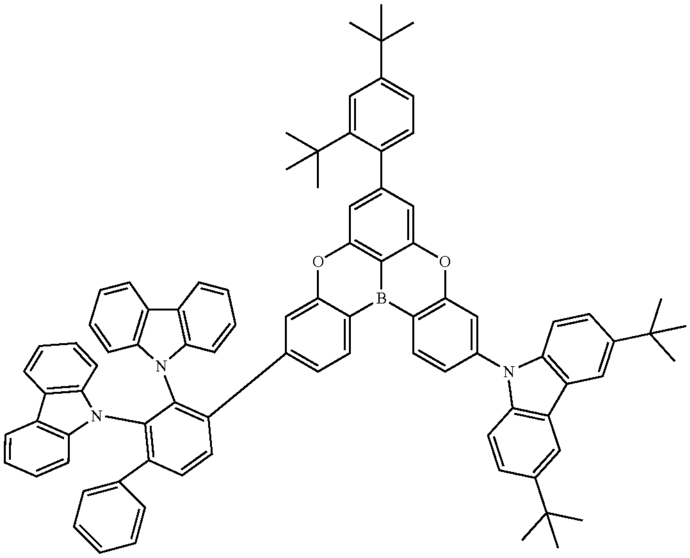
78
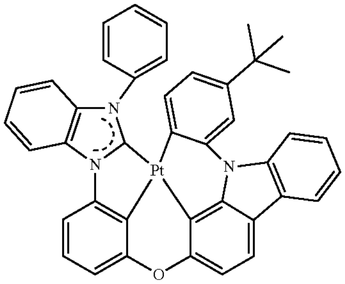
PD40

TABLE 4-continued

| | Hole transport layer | Host (first compound/second compound) | Sensitizer | Dopant |
|---|---|---|---|---|

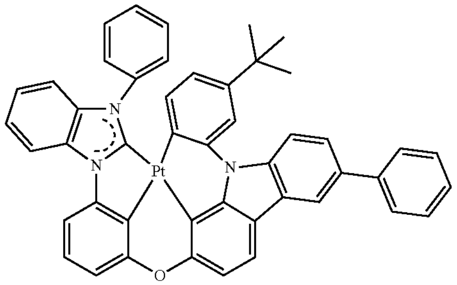

PD41

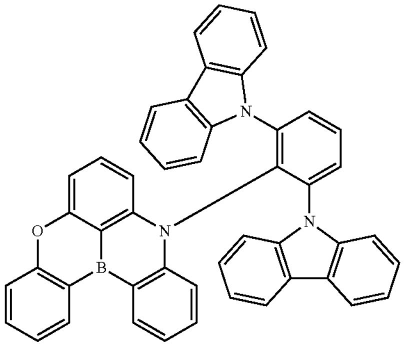

[Comparative Compound 1]

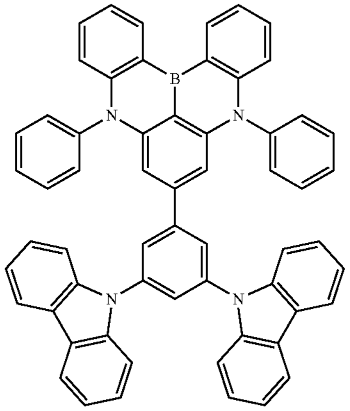

[Comparative Compound 2]

TABLE 5

| | Driving voltage (V) | Luminescence efficiency (cd/A) | Maximum external quantum efficiency (%) | Ref. Relative lifespan $T_{95}$ (%) | Emission color |
|---|---|---|---|---|---|
| Example 1 | 4.4 | 25.8 | 24.2 | 350 | Blue |
| Example 2 | 4.2 | 26.1 | 25.4 | 319 | Blue |
| Example 3 | 4.3 | 24.3 | 23.7 | 275 | Blue |
| Example 4 | 4.2 | 23.7 | 22.6 | 273 | Blue |
| Comparative Example 1 | 4.8 | 14.6 | 13.7 | 100 | Blue |
| Comparative Example 2 | 4.5 | 16.5 | 15.7 | 151 | Blue |

Referring to Table 5, it was confirmed that the light-emitting devices of Examples 1 to 4 had low driving voltage, excellent luminescence efficiency and maximum external quantum efficiency, and a long lifespan, compared to the light-emitting devices of Comparative Examples 1 and 2.

Example 5

As an anode, a glass substrate (product of Corning Inc.) with a 15 Ω/cm$^2$ (1,200 Å) ITO electrode formed thereon was cut to a size of 50 mm×50 mm×0.7 mm, sonicated using isopropyl alcohol and pure water each for 5 minutes, and cleaned by irradiation of ultraviolet rays and exposure of ozone thereto for 30 minutes. The resultant glass substrate was mounted on a vacuum deposition apparatus.

NPD(NPB) was deposited on the anode to form a hole injection layer having a thickness of 300 Å, HT48 was deposited on the hole injection layer to form a hole transport layer having a thickness of 200 Å, and CzSi was deposited on the hole transport layer to form an emission auxiliary layer having a thickness of 100 Å.

On the emission auxiliary layer, a mixture of Compound H126 and Compound H129 (at a weight ratio of 5:5) as a host and Compound 11 as a dopant were co-deposited at a weight ratio of 99:1 to form an emission layer having a thickness of 200 Å.

TSPO1 was deposited on the emission layer to form a hole blocking layer having a thickness of 200 Å, TPBI was deposited on the hole blocking layer to form an electron transport layer having a thickness of 300 Å, LiF was deposited on the electron transport layer to form an electron injection layer having a thickness of 10 Å, A1 was deposited on the electron injection layer to form a cathode having a thickness of 3,000 Å, and HT28 was deposited on the electrode to form a capping layer having a thickness of 700 Å, thereby completing the manufacture of a light-emitting device.

Examples 6 to 8 and Comparative Examples 3 and 4

Light-emitting devices were manufactured in the same manner as in Example 5, except that compounds shown in Table 6 were used to form a hole transport layer and an emission layer.

Table 6 also shows weight ratios of the first compound to the second compound.

Evaluation Example 3

To evaluate the characteristics of the light-emitting devices of Examples 5 to 8 and Comparative Examples 3 and 4, the driving voltage (V) at a luminance of 1,000 cd/m$^2$, luminescence efficiency (Cd/A), and emission color were each measured by using Keithley MU 236 and luminance meter PR650. The time taken for the luminance to become 95% compared to the initial luminance was measured as a lifespan ($T_{95}$). Based on the device of Comparative Example 3 (reference), the lifespan was calculated, and results are shown in Table 6.

The maximum external quantum efficiency was measured by using an external quantum efficiency measuring meter (C9920-2-12 by Hamamatsu Photonics Co.). In evaluating the maximum external quantum efficiency, the luminance/current density was measured using a luminance meter that was calibrated for wavelength sensitivity, and the measured luminance/current density was converted into the maximum external quantum efficiency by assuming an angular luminance distribution (Lambertian) which introduced a perfect reflecting diffuser. Results are shown in Table 6.

TABLE 6

| | Hole transport layer | Host (first compound/second compound) | Dopant | Driving voltage (V) | Luminescence efficiency (cd/A) | Maximum external quantum efficiency (%) | Ref. Relative lifespan $T_{95}$ (%) | Emission color |
|---|---|---|---|---|---|---|---|---|
| Example 5 | HT48 | H126/H129 (5:5) | Compound 11 | 7 | 8.2 | 8.1 | 439 | Blue |
| Example 6 | HT43 | H125/H130 (5:5) | Compound 31 | 6.8 | 8.8 | 8.4 | 413 | Blue |
| Example 7 | HT47 | H127/H130 (5:5) | Compound 48 | 6.9 | 8.3 | 8.0 | 350 | Blue |
| Example 8 | HT52 | H125/H131 (5:5) | Compound 78 | 6.8 | 8.4 | 8.2 | 346 | Blue |
| Comparative Example 3 | HT52 | H125/H131 (5:5) | Comparative Compound 1 | 7.4 | 4.5 | 4.6 | 100 | Blue |
| Comparative Example 4 | HT43 | H126/H130 (5:5) | Comparative Compound 2 | 7.1 | 5.1 | 5.2 | 173 | Blue |

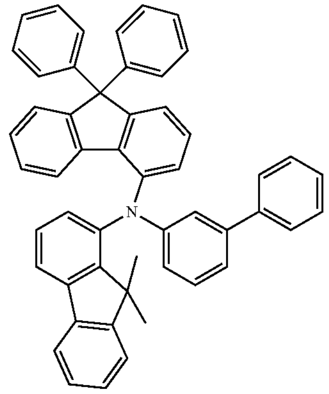

HT47

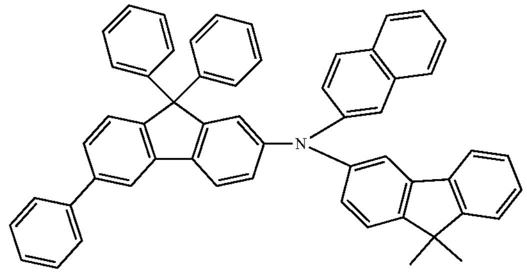

HT48

TABLE 6-continued
| | Hole transport layer | Host (first compound/second compound) | Dopant | Driving voltage (V) | Luminescence efficiency (cd/A) | Maximum external quantum efficiency (%) | Ref. Relative lifespan $T_{95}$ (%) | Emission color |
|---|---|---|---|---|---|---|---|---|
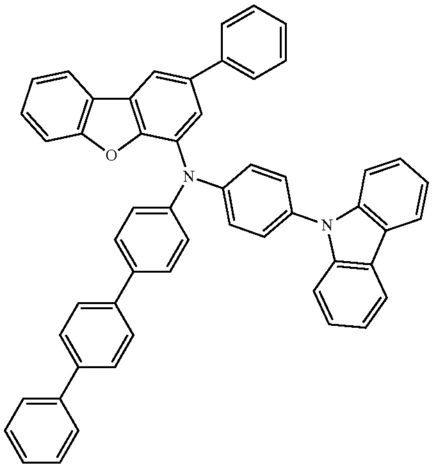
HT43
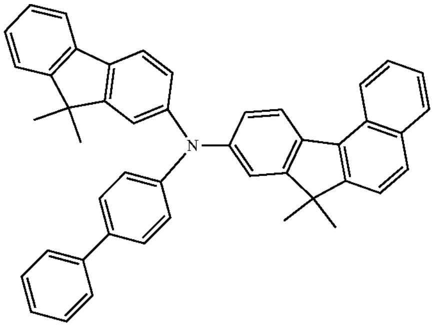
HT52
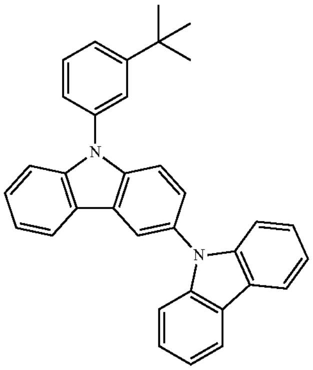
H125

TABLE 6-continued
| | Hole transport layer | Host (first compound/second compound) | Dopant | Driving voltage (V) | Luminescence efficiency (cd/A) | Maximum external quantum efficiency (%) | Ref. Relative lifespan $T_{95}$ (%) | Emission color |
|---|---|---|---|---|---|---|---|---|
| 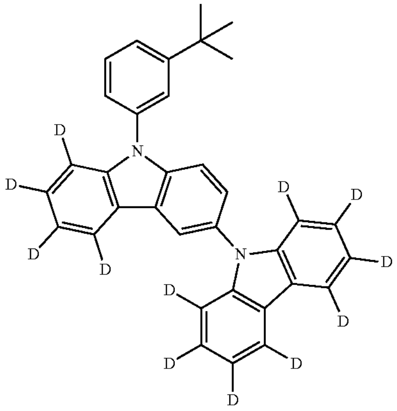 H126 | | | | | | | | |
| 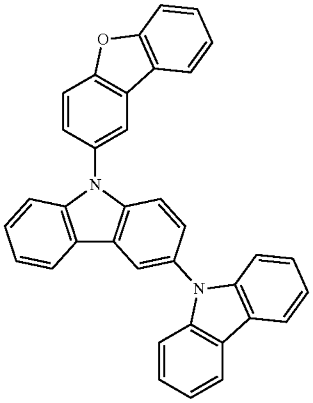 H127 | | | | | | | | |
| 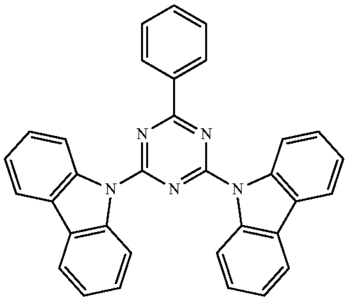 H129 | | | | | | | | |

TABLE 6-continued
| | Hole transport layer | Host (first compound/second compound) | Dopant | Driving voltage (V) | Luminescence efficiency (cd/A) | Maximum external quantum efficiency (%) | Ref. Relative lifespan $T_{95}$ (%) | Emission color |
|---|---|---|---|---|---|---|---|---|
| | | 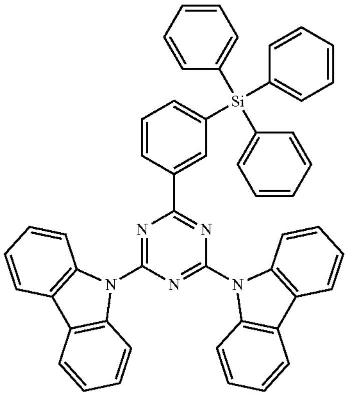 H130 | | | | | | |
| | | 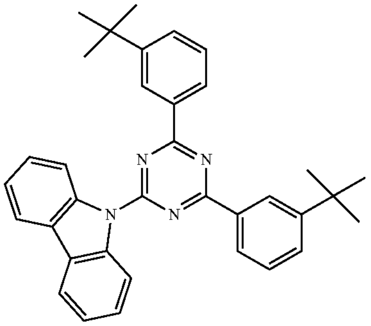 H131 | | | | | | |
| | | | 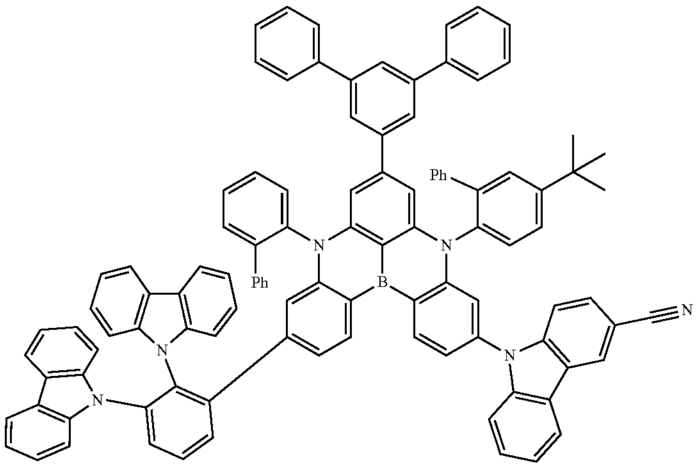 11 | | | | | |

TABLE 6-continued
| Hole transport layer | Host (first compound/second compound) | Dopant | Driving voltage (V) | Luminescence efficiency (cd/A) | Maximum external quantum efficiency (%) | Ref. Relative lifespan $T_{95}$ (%) | Emission color |
|---|---|---|---|---|---|---|---|
| | | 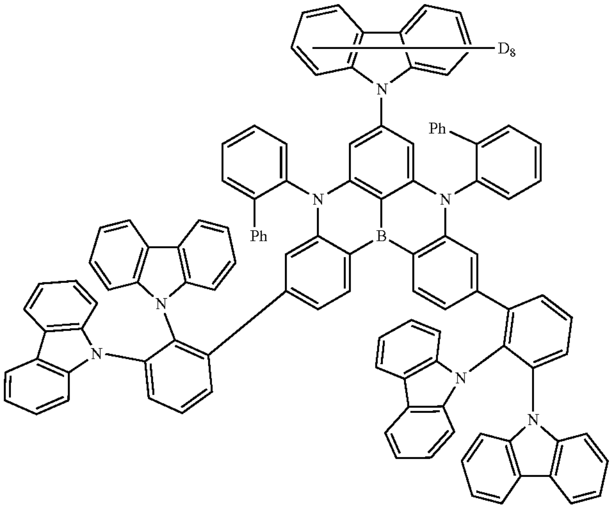 31 | | | | | |
| | | 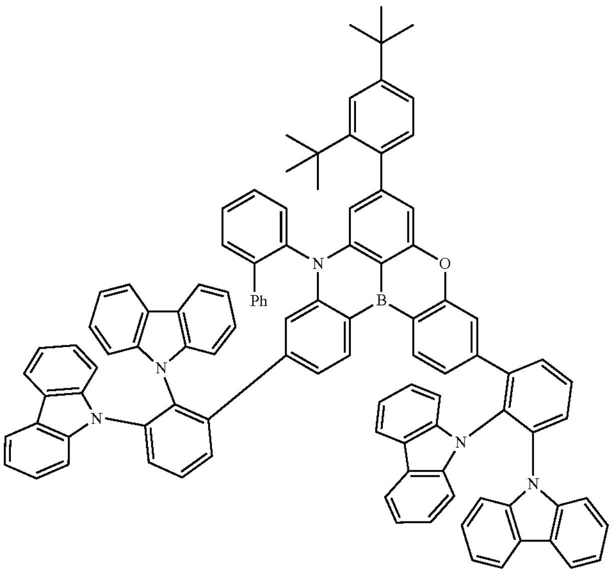 48 | | | | | |

TABLE 6-continued

| | Hole transport layer | Host (first compound/second compound) | Dopant | Driving voltage (V) | Luminescence efficiency (cd/A) | Maximum external quantum efficiency (%) | Ref. Relative lifespan $T_{95}$ (%) | Emission color |
|---|---|---|---|---|---|---|---|---|

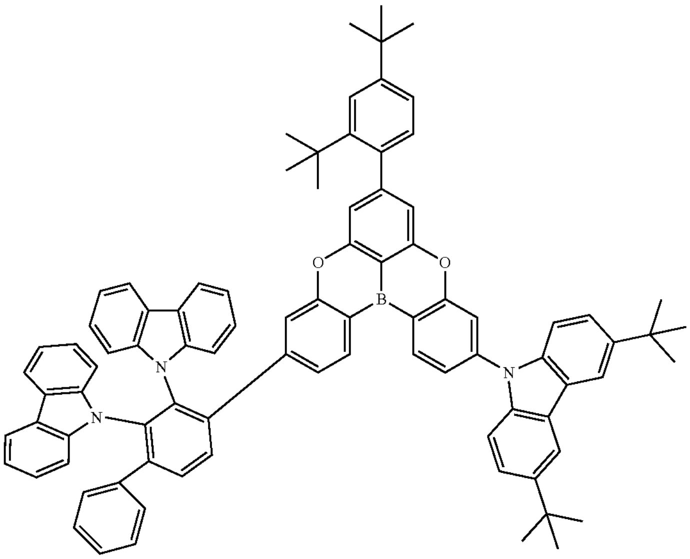

78

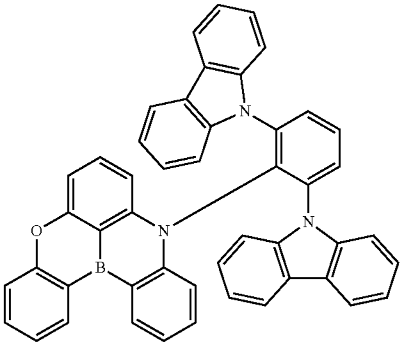

[Comparative Compound 1]

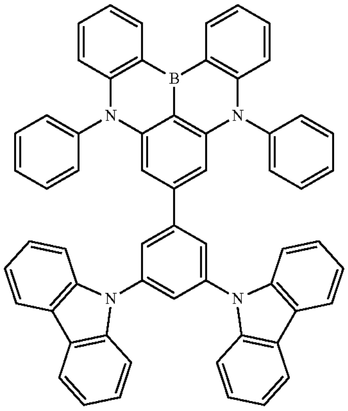

[Comparative Compound 2]

Referring to Table 6, it was confirmed that the light-emitting devices of Examples 5 to 8 had low driving voltage, excellent luminescence efficiency and maximum external quantum efficiency, and a long lifespan, compared to the light-emitting devices of Comparative Examples 3 and 4.

According to embodiments, a condensed cyclic compound may have excellent electrical characteristics and the like, and thus, a light-emitting device including the condensed cyclic compound may have high luminescence efficiency and a long lifespan.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light-emitting device comprising:

a first electrode;

a second electrode facing the first electrode; and an interlayer between the first electrode and the second electrode, wherein the interlayer comprises:

an emission layer; and at least one condensed cyclic compound represented by Formula 1:

[Formula 1]

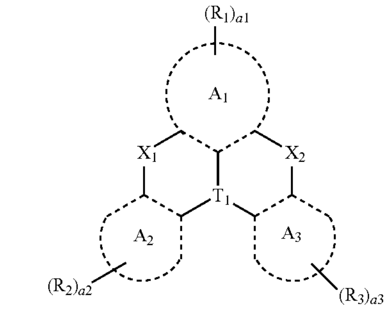

[Formula 2]

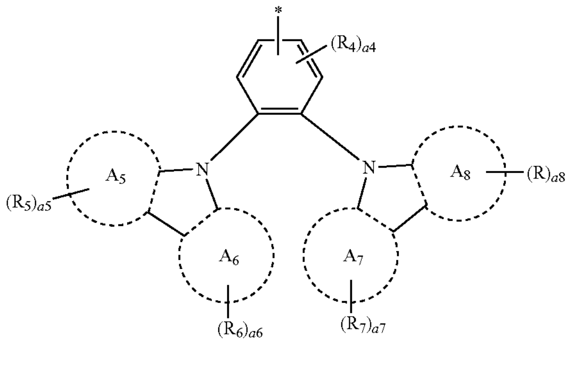

wherein in Formulae 1 and 2, $T_1$ is B, P(=O), or P(=S), $X_1$ is O, S, or N($R_{1a}$), $X_2$ is O, S, or N($R_{2a}$), ring $A_1$ to ring $A_3$ and ring $A_5$ to ring $A_8$ are each independently a $C_5$-$C_{30}$ carbocyclic group or a $C_2$-$C_{30}$ heterocyclic group, $R_1$ to $R_3$ are each independently:

hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_2$-$C_{60}$ heteroarylalkyl group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$); or a group represented by Formula 2, a1 to a3 are each independently an integer from 1 to 10, at least one of $R_1$(s) in the number of a1, $R_2$(s) in the number of a2, and $R_3$(s) in the number of a3 is each independently a group represented by Formula 2, $R_{1a}$, $R_{2a}$, and $R_4$ to $R_8$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_6$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_2$-$C_{60}$ heteroarylalkyl group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), a4 is 0, 1, 2, or 3, a5 to a8 are each independently an integer from 1 to 10,

* indicates a binding site to a neighboring atom, $R_{10a}$ is:

deuterium, —F, —Cl, —Br, —I, a hydroxyl group, a cyano group, or a nitro group;

a $C_1$-$C_6$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

2. The light-emitting device claim 1, wherein the first electrode is an anode, the second electrode is a cathode, the interlayer further includes:

a hole transport region between the emission layer and the first electrode; and an electron transport region between the emission layer and the second electrode, the hole transport region includes a hole injection layer, a hole transport layer, an emission auxiliary layer, an electron blocking layer, or a combination thereof, and the electron transport region includes a buffer layer, a hole blocking layer, an electron control layer, an electron transport layer, an electron injection layer, or a combination thereof.

3. The light-emitting device of claim 2, wherein the emission layer includes the at least one condensed cyclic compound.

4. The light-emitting device of claim 3, wherein the emission layer further includes:

a first compound that is a hole-transporting compound; and a second compound that is an electron-transporting compound.

5. The light-emitting device of claim 4, wherein the emission layer further includes a third compound, and the third compound is a phosphorescent sensitizer.

6. The light-emitting device claim 1, wherein the emission layer emits light having a maximum emission wavelength in a range of about 400 nm to about 500 nm.

7. An electronic apparatus comprising:

the light-emitting device of claim 1; and a thin-film transistor, wherein the thin-film transistor includes a source electrode and a drain electrode, and the first electrode of the light-emitting device is electrically connected to the source electrode or the drain electrode.

8. The electronic apparatus of claim 7, further comprising a color filter, a quantum dot color conversion layer, a touch screen layer, a polarizing layer, or a combination thereof.

9. A condensed cyclic compound represented by Formula 1:

[Formula 1]

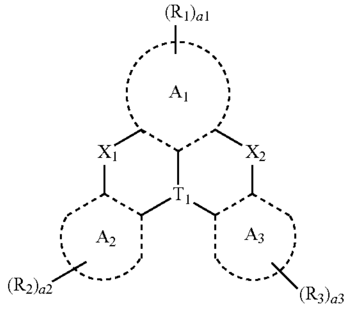

[Formula 2]

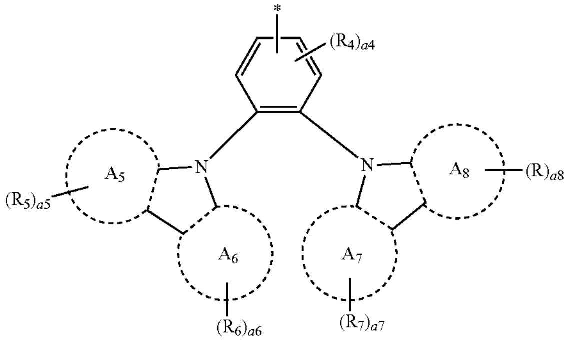

wherein in Formulae 1 and 2, $T_1$ is B, P(=O), or P(=S), $X_1$ is O, S, or N($R_{1a}$), $X_2$ is O, S, or N($R_{2a}$), ring $A_1$ to ring $A_3$ and ring $A_5$ to ring $A_8$ are each independently a $C_5$-$C_{30}$ carbocyclic group or a $C_2$-$C_{30}$ heterocyclic group, $R_1$ to $R_3$ are each independently:

hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_6$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_2$-$C_{60}$ heteroarylalkyl group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$); or a group represented by Formula 2, a1 to a3 are each independently an integer from 1 to 10, at least one of $R_1$(s) in the number of a1, $R_2$(s) in the number of a2, and $R_3$(s) in the number of a3 is each independently a group represented by Formula 2, $R_{1a}$, $R_{2a}$, and $R_4$ to $R_8$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_6$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_7$-$C_{60}$ arylalkyl group unsubstituted or substituted with at least one $R_{10a}$, a $C_2$-$C_{60}$ heteroarylalkyl group unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), a4 is 0, 1, 2, or 3, a5 to a8 are each independently an integer from 1 to 10,

* indicates a binding site to a neighboring atom, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroarylalkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

10. The condensed cyclic compound of claim 9, wherein $T_1$ is B.

11. The condensed cyclic compound of claim 9, wherein ring $A_1$ to ring $A_3$ and ring $A_5$ to ring $A_8$ are each independently a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

12. The condensed cyclic compound of claim 9, wherein ring $A_5$ to ring $A_8$ are each independently a benzene group, a pyridine group, or a pyrimidine group.

13. The condensed cyclic compound of claim 9, wherein $R_1$ to $R_3$ are each independently:

hydrogen, deuterium, —F, or a cyano group;

a $C_1$-$C_{20}$ alkyl group or a $C_3$-$C_{20}$ cycloalkyl group, each unsubstituted or substituted with deuterium, —F, a cyano group, or a combination thereof;

a phenyl group, a naphthyl group, a dibenzofuranyl group, a dibenzothiophenyl group, or a carbazolyl group, each unsubstituted or substituted with deuterium, —F, —Cl, —Br, —I, a hydroxyl group, a cyano group, a nitro group, a $C_1$-$C_{20}$ alkyl group, a deuterated $C_1$-$C_{20}$ alkyl group, a fluorinated $C_1$-$C_{20}$ alkyl group, a phenyl group, a deuterated phenyl group, a fluorinated phenyl group, a ($C_1$-$C_{20}$ alkyl)phenyl group, or a combination thereof;

—N($Q_1$)($Q_2$); or a group represented by Formula 2, and $Q_1$ and $Q_2$ are each independently:

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or a combination thereof.

14. The condensed cyclic compound of claim 9, wherein one of Conditions i to iv is satisfied:

[Condition i]

one of $R_1$(s) in the number of a1, $R_2$(s) in the number of a2, and $R_3$(s) in the number of a3 is a group represented by Formula 2, and the remaining groups are not represented by Formula 2

[Condition ii]

one of $R_1$(s) in the number of a1 and one of $R_2$(s) in the number of a2 are each independently a group represented by Formula 2, and the remaining groups are not represented by Formula 2

[Condition iii]

one of $R_1$(s) in the number of a1 and one of $R_3$(s) in the number of a3 are each independently a group represented by Formula 2, and the remaining groups are not represented by Formula 2

[Condition iv]

one of $R_2$(s) in the number of a2 and one of $R_3$(s) in the number of a3 are each independently a group represented by Formula 2, and the remaining groups are not represented by Formula 2.

15. The condensed cyclic compound of claim 9, wherein $R_{1a}$ and $R_{2a}$ are each independently a phenyl group unsubstituted or substituted with deuterium, —F, —$CD_3$, —$CD_2H$, —$CDH_2$, —$CF_3$, —$CF_2H$, —$CFH_2$, a cyano group, a $C_1$-$C_{20}$ alkyl group, a phenyl group, or a combination thereof.

16. The condensed cyclic compound of claim 9, wherein $R_4$ to $R_8$ are each independently:

hydrogen, deuterium, —F, or a cyano group;

a $C_1$-$C_{20}$ alkyl group or a $C_3$-$C_{10}$ cycloalkyl group, each unsubstituted or substituted with deuterium, —F, a cyano group, or a combination thereof; or a phenyl group, a naphthyl group, a dibenzofuranyl group, a dibenzothiophenyl group, or a carbazolyl group, each unsubstituted or substituted with deuterium, —F, —$CD_3$, —$CD_2H$, —$CDH_2$, —$CF_3$, —$CF_2H$, —$CFH_2$, a cyano group, a $C_1$-$C_{20}$ alkyl group, a phenyl group, or a combination thereof.

17. The condensed cyclic compound of claim 9, wherein Formula 2 is represented by one of Formulae 2-1 to 2-8:

2-1

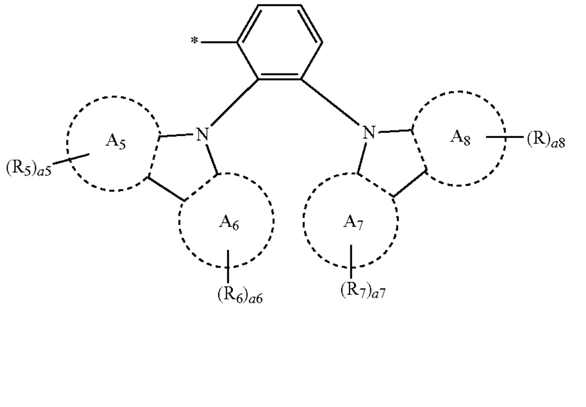

-continued 2-2

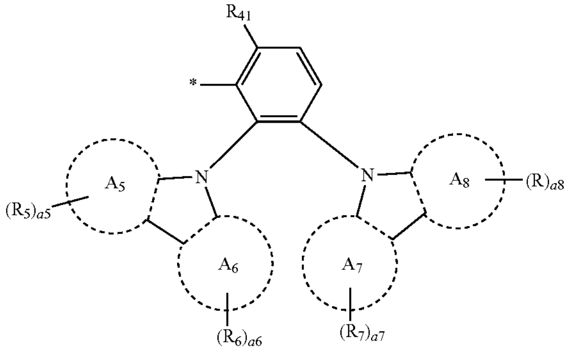

2-3

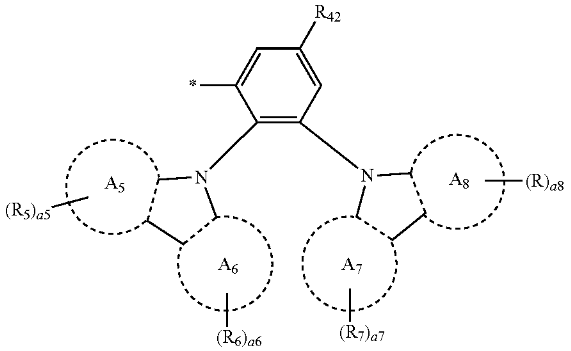

2-4

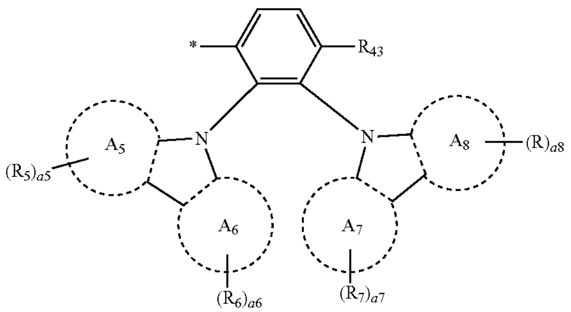

2-5

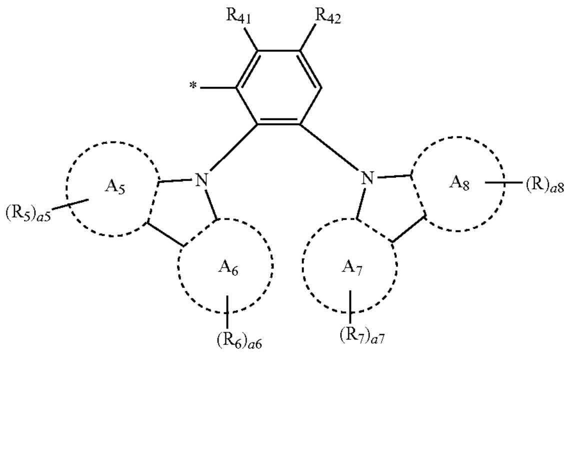

-continued 2-6

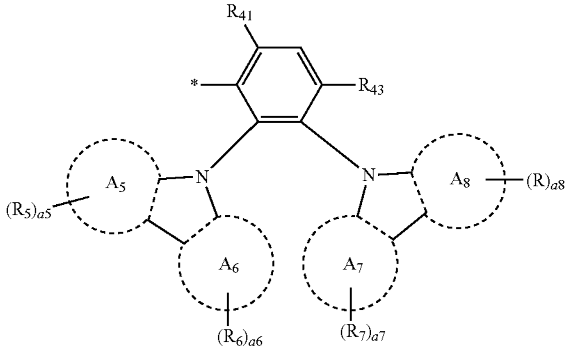

2-7

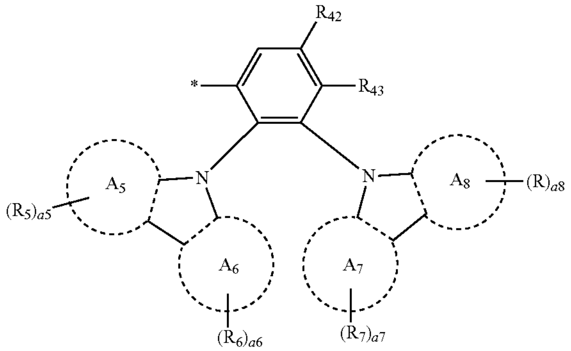

2-8

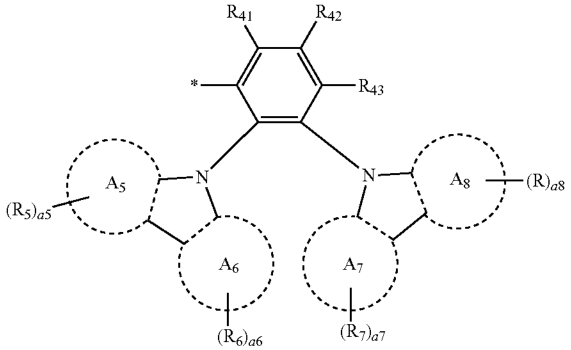

wherein in Formulae 2-1 to 2-8, ring $A_5$ to $A_8$, $R_5$ to $R_8$, and a5 to a8 are each the same as defined in Formula 2, $R_{41}$ to $R_{43}$ are each independently as defined in connection with $R_4$ in Formula 2, except that each of $R_{41}$ to $R_{43}$ is not hydrogen, and

* indicates a binding site to a neighboring atom.

18. The condensed cyclic compound of claim 9, wherein at least one of Condition a to Condition c is satisfied:

[Condition a]

a group represented by

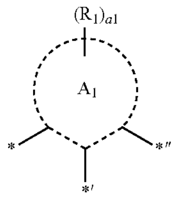

in Formula 1 is a group represented by Formula A1:

A1

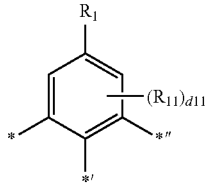

wherein in Formula A1, $R_1$ is the same as defined in Formula 1, $R_{11}$ is the same as defined in connection with $R_1$ in Formula 1, except that $R_{11}$ is not a group represented by Formula 2, d11 is 0, 1, or 2,

* indicates a binding site to $X_1$ in Formula 1,

*' indicates a binding site to $T_1$ in Formula 1, and

*" indicates a binding site to $X_2$ in Formula 1;

[Condition b]

a group represented by

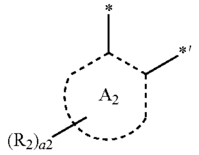

in Formula 1 is a group represented by Formula A2-1 or Formula A2-2:

A2-1

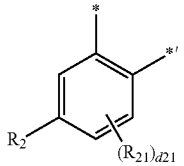

A2-2

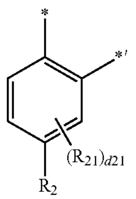

wherein in Formulae A2-1 and A2-2, $R_2$ is the same as defined in Formula 1, $R_{21}$ is the same as defined in connection with $R_2$ in Formula 1, except that $R_{21}$ is not a group represented by Formula 2, d21 is 0, 1, 2, or 3,

* indicates a binding site to $X_1$ in Formula 1, and

*' indicates a binding site to $T_1$ in Formula 1; and

[Condition c]

a group represented by

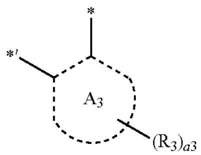

in Formula 1 is a group represented by Formula A3-1 or Formula A3-2:

A3-1

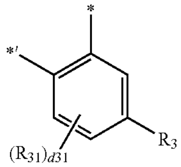

A3-2

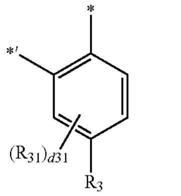

wherein in Formulae A3-1 and A3-2, $R_3$ is the same as defined in Formula 1, $R_{31}$ is the same as defined in connection with $R_3$ in Formula 1, except that $R_{31}$ is not a group represented by Formula 2, d31 is 0, 1, 2, or 3,

* indicates a binding site to $X_2$ in Formula 1, and

*' indicates a binding site to $T_1$ in Formula 1.

19. The condensed cyclic compound of claim 9, wherein the condensed cyclic compound is represented by one of Formulae 1(1) to 1(13):

1(1)

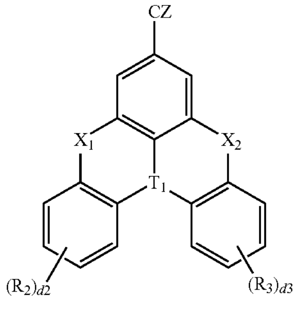

-continued

1(2)

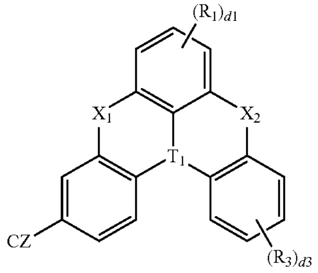

1(3)

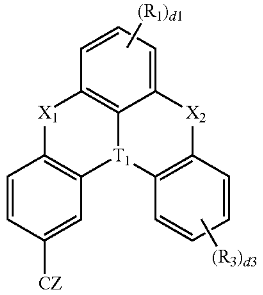

1(4)

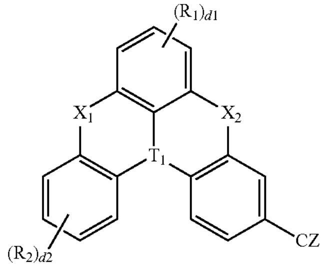

1(5)

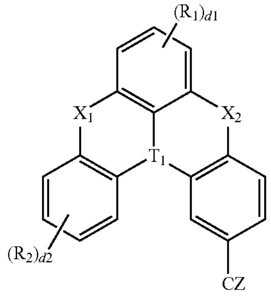

1(6)

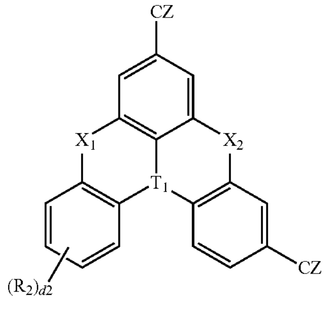

-continued

1(7)

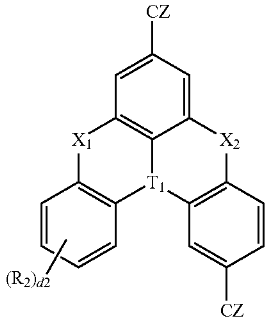

1(8)

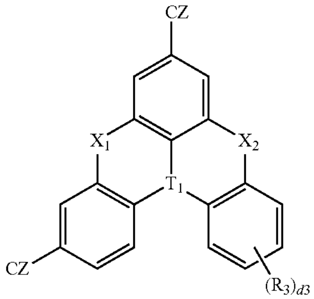

1(9)

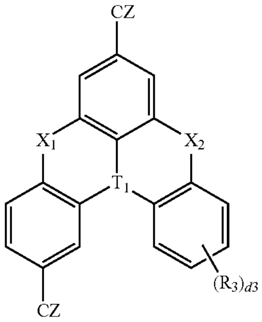

1(10)

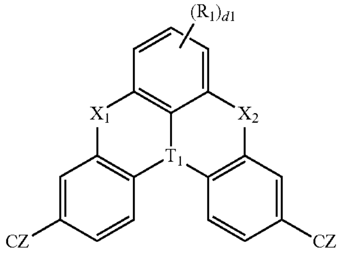

-continued

1(11)

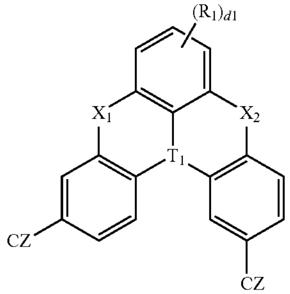

1(12)

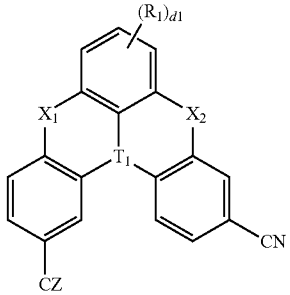

1(13)

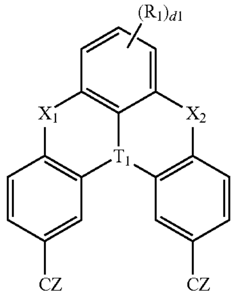

wherein in Formulae 1(1) to 1(13), $T_1$, $X_1$, $X_2$, $R_1$, $R_2$, and $R_3$ are each the same as defined in Formula 1, CZ is a group represented by Formula 2, d1 is an integer from 0 to 3, and d2 and d3 are each independently an integer from 0 to 4.

20. The condensed cyclic compound of claim 9, wherein Equation 1 is satisfied:

$$\Delta E_{ST}=S1-T1\leq 0.44\text{ eV} \quad \text{[Equation 1]}$$

wherein in Equation 1,

S1 is a lowest excitation singlet energy level (eV) of the condensed cyclic compound, and T1 is a lowest excitation triplet energy level (eV) of the condensed cyclic compound.

* * * * *